US009299933B2

(12) United States Patent
Baba et al.

(10) Patent No.: US 9,299,933 B2
(45) Date of Patent: Mar. 29, 2016

(54) POLYMER AND ORGANIC ELECTROLUMINESCENT ELEMENT

(71) Applicant: MITSUBISHI CHEMICAL CORPORATION, Chiyoda-ku (JP)

(72) Inventors: Tatsushi Baba, Kanagawa (JP); Yanjun Li, Kanagawa (JP); Koichiro Iida, Kanagawa (JP); Hideki Gorohmaru, Kanagawa (JP); Emi Nakamoto, Kanagawa (JP); Takayuki Shouda, Kanagawa (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/467,503

(22) Filed: Aug. 25, 2014

(65) Prior Publication Data

US 2015/0041797 A1 Feb. 12, 2015

Related U.S. Application Data

(63) Continuation of application No. PCT/JP2013/054418, filed on Feb. 21, 2013.

(30) Foreign Application Priority Data

Feb. 23, 2012 (JP) .................................. 2012-037678
Aug. 6, 2012 (JP) .................................. 2012-173835

(51) Int. Cl.
H01L 51/54 (2006.01)
H01L 51/00 (2006.01)
H01L 51/50 (2006.01)
C08G 73/02 (2006.01)

(52) U.S. Cl.
CPC ........ *H01L 51/0035* (2013.01); *C08G 73/0266* (2013.01); *H01L 51/0043* (2013.01); *H01L 51/5056* (2013.01); *H01L 51/5072* (2013.01); *H01L 51/5088* (2013.01); *H01L 51/5092* (2013.01)

(58) Field of Classification Search
None
See application file for complete search history.

(56) References Cited

U.S. PATENT DOCUMENTS

| 2004/0204557 | A1* | 10/2004 | Uckert et al. ...................... 528/4 |
| 2008/0097076 | A1* | 4/2008 | Radu et al. ...................... 528/422 |
| 2009/0212693 | A1 | 8/2009 | Yamada |
| 2011/0108814 | A1 | 5/2011 | Iida et al. |
| 2011/0114926 | A1 | 5/2011 | Okabe et al. |
| 2011/0198573 | A1 | 8/2011 | Iida et al. |
| 2012/0074360 | A1 | 3/2012 | Funyuu et al. |
| 2013/0020562 | A1 | 1/2013 | Iida et al. |
| 2013/0200337 | A1 | 8/2013 | Iida et al. |

FOREIGN PATENT DOCUMENTS

| EP | 2 063 473 A1 | 5/2009 |
| EP | 2 272 894 A1 | 1/2011 |
| EP | 2 314 639 A1 | 4/2011 |
| EP | 2 315 291 A1 | 4/2011 |
| EP | 2 535 366 A1 | 12/2012 |
| JP | 2010-98306 | 4/2010 |
| WO | WO 2008/032843 A1 | 3/2008 |
| WO | WO 2010/140553 A1 | 12/2010 |
| WO | WO 2011/099531 A1 | 8/2011 |
| WO | WO 2013/180036 A1 | 12/2013 |

OTHER PUBLICATIONS

International Search Report issued Mar. 19, 2013 in PCT/JP2013/054418 (with English translation).
Extended European Search Report issued on Dec. 4, 2014 in European Patent Application No. 13752359.3.
Office Action issued Nov. 5, 2015, in Chinese Patent Application No. 201380010741.1 filed Feb. 21, 2013 (with English translation).

* cited by examiner

*Primary Examiner* — Andrew K Bohaty
(74) *Attorney, Agent, or Firm* — Oblon, McClelland, Maier & Neustadt, L.L.P.

(57) ABSTRACT

The present invention relates to a polymer comprising a repeating unit containing a specific partial structure and a repeating unit containing a crosslinking group, a composition for an organic electroluminescent element comprising the polymer, and an organic electroluminescent element comprising an organic layer formed using the composition for an organic electroluminescent element by a wet film formation method.

12 Claims, 2 Drawing Sheets

POLYMER AND ORGANIC ELECTROLUMINESCENT ELEMENT

TECHNICAL FIELD

The present invention relates to a polymer useful as a material for hole injection layer and/or hole transport layer of organic electroluminescent elements, to an organic electroluminescent element material comprising the polymer and to a composition for organic electroluminescent elements and an organic electroluminescent element using the polymer, as well as to an organic EL display device and an organic EL lighting device equipped with the organic electroluminescent element.

BACKGROUND ART

A method for formation of an organic layer in organic electroluminescent elements includes a vacuum evaporation method and a wet film formation method. A vacuum evaporation method enables easy lamination and therefore has the advantage of improving charge injection from anode and/or cathode and facilitating exciton blocking in light-emitting layer. On the other hand, a wet film formation method does not require a vacuum process and therefore has the advantage that it enables large-area film formation and makes it possible to mix multiple materials having different functions in forming one layer and preparing a coating liquid for the layer. However, according to the wet film formation method, lamination is difficult. Consequently, as compared with elements produced according to a vacuum evaporation method, those produced according to the wet film formation method are poor in driving stability, and except for a few, they could not be on a practicable level as yet. In particular, lamination of two layers would be possible according to the wet film formation method using an organic solvent and an aqueous solvent, but lamination of three or more layers is still difficult.

For solving the problems with lamination, PTL 1 proposes a polymer (Q-1) having a fluorene ring and a crosslinking group as described below, and discloses lamination of multiple layers by utilizing the phenomenon that the network polymer to be formed through reaction of the crosslinking group by heating becomes insoluble in an organic solvent.

PTL 2 reports film formation by the use of a polymer having both a branched structure and a crosslinking moiety, under milder heating conditions.

CITATION LIST

Patent Literature

PTL 1: WO2008-032843
PTL 2: WO2010-140553

SUMMARY OF INVENTION

Technical Problem

When the polymer (Q-1) described in PTL 1 forms a network polymer by crosslinking, the main-chain structure thereof that is naturally rigid is bent or twisted and therefore the charge transporting ability and the oxidation reduction stability of the polymer greatly worsen. Consequently, there are problems that the driving voltage for the organic electroluminescent elements obtained according to the technique described in PTL 1 is high, the luminescent efficiency of the elements is low and the operation life thereof is short.

On the other hand, PTL 2 reports that, using a polymer having both a branched structure and a crosslinking moiety, a film can be formed under milder heating conditions. However, the degree of freedom of the branched structure of the polymer is low, and the branched structure part is rigid, and therefore the solubility of the polymer in solvent is low and a homogeneous film is difficult to form. In addition, since the degree of freedom of the branched structure is low, the intermolecular interaction between the polymer chains is weak and therefore there hardly occurs hole transfer between the molecules and the hole mobility is low; and consequently, there are problems that the driving voltage for the organic electroluminescent elements produced according to the technique described in PTL 2 is high, holes tend to accumulate in the hole transport layer and the material is readily broken, or that is, the operation life of the elements is short.

Given the situation and in consideration of the above-mentioned problems, it is an object of the present invention to provide a polymer which is excellent in hole transporting ability and in electrochemical stability, which enables lamination of layers according to a wet film formation method and which hardly decomposes through electrification, and to provide an organic electroluminescent element material and an organic electroluminescent element composition containing the polymer.

[Chem. 1]

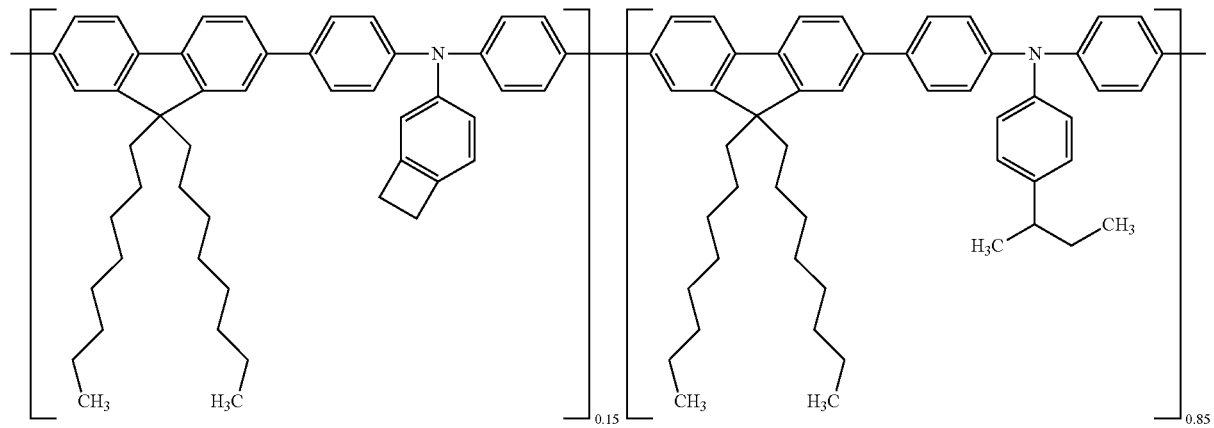

Another object of the present invention is to provide an organic electroluminescent element using the polymer, which can be driven at a low voltage and which has high driving stability, and to provide an organic EL display device and an organic EL lighting device equipped with the element.

Solution to Problem

The present inventors have made assiduous investigations for solving the above-mentioned problems and, as a result, have found that the reason why the driving voltage for the organic electroluminescent element having a hole injection layer, a hole transport layer and a light-emitting layer formed according to a wet film formation method is high and therefore the driving stability of the element of the type is low is because the hole transporting ability of the hole injection layer or the hole transport layer is poor. Further investigations made by the inventors have revealed that one reason of the poor hole transporting ability of the hole injection layer or the hole transport layer formed of a charge transporting polymer is that the intermolecular interaction is weak and therefore hole transfer between molecules could hardly occur.

The present inventors have made further investigations for solving the problems and have found that a polymer having a repeating unit with a specific partial structure and a repeating unit with a crosslinking group enables lamination of layers according to a wet film formation method and the polymer has high hole transporting ability and electrochemical stability, and that an organic electroluminescent element produced using the polymer can be driven highly efficiently at a low voltage, and have completed the present invention.

Specifically, the present invention relates to the following <1> to <12>.

<1> A polymer comprising a repeating unit having a partial structure represented by the following formula (1) and a repeating unit having a crosslinking group:

[Chem. 2]

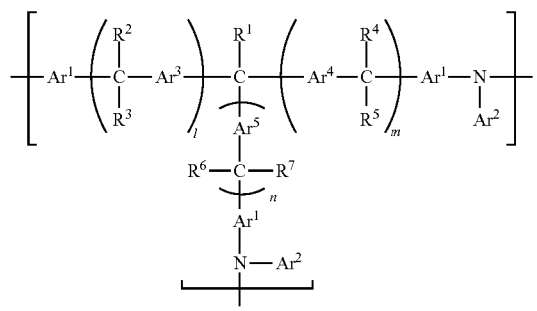

(1)

wherein $Ar^1$, $Ar^3$, $Ar^4$ and $Ar^5$ each independently represent a divalent aromatic hydrocarbon-cyclic group optionally having a substituent or a divalent aromatic heterocyclic group optionally having a substituent, $Ar^2$ represents an aromatic hydrocarbon-cyclic group optionally having a substituent, or an aromatic heterocyclic group optionally having a substituent, $R^1$ represents an alkyl group optionally having a substituent, or an alkoxy group optionally having a substituent, $R^2$ to $R^7$ each independently represent a hydrogen atom, an alkyl group optionally having a substituent, an alkoxy group optionally having a substituent, an aromatic hydrocarbon-cyclic group optionally having a substituent, or an aromatic heterocyclic group optionally having a substituent, $R^2$ and $R^3$ may bond to each other to form a ring. $R^4$ and $R^5$ may bond to each other to form a ring. $R^6$ and $R^7$ may bond to each other to form a ring, l, m and n each independently indicate an integer of from 0 to 2, and Multiple $Ar^1$ to $Ar^5$ or $R^2$ to $R^7$ in the formula (1) may be the same or different.

<2> The polymer according to the item <1> above, wherein in the formula (1), at least one of l, m and n is an integer differing from the others.

<3> The polymer according to the item <1> or <2> above, which further comprises a repeating unit having a partial structure represented by the following formula (2):

[Chem. 3]

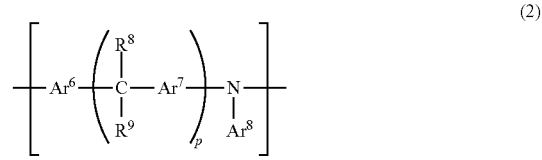

(2)

wherein $Ar^6$ and $Ar^7$ each independently represent a divalent aromatic hydrocarbon-cyclic group optionally having a substituent, or a divalent aromatic heterocyclic group optionally having a substituent, $Ar^8$ represents an aromatic hydrocarbon-cyclic group optionally having a substituent, or an aromatic heterocyclic group optionally having a substituent, $R^8$ and $R^9$ each independently represent a hydrogen atom, an alkyl group optionally having a substituent, an alkoxy group optionally having a substituent, an aromatic hydrocarbon-cyclic group optionally having a substituent, or an aromatic heterocyclic group optionally having a substituent, $R^8$ and $R^9$ may bond to each other to form a ring, p indicates an integer of from 0 to 2, and Multiple substituents of at least one of $R^8$, $R^9$ and $Ar^7$ in the formula (2) may be the same or different.

<4> The polymer according to any one of the items <1> to <3> above, wherein the crosslinking group is at least one group selected from crosslinking groups of the following formulae:

<Crosslinking Groups>

[Chem. 4]

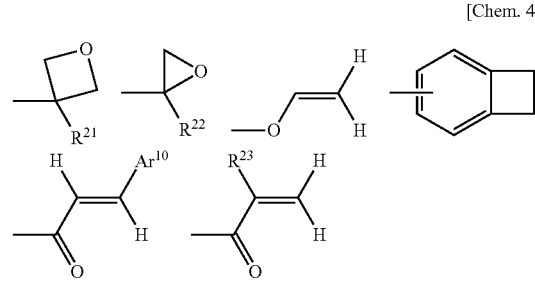

wherein $R^{21}$ to $R^{23}$ each independently represent a hydrogen atom, or an alkyl group optionally having a substituent, $Ar^{10}$ represents an aromatic hydrocarbon-cyclic group optionally having a substituent, or an aromatic heterocyclic group optionally having a substituent, and when multiple crosslinking groups and multiple $R^{21}$ to $R^{23}$ and $Ar^{10}$ are present, the multiple $R^{21}$ to $R^{23}$ and $Ar^{10}$ may be the same or different.

<5> The polymer according to any one of the items <1> to <4> above, wherein the weight-average molecular weight (Mw) of the polymer is 20,000 or more, and the degree of dispersion (Mw/Mn where Mn indicates the number-average molecular weight of the polymer) is 2.5 or less.

<6> A material for organic electroluminescent element, which comprises the polymer according to any one of the items <1> to <5> above.

<7> A composition for organic electroluminescent element, which comprises the polymer according to any one of the items <1> to <5> above.

<8> An organic electroluminescent element comprising, on a substrate, an anode and a cathode and an organic layer between the anode and the cathode, wherein the organic layer contains a layer formed according to a wet film formation method using the composition for organic electroluminescent elements according to the item <7> above.

<9> The organic electroluminescent element according to the item <8> above, wherein the layer formed according to a wet film formation method is at least one of a hole injection layer and a hole transport layer.

<10> The organic electroluminescent element according to the item <9> above, wherein the organic layer includes a hole injection layer, a hole transport layer and a light-emitting layer, and all of the hole injection layer, the hole transport layer and the light-emitting layer are a layer formed according to a wet film formation method.

<11> An organic EL display device comprising the organic electroluminescent element according to any one of the items <8> to <10> above.

<12> An organic EL lighting device comprising the organic electroluminescent element according to any one of the items <8> to <10> above.

Advantageous Effects of Invention

The polymer of the present invention enables lamination of layers according to a wet film formation method. In addition, the polymer has high hole transporting ability and electrochemical stability, and is therefore useful as an organic electroluminescent element material. The organic electroluminescent element produced using the polymer can be driven highly efficiently at a low voltage and is excellent in driving stability, and is therefore useful for organic EL display devices (organic EL displays) and organic EL lighting devices.

DESCRIPTION OF EMBODIMENTS

Figure 1:
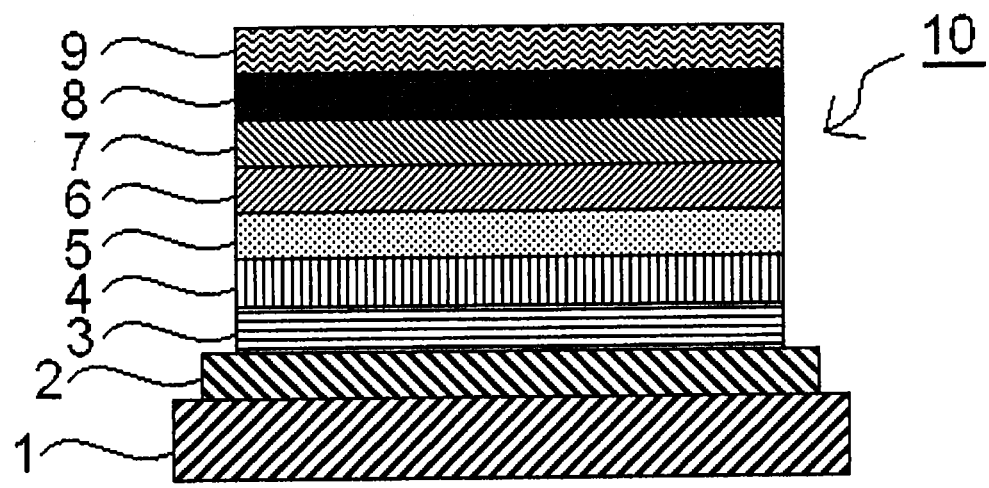
FIG. 1 is a schematic cross-sectional view showing one example of an embodiment of the organic electroluminescent element of the present invention.

Embodiments of the present invention are described in detail hereinunder; however, the description of the constituent features given below is of some examples (typical examples) of the embodiments of the present invention, and the present invention is not specifically defined by these contents, not overstepping the scope and the spirit thereof

[Polymer]

The polymer of the present invention contains a repeating unit having a partial structure represented by the following formula (1) and a repeating unit having a crosslinking group.

{Partial Structure (1)}

[Chem. 5]

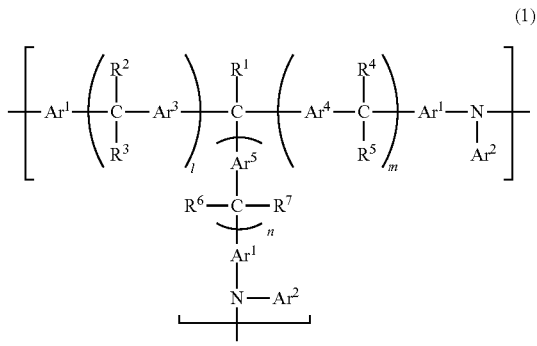

(In the formula (1), $Ar^1$, $Ar^3$, $Ar^4$ and $Ar^5$ each independently represent a divalent aromatic hydrocarbon-cyclic group optionally having a substituent or a divalent aromatic heterocyclic group optionally having a substituent, $Ar^2$ represents an aromatic hydrocarbon-cyclic group optionally having a substituent, or an aromatic heterocyclic group optionally having a substituent.

$R^1$ represents an alkyl group optionally having a substituent, or an alkoxy group optionally having a substituent, $R^2$ to $R^7$ each independently represent a hydrogen atom, an alkyl group optionally having a substituent, an alkoxy group optionally having a substituent, an aromatic hydrocarbon-cyclic group optionally having a substituent, or an aromatic heterocyclic group optionally having a substituent.

$R^2$ and $R^3$ may bond to each other to form a ring. $R^4$ and $R^5$ may bond to each other to form a ring. $R^6$ and $R^7$ may bond to each other to form a ring.

l, m and n each independently indicate an integer of from 0 to 2.

Multiple $Ar^1$ to $Ar^5$ or $R^2$ to $R^7$ in the formula (1) may be the same or different.)

<Structural Characteristics>

The partial structure (1) is a soft branched structure that is branched at the $sp^3$ carbon, in which the $sp^3$ carbon has an alkyl group or an alkoxy group of R'. The polymer of the present invention contains the partial structure (1) as a repeating unit therein, and the polymer chains can readily interact with each other to facilitate hole transfer between the molecules of the polymer. Consequently, a film formed using the polymer has a high hole mobility and therefore, the driving voltage for the organic electroluminescent element of the present invention that has an organic layer formed using the polymer is low.

The layer using the polymer hardly traps holes, and charges hardly accumulate therein, and accordingly, the material is hardly decomposed. Consequently, the organic electroluminescent element of the present invention that has a layer formed using the polymer is excellent in driving stability.

<Regarding $Ar^1$ to $Ar^5$>

The aromatic hydrocarbon-cyclic group optionally having a substituent, which constitutes $Ar^1$ to $Ar^5$, includes 6-membered monocyclic rings or 2 to 5-condensed rings thereof such as a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring and the like having one (for $Ar^2$) or two (for $Ar^1$, $Ar^3$ to $Ar^5$) free atomic valences.

Here, in the present invention, the free atomic valence is one capable of forming a bond with any other free atomic valence, as described in Organic Chemistry, Biochemical Nomenclature (Vol. 1) (revised version of 2nd edition, issued by Nanko-do in 1992).

The aromatic heterocyclic group optionally having a substituent, which constitutes $Ar^1$ to $Ar^5$, includes 5-membered or 6-membered monocyclic rings or 2 to 4-condensed rings thereof such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, an azurene ring and the like having one (for $Ar^2$) or two (for $Ar^1$, $Ar^3$ to $Ar^5$) free atomic valences.

Above all, from the viewpoint of the solubility and the heat resistance of the polymer, $Ar^1$ to $Ar^5$ each are preferably a ring selected from a group of a benzene ring, a naphthalene ring, an anthracene ring, a phenanthrene ring, a triphenylene ring, a pyrene ring, a thiophene ring, a pyridine ring and a fluorene ring having one (for $Ar^2$) or two (for $Ar^1$, $Ar^3$ to $Ar^5$) free atomic valences.

In the formula (1), $Ar^1$ to $Ar^5$ each may be a group formed by bonding two or more aromatic hydrocarbon-cyclic groups optionally having a substituent and/or aromatic heterocyclic groups optionally having a substituent. The group of the type includes, as $Ar^1$ and $Ar^3$ to $Ar^5$, a biphenylene group, a terphenylene group, etc., and preferred is a 4,4'-biphenylene group. As $Ar^2$, the group of the type includes a biphenyl group, a terphenyl group, etc., and preferred is a p-phenylphenyl group.

The substituent that the aromatic hydrocarbon-cyclic group or the aromatic heterocyclic group for $Ar^1$ to $Ar^5$ may have is not specifically defined. For example, the substituent may be selected from the following substituent groups Z. $Ar^1$ to $Ar^5$ may have one substituent or two or more substituents. Two or more substituents which they may have may be substituents of the same type, or may be substituents of two or more different types as combined in any desired manner and in any desired ratio.
(Substituent Groups Z)

There are mentioned an alkyl group having a carbon number of generally 1 or more and generally 24 or less, preferably 12 or less, for example, a methyl group, an ethyl group, etc.;

an alkenyl group having a carbon number of generally 2 or more and generally 24 or less, preferably 12 or less, for example, a vinyl group, etc.;

an alkynyl group having a carbon number of generally 2 or more and generally 24 or less, preferably 12 or less, for example, a ethynyl group, etc.;

an alkoxy group having a carbon number of generally 1 or more and generally 24 or less, preferably 12 or less, for example, a methoxy group, an ethoxy group, etc.;

an aryloxy group having a carbon number of generally 4 or more, preferably 5 or more and generally 36 or less, preferably 24 or less, for example, a phenoxy group, a naphthoxy group, a pyridyloxy group, etc.;

an alkoxycarbonyl group having a carbon number of generally 2 or more and generally 24 or less, preferably 12 or less, for example, a methoxycarbonyl group, an ethoxycarbonyl group, etc.;

a dialkylamino group having a carbon number of generally 2 or more and generally 24 or less, preferably 12 or less, for example, a dimethylamino group, a diethylamino group, etc.;

a diarylamino group having a carbon number of generally 10 or more, preferably 12 or more, and generally 36 or less, preferably 24 or less, for example, a diphenylamino group, a ditolylamino group, an N-carbazolyl group, etc.;

an arylalkylamino group having a carbon number of generally 7 or more and generally 36 or less, preferably 24 or less, for example, a phenylmethylamino group, etc.;

an acyl group having a carbon number of generally 2 or more and generally 24 or less, preferably 12 or less, for example, an acetyl group, a benzoyl group, etc.;

a halogen atom, for example, a fluorine atom, a chlorine atom, etc.;

a haloalkyl group having a carbon number of generally 1 or more and generally 12 or less, preferably 6 or less, for example, a trifluoromehtyl group, etc.;

an alkylthio group having a carbon number of generally 1 or more and generally 24 or less, preferably 12 or less, for example, a methylthio group, an ethylthio group, etc.;

an arylthio group having a carbon number of generally 4 or more, preferably 5 or more and generally 36 or less, preferably 24 or less, for example, a phenylthio group, a naphthylthio group, a pyridylthio group, etc.;

a silyl group having a carbon number of generally 2 or more, preferably 3 or more and generally 36 or less, preferably 24 or less, for example, a trimethylsilyl group, a triphenylsilyl group, etc.;

a siloxy group having a carbon number of generally 2 or more, preferably 3 or more and generally 36 or less, preferably 24 or less, for example, a trimethylsiloxy group, a triphenylsiloxy group, etc.;

a cyano group;

an aromatic hydrocarbon-cyclic group having a carbon number of generally 6 or more and generally 36 or less, preferably 24 or less, for example, a phenyl group, a naphthyl group, etc.;

an aromatic heterocyclic group having a carbon number of generally 3 or more, preferably 4 or more and generally 36 or less, preferably 24 or less, for example, a thienyl group, a pyridyl group, etc.

Of those substituents, preferred are an alkyl group having from 1 to 12 carbon atoms and an alkoxy group having from 1 to 12 carbon atoms, from the viewpoint of the solubility of the polymer.

The substituents may further have a substituent, and as examples of the additional substituents, there are mentioned the groups exemplified hereinabove for the substituent groups Z.

The formula weight of the group represented by $Ar^1$ to $Ar^5$ is generally 65 or more, preferably 75 or more and is generally 500 or less, preferably 300 or less, more preferably 250 or less, even more preferably 200 or less, including the substituent, if any, therein. When the formula weight of the group represented by $Ar^1$ to $Ar^5$ is too large, then there is a possibility that the charge transporting ability of the polymer may lower, and there is a possibility that the solubility of the polymer before crosslinking in solvent may greatly lower.

<Regarding $R^1$>

$R^1$ represents an alkyl group optionally having a substituent, or an alkoxy group optionally having a substituent.

The polymer of the present invention has an alkyl group or an alkoxy group introduced at the sp3 carbon in the branched part thereof, and consequently, as compared with a case where an aromatic hydrocarbon-cyclic group or an aromatic heterocyclic group is introduced, the solubility in solvent of the polymer before crosslinking is improved and therefore can form a homogeneous film with ease.

The alkyl group optionally having a substituent to constitute $R^1$ includes a straight-chain or branched-chain alkyl group having a carbon number of generally 1 or more and generally 24 or less, for example, a methyl group, an ethyl group, an n-propyl group, a 2-propyl group, an n-butyl group, an isobutyl group, a tert-butyl group, etc. Of those, more preferred is an alkyl group having a carbon number of 1 or more and 12 or less, especially 6 or less, from the viewpoint of the durability and the solubility of the polymer.

The alkoxy group optionally having a substituent to constitute $R^1$ includes a straight-chain or branched-chain alkoxy group having a carbon number of generally 1 or more and generally 24 or less, for example, a methoxy group, an ethoxy group, a butoxy group, etc. Of those, more preferred is an alkoxy group having a carbon number of generally 1 or more and 12 or less, especially 6 or less, from the viewpoint of the durability and the solubility of the polymer.

Not specifically defined, the substituent that the alkyl group or the alkoxy group of $R^1$ may have includes, for example, the groups selected from the above-mentioned substituent groups Z. $R^1$ may have one substituent or may have two or more substituents. Two or more substituents which the groups may have may be substituents of the same type, or may be substituents of two or more different types as combined in any desired manner and in any desired ratio.

In case where the alkyl group or the alkoxy group of $R^1$ has a substituent, the substituent is preferably an aromatic hydrocarbon-cyclic group having 12 or less carbon atoms, in view of the above-mentioned effects of $R^1$ in the present invention, or that is, from the viewpoint of favorably securing the effect of facilitating the interaction of polymer chains. Especially preferably, the alkyl group or the alkoxy group of $R^1$ does not have a substituent.

The formula weight of $R^1$ is preferably 500 or less, more preferably 200 or less, including the substituent, if any, therein. When the formula weight of the group represented by $R^1$ is too large, then there is a possibility of failing in securing the effect of easy interaction between polymer chains.

<Regarding $R^2$ to $R^7$>

As the alkyl group optionally having a substituent or the alkoxy group optionally having a substituent to constitute $R^2$ to $R^7$, there are mentioned those exemplified hereinabove as the alkyl group optionally having a substituent or the alkoxy group optionally having a substituent to constitute R'.

As the aromatic hydrocarbon-cyclic group optionally having a substituent or the aromatic heterocyclic group optionally having a substituent to constitute $R^2$ to $R^7$, there are mentioned those exemplified hereinabove as the aromatic hydrocarbon-cyclic group optionally having a substituent or the aromatic heterocyclic group optionally having a substituent to constitute $Ar^2$.

$R^2$ and $R^3$, $R^4$ and $R^5$, and $R^6$ and $R^7$ may bond to each other to form a ring. In this case, from the viewpoint of the solubility and the heat resistance of the polymer, preferably formed is a cyclopentane ring, a cyclohexane ring, a cycloheptane ring, a fluorene ring, or an indene ring.

Of the above, $R^2$ to $R^7$ each are preferably a straight-chain or branched-chain alkyl group having a carbon number of generally 1 or more and generally 12 or less, for example, a methyl group, an ethyl group, an n-propyl group, a 2-propyl group, an n-butyl group, an isobutyl group, a tert-butyl group or the like, from the viewpoint of the durability and the solubility of the polymer.

The substituent that the alkyl group, the alkoxy group, the aromatic hydrocarbon-cyclic group or the aromatic heterocyclic group to constitute $R^2$ to $R^7$ may have is not specifically defined, for which, for example, there are mentioned the groups selected from the above-mentioned substituent groups Z. $R^2$ to $R^7$ each may have one substituent or may have two or more substituents. Two or more substituents which the groups may have may be substituents of the same type, or may be substituents of two or more different types as combined in any desired manner and in any desired ratio.

Regarding the formula weight, the formula weight of the group represented by $R^2$ to $R^7$ is generally 15 or more and is generally 500 or less, preferably 300 or less, more preferably 250 or less, even more preferably 200 or less, including the substituent, if any, therein. When the formula weight of $R^2$ to $R^7$ is too large, there is a possibility that the solubility of the polymer before crosslinking in solvent may greatly lower.

<Regarding l, m, n> l, m and n each represent the repeating number of the basic structure (repeating structure) as parenthesized by ( ) which constitutes the partial structure represented by the formula (1), and each independently indicates an integer of from 0 to 2. In case where at least one of l, m and n is a different integer, or that is, in a case different from 1=m=n, the symmetricity of the branched structure may lower and the solubility in solvent of the polymer may increase, and therefore the polymer of the type is more preferred as forming a more homogeneous film.

In case where the formula (1) has multiple $Ar^1$ to $Ar^5$, and $R^2$ to $R^7$, they may be the same or different.

<Regarding Formula Weight of Partial Structure (1)>

Preferably, the formula weight of the partial structure (1) is generally 400 or more and is generally 3000 or less, more preferably 2000 or less. When the formula weight of the partial structure (1) is too large, then the solubility of the polymer in solvent before crosslinking may lower. However, for introducing the necessary structure into the formula (1), the formula weight of the partial structure (1) is generally a value of 400 or more that is the lower limit mentioned above.

<Examples of Partial Structure (1)>

Specific examples of the partial structure (1) are shown below. However, the partial structure (1) in the present invention is not limited at all to those mentioned below.

The polymer of the present invention may have a repeating unit having one type of the partial structure (1) or may have a repeating unit having two or more different types of the partial structure (1).

[Chem. 6]
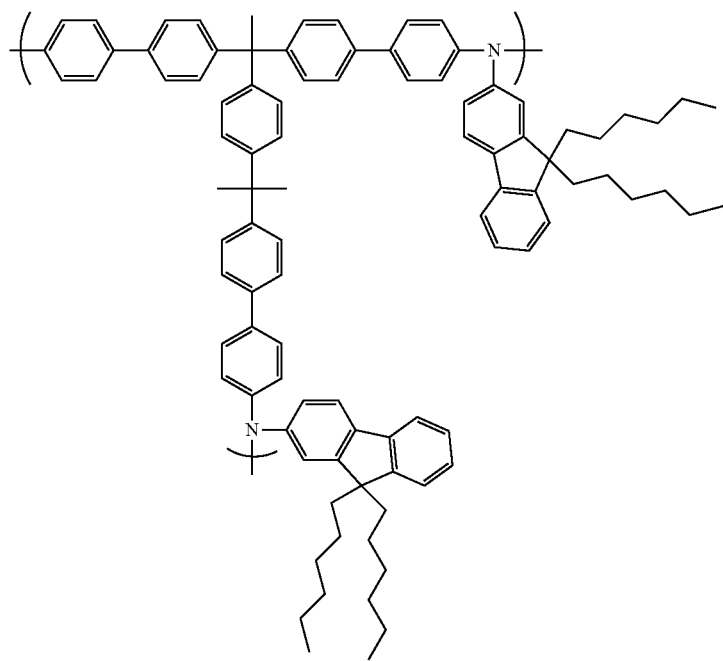
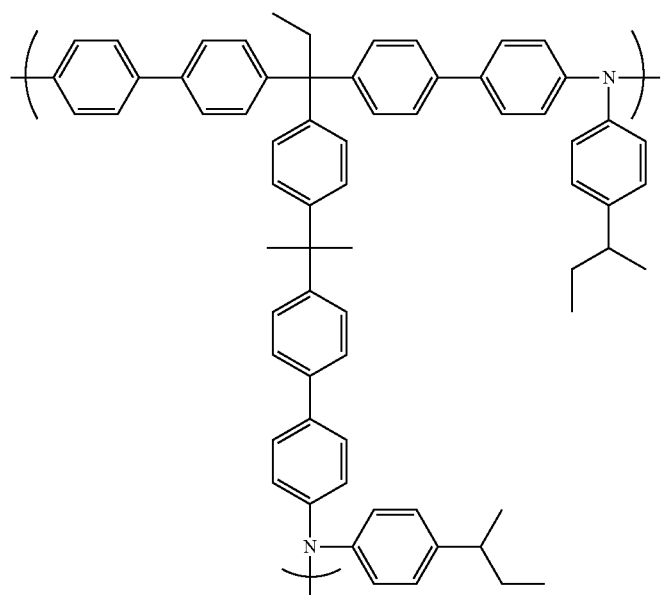

-continued
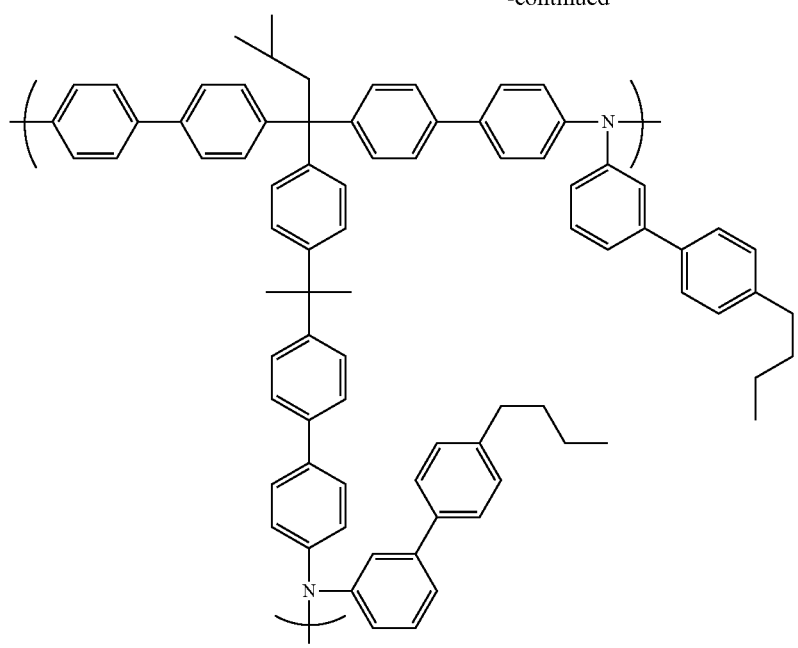
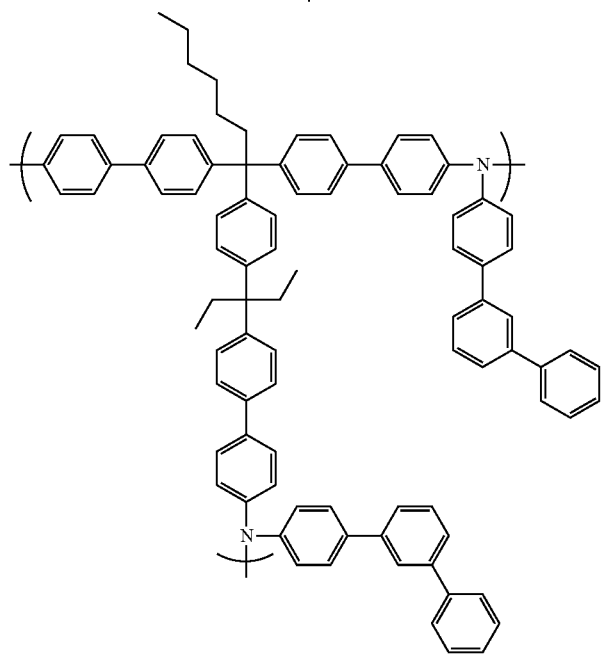
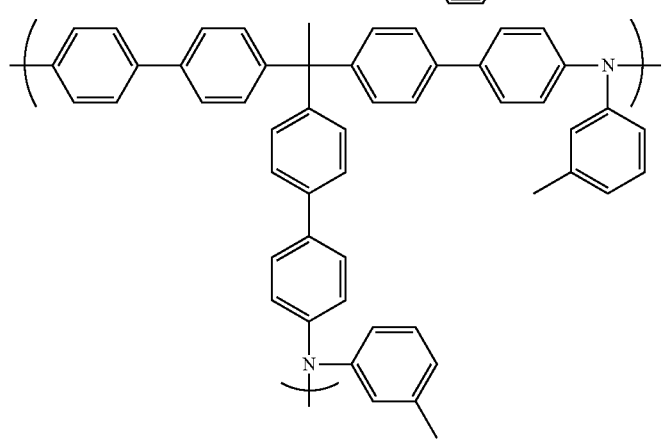

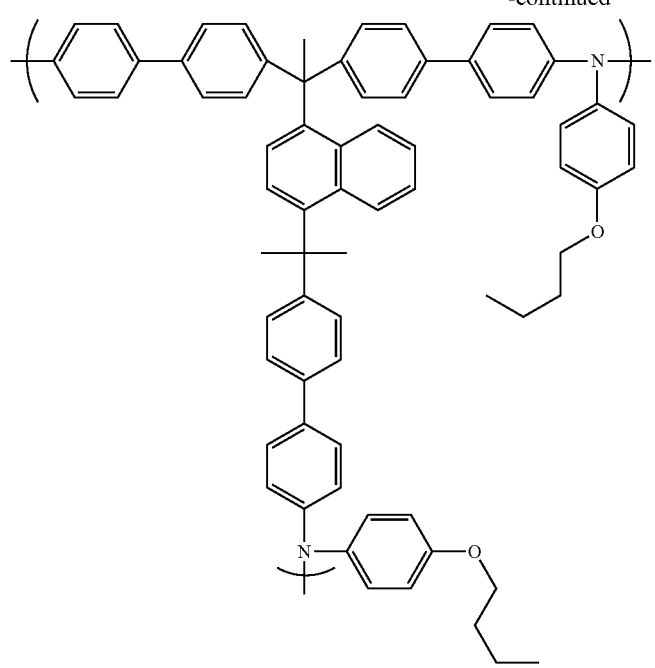
[Chem. 7]
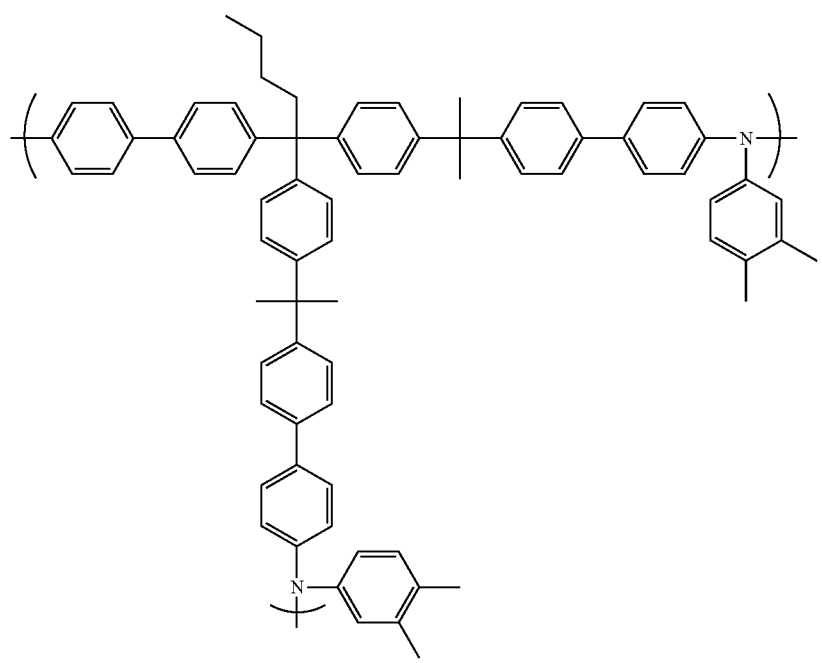

-continued
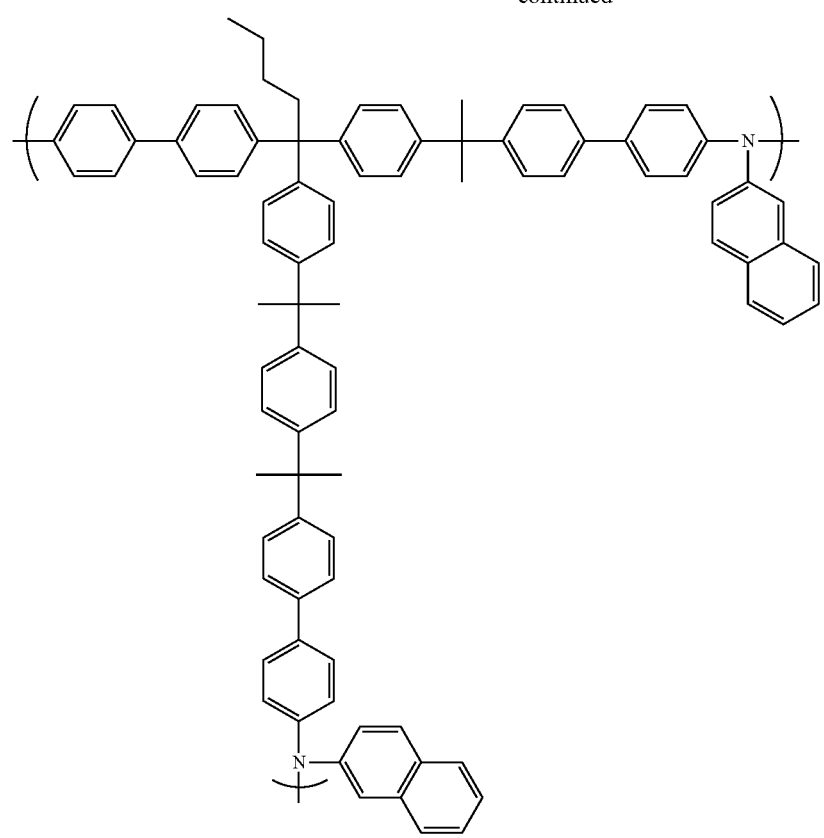
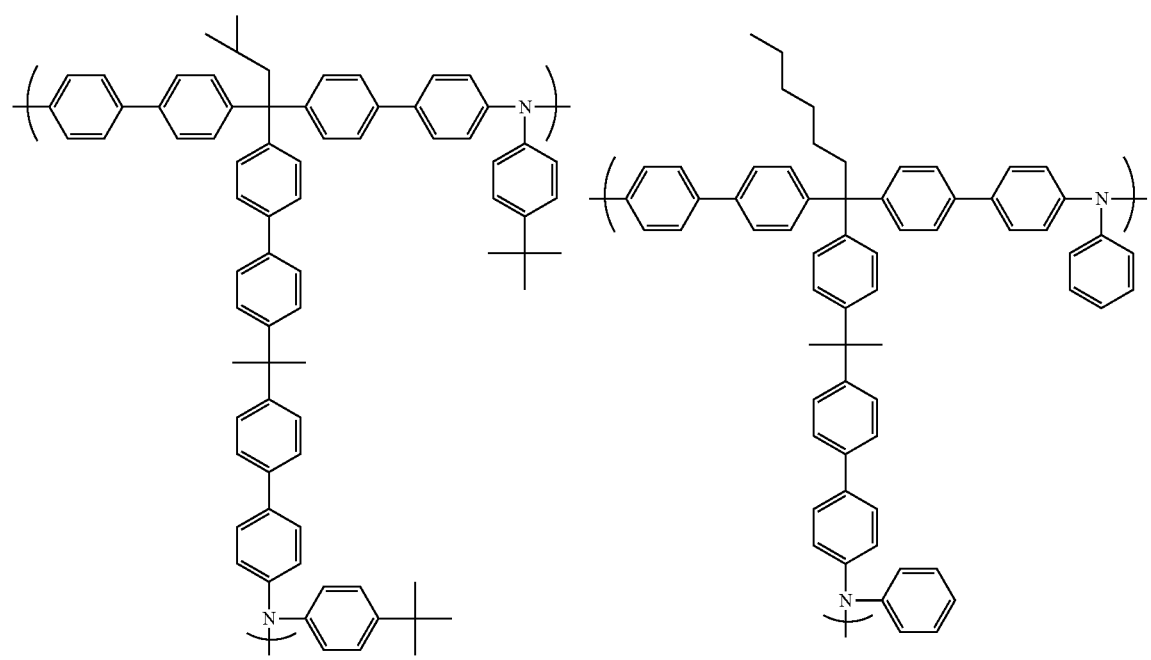

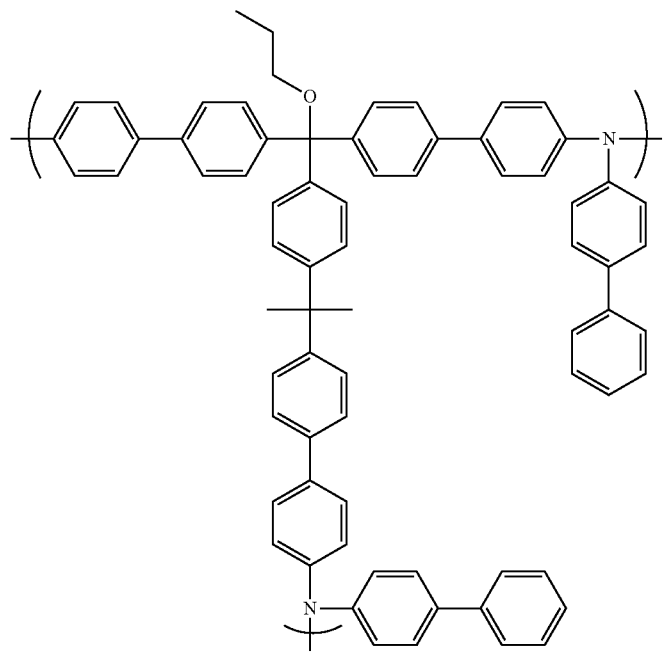
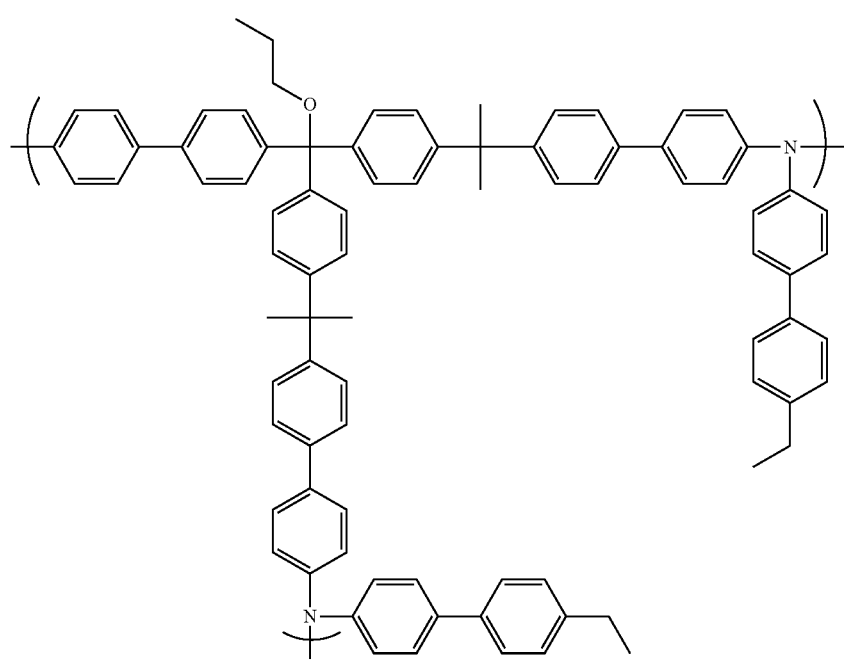

[Chem. 8]
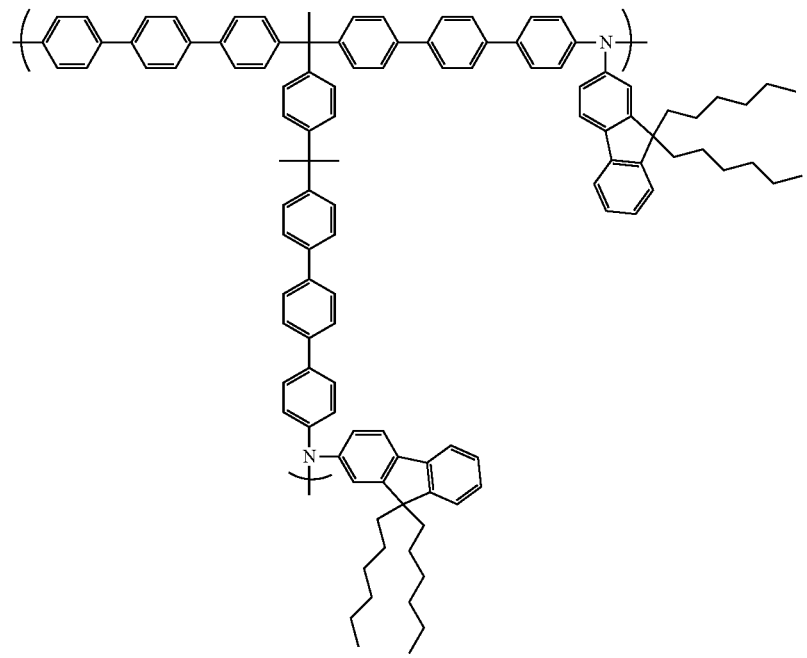
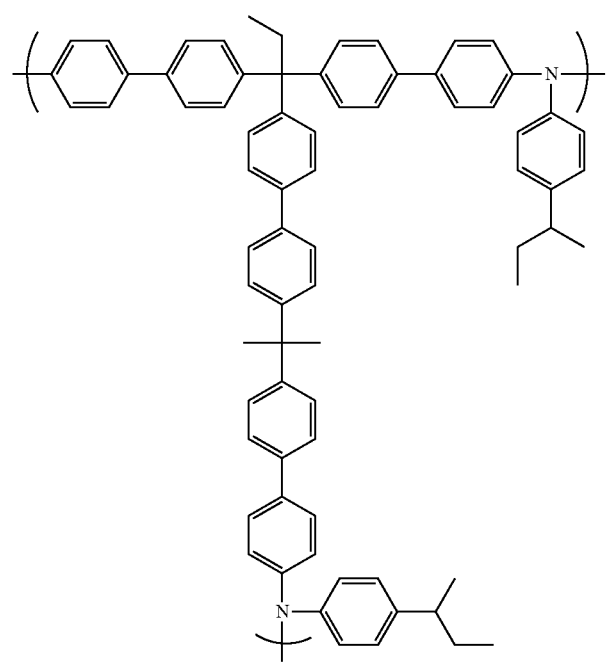

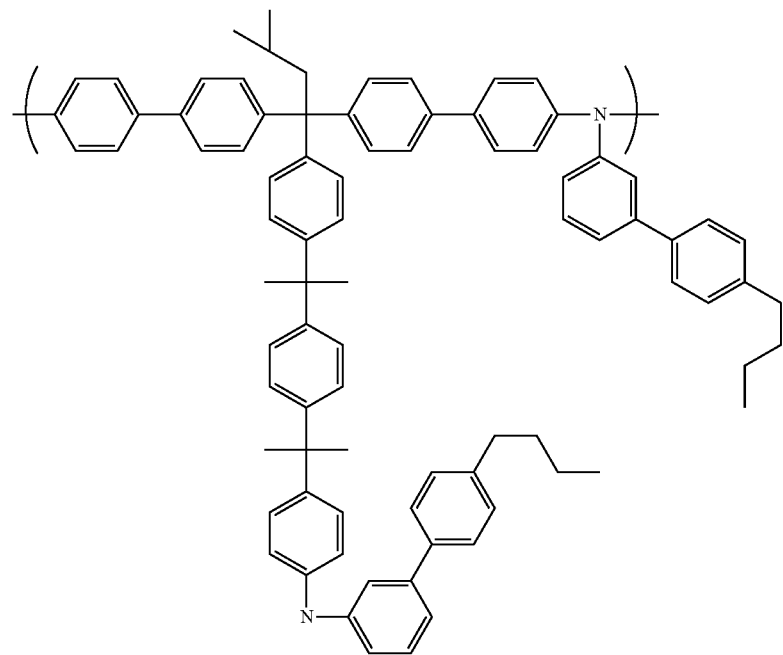
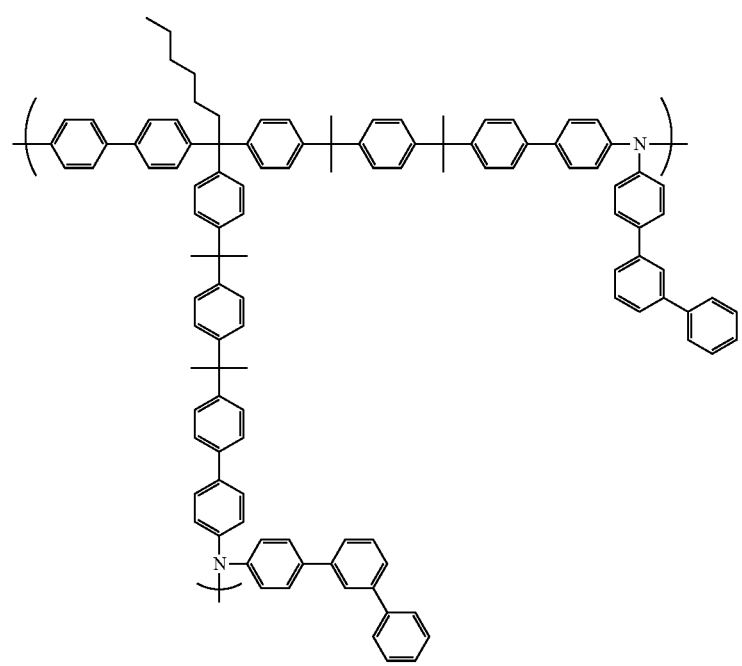

[Chem. 9]
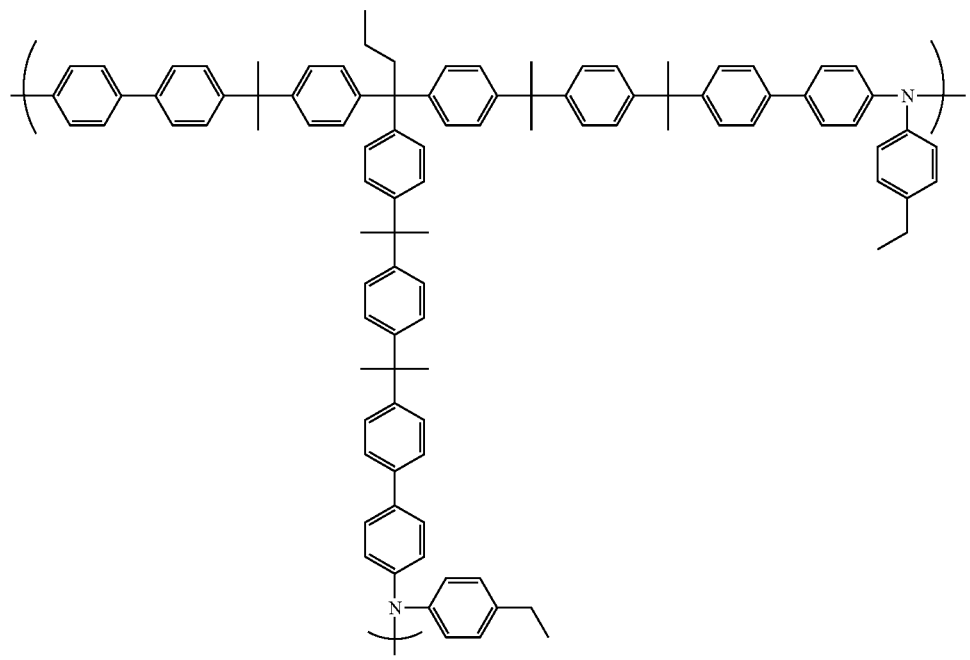
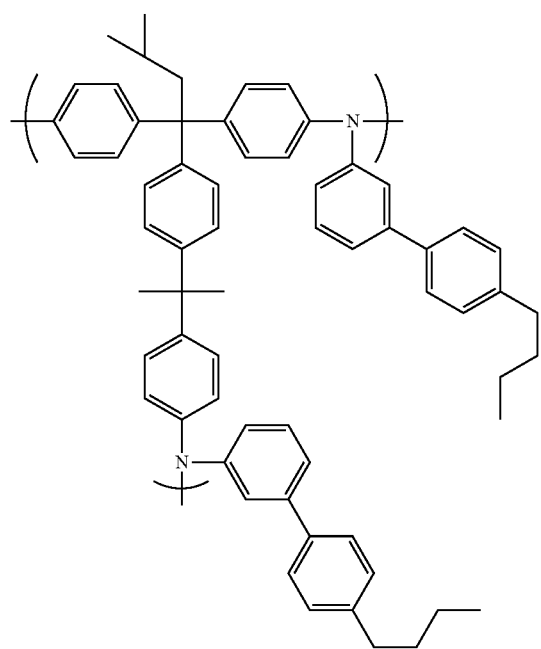

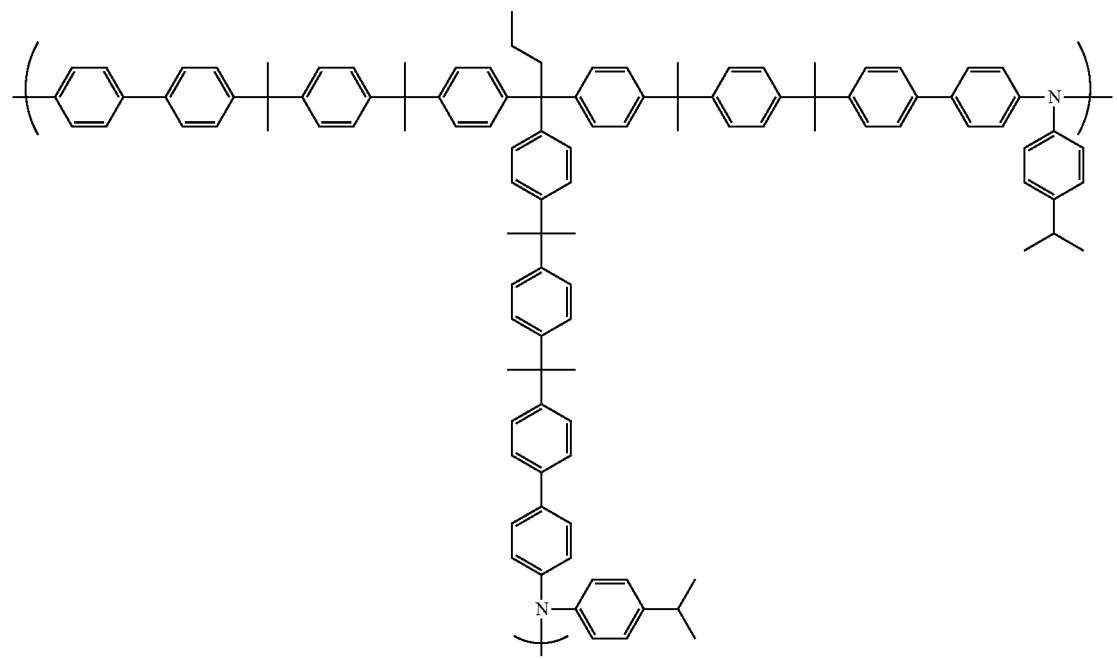
[Chem. 10]
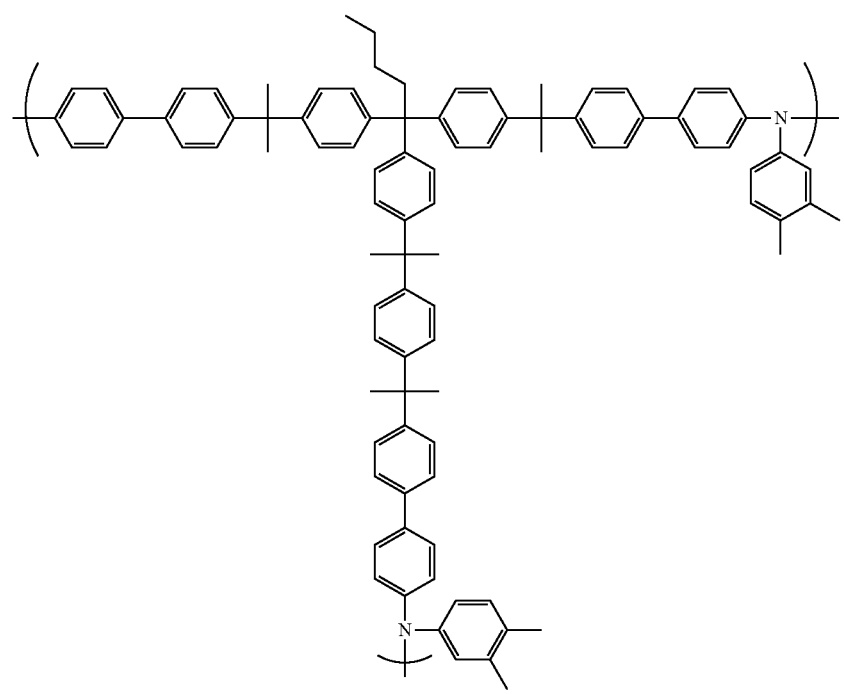

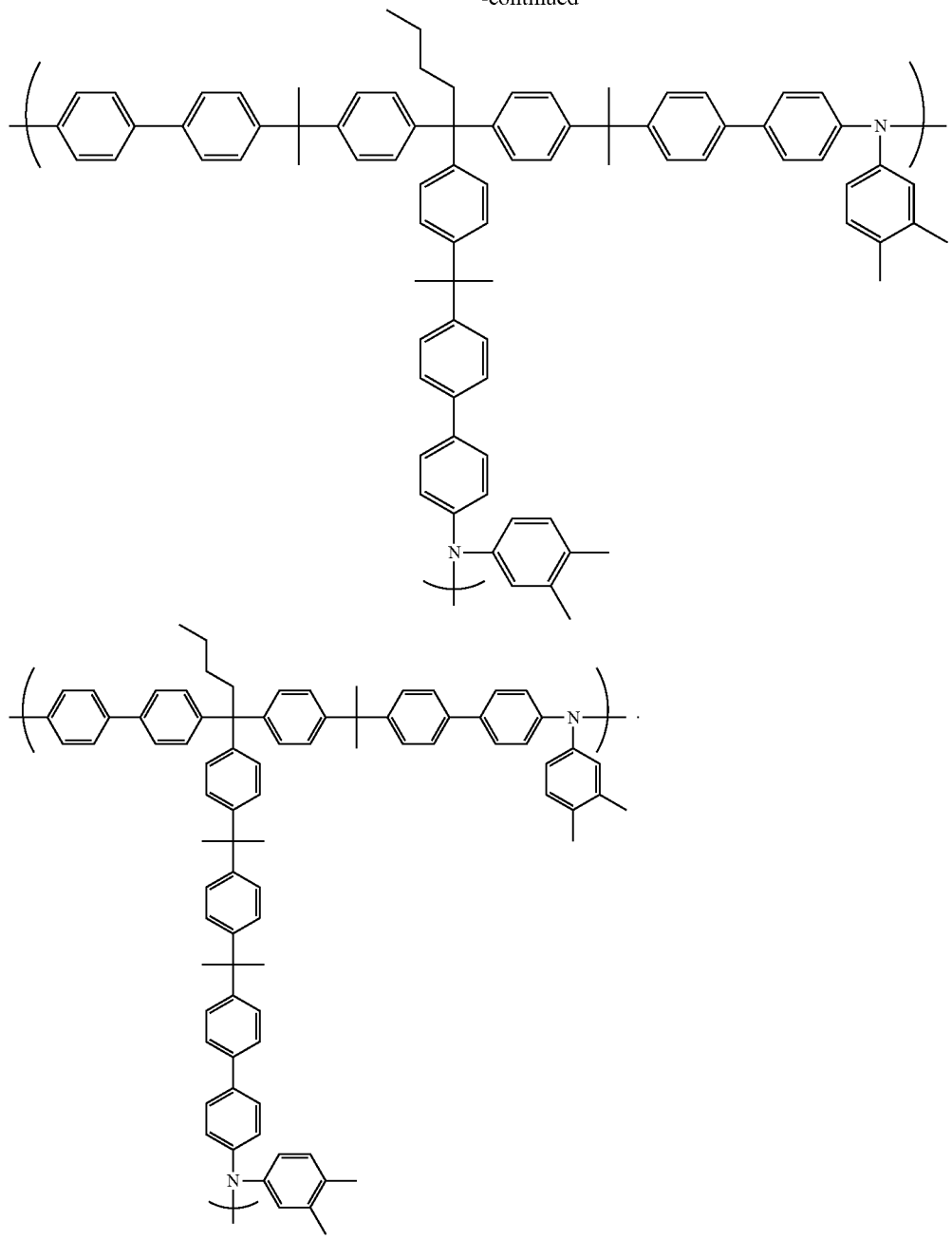

{Crosslinking Group}

The polymer of the present invention contains a repeating unit having a crosslinking group, and therefore provides a great difference in solubility in organic solvent before and after the reaction that occurs through exposure to heat and/or active energy rays (insolubilization reaction).

The crosslinking group means a group that reacts with a group constituting any other molecule as positioned around the crosslinking group, through exposure to heat and/or active energy rays, thereby forming a new chemical bond. In this case, the group with which the crosslinking group reacts may be the same group as or a different group from the crosslinking group.

The crosslinking group includes a group capable of crosslinking through cationic polymerization, a group capable of crosslinking through radical polymerization, a group capable of capable of undergoing cycloaddition, etc. More concretely, there are mentioned the following crosslinking groups T that enable easy crosslinking.

<Crosslinking Groups T>

[Chem. 11]

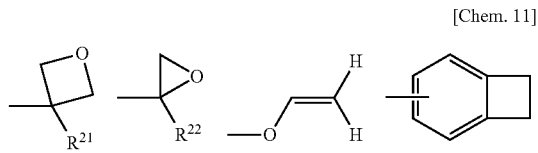

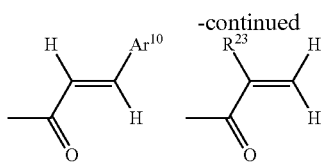

(In the formulae, $R^{21}$ to $R^{23}$ each independently represent a hydrogen atom or an alkyl group. $Ar^{10}$ represents an aromatic hydrocarbon-cyclic group optionally having a substituent, or an aromatic heterocyclic group optionally having a substituent.)

Here, the alkyl group of $R^{21}$ to $R^{23}$ is preferably a straight-chain or branched-chain alkyl group generally having a carbon number of 6 or less, for example, a methyl group, an ethyl group, an n-propyl group, a 2-propyl group, an n-butyl group, an isobutyl group, etc. Especially preferred is a methyl group or an ethyl group. When the carbon number of $R^{21}$ to $R^{23}$ is too large, then the crosslinking reaction would be sterically hindered and film insolubilization would be difficult.

The aromatic hydrocarbon-cyclic group optionally having a substituent of $Ar^{10}$ includes, for example, 6-membered monocyclic rings or 2 to 5-condensed rings thereof such as a benzene ring, a naphthalene ring and the like having one free atomic valence. Especially preferred is a benzene ring having one free atomic valence. $Ar^{10}$ may also be a group formed by bonding two or more such aromatic hydrocarbon-cyclic groups optionally having a substituent. The group of the type includes a biphenylene group, a terphenylene group, etc. Preferred is a 4,4'-biphenylene group.

Of the crosslinking groups T mentioned below, preferred are those capable of crosslinking through cationic polymerization, such as an epoxy group, an oxetane group or the like cyclic ether group, a vinyl ether group, etc., since they have high reactivity and facilitate insolubilization by crosslinking. Above all, especially preferred is an oxetane group as capable of readily controlling the rate of cationic polymerization. Also preferred is a vinyl ether group, from the viewpoint that a hydroxyl group that may deteriorate elements during cationic polymerization is hardly formed.

In addition, also preferred is a group capable of undergoing cycloaddition reaction, for example an arylvinylcarbonyl group such as cinnamoyl group or the like, as well as a benzocyclobutene ring having one free atomic valence, etc., from the viewpoint of the ability to further enhance the electrochemical stability of elements.

Of those crosslinking groups, especially preferred is a benzocyclobutene ring having one free atomic valence, from the viewpoint that the crosslinked structure is especially stable.

As the crosslinking group, concretely, preferred is a benzocyclobutene ring having one free atomic valence represented by the following formula (III). The benzocyclobutene ring represented by the formula (III) is unsubstituted, however, other benzocyclobutene rings having a substituent are also preferred here. On the ring, the substituents may bond to each other to form a ring.

[Chem. 12]

(III)

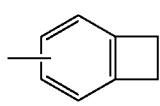

In the polymer of the present invention, the crosslinking group may bond directly to the aromatic hydrocarbon-cyclic group and/or the aromatic heterocyclic group, or may bond directly to any other group than the aromatic hydrocarbon-cyclic group and/or the aromatic heterocyclic group, or may bond to these groups via any divalent group therebetween. The divalent group is preferably a group formed by linking from 1 to 30 groups selected from a group —O—, a group —C(=O)— and a group —CH$_2$— (optionally having a substituent), in any desired order. As preferred examples of the crosslinking group bonding to each other via such a divalent group, there are mentioned those listed in the following <Crosslinking Group-Containing Groups G3>; however, the present invention is not restricted to these.

<Crosslinking Group-Containing Groups G3>

[Chem. 13]

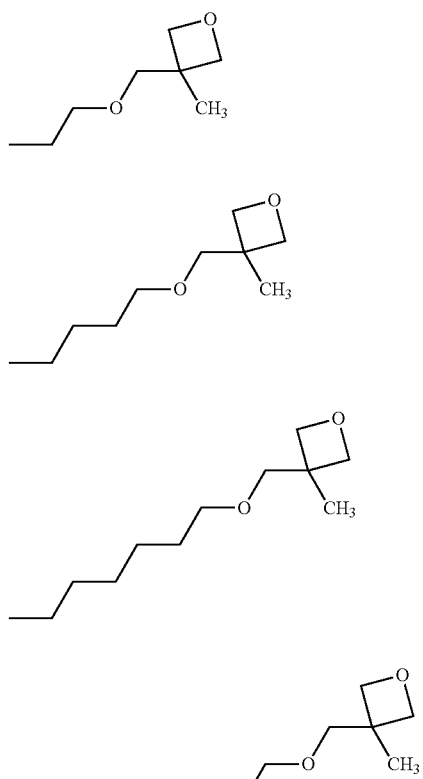

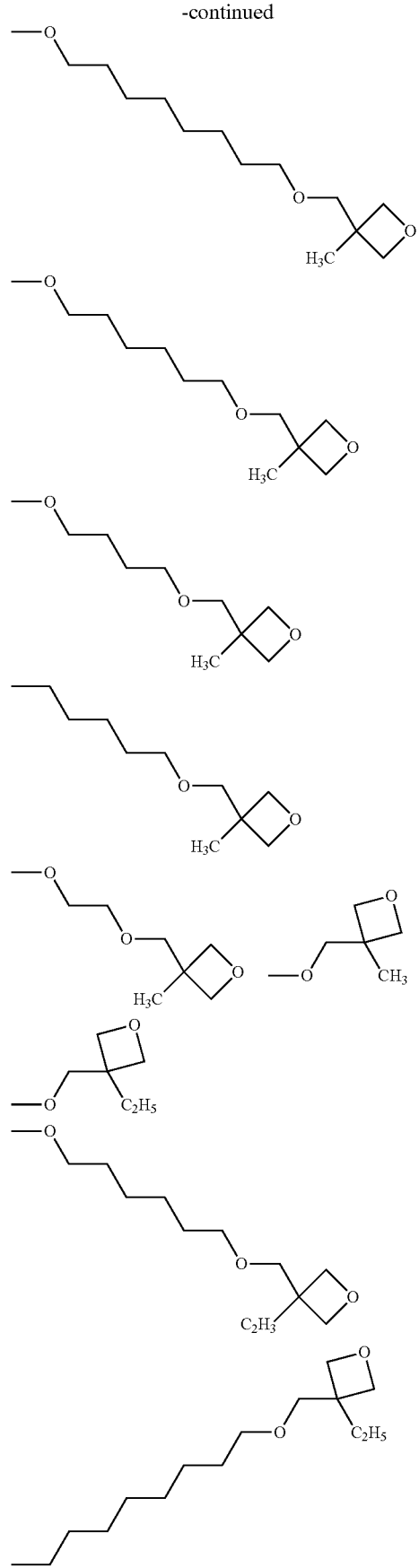
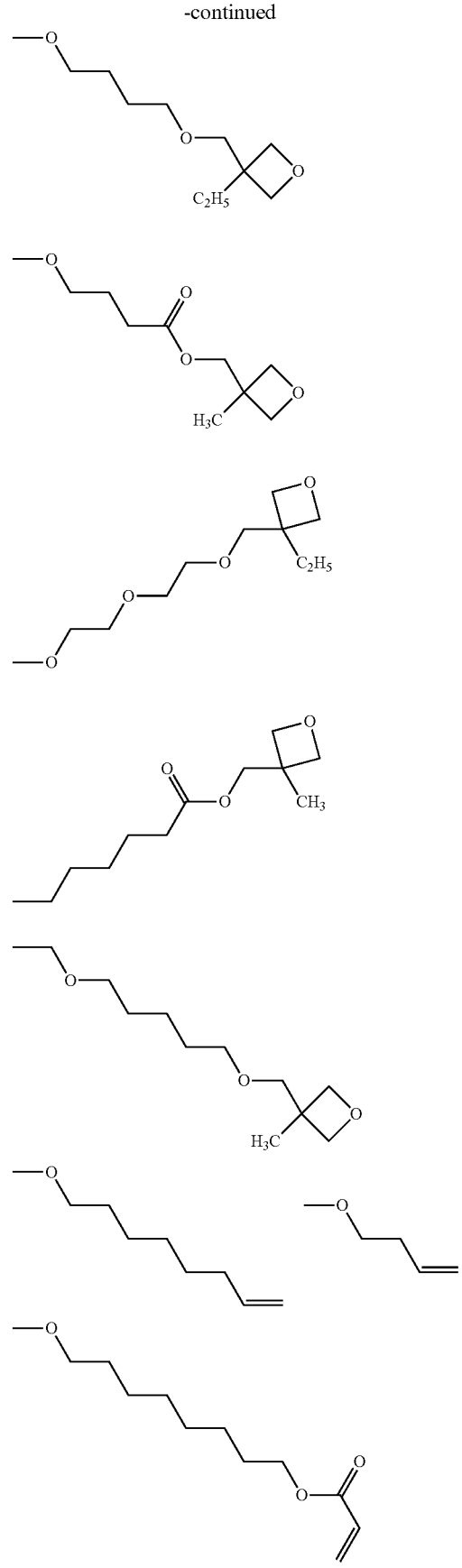

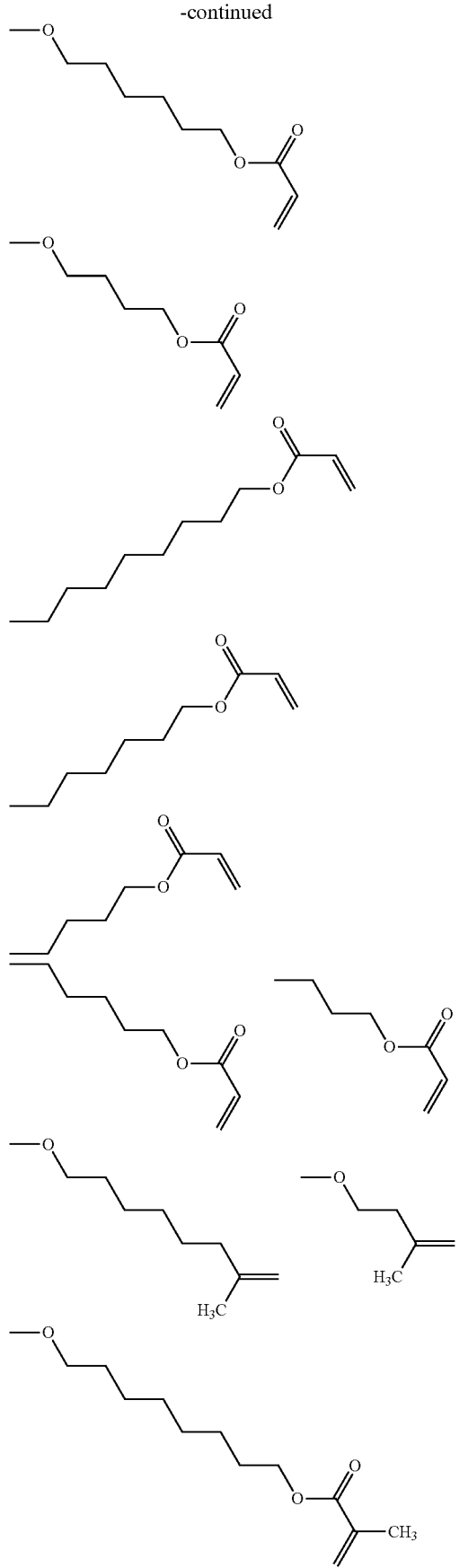
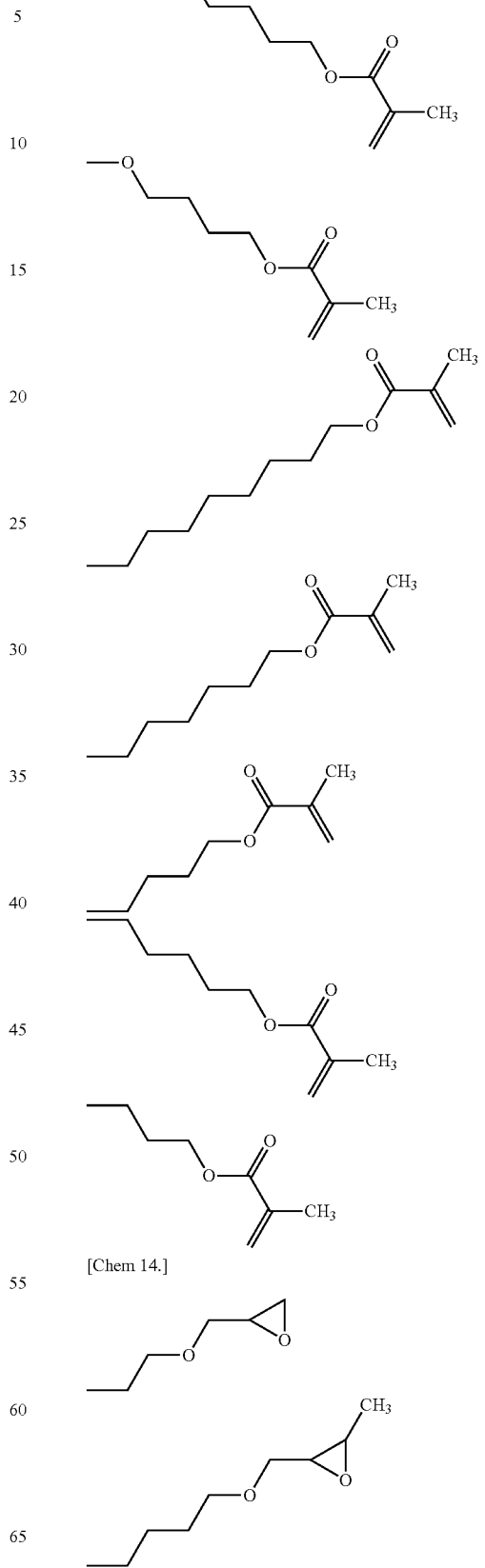
[Chem 14.]

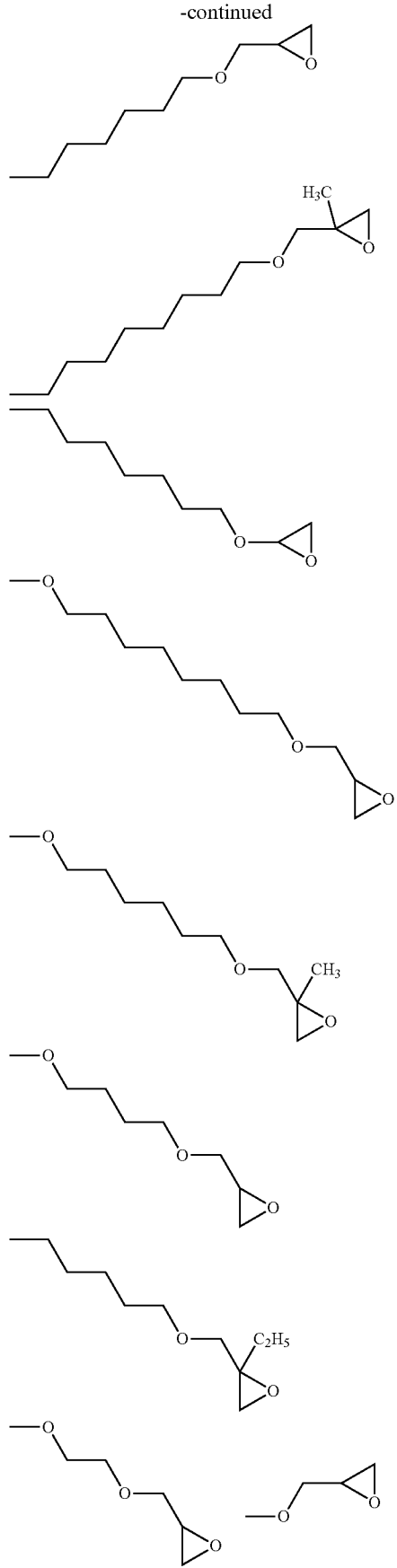
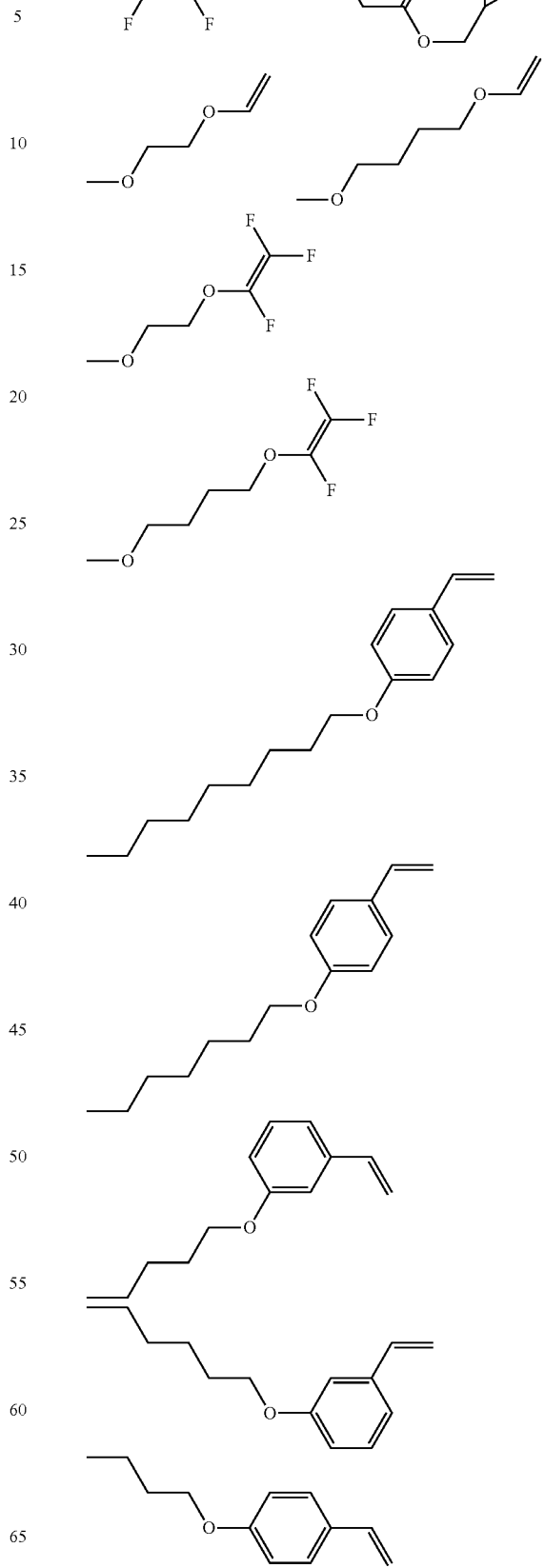

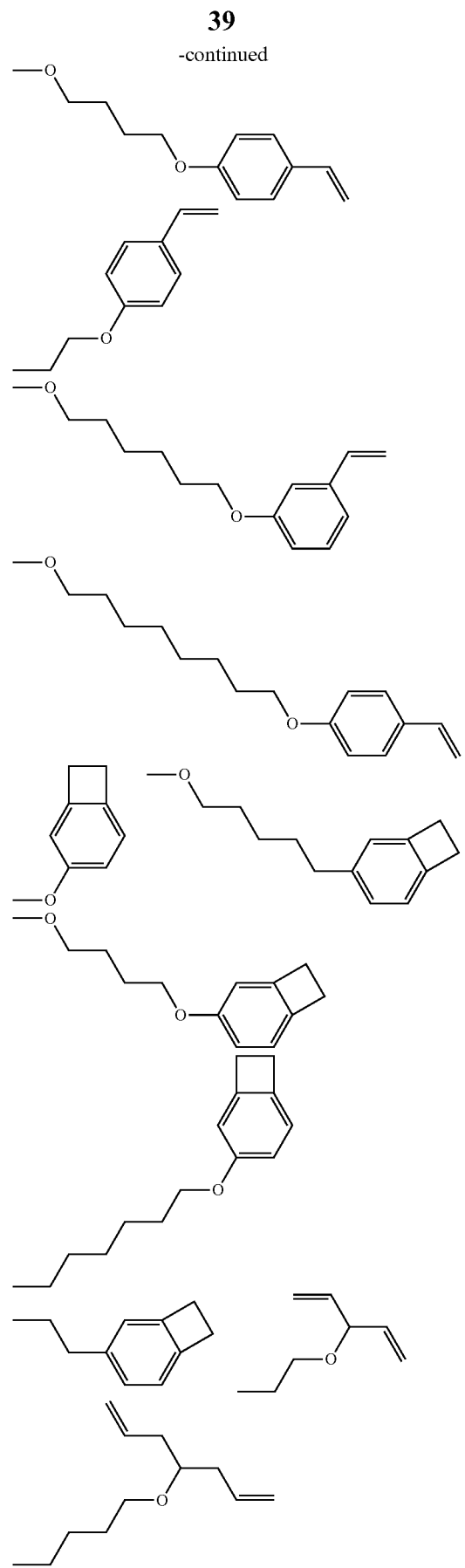
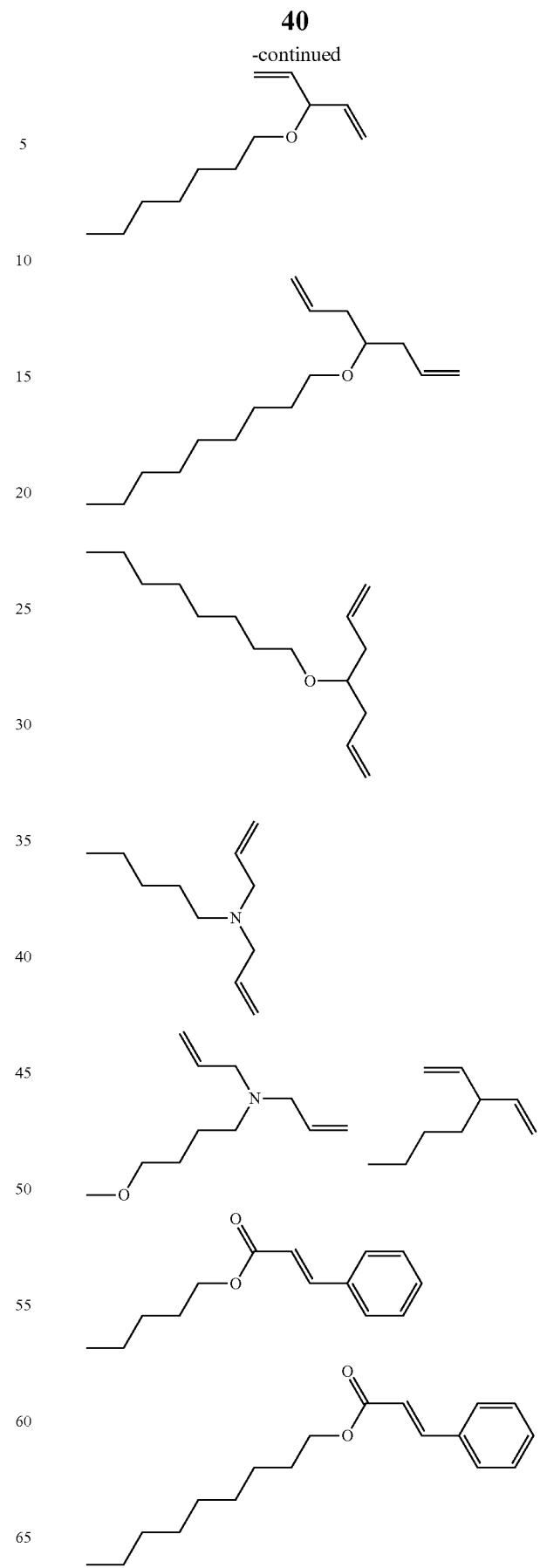

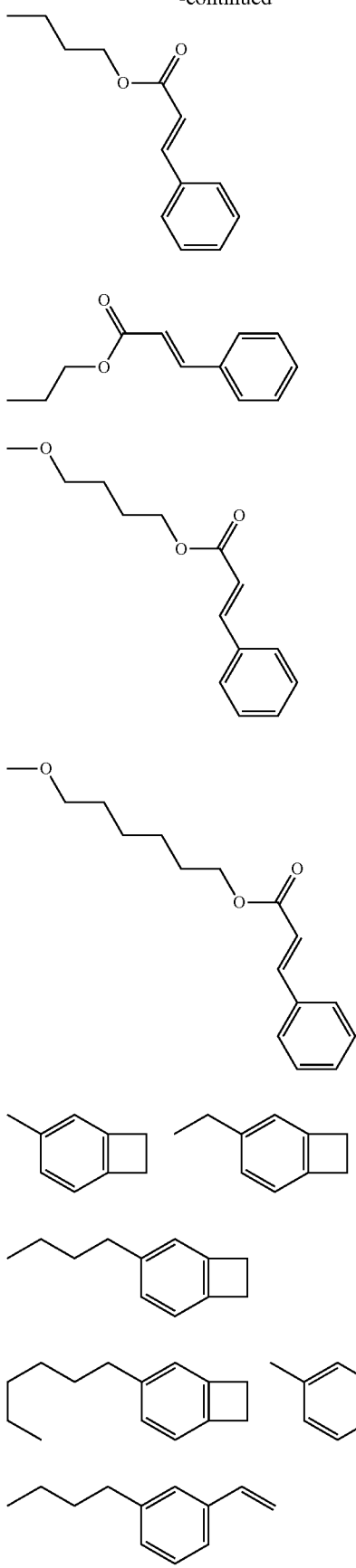

In the polymer of the present invention, the position of the crosslinking group is not specifically defined so far as it does not detract from the advantageous effects of the present invention. From the viewpoint of easy crosslinkability, it is especially desirable that the crosslinking group exists as a substituent on the aromatic ring in $Ar^2$ in the above-mentioned formula (1).

In the formula (1), as mentioned above, two or more $Ar^2$'s contained in the partial structure (1) may be the same or different. Accordingly, one repeating unit having the partial structure represented by the formula (1) may have $Ar^2$ having a crosslinking group as the substituent therein and $Ar^2$ not having a crosslinking group therein.

The number of the crosslinking groups that the polymer of the present invention has is preferably larger, from the viewpoint that the polymer is insolubilized through crosslinking, and in addition, any other layer may be readily formed on the layer of the polymer, according to a wet film formation method. On the other hand, however, from the viewpoint that the formed layer is hardly cracked, that an unreacted crosslinking group hardly remains and that the life of the organic electroluminescent element (organic EL element) having the polymer layer tends to be prolonged, it is desirable that the number of the crosslinking group in the polymer is smaller.

The number of the crosslinking groups existing in one polymer chain in the polymer of the present invention is preferably 1 or more on average, more preferably 2 or more on average, and is preferably 200 or less, more preferably 100 or less.

The number of the crosslinking groups that the polymer of the present invention has may be expressed as the number thereof per a molecular weight 1000 of the polymer.

When the number of the crosslinking groups that the polymer of the present invention has is expressed as the number thereof per a molecular weight 1000 of the polymer, the number is generally 3.0 or less, preferably 2.0 or less, more preferably 1.0 or less and is generally 0.01 or more, preferably 0.05 or more, per a molecular weight 1000 of the polymer.

When the number of the crosslinking groups falls within the above range, then cracking hardly occurs and a flat film is easy to form. In addition, the crosslinking density is suitable, and therefore the number of the unreacted crosslinking groups that may remain in the layer after crosslinking reaction is small, and has few influences on the life of the elements to be obtained.

Further, the insolubility of the crosslinked polymer in organic solvent is sufficient, and therefore a multilayer lamination structure is easy to form according to a wet film formation method.

Here, the number of the crosslinking groups per a molecular weight 1000 of the polymer can be calculated from the molar ratio of the monomers fed in the reactor in synthesis and the structural formula of the polymer, excepting the terminal group from the polymer.

For example, a case of the product polymer 1 synthesized in Synthesis Example 1 given below is described. In the product polymer 1, the molecular weight of the repeating unit except the terminal group is 731.8805 on average, and the number of the crosslinking groups is 0.0639 on average per one repeating unit. Through calculation in simple proportion, the number of the crosslinking groups per a molecular weight 1000 is calculated as 0.087.

{Partial Structure (2)}

Preferably, the polymer of the present invention contains a partial structure represented by the following formula (2) (hereinafter this may be referred to as a partial structure (2)) along with the above-mentioned partial structure (1) therein. Specifically, the polymer of the present invention preferably contains a repeating unit having the partial structure (1), a repeating unit having the partial structure (2) and a repeating unit having a crosslinking group, in which the repeating unit having a crosslinking group is preferably a repeating unit having the partial structure (1) having a crosslinking group.

[Chem. 15]

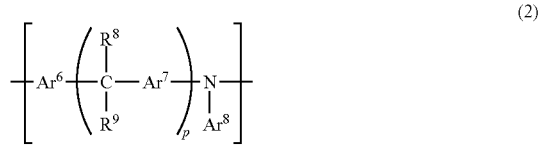

(2)

(In the formula (2), $Ar^6$ and $Ar^7$ each independently represent a divalent aromatic hydrocarbon-cyclic group optionally having a substituent, or a divalent aromatic heterocyclic group optionally having a substituent, $Ar^8$ represents an aromatic hydrocarbon-cyclic group optionally having a substituent, or an aromatic heterocyclic group optionally having a substituent.

$R^8$ and $R^9$ each independently represent a hydrogen atom, an alkyl group optionally having a substituent, an alkoxy group optionally having a substituent, an aromatic hydrocarbon-cyclic group optionally having a substituent, or an aromatic heterocyclic group optionally having a substituent.

$R^8$ and $R^9$ may bond to each other to form a ring.

p indicates an integer of from 0 to 2.

Multiple substituents of at least one of $R^8$, $R^9$ and $Ar^7$ in the formula (2) may be the same or different.)

<Structural Characteristics>

The formula (2) has a methylene group. Thus containing a non-rigid methylene group in the main chain thereof, the polymer that has been crosslinked to be insoluble in organic solvent can still maintain high charge transporting ability and oxidation reduction stability. In addition, the main chain contains the methylene group having the ability to prevent the n-conjugated system from expanding, the polymer that has been crosslinked to be insoluble in organic solvent can still maintain a high singlet excitation level and a triplet excitation level. Consequently, when the polymer of the invention having the partial structure (2) is crosslinked to form a layer of a network polymer, the layer can still accept a current flow therethrough even at a low voltage and the excitons are therefore hardly deactivated.

In addition, the formula (2) has a methylene group existing therein and the n-conjugation therein is not expanded, and therefore, holes transfer through the polymer chains while hopping therethrough. In the case where holes transfer by hopping, when the polymer has a branched structure of the soft partial structure (1), then interaction of the polymer chains with each other readily occurs inside the molecules and between the molecules, and the hole mobility further increases more favorably.

<Regarding $Ar^6$ to $Ar^8$>

The divalent aromatic hydrocarbon-cyclic group optionally having a substituent and the divalent aromatic heterocyclic group optionally having a substituent to constitute $Ar^6$ and $Ar^7$ are the same as the divalent aromatic hydrocarbon-cyclic group optionally having a substituent and the divalent aromatic heterocyclic group optionally having a substituent to constitute $Ar^1$, $Ar^3$ to $Ar^5$ in the above-mentioned partial structure (1), and the specific examples and the preferred embodiments thereof are the same as those of the latter.

The aromatic hydrocarbon-cyclic group optionally having a substituent and the aromatic heterocyclic group optionally having a substituent to constitute $Ar^8$ are the same as the aromatic hydrocarbon-cyclic group optionally having a substituent and the aromatic heterocyclic group optionally having a substituent to constitute $Ar^2$ in the above-mentioned partial structure (1), and the specific examples and the preferred embodiments thereof are the same as those of the latter.

<Regarding $R^8$ and $R^9$>

The alkyl group optionally having a substituent, the alkoxy group optionally having a substituent, the aromatic hydrocarbon-cyclic group optionally having a substituent and the aromatic heterocyclic group optionally having a substituent to constitute $R^8$ and $R^9$ are the same as the alkyl group optionally having a substituent, the alkoxy group optionally having a substituent, the aromatic hydrocarbon-cyclic group optionally having a substituent and the aromatic heterocyclic group optionally having a substituent for $R^2$ to $R^7$ in the above-mentioned structural formula (1), and the specific examples and the preferred embodiments thereof are the same as those of the latter.

$R^8$ and $R^9$ may bond to each other to form a ring. In the case, from the viewpoint of the solubility and the heat resistance of the polymer, the two preferably form a cyclopentane ring, a cyclohexane ring, a cycloheptane ring, a fluorene ring, or an indene ring.

<Regarding p> p represents the repeating number of the structure represented in the parenthesis to constitute the repeating unit having the partial structure represented by the formula (2), and indicates an integer of from 0 to 2.

When p is too large, then the charge transferability of the polymer may lower, and therefore p is preferably 0 or 1.

In case where the formula (2) has multiple $Ar^7$, $R^8$ and $R^9$, they may be the same or different.

<Regarding Formula Weight of Partial Structure (2)>

Preferably, the formula weight of the partial structure (2) is generally 300 or more and is generally 3000 or less, more preferably 2000 or less. When the formula weight of the partial structure (2) is too large, then the solubility of the polymer in solvent before crosslinking may lower. However, for introducing the necessary structure into the formula (2), the formula weight of the partial structure (2) is generally a value of 300 or more that is the lower limit mentioned above.

<Examples of Partial Structure (2)>

Specific examples of the partial structure (2) are shown below. However, the partial structure (2) in the present invention is not limited at all to those mentioned below.

The polymer of the present invention may have a repeating unit having one type of the partial structure (2) or may have a repeating unit having two or more different types of the partial structure (2).

[Chem. 16]
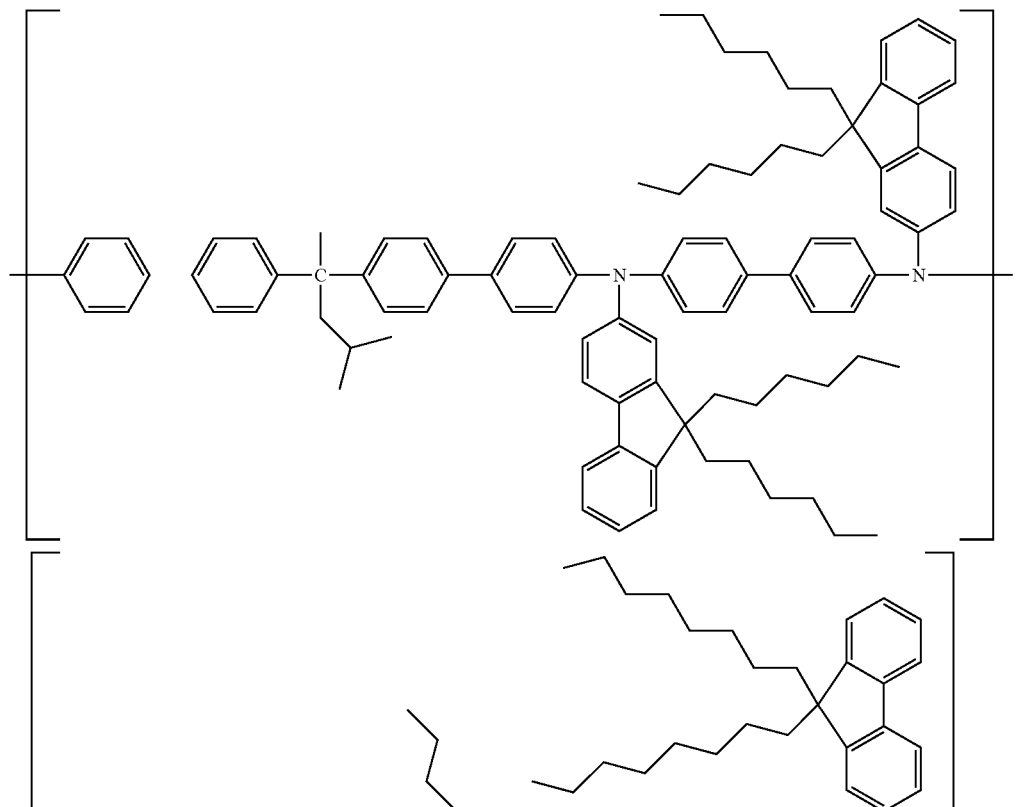
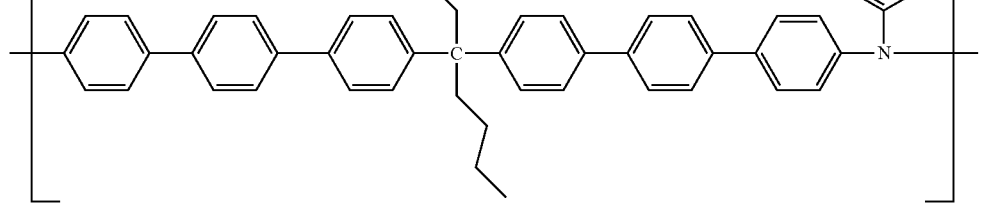
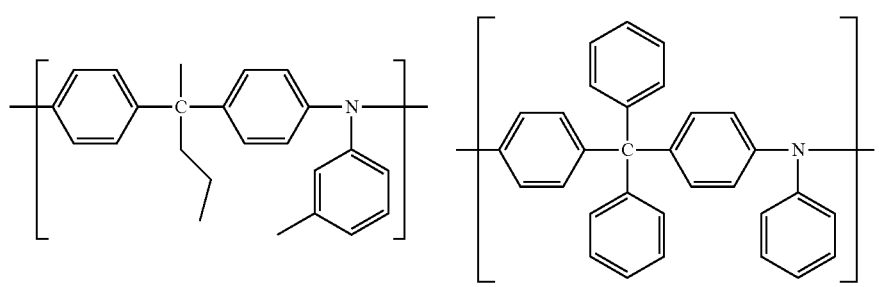
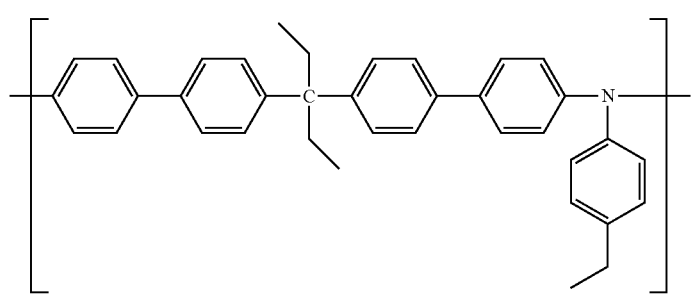

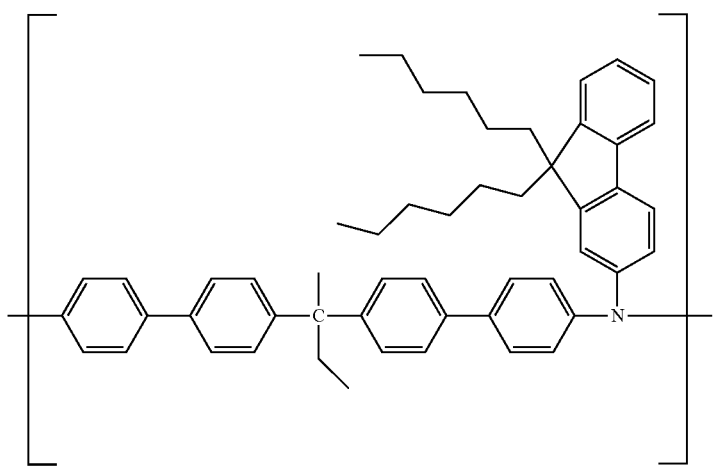
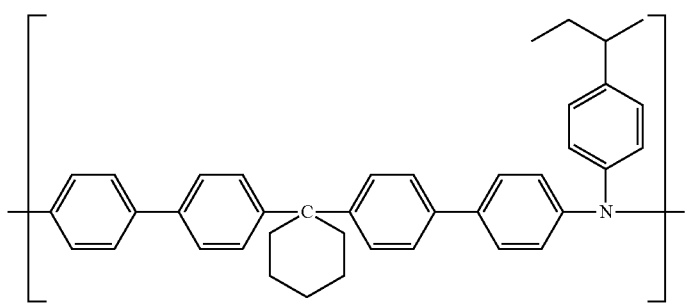
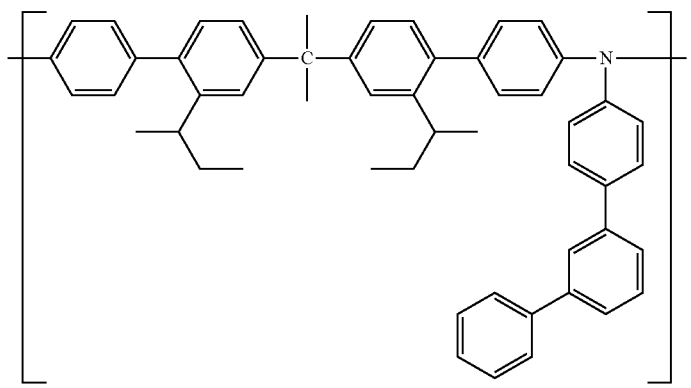
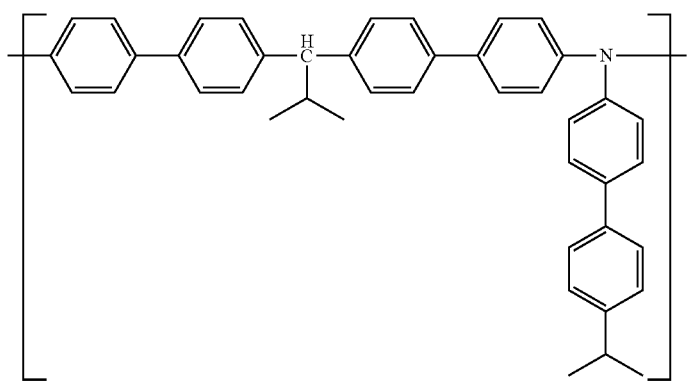

-continued
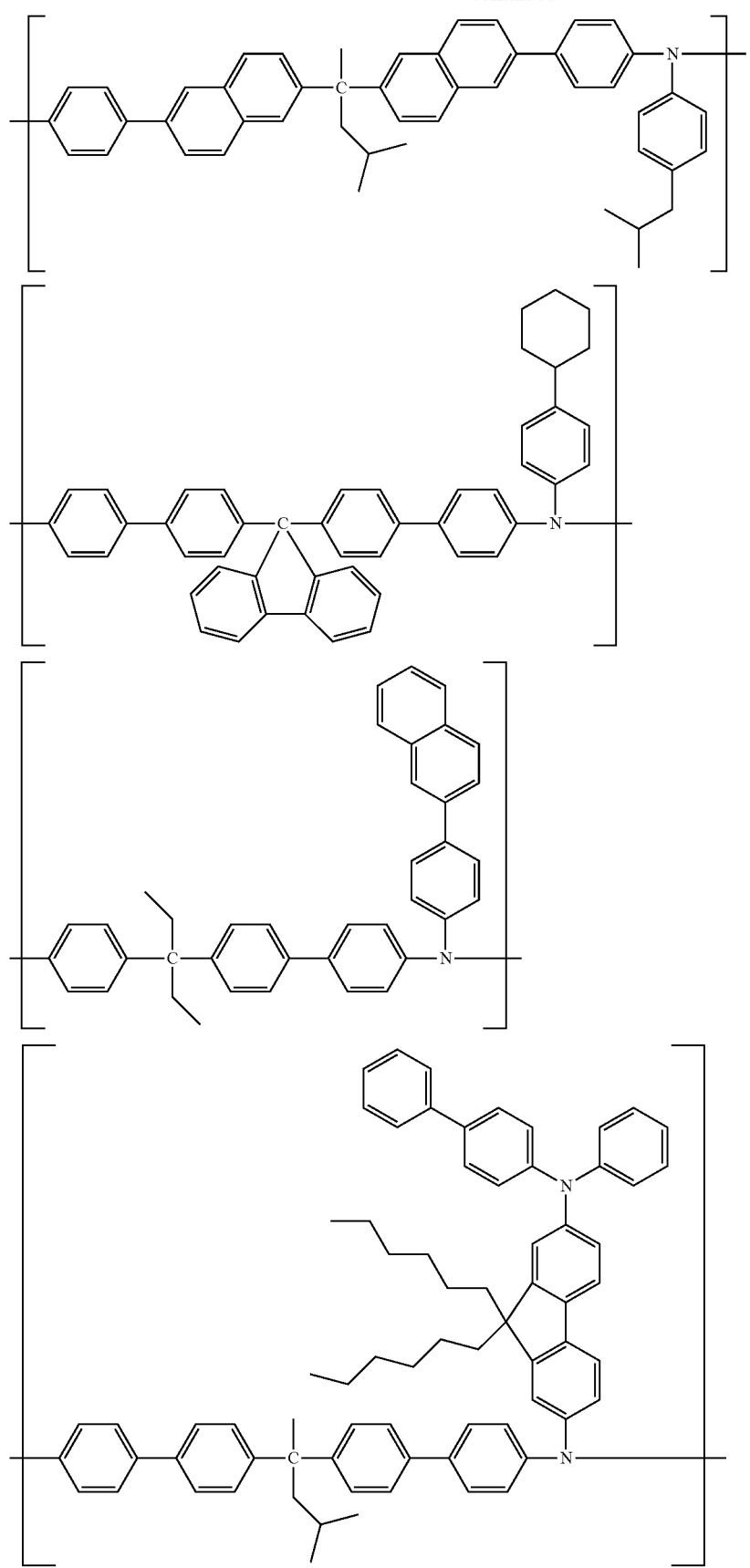

-continued
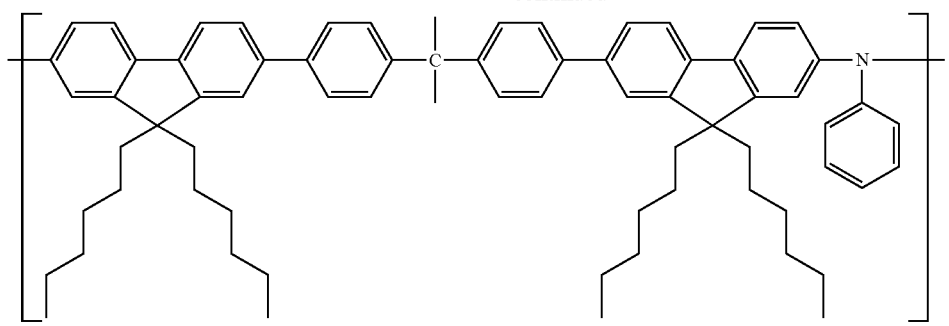
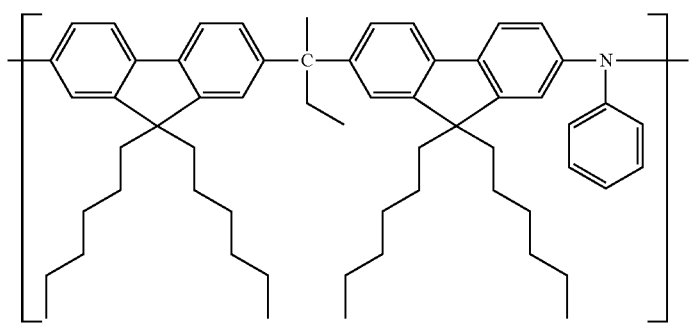
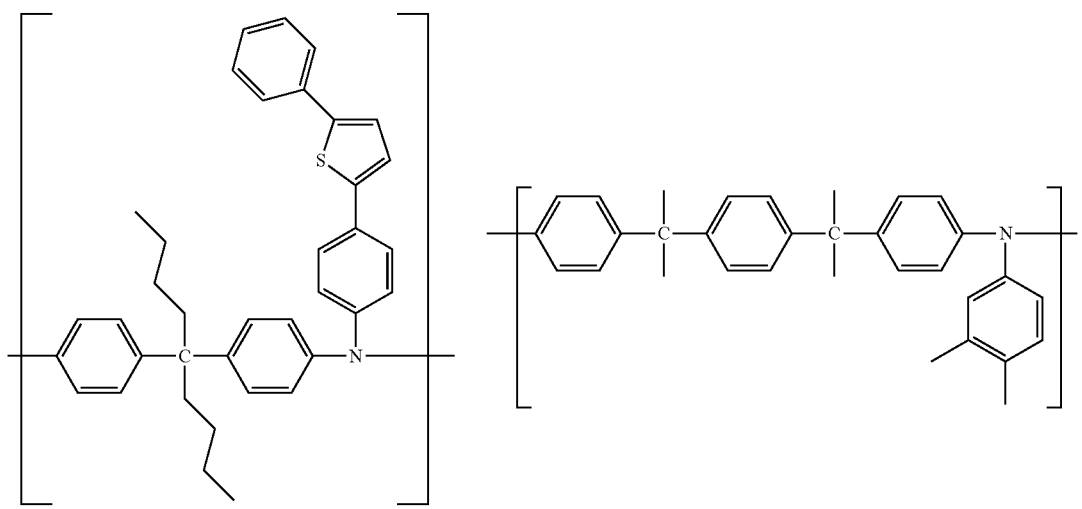
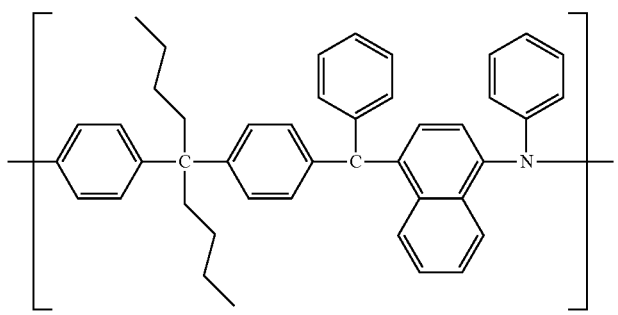
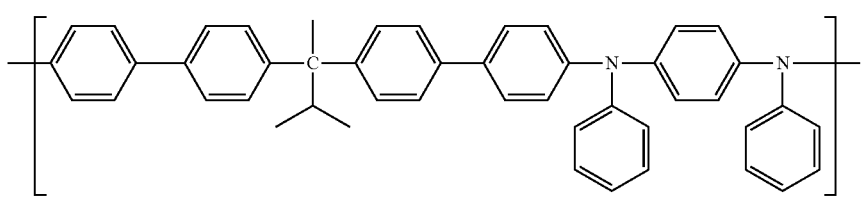

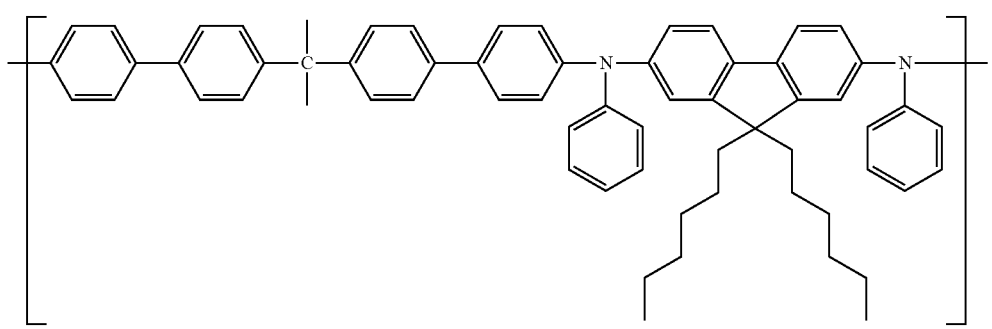
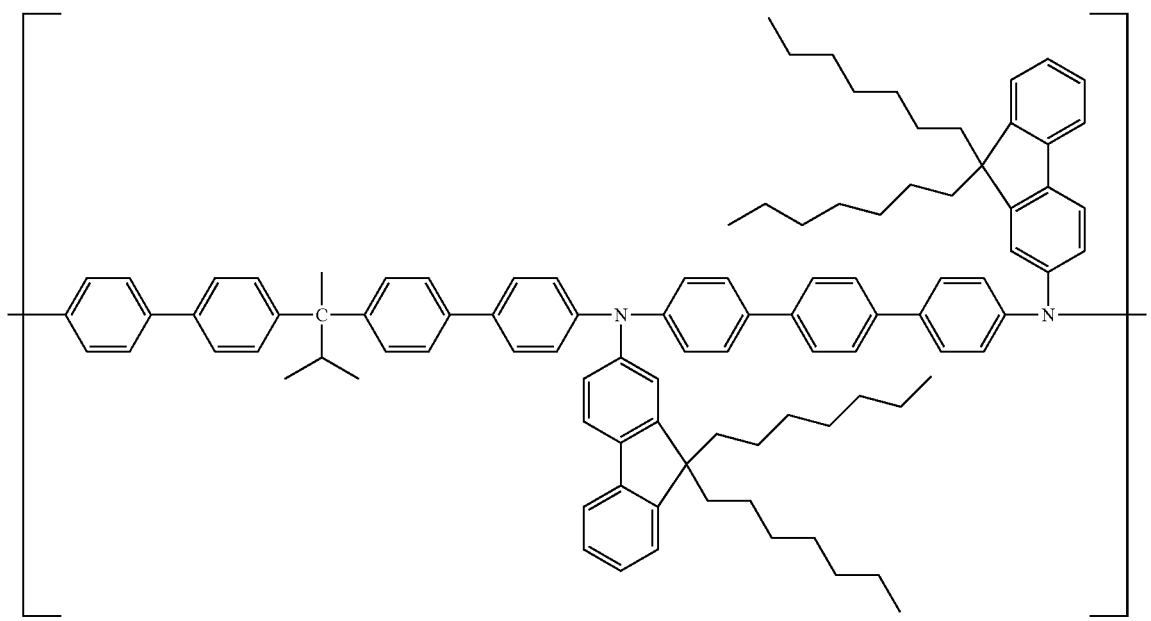
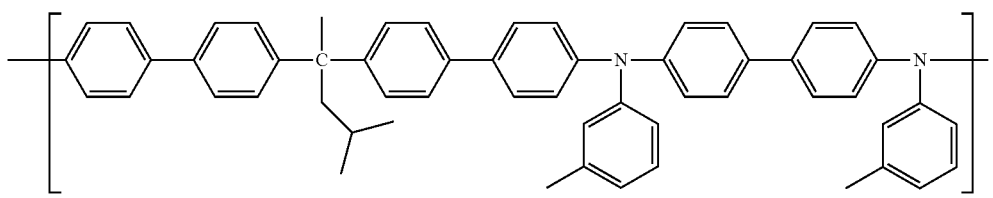
[Chem. 17]
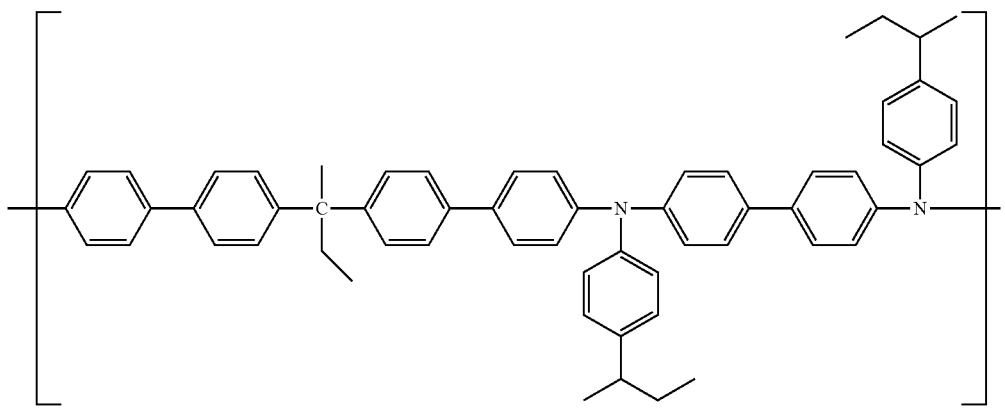

-continued
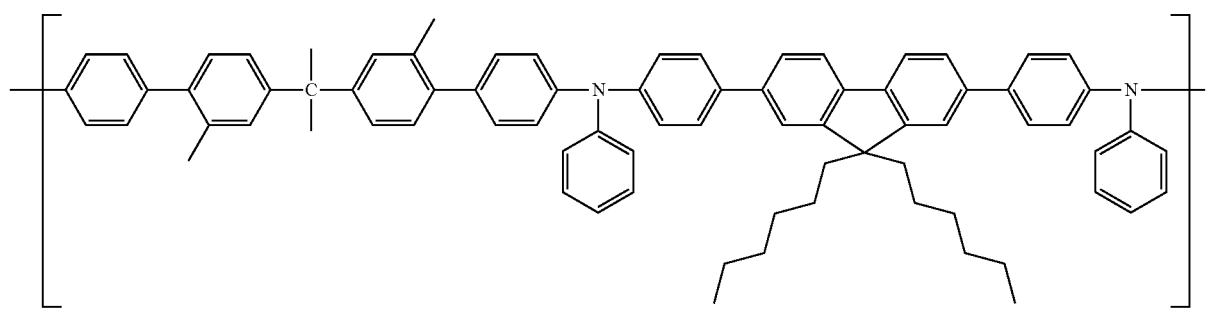
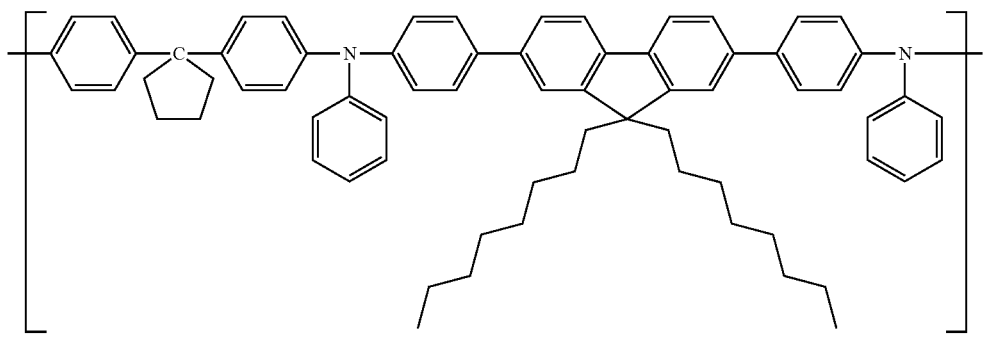
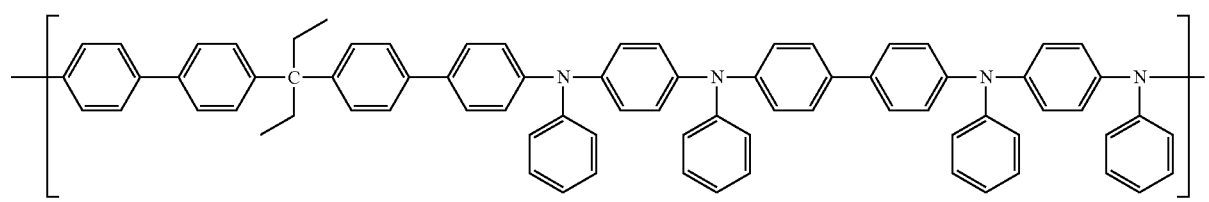
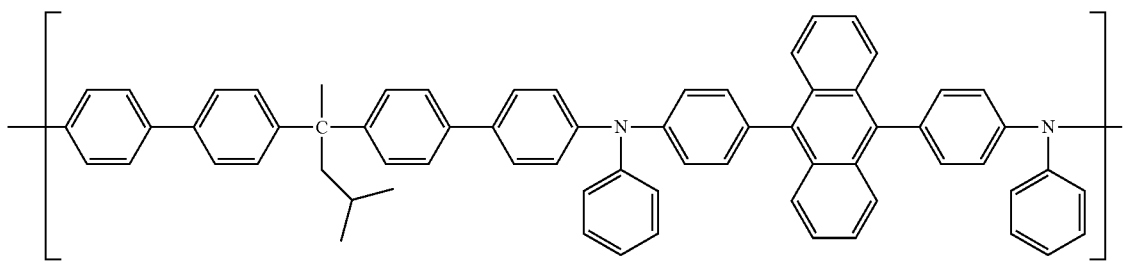
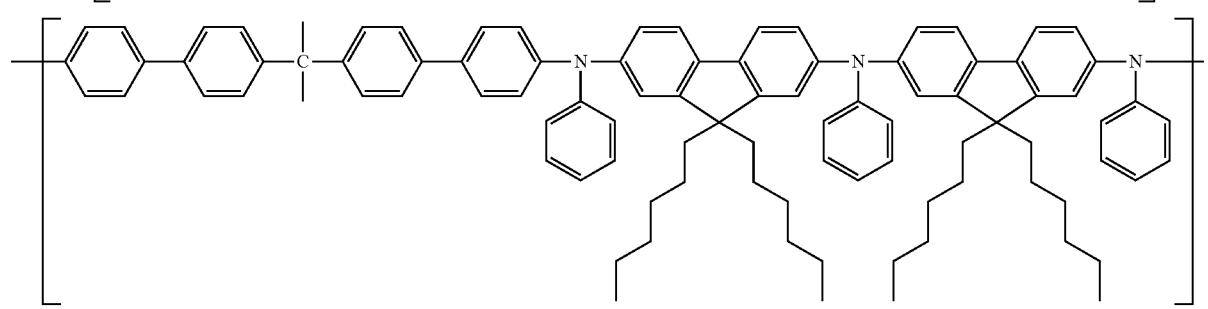
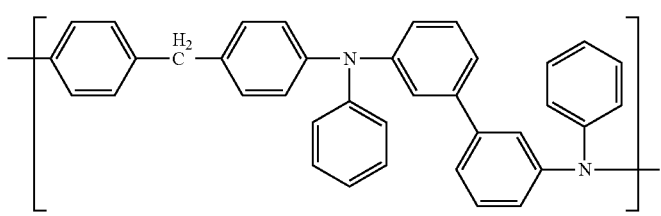

-continued
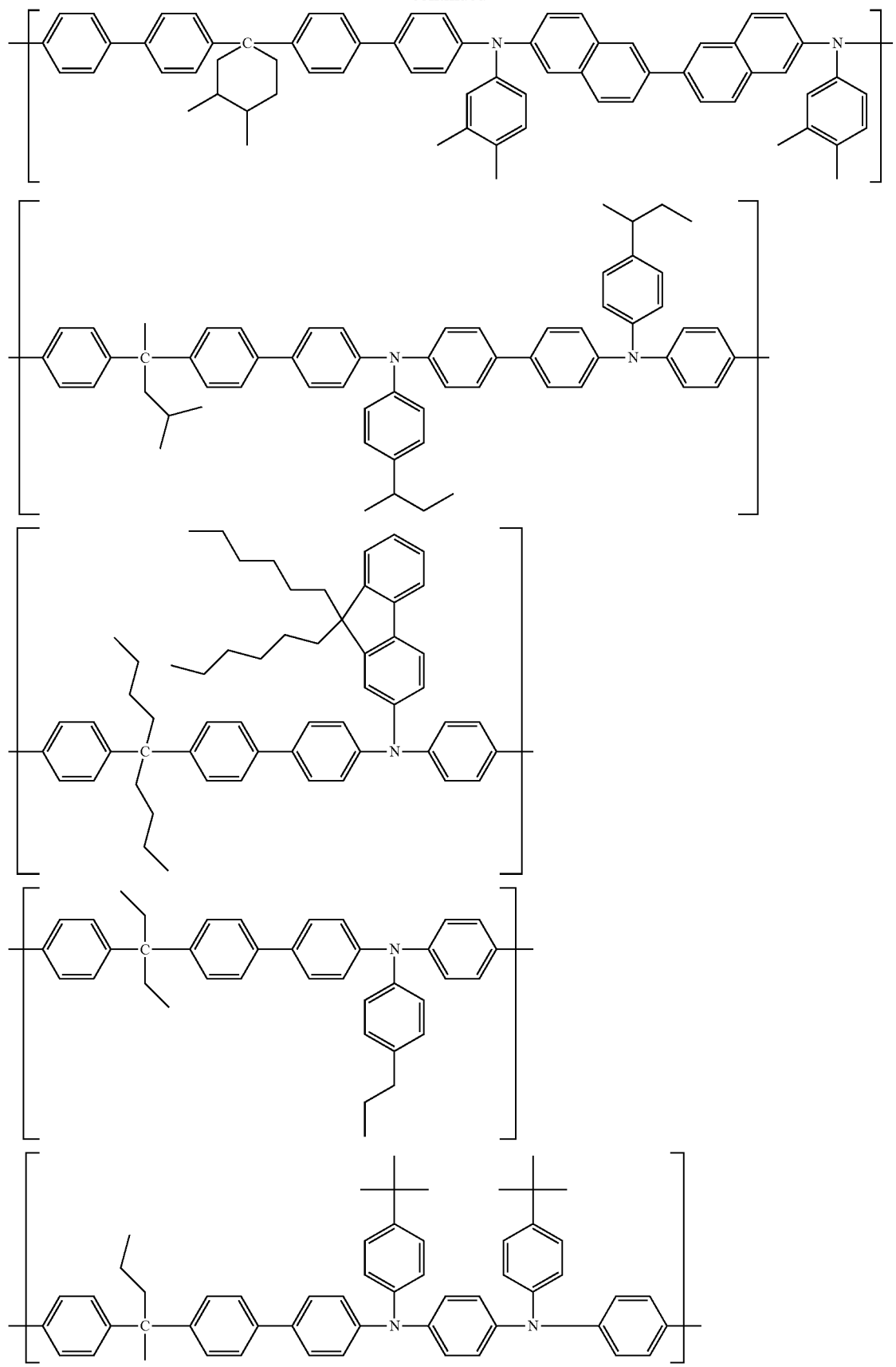

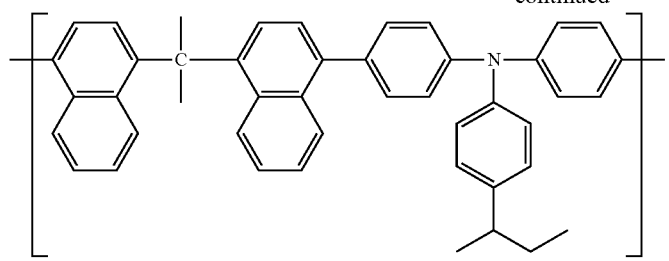
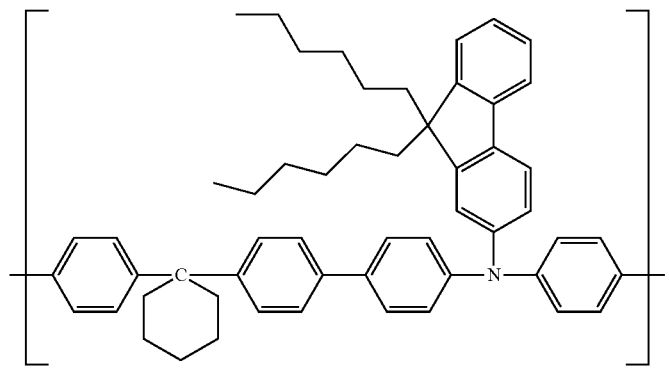
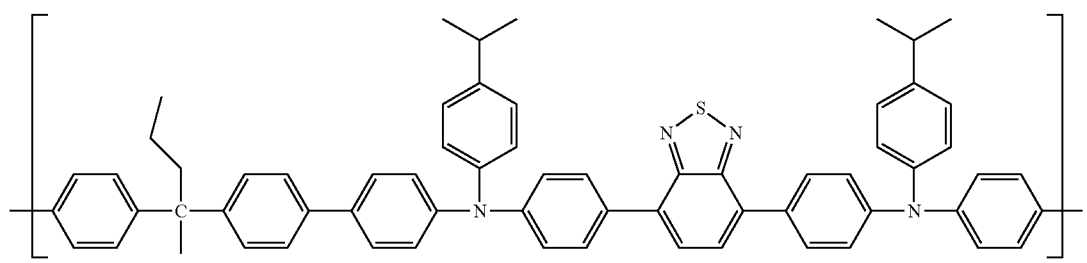
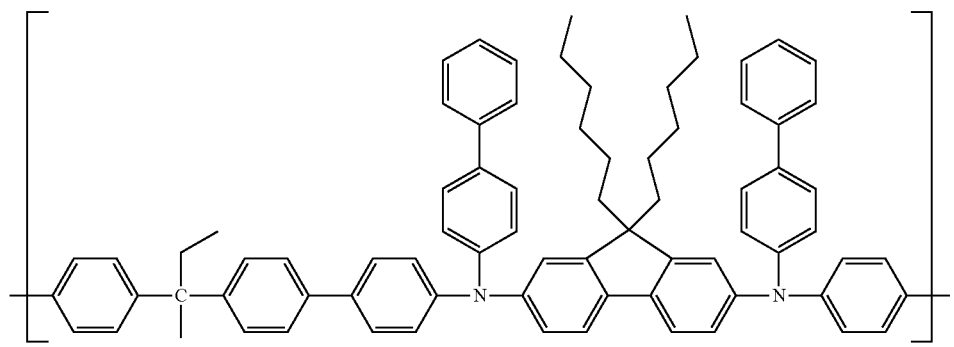
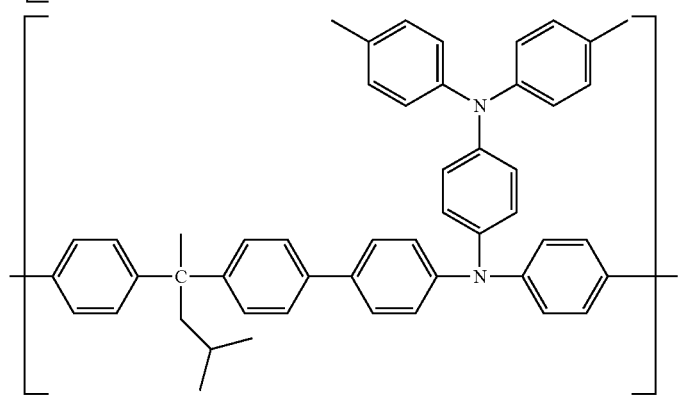

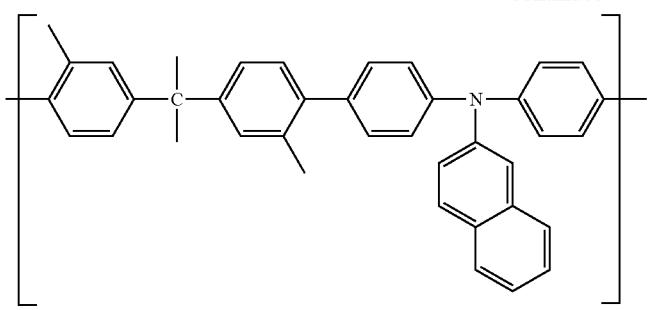
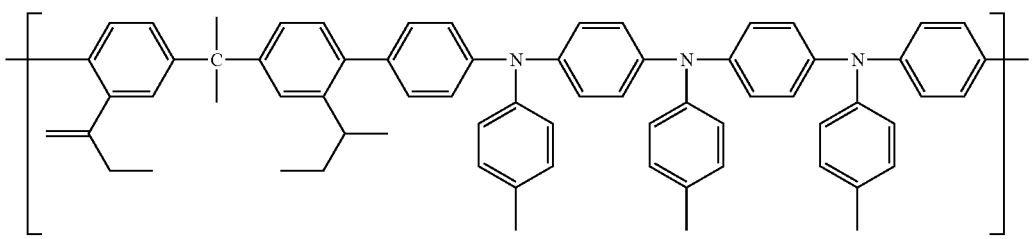
[Chem. 18]
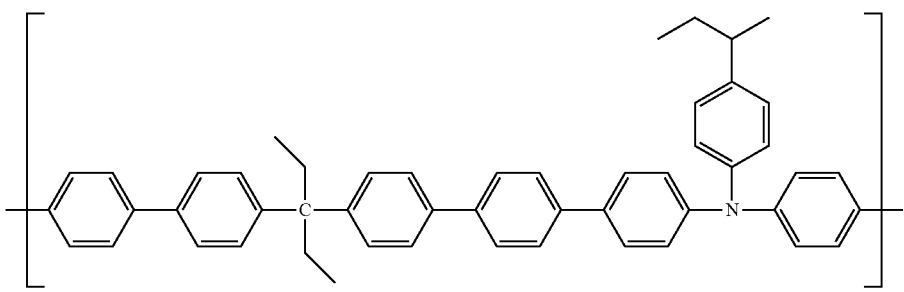
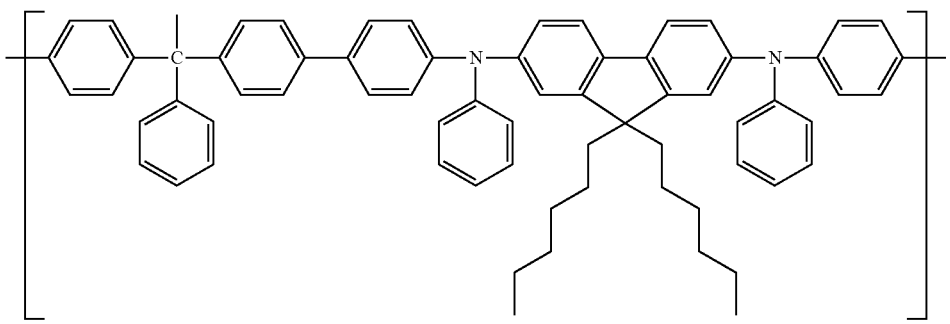
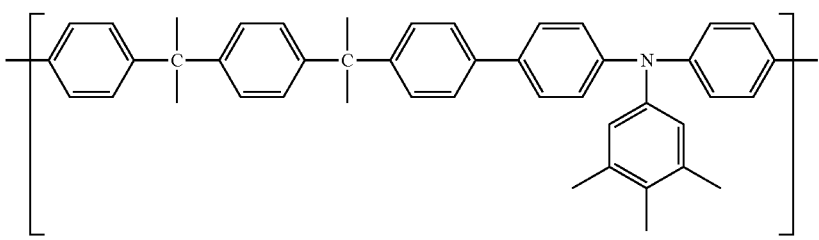

-continued
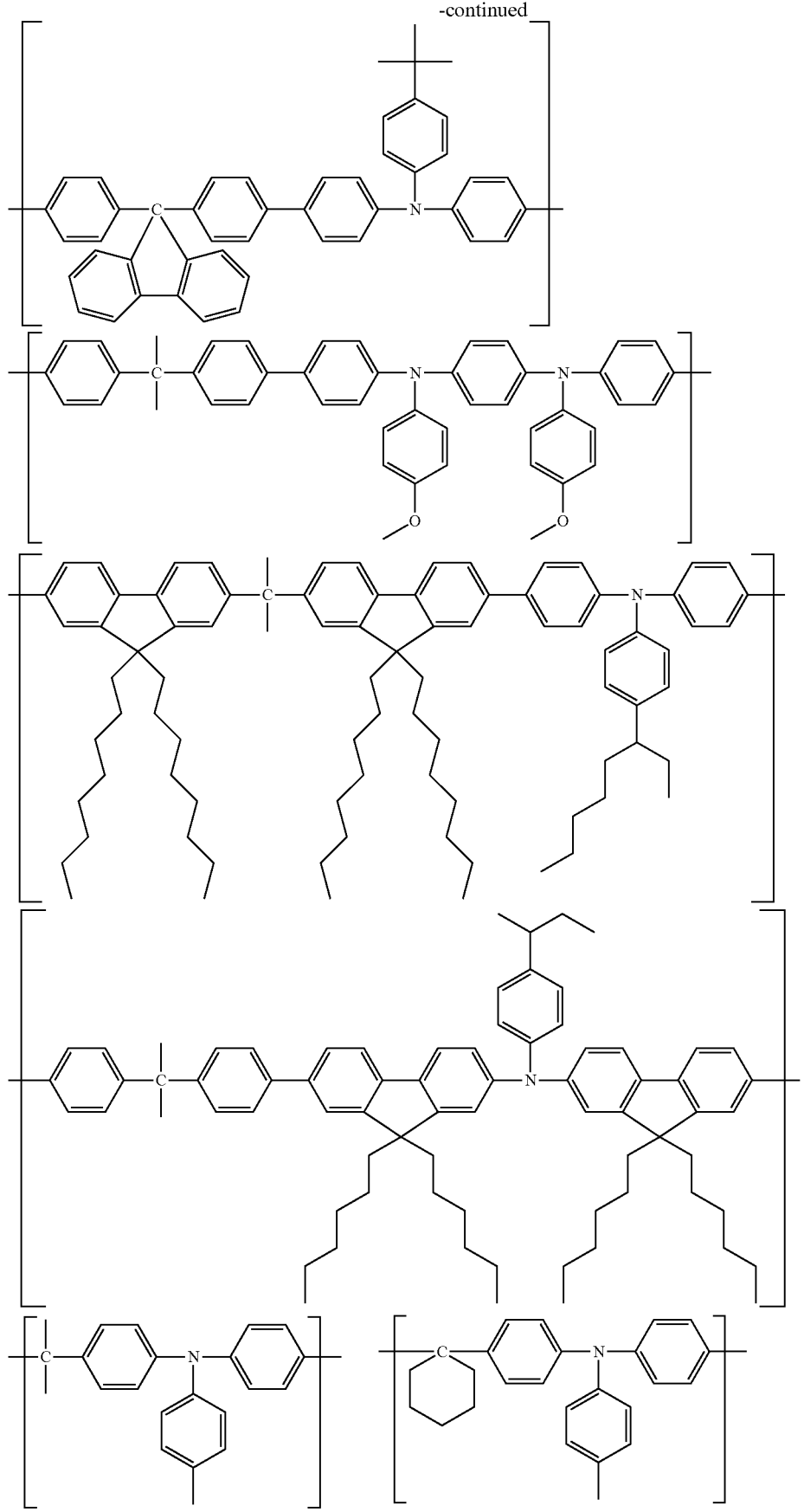

65 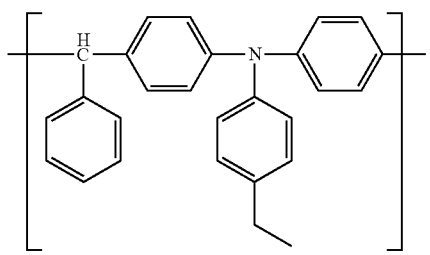 66 -continued 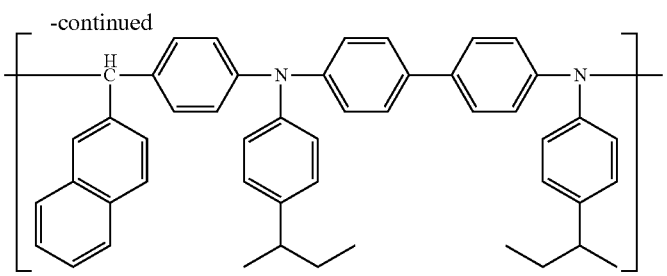

{Proportion of Partial Structure (1) and Partial Structure (2)}

Regarding the proportion of the partial structure (1) and the partial structure (2) contained in the polymer of the present invention, preferably, the partial structure (2) accounts for from 0 to 99.9 mol %, more preferably from 80 to 99.5 mol % relative to 100 mol % of the total of the partial structure (1) and the partial structure (2). Having the partial structure (2), the polymer exhibits the effects of improving charge transferability, maintaining oxidation reduction stability and improving hole mobility, as mentioned above.

{Molecular Weight of Polymer}

The weight-average molecular weight of the polymer of the present invention is generally 3,000,000 or less, preferably 1,000,000 or less, more preferably 500,000 or less, even more preferably 200,000 or less, and is generally 1,000 or more, preferably 2,500 or more, more preferably 5,000 or more, even more preferably 20,000 or more.

When the weight-average molecular weight of the polymer is more than the above-mentioned upper limit, then the solubility thereof in solvent may lower and the film formability thereof may be thereby worsened. When the weight-average molecular weight of the polymer is less than the above-mentioned lower limit, then the glass transition temperature, the melting point and the vaporization temperature of the polymer may lower and the heat resistance thereof may be thereby worsened.

The number-average molecular weight (Mn) of the polymer of the present invention is generally 2,500,000 or less, preferably 750,000 or less, more preferably 400,000 or less, and is generally 500 or more, preferably 1,500 or more, more preferably 3,000 or more.

Further, the degree of dispersion (Mw/Mn) of the polymer of the present invention is preferably 3.5 or less, more preferably 2.5 or less, even more preferably 2.0 or less. The degree of dispersion is preferably smaller, and therefore, the lower limit is ideally 1. When the degree of dispersion of the polymer is less than the above-mentioned upper limit, then the polymer is easy to purify, and favorably has good solubility in solvent and good charge transporting ability.

In general, the weight-average molecular weight of the polymer may be determined through SEC (size exclusion chromatography). In SEC, a high-molecular-weight component takes a short elution time, while a low-molecular-weight component takes a long elution time. Using a calibration curve calculated from the elution time of polystyrene (standard sample) of which the molecular weight is known, the elution time of the sample is converted into the molecular weight thereof, and the weight-average molecular weight is calculated from the found data.

{Examples of Polymer}

Specific examples of the polymer of the present invention are shown below. However, the polymer of the present invention is not limited to these examples. In the chemical formulae, the number indicates the molar ratio of the repeating unit therein.

These copolymers may be any of random copolymers, alternate copolymers, block copolymers, graft copolymers, etc., in which the sequence of the monomers is not specifically defined.

[Chem. 19]

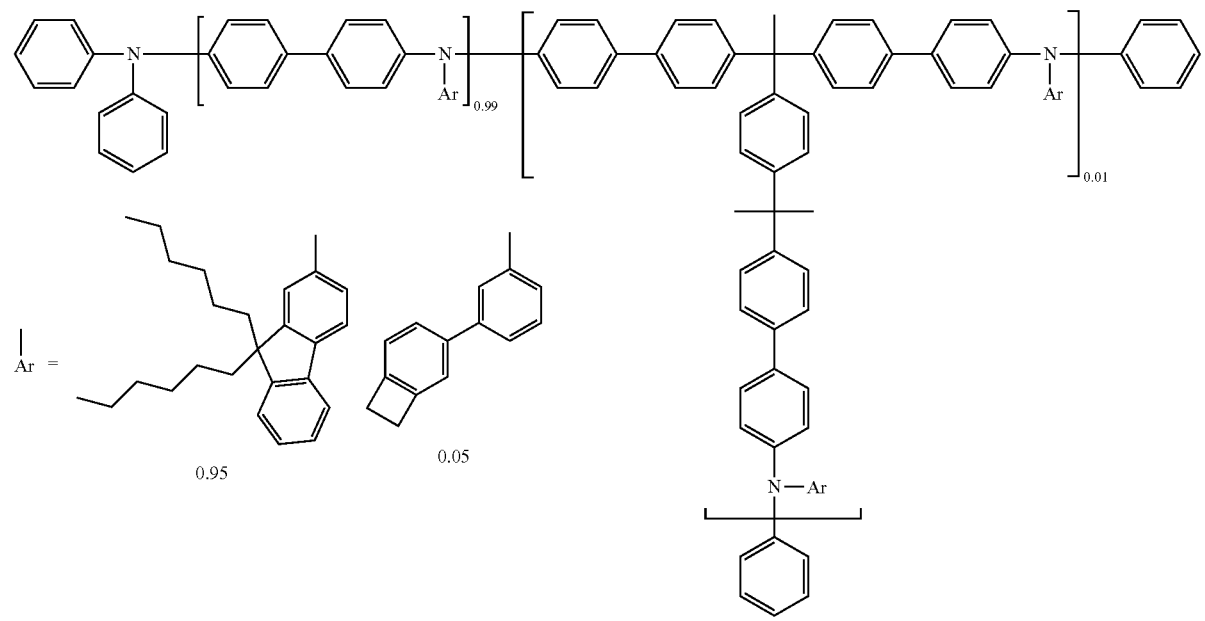

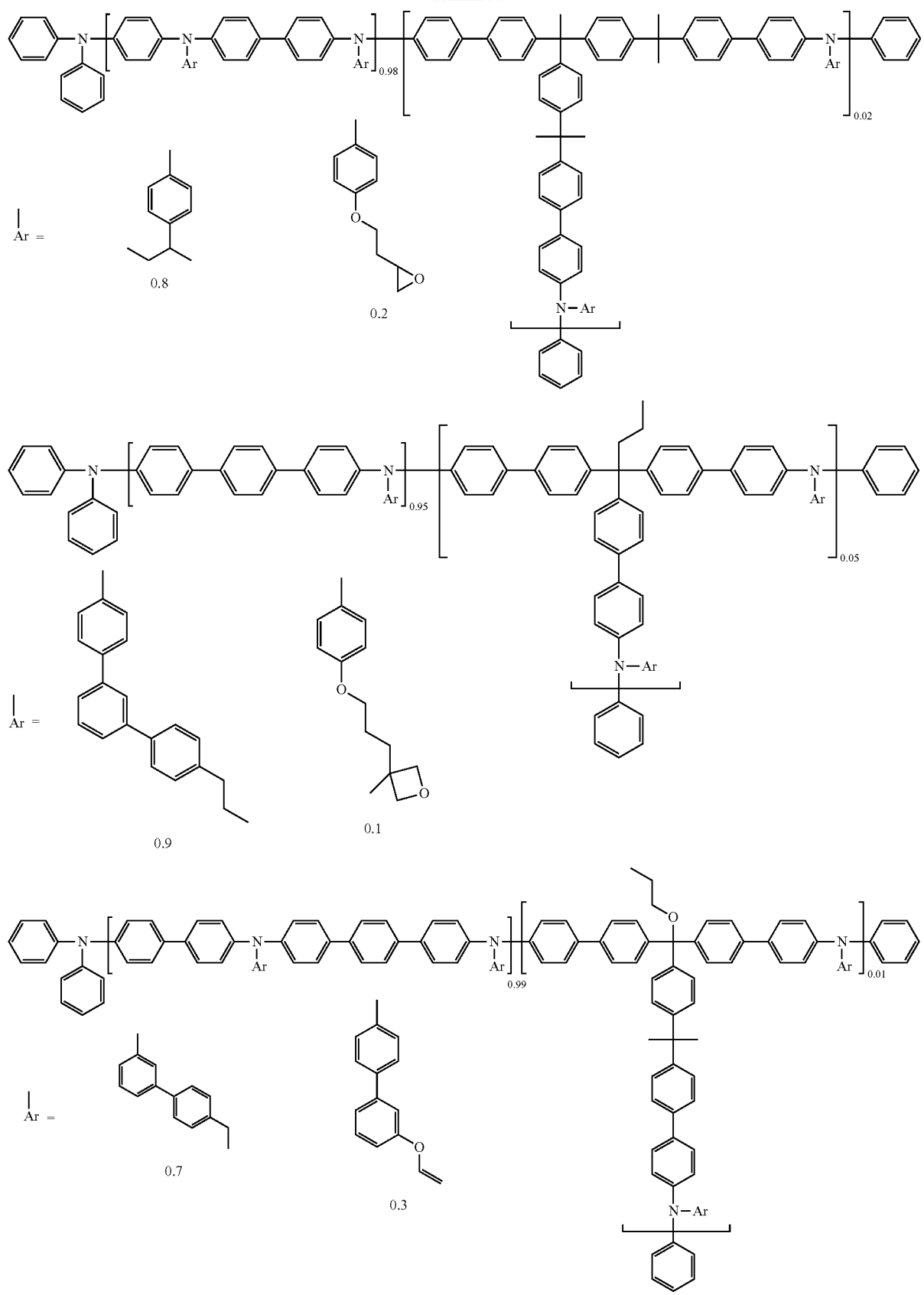

-continued
[Chem. 20]
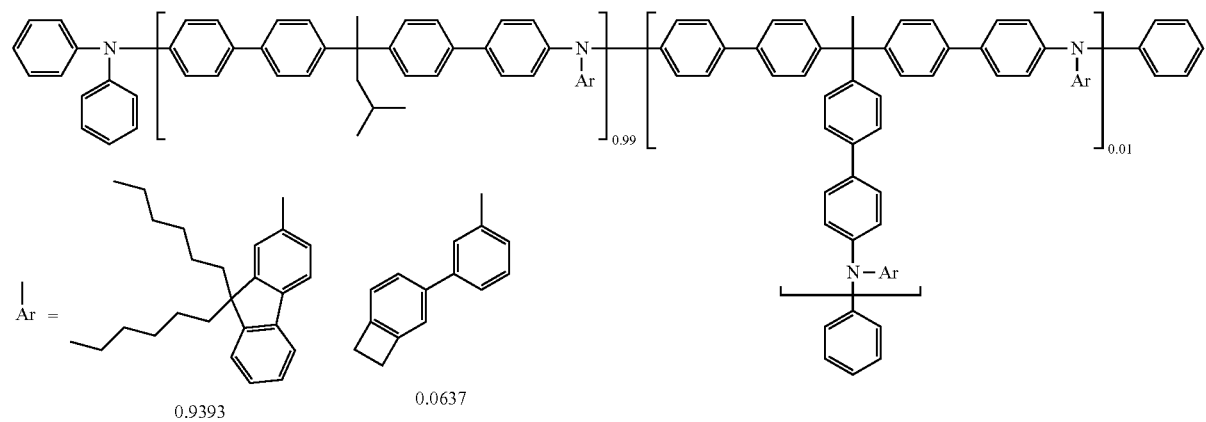
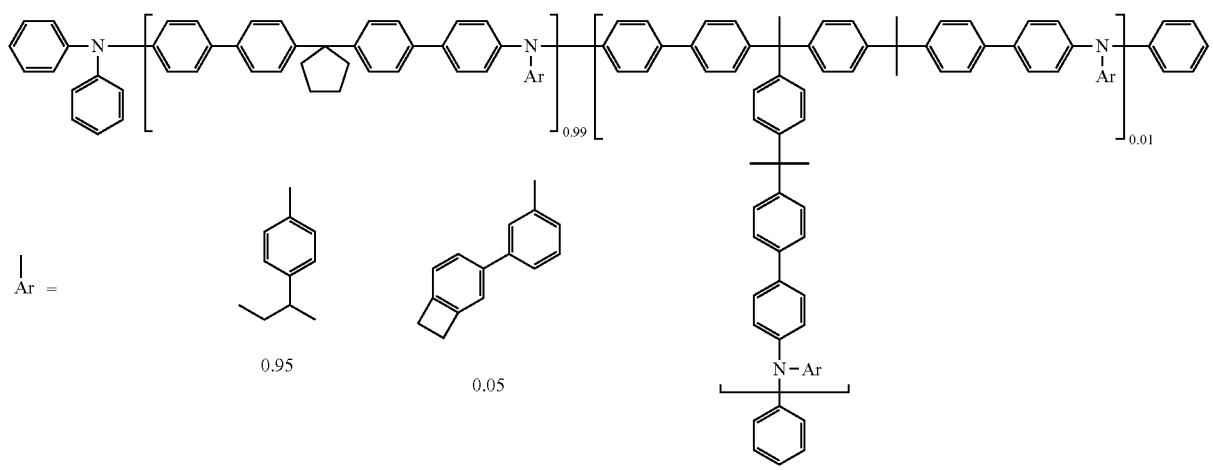
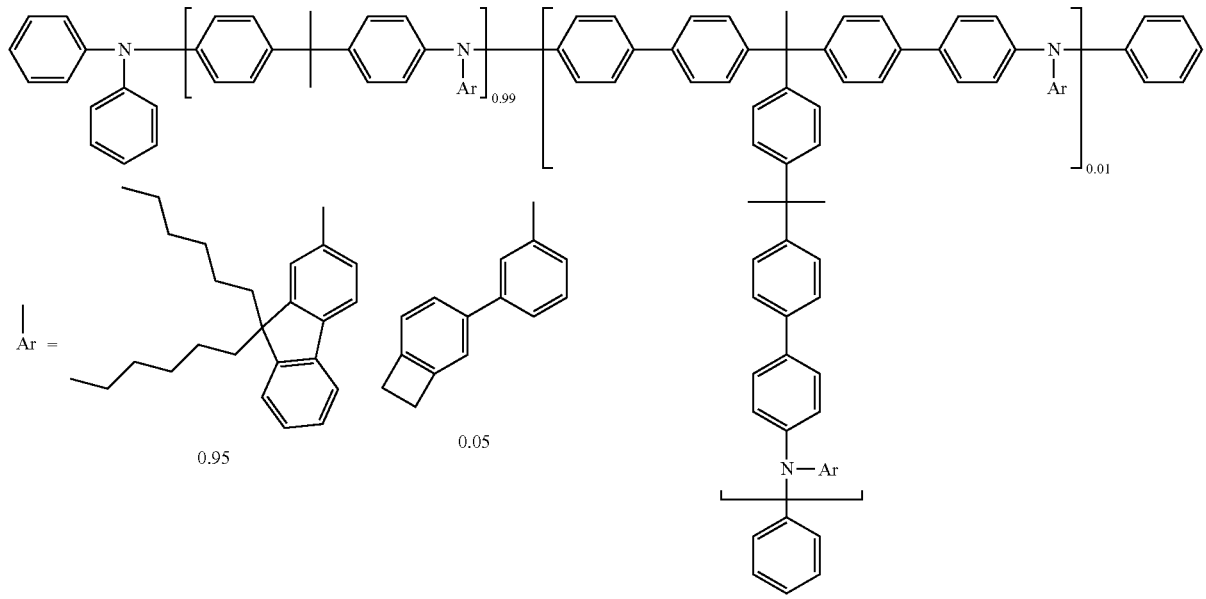

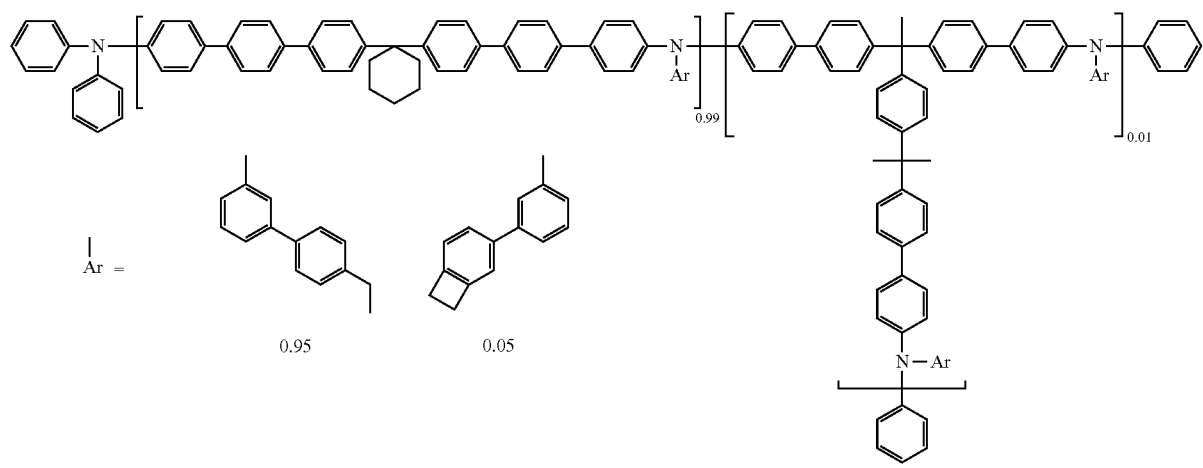
[Chem. 21]
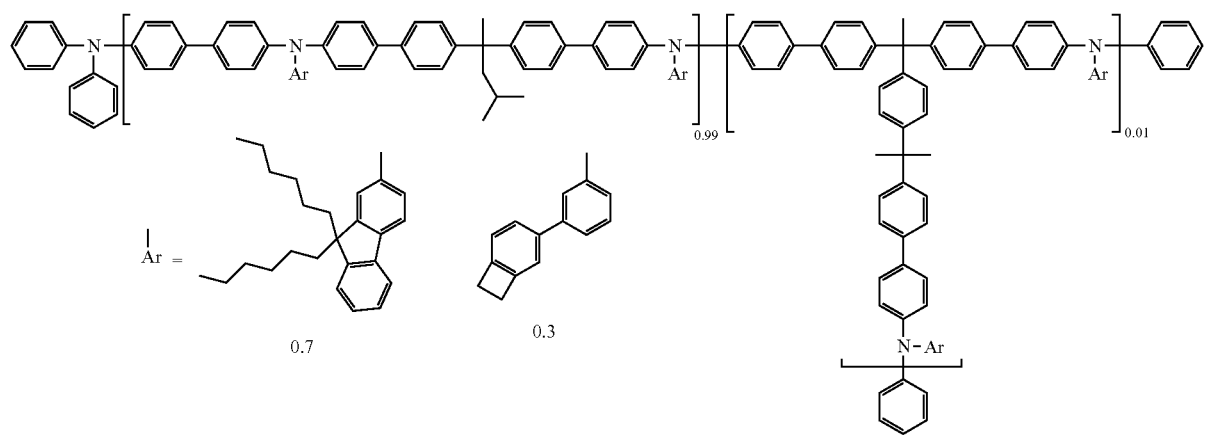
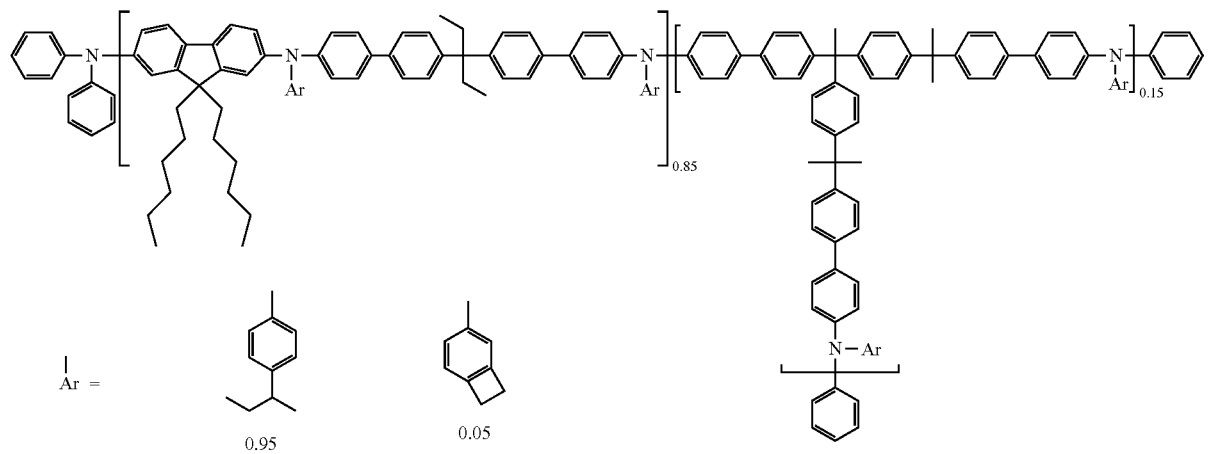

-continued
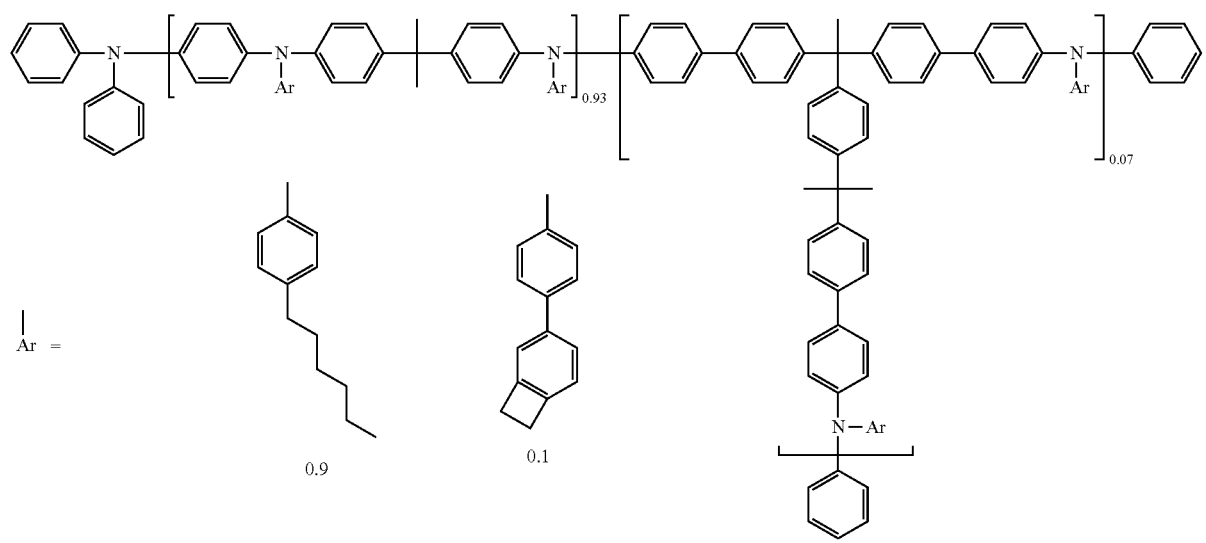
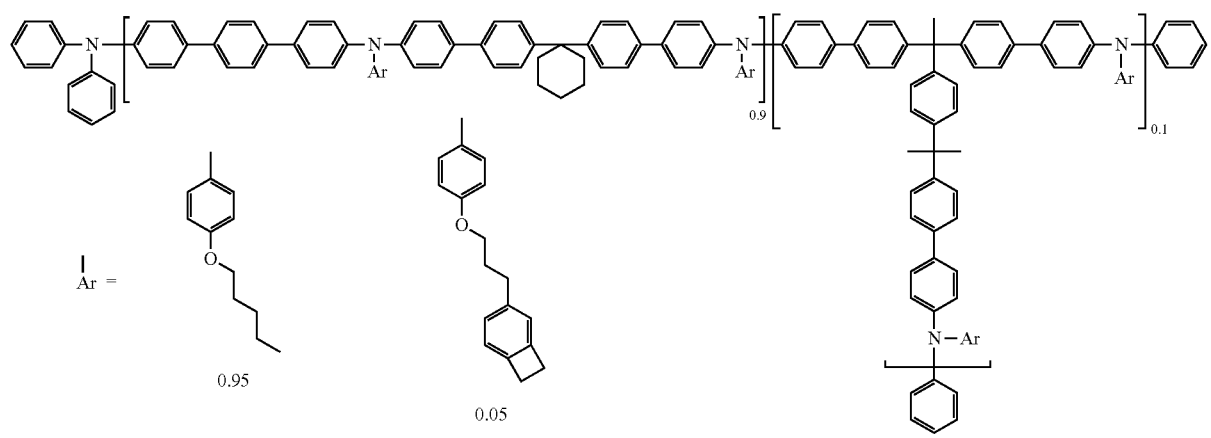
[Chem 22.]
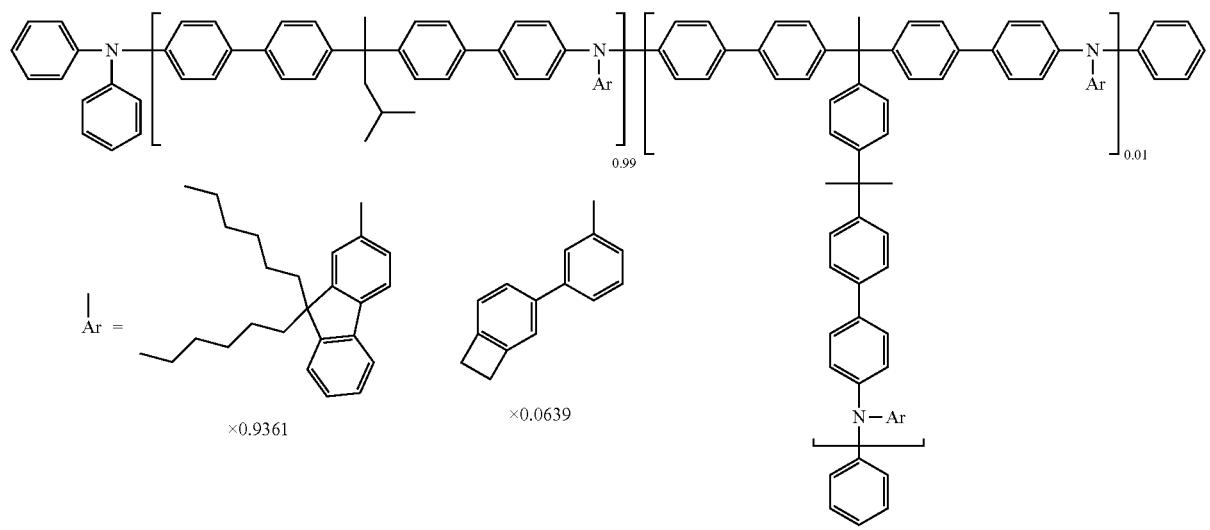

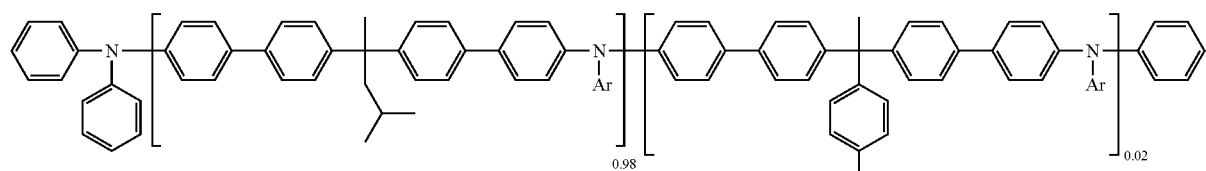
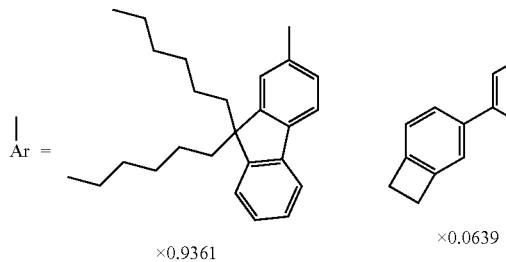
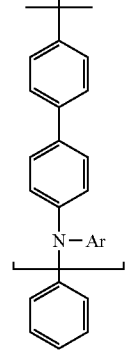
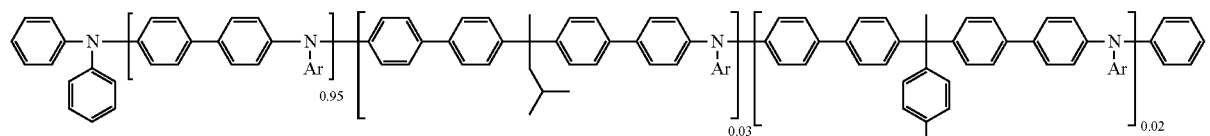
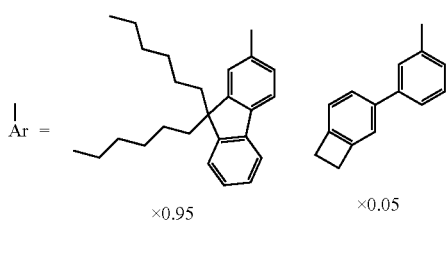
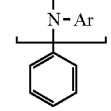
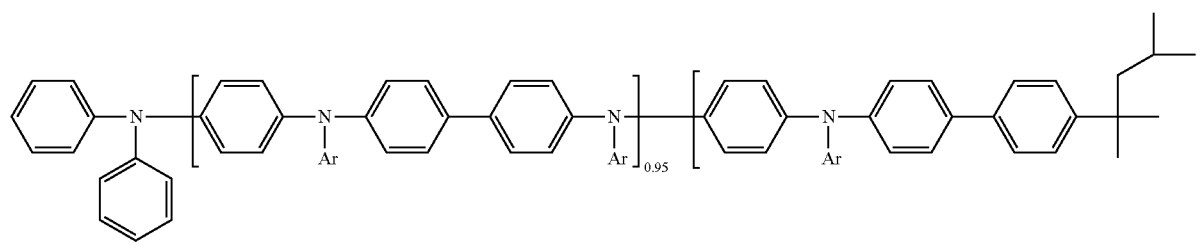

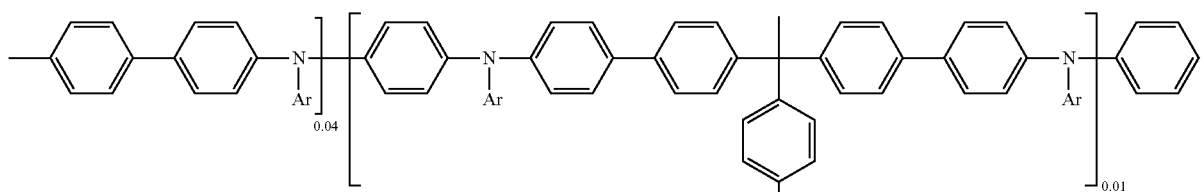
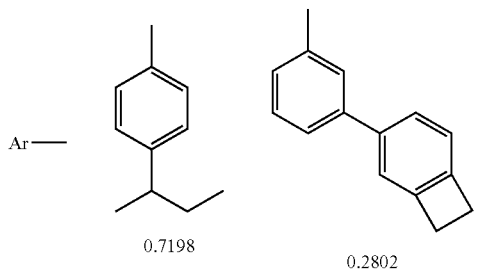
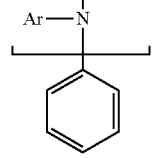
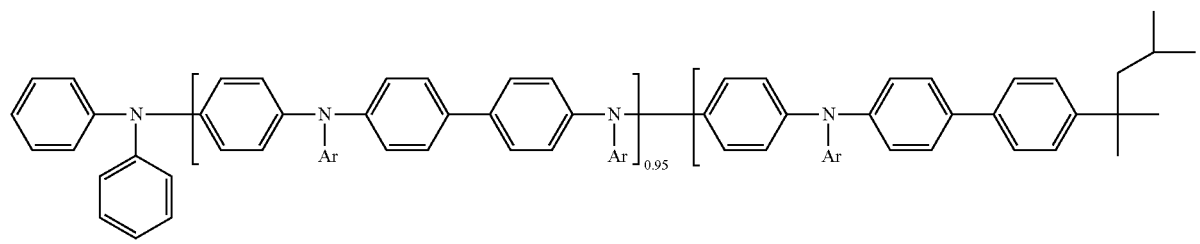
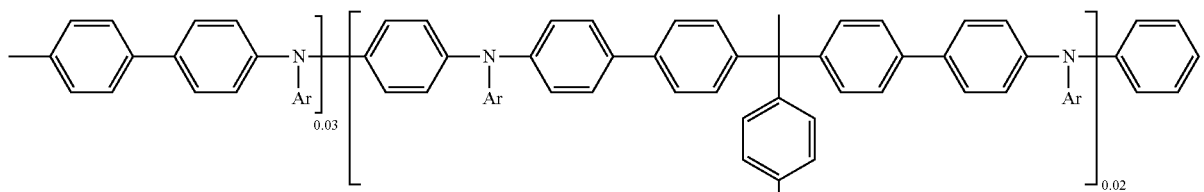
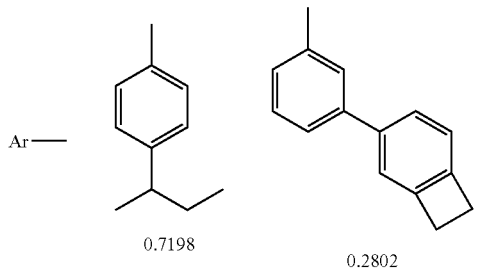
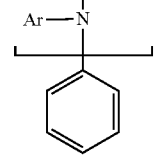

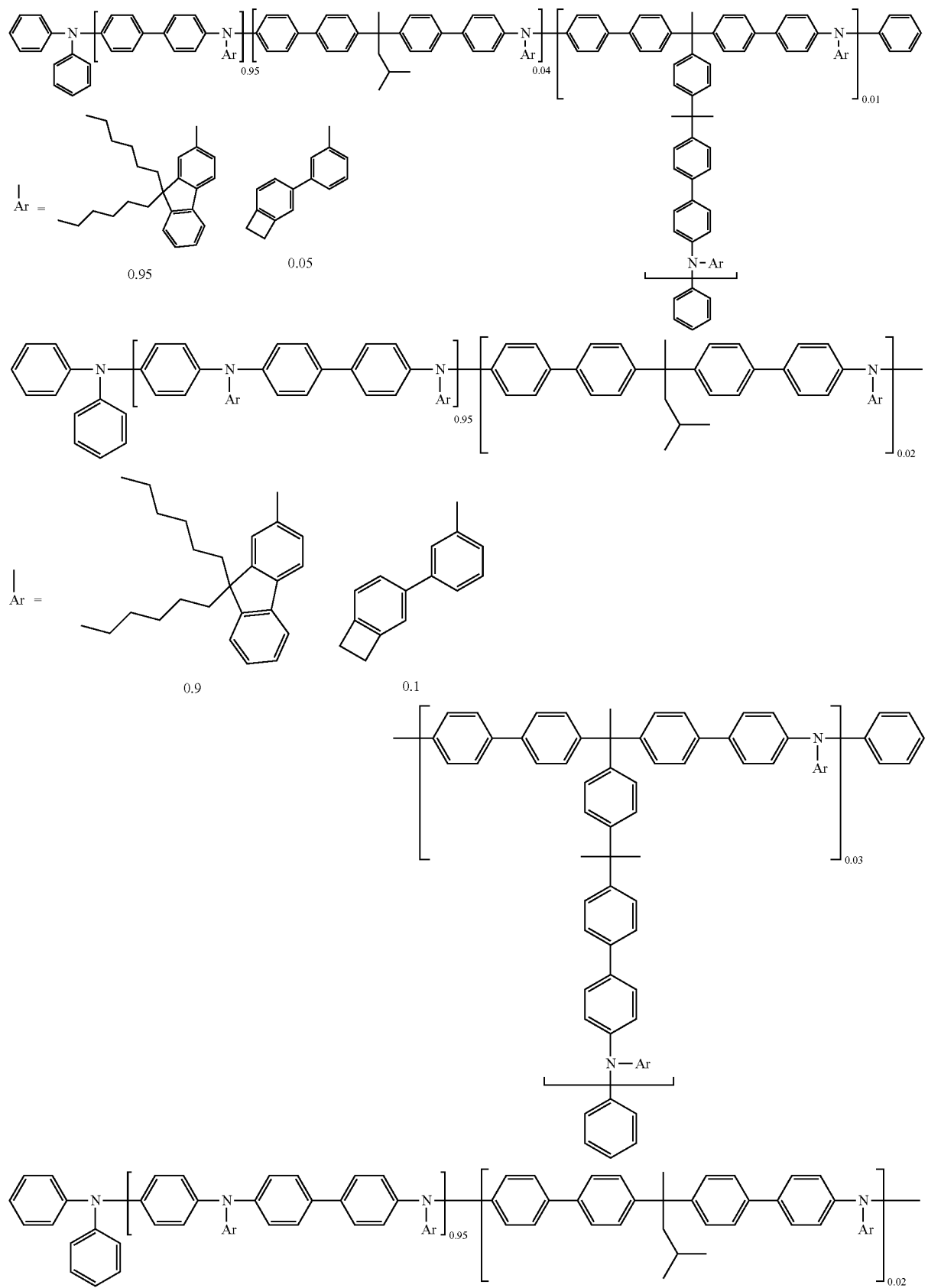

81
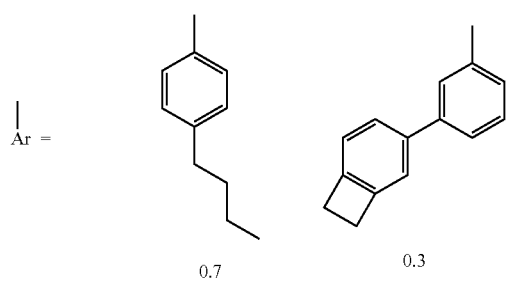
82
-continued
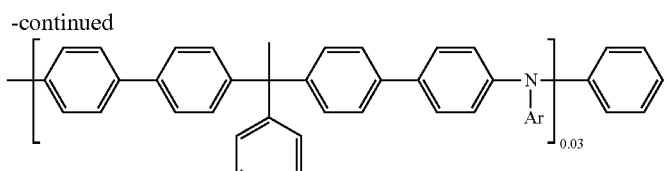
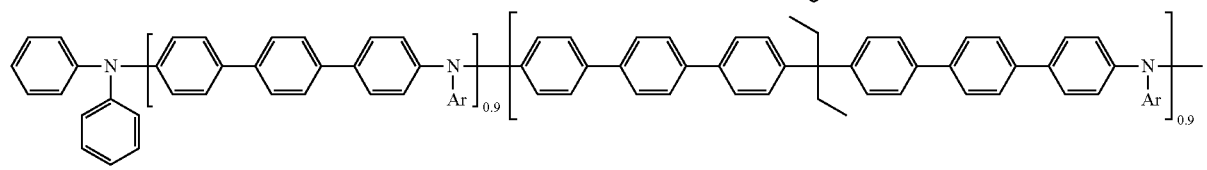
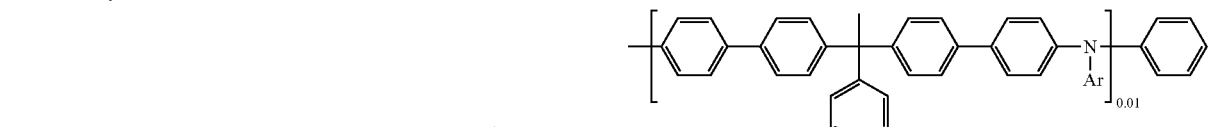
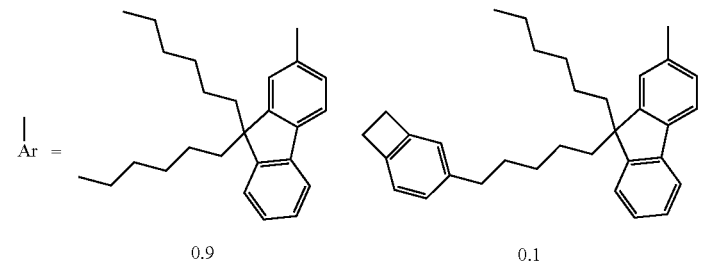
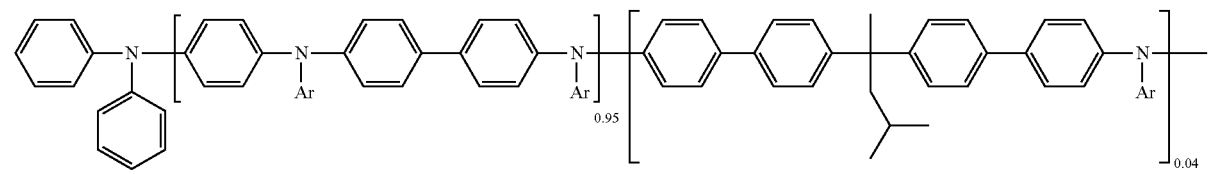
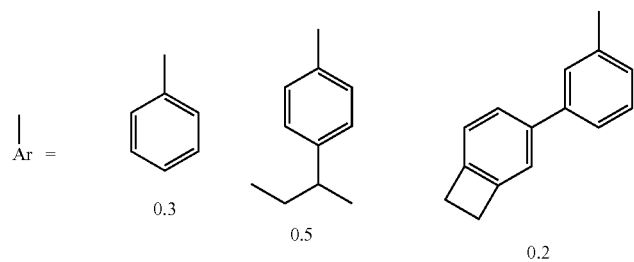

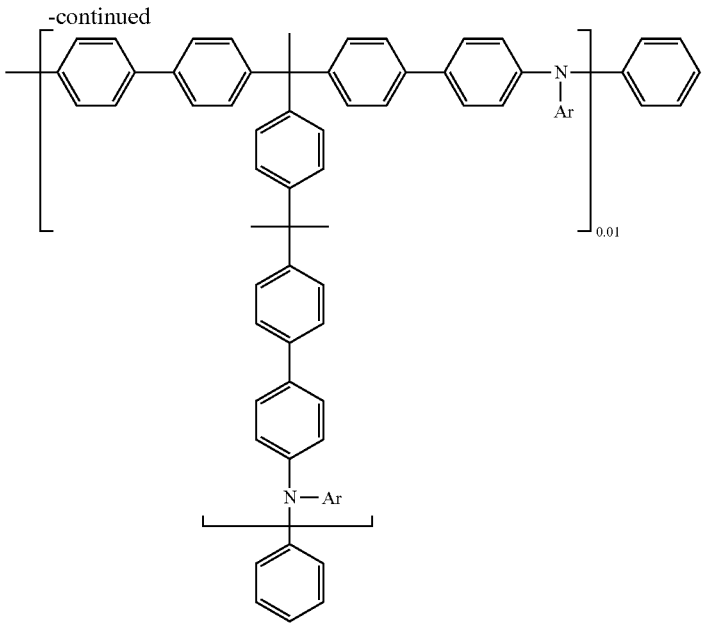

{Properties of Polymer}

The glass transition temperature of the polymer of the present invention is generally 50° C. or higher, preferably 80° C. or higher, more preferably 100° C. or higher, and is generally 300° C. or lower.

Falling within the above range is preferred, since the heat resistance of the polymer is excellent, and since the operation life of the elements to be obtained is prolonged.

The ionization potential of the polymer of the present invention is generally 4.5 eV or more, preferably 4.8 eV or more, and is generally 6.0 eV or less, preferably 5.7 eV or less.

The above range is preferred, within which the polymer is excellent in the hole transporting ability and the driving voltage for the elements to be obtained can be lowered.

{Production Method for Polymer}

The production method for the polymer of the present invention is not specifically defined. Any method is employable here capable of producing the polymer of the present invention. For example, the polymer may be produced according to a polymerization method through Suzuki reaction, a polymerization method through Grignard reaction, a polymerization method through Yamamoto reaction, a polymerization method through Ullmann reaction, a polymerization method through Buchwald-Hartwig reaction, etc.

In the case of a polymerization reaction through Ullmann reaction or a polymerization method through Buchwald-Hartwig reaction, for example, the polymer of the present invention can be synthesized by reacting an aryl trihalides or an aryl dihalide represented by the following formula (1a) or (1b) (where X represents a halogen atom such as I, Br, Cl, F, etc.), and a primary aminoaryl represented by the following formula (2a).

[Chem. 24]

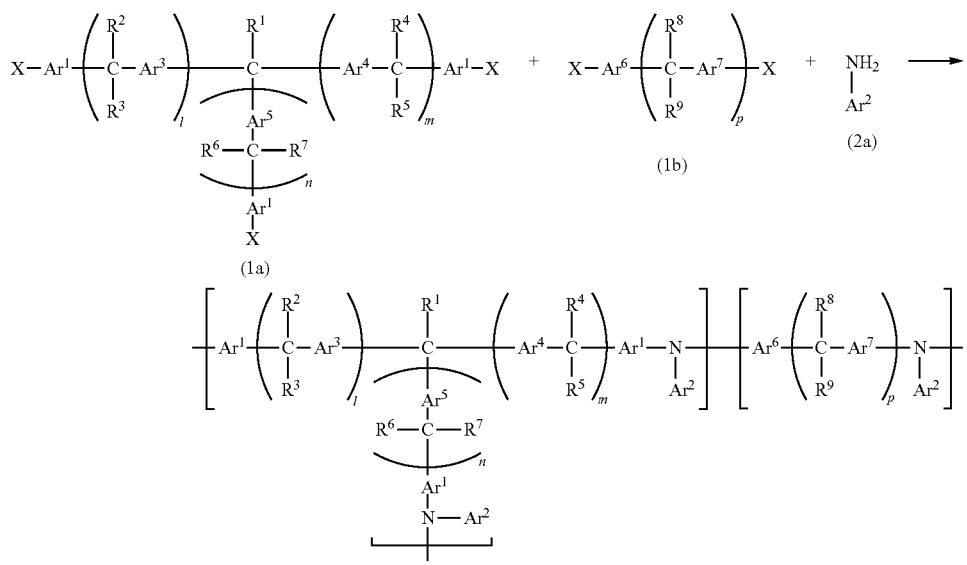

(In the above formula, $Ar^1$ to $Ar^7$, $R^1$ to $R^9$, l, m, n and p are the same as $Ar^1$ to $Ar^7$, $R^1$ to $R^9$, l, m, n and p in the above-mentioned formulae (1) and (2).)

In place of the primary aminoaryl (2a), a secondary aminoaryl (2b) may also be used as described below.

In the above-mentioned polymerization method, in general, the reaction to form the N-aryl bond is carried out in the presence of a base such as potassium carbonate, potassium tert-butoxide, triethylamine, etc. In addition, the reaction can also be carried out in the presence of a transition metal catalyst, for example, a copper or palladium complex, etc.

[Chem. 25]

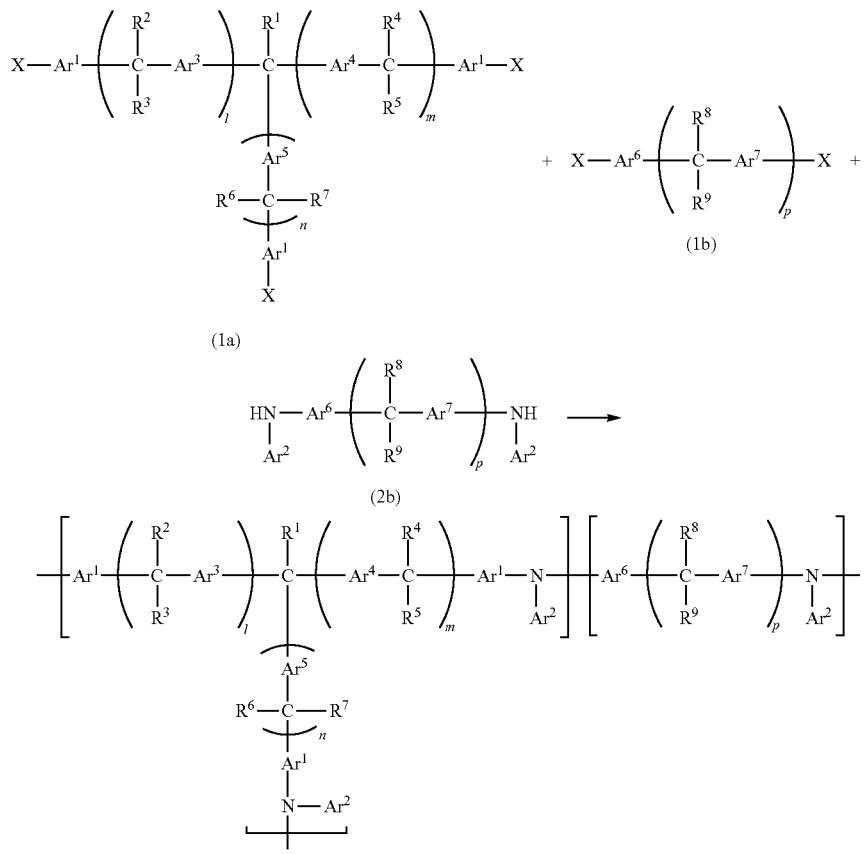

(In the above formula, $Ar^1$ to $Ar^7$, $R^1$ to $R^9$, l, m, n and p are the same as $Ar^1$ to $Ar^7$, $R^1$ to $R^9$, l, m, n and p in the above-mentioned formulae (1) and (2).)

In the case of a polymerization method through Suzuki reaction, for example, the polymer of the present invention can be synthesized by reacting a boron derivative and an aryl dihalide as exemplified by the following formula.

[Chem. 26]

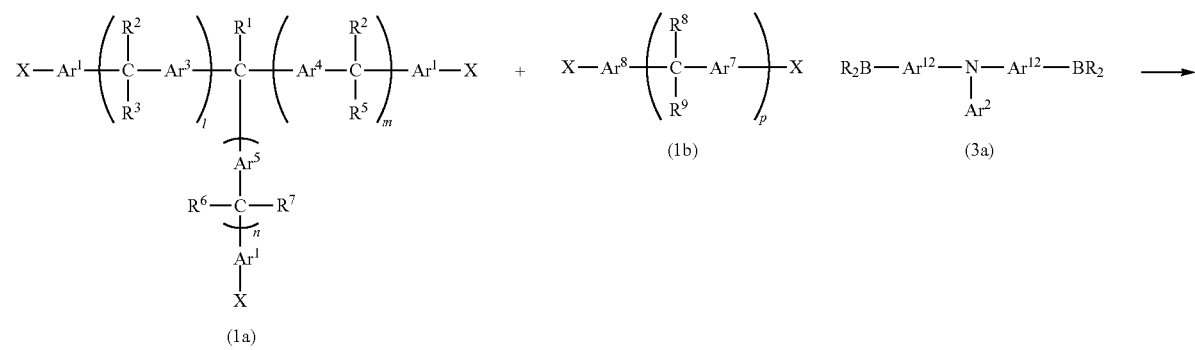

-continued

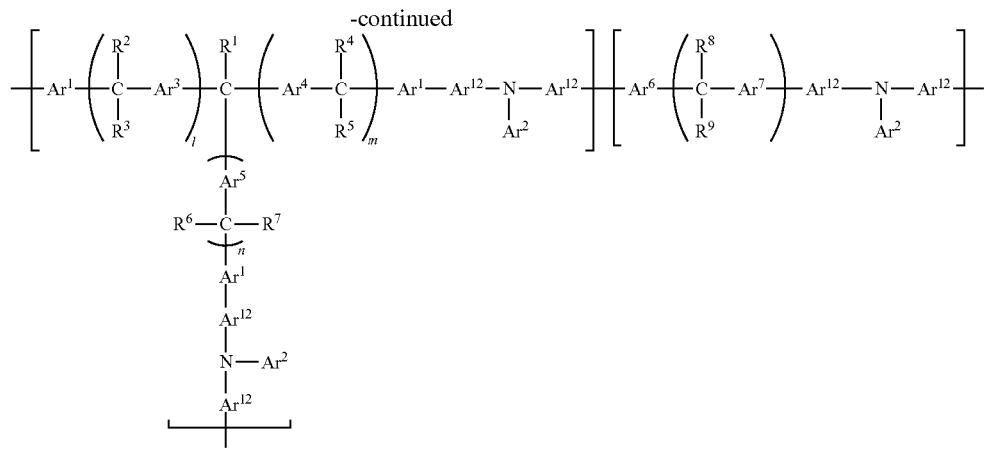

(In the above formula, $Ar^1$ to $Ar^7$, $R^1$ to $R^9$, l, m, n and p are the same as $Ar^1$ to $Ar^7$, $R^1$ to $R^9$, l, m, n and p in the above-mentioned formulae (1) and (2).

R represents a substituent, and is generally a hydroxyl group or an alkoxy group optionally forming a ring. Multiple R's may be the same or different.

X represents a halogen atom such as I, Br, Cl, F, etc. Multiple X's may be the same or different.

$Ar^{12}$ represents an aromatic hydrocarbon-cyclic group optionally having a substituent, or an aromatic heterocyclic group optionally having a substituent. Multiple $Ar^{12}$'s may be the same or different.)

In the above polymerization method, the reaction step of reacting a boron derivative and a dihalide compound is generally carried out in the presence of a base such as potassium carbonate, sodium tert-butoxide, triethylamine, etc. The reaction may also be carried out in the presence of a transition metal catalyst such as a copper or palladium complex of the like, if desired. Further, in the reaction step with a boron derivative, for example, the reaction may be carried out in the presence of a base such as potassium carbonate, potassium phosphate, sodium tert-butoxide, triethylamine or the like, or a transition metal catalyst such as a palladium complex or the like.

The polymer of the present invention may also be synthesized through polymerization of a carbonyl compound or a divinyl compound and a triarylamine in which the p-position relative to the amino group is a hydrogen atom, in the presence of an acid catalyst such as trifluoromethanesulfonic acid, sulfuric acid, etc.

[Organic Electroluminescent Element Material]

Preferably, the polymer of the present invention is used as an organic electroluminescent element material. In other words, the polymer of the present invention is preferably a material for organic electroluminescent elements.

In case where the polymer of the present invention is used as an organic electroluminescent element material, it is desirable that the polymer is used as a material of forming at least one of the hole injection layer and the hole transport layer in an organic electroluminescent element, or that is, the polymer is used preferably as a charge transporting material.

In case where the polymer is used as a charge transporting material, one type alone of the polymer of the present invention may be used, or two or more types of the polymer may be used as combined in any desired manner and in any desired ratio.

In case where at least one of a hole injection layer and a hole transport layer of an organic electroluminescent element is formed using the polymer of the present invention, the content of the polymer of the present invention in the hole injection layer and/or the hole transport layer is generally from 1 to 100% by weight, preferably from 5 to 100% by weight, more preferably from 10 to 100% by weight. Falling within the range is preferred since the charge transferability of the hole injection layer and/or the hole transport layer improves, the driving voltage for the element lowers and the driving stability improves.

In case where the content of the polymer of the present invention in the hole injection layer and/or the hole transport layer is not 100% by weight, the other component to constitute the hole injection layer and/or the hole transport layer includes hole transporting compounds and others mentioned hereinunder.

The polymer of the present invention is preferably used in the organic layer formed according to a wet film formation method, as facilitating the production of organic electroluminescent elements.

[Composition for Organic Electroluminescent Elements]

The composition for organic electroluminescent elements of the present invention contains the polymer of the present invention. The composition for organic electroluminescent elements of the present invention may contain one type alone of the polymer of the invention or may contain two or more different types of the polymer as combined in any desired manner and in any desired ratio.

{Content of Polymer}

The content of the polymer of the invention in the composition for organic electroluminescent elements of the present invention is generally from 0.01 to 70% by weight, preferably from 0.1 to 60% by weight, more preferably from 0.5 to 50% by weight.

Falling within the range is preferred, since faults hardly form in the organic layer and since film thickness unevenness hardly occurs.

The composition for organic electroluminescent elements of the present invention may contain solvent and others in addition to the polymer of the present invention.

{Solvent}

The composition for organic electroluminescent elements of the present invention generally contains a solvent. Preferably, the solvent is one capable of dissolving the polymer of the invention. Concretely, the solvent is preferably one capable of dissolving the polymer of the invention in an amount of generally 0.05% by weight or more at room temperature, preferably 0.5% by weight or more, more preferably 1% by weight or more.

Specific examples of the solvent include organic solvents, for example, aromatic solvents such as toluene, xylene, mesitylene, cyclohexylbenzene, etc.; halogen-containing solvents such as 1,2-dichloroethane, chlorobenzene, o-dichlorobenzene, etc.; ether solvents, for example, aliphatic ethers such as ethylene glycol dimethyl ether, ethylene glycol diethyl ether, propylene glycol 1-monomethyl ether acetate (PGMEA), etc., aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, etc.; ester solvents, for example, aliphatic esters such as ethyl acetate, n-butyl acetate, ethyl lactate, n-butyl lactate, etc., aromatic esters such as phenyl acetate, phenyl propionate, methyl benzoate, ethyl benzoate, isopropyl benzoate, propyl benzoate, n-butyl benzoate, etc.; and other organic solvents for use in compositions for hole injection layer formation and compositions for hole transport layer formation to be mentioned hereinunder.

One type alone of the solvent may be used, or two or more different types of the solvent may be used as combined in any desired manner and in any desired ratio.

Above all, the solvent to be contained in the composition for organic electroluminescent elements of the present invention is preferably one having a surface tension at 20° C. of generally less than 40 dyn/cm, preferably 36 dyn/cm or less, more preferably 33 dyn/cm or less.

In case where the composition for organic electroluminescent elements of the present invention is used to form a coating film according to a wet film formation method and where the polymer of the invention therein is crosslinked to form an organic layer, it is desirable that the affinity between the solvent and the substrate is high. This is because the uniformity of the film has a great influence on the uniformity and the stability of light emission by organic electroluminescent elements. Accordingly, the composition for organic electroluminescent elements to be used in a wet film formation method is desired to have a low surface tension so as to form a uniform coating film having a high leveling capability. Consequently, using the solvent that has a low surface tension as mentioned above is preferred, as capable of forming a uniform layer that contains the polymer of the present invention and therefore as capable of forming a uniform crosslinked layer.

Specific examples of the solvent having a low surface tension include, as mentioned above, aromatic solvents such as toluene, xylene, mesitylene, cyclohexylbenzene, etc.; ester solvents such as ethyl benzoate, etc.; ether solvents such as anisole, etc.; trifluoromethoxyanisole, pentafluoromethoxybenzene, 3-(trifluoromethyl)anisole, ethyl (pentafluorobenzoate), etc.

On the other hand, as the solvent to be contained in the composition for organic electroluminescent elements of the present invention, also preferred is one having a vapor pressure at 25° C. of generally 10 mmHg or less, preferably 5 mmHg or less, and generally 0.1 mmHg or more. Using the solvent of the type is preferred for a process of producing organic electroluminescent elements according to a wet film formation method, and the solvent can make it possible to prepare a composition for organic electroluminescent elements suitable to the properties of the polymer of the present invention.

Specific examples of the solvent of the type include, as mentioned above, aromatic solvents such as toluene, xylene, mesitylene, etc., and ether solvents, ester solvents.

There is a possibility that water may degrade organic electroluminescent elements, and in particular, may promote brightness reduction in continuous driving operation. Accordingly, of the solvents mentioned above, preferred are those in which the solubility of water at 25° C. is 1% by weight or less, more preferably 0.1% by weight or less, for reducing the content of water to remain in the film produced through wet film formation.

The content of the solvent to be contained in the composition for organic electroluminescent elements of the present invention is generally 10% by weight or more, preferably 30% by weight or more, more preferably 50% by weight or more, and even more preferably 80% by weight or more. When the solvent content is not less than the above-mentioned lower limit, then the flatness and the uniformity of the layer to be formed may be bettered.

<Electron Accepting Compound>

In case where the composition for organic electroluminescent elements of the present invention is used for forming a hole injection layer, it is desirable that the composition further contains an electron accepting compound from the viewpoint of reducing the resistance of the layer.

The electron accepting compound is preferably a compound having an oxidizing power and having the ability to accept an electron from the polymer of the present invention. Concretely, preferred is a compound having an electron affinity of 4 eV or more, more preferably 5 eV or more.

As the electron accepting compound of the type, for example, there are mentioned one or more compounds selected from a group consisting of triarylboron compounds, metal halides, Lewis acids, organic acids, onium salts, salts of arylamines and metal halides, and salts of arylamines and Lewis acids.

Concretely, there are mentioned organic group-substituted onium salts such as 4-isopropyl-4'-methyldiphenyliodonium tetrakis(pentafluorophenyl)borate, triphenylsulfonium tetrafluoroborate, etc. (WO2005/089024); high-valence inorganic compounds such as iron(III) chloride (JP-A 11-251067), ammonium peroxodisulfate, etc.; cyano compounds such as tetracyanoethylene, etc.; aromatic boron compounds such as tris(pentafluorophenyl)borane (JP-A 2003-31365), etc.; fullerene derivatives and iodide, etc.

As those compounds, preferred are ionic compounds having a structure where at least one organic group bonds to an element belonging to Group 15 to Group 17 of the Long Periodic Table (hereinafter unless otherwise specifically indicated, "Periodic Table" means Long Periodic Table) via the carbon atom thereof, and more preferred are compounds represented by the following formula (I-1):

[Chem. 27]

(I-1)

In the formula (I-1), $R^{11}$ represents an organic group bonding to $A^1$ via the carbon atom thereof, $R^{12}$ represents a substituent. $R^{11}$ and $R^{12}$ may bond to each other to form a ring.

$R^{11}$ may be any organic group having a carbon atom at the bonding site to $A^1$, and unless otherwise contradictory to the spirit of the present invention, the type thereof is not specifically defined. The molecular weight of $R^{11}$ is generally 1000 or less, preferably 500 or less, including the substituent thereof.

Preferred examples of $R^{11}$ include an alkyl group, an alkenyl group, an alkynyl group, an aromatic hydrocarbon-cyclic group, and an aromatic heterocyclic group, from the viewpoint of delocalizing positive charges. Above all, preferred are an aromatic hydrocarbon-cyclic group and an aromatic heterocyclic group from the viewpoint of delocalizing positive charges and of thermal stability.

The aromatic hydrocarbon-cyclic group includes groups of 5-membered or 6-membered monocyclic rings or 2 to 5-condensed rings thereof having one free atomic valence and capable of delocalizing more positive charges thereon. Specific examples of the groups include a benzene ring, naphthalene ring, an anthracene ring, a phenanthrene ring, a perylene ring, a tetracene ring, a pyrene ring, a benzopyrene ring, a chrysene ring, a triphenylene ring, an acenaphthene ring, a fluorene ring and the like having one free atomic valence.

The aromatic heterocyclic group includes groups of 5-membered or 6-membered monocyclic rings or 2 to 4-condensed rings thereof having one free atomic valence and capable of delocalizing more positive charges thereon. Specific examples of the groups include a furan ring, a benzofuran ring, a thiophene ring, a benzothiophene ring, a pyrrole ring, a pyrazole ring, a triazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, an azurene ring and the like having one free atomic valence.

The alkyl group includes a straight-chain, branched-chain or cyclic alkyl group having a carbon number of generally 1 or more and generally 12 or less, preferably 6 or less. Specific examples of the group include a methyl group, an ethyl group, an n-propyl group, a 2-propyl group, an n-butyl group, an isobutyl group, a tert-butyl group, a cyclohexyl group, etc.

The alkenyl group includes those having a carbon number of generally 2 or more and generally 12 or less, preferably 6 or less. Specific examples of the group include a vinyl group, an allyl group, a 1-butenyl group, etc.

The alkynyl group includes those having a carbon number of generally 2 or more and generally 12 or less, preferably 6 or less. Specific examples of the group include an ethynyl group, a propargyl group, etc.

Not contradictory to the spirit of the present invention, $R^{12}$ is not specifically defined. The molecular weight of $R^{12}$ is generally 1000 or less, preferably 500 or less, including the substituent thereof.

Examples of $R^{12}$ include an alkyl group, an alkenyl group, an alkynyl group, an aromatic hydrocarbon-cyclic group, an aromatic heterocyclic group, an amino group, an alkoxy group, an aryloxy group, an acyl group, an alkoxycarbonyl group, an aryloxycarbonyl group, an alkylcarbonyloxy group, an alkylthio group, an arylthio group, a sulfonyl group, am alkylsulfonyl group, an arylsulfonyl group, a cyano group, a hydroxyl group, a thiol group, a silyl group, etc.

Above all, like that for $R^{11}$, from the viewpoint of large electron acceptability, preferred is an organic group having a carbon atom at the bonding site to $A^1$, and preferred examples thereof are an alkyl group, an alkenyl group, an alkynyl group, an aromatic hydrocarbon-cyclic group, and an aromatic heterocyclic group. In particular, from the viewpoint of large electron acceptability and thermal stability, more preferred are an aromatic hydrocarbon-cyclic group and an aromatic heterocyclic group.

As the alkyl group, the alkenyl group, the alkynyl group, the aromatic hydrocarbon-cyclic group and the aromatic heterocyclic group of $R^{12}$, there are mentioned the same ones as those referred to hereinabove for $R^{11}$.

The amino group includes an alkylamino group, an arylamino group, an acylamino group, etc.

The alkylamino group includes an alkylamino group having one or more alkyl groups having a carbon number of generally 1 or more and generally 12 or less, preferably 6 or less. Specific examples of the group include a methylamino group, a dimethylamino group, a diethylamino group, a dibenzylamino group, etc.

The arylamino group includes an arylamino group having one or more aromatic hydrocarbon-cyclic groups or aromatic heterocyclic groups having a carbon number of generally 3 or more, preferably 4 or more and generally 25 or less, preferably 15 or less. Specific examples of the group include a phenylamino group, a diphenylamino group, a tolylamino group, a pyridylamino group, a thienylamino group, etc.

The acylamino group includes an acylamino group having one or more acyl groups having a carbon number of generally 2 or more and generally 25 or less, preferably 15 or less. Specific examples of the group include an acetylamino group, a benzoylamino group, etc.

The alkoxy group includes an alkoxy group having a carbon number of generally 1 or more and generally 12 or less, preferably 6 or less. Specific examples of the group include a methoxy group, an ethoxy group, a butoxy group, etc.

The aryloxy group includes an aryloxy group having an aromatic hydrocarbon-cyclic group or an aromatic heterocyclic group having a carbon number of generally 3 or more, preferably 4 or more and generally 25 or less, preferably 15 or less. Specific examples of the group include a phenyloxy group, a naphthyloxy group, a pyridyloxy group, a thienyloxy group, etc.

The acyl group includes an acyl group having a carbon number of generally 1 or more and generally 25 or less, preferably 15 or less. Specific examples of the group include a formyl group, an acetyl group, a benzoyl group, etc.

The alkoxycarbonyl group includes an alkoxycarbonyl group having a carbon number of generally 2 or more and generally 10 or less, preferably 7 or less. Specific examples of the group include a methoxycarbonyl group, an ethoxycarbonyl group, etc.

The aryloxycarbonyl group includes a group having an aromatic hydrocarbon-cyclic group or an aromatic heterocyclic group having a carbon number of generally 3 or more, preferably 4 or more and generally 25 or less, preferably 15 or less. Specific examples of the group include a phenoxycarbonyl group, a pyridyloxycarbonyl group, etc.

The alkylcarbonyloxy group includes an alkylcarbonyloxy group having a carbon number of generally 2 or more and generally 10 or less, preferably 7 or less. Specific examples of the group include an acetoxy group, a trifluoroacetoxy group, etc.

The alkylthio group includes an alkylthio group having a carbon number of generally 1 or more and generally 12 or less, preferably 6 or less. Specific examples of the group include a methylthio group, an ethylthio group, etc.

The arylthio group includes an arylthio group having a carbon number of generally 3 or more, preferably 4 or more and generally 25 or less, preferably 14 or less. Specific examples of the group include a phenylthio group, a naphthylthio group, a pyridylthio group, etc.

Specific examples of the alkylsulfonyl group and the arylsulfonyl group include a mesyl group, a tosyl group, etc.

Specific examples of the sulfonyloxy group include a mesyloxy group, a tosyloxy group, etc.

Specific examples of the silyl group include a trimethylsilyl group, a triphenylsilyl group, etc.

Not contradictory to the spirit of the present invention, the groups exemplified for $R^{11}$ and $R^{12}$ hereinabove may be further substituted with any other substituent. The type of the substituent is not specifically defined. As examples of the substituent, there are mentioned those exemplified for $R^{11}$ and $R^{12}$ hereinabove, and additionally a halogen atom, a cyano group, a thiocyano group, a nitro group, etc. Above all, from the viewpoint that the substituent does not interfere with the heat resistance and the electron acceptability of the ionic compounds (electron accepting compounds), preferred are an alkyl group, an alkenyl group, an alkynyl group, an alkoxy group, an aryloxy group, an aromatic hydrocarbon-cyclic group, and an aromatic heterocyclic group.

In the formula (I-1), $A^1$ is preferably an element belonging to Group 17 of the Periodic Table, and from the viewpoint of the electron acceptability and the availability of the compound, more preferred are an element of or before the 5th Period (from the 3rd Period to the 5th Period) of the Periodic Table. Specifically, $A^1$ is preferably any one of an iodine atom, a bromine atom or a chlorine atom.

In particular, from the viewpoint of the electron acceptability and the stability of thereof, preferred are ionic compounds of the formula (I-1) where $A^1$ is a bromine atom or an iodine atom, and most preferred are those having an iodine atom.

In the formula (I-1), $Z_1^{n1-}$ represents a counter anion. The type of the counter anion is not specifically defined. The counter anion may be a monoatomic ion or a complex ion. However, when the size of the counter anion is larger, then negative charges may be delocalized more, and with that, positive charges may also be delocalized more to increase the electron acceptability of the compound. For these reasons, for the counter anion, a complex ion is preferred to a monoatomic ion.

$n_1$ indicates a positive integer corresponding to the ionic valence of the counter anion $Z_1^{n1-}$. The value of $n_1$ is not specifically defined, but is preferably 1 or 2, most preferably 1.

Specific examples of $Z_1^{n1-}$ include a hydroxide ion, a fluoride ion, a chloride ion, a bromide ion, an iodide ion, a cyanide ion, a nitrate ion, a nitrite ion, a sulfate ion, a sulfite ion, a perchlorate ion, a perborate ion, a periodate ion, a chlorate ion, a chlorite ion, a hypochlorite ion, a phosphate ion, a phosphite ion, a hypophosphite ion, a borate ion, an isocyanate ion, a hydrogen sulfide ion, a tetrafluoroborate ion, a hexafluorophosphate ion, a hexachloroantimonate ion; a carboxylate ion such as an acetate ion, a trifluoroacetate ion, a benzoate ion, etc.; a sulfonate ion such as a methanesulfonate ion, a trifluoromethanesulfonate ion, etc.; an alkoxy ion such as a methoxy ion, a t-butoxy ion, etc. Preferred are a tetrafluoroborate ion and a hexafluoroborate ion.

As the counter anion $Z_1^{n1-}$, especially preferred is a complex ion represented by the following formula (I-2), from the viewpoint of the stability of the compound, the solubility in solvent thereof, and the large size thereof. The advantages of the counter anion of the type are that negative charges can be readily delocalized, and with that, positive charges can also be delocalized with ease to increase the electron acceptability of the compound.

[Chem. 28]

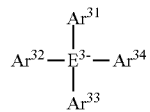

(I-2)

In the formula (I-2), $E^3$ represents an element belonging to Group 13 of the Long Periodic Table. Above all, preferred are a boron atom, an aluminium atom and a gallium atom. From the viewpoint of the stability of the compound and of the easiness in synthesizing and purifying the compound, preferred is a boron atom.

In the formula (I-2), $A^{31}$ to $Ar^{34}$ each independently represent an aromatic hydrocarbon-cyclic group or an aromatic heterocyclic group. Examples of the aromatic hydrocarbon-cyclic group and the aromatic heterocyclic group are the same as those exemplified hereinabove for $R^{11}$, including 5-membered or 6-membered monocyclic rings and 2- to 4-condensed rings thereof having one free atomic valence. Above all, from the viewpoint of the stability and the heat resistance of the compound, preferred are a benzene ring, a naphthalene ring, a pyridine ring, a pyrazine ring, a pyridazine ring, a pyrimidine ring, a triazine ring, a quinoline ring and an isoquinoline ring having one free atomic valence.

Not contradictory to the spirit of the present invention, the aromatic hydrocarbon-cyclic group and the aromatic heterocyclic group exemplified for $Ar^{31}$ to $Ar^{34}$ may be further substituted with any other substituent. The type of the substituent is not specifically defined, and any substituent is applicable here, but an electron attracting group is preferred.

Examples of the electron attracting group preferred as the substituent that $Ar^{31}$ to $Ar^{34}$ may have include a halogen atom such as a fluorine atom, a chlorine atom, a bromine atom, etc.; a cyano group; a thiocyano group; a nitro group; an alkylsulfonyl group such as a mesyl group, etc.; an arylsulfonyl group such as a tosyl group, etc.; an acyl group having a carbon number of generally 1 or more and generally 12 or less, preferably 6 or less, such as a formyl group, an acetyl group, a benzoyl group, etc.; an alkoxycarbonyl group having a carbon number of generally 2 or more and generally 10 or less, preferably 7 or less, such as a methoxycarbonyl group, an ethoxycarbonyl group, etc.; an aryloxycarbonyl group having an aromatic hydrocarbon-cyclic group or an aromatic heterocyclic group and having a carbon number of generally 3 or more, preferably 4 or more and generally 25 or less, preferably 15 or less, such as a phenoxycarbonyl group, a pyridyloxycarbonyl group, etc.; an aminocarbonyl group; an aminosulfonyl group; a haloalkyl group that comprises a straight-chain, branched-chain or cyclic alkyl group having a carbon number of generally 1 or more and generally 10 or less, preferably 6 or less and substituted with a halogen atom such as a fluorine atom, a chlorine atom or the like, such as a trifluoromethyl group, a pentafluoroethyl group, etc.

Above all, it is more desirable that at least one group of $Ar^{31}$ to $Ar^{34}$ has one or more substituents of a fluorine atom or a chlorine atom. In particular, from the viewpoint of efficiently delocalizing negative charges and having suitable sublimation capability, it is most preferable that all hydrogen atoms of $Ar^{31}$ to $Ar^{34}$ are substituted with fluorine atoms to give a perfluoroaryl group. Specific examples of the perfluoroaryl group include a pentafluorophenyl group, a heptafluoro-2-naphthyl group, a tetrafluoro-4-pyridyl group, etc.

The molecular weight of the electron accepting compound in the present invention is generally from 100 to 5000, preferably from 300 to 3000, more preferably from 400 to 2000.

Falling within the above range is preferred since positive charges and negative charges could be fully delocalized, and the electron accepting ability of the compound is good and the compound hardly interferes with charge transportation.

Preferred examples of the electron accepting compound for use in the present invention are shown below, however, the present invention is not restricted to these.

TABLE 1

$$(R^{11}-A^{1+}-R^{12})_{n_1} \quad Z_1^{n-}\quad\quad (I\text{-}1)$$

| Number | $A^1$ | $-R^{11}$ | $-R^{12}$ | $Z^{n-}$ |
|---|---|---|---|---|
| A-1 | I | –C$_6$H$_4$–CH$_3$ | –C$_6$H$_4$–CH(CH$_3$)$_2$ | [B(C$_6$F$_5$)$_4$]$^-$ |
| A-2 | I | –C$_6$H$_5$ | –C$_6$H$_5$ | [B(C$_6$H$_5$)$_4$]$^-$ |
| A-3 | I | –C$_6$H$_4$–CH$_3$ | –C$_6$H$_4$–CH(CH$_3$)$_2$ | [(C$_6$F$_5$)$_3$B–C$_6$F$_4$–B(C$_6$F$_5$)$_3$]$^{2-}$ |

TABLE 1-continued $$(R^{11}-A^{1+}-R^{12})_{n_1} \quad Z_1^{n_1-} \quad (I-1)$$

| Number | A¹ | —R¹¹ | —R¹² | Z$^{n-}$ |
|---|---|---|---|---|
| A-4 | I | —C₆H₄—CH₃ (p-tolyl) | —C₆H₄—CH(CH₃)₂ (p-isopropylphenyl) | [Ga(C₆F₅)₄]⁻ |
| A-5 | I | —C₆H₅ | —C₆H₅ | PF₆⁻ |
| A-6 | I | —C₆H₅ | —C₆H₅ | SbF₆⁻ |
| A-7 | I | —C₆H₄—CH(CH₃)₂ | —C₆H₄—CH(CH₃)₂ | BF₄⁻ |
| A-8 | I | —C₆H₄—CH₃ | —(1-naphthyl) | ClO₄⁻ |
| A-9 | I | —C₆H₅ | —C₆H₅ | I⁻ |
| A-10 | I | —C₆H₅ | —C₆H₅ | CF₃SO₃⁻ |
| A-11 | I | —C₆H₄—CH₂CH₃ | —C₆H₄—CH₂CH₃ | CH₃CO₂⁻ |
| A-12 | I | —(2-naphthyl) | —C₆H₅ | AsF₆⁻ |

TABLE 1-continued $$(R^{11}-A^{1+}-R^{12})_{n_1} \quad Z_1^{n-} \quad (I\text{-}1)$$

| Number | $A^1$ | $-R^{11}$ | $-R^{12}$ | $Z^{n-}$ |
|---|---|---|---|---|
| A-13 | I | 4-methyl-2-isopropyl-anisyl | 4-methyl-2-isopropyl-anisyl | $BF_4^-$ |
| A-14 | I | 4-(2-methyl-2-propyl)phenyl | 4-(2-methyl-2-propyl)phenyl | tetrakis(4-fluorophenyl)borate |

TABLE 2

| Number | $A^1$ | $-R^{11}$ | $-R^{12}$ | $Z^{n-}$ |
|---|---|---|---|---|
| A-15 | I | 2,3-dimethylphenyl | 2,3-dimethylphenyl | $NO_3^-$ |
| A-16 | I | 3-methylpyridyl | 4-methylphenyl | $CH_3O-SO_3^-$ |
| A-17 | I | 2,3,4,6-tetramethylpyridyl | 2,3,4,6-tetramethylpyridyl | $PF_6^-$ |
| A-18 | I | 2-methylthienyl | 2-methylthienyl | benzoate |

TABLE 2-continued

| Number | A¹ | —R¹¹ | —R¹² | $Z^{n-}$ |
|---|---|---|---|---|
| A-19 | I | —C₆H₄—OCH₃ (para) | —C₆H₄—OCH₃ (para) | [B(C₆F₅)₄]⁻ |
| A-20 | I | —C₆H₄—Cl (para) | —C₆H₄—Cl (para) | $GaF_4^-$ |
| A-21 | I | —C₆H₅ | —C₆H₄—F (para) | $IO_3^-$ |
| A-22 | I | —C₆H₅ | 2-quinolinyl | $Cl^-$ |
| A-23 | I | —C₆H₄—CH₃ (meta) | —C₆H₄—NO₂ (para) | $Br^-$ |
| A-24 | I | 2-naphthyl | 2-naphthyl | $PF_6^-$ |
| A-25 | I | 3-methoxyphenyl | —C₆H₅ | $CF_3CO_2^-$ |
| A-26 | I | —C₆H₄—C(=O)CH₃ (para) | —C₆H₅ | $F^-$ |
| A-27 | I | —C₆H₄—C(CH₃)₂—C₆H₅ (para) | —C₆H₄—C(CH₃)₂—C₆H₅ (para) | $SO_4^{2-}$ |
| A-28 | I | 4-pyridyl | 4-pyridyl | $NO_3^-$ |

TABLE 2-continued

| Number | A¹ | —R¹¹ | —R¹² | Z$^{n-}$ |
|---|---|---|---|---|
| A-29 | I | 2,6-bis(CH₂CH₂-)methylphenyl (cyclic) | phenyl | BF$_4^-$ |
| A-30 | I | 4-bromo-2-methylthiophen-5-yl | 4-bromo-2-methylthiophen-5-yl | ClO$_4^-$ |
| A-31 | I | phenanthren-9-yl | 4-methylphenyl | [Ga(C$_6$F$_5$)$_4$]$^-$ |

TABLE 3

| Number | A¹ | —R¹¹ | —R¹² | Z$^{n-}$ |
|---|---|---|---|---|
| A-32 | I | 4-isopropylphenyl | 4-isopropylphenyl | NO$_3^-$ |
| A-33 | I | phenyl | pentafluorophenyl | PF$_6^-$ |
| A-34 | I | 4-methylphenyl | 4-methylphenyl | Cl$^-$ |
| A-35 | I | 4-(trimethylsilyl)phenyl | 4-(trimethylsilyl)phenyl | CF$_3$CF$_2$SO$_3^-$ |
| A-36 | I | 4-biphenylyl | 4-biphenylyl | C$_6$H$_5$SO$_3^-$ |

TABLE 3-continued
| Number | A¹ | —R¹¹ | —R¹² | Z$^{n-}$ |
|---|---|---|---|---|
| A-37 | I | —CH₃ | 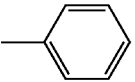 | 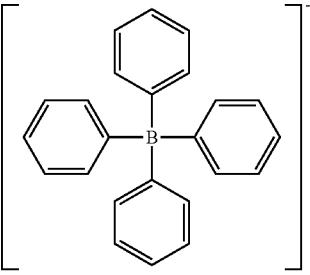 |
| A-38 | I | 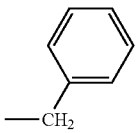 | 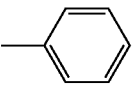 | NO₃⁻ |
| A-39 | I |  | —CH=CH₂ | ClO₄⁻ |
| A-40 | I |  | —CH₂—C≡CH | 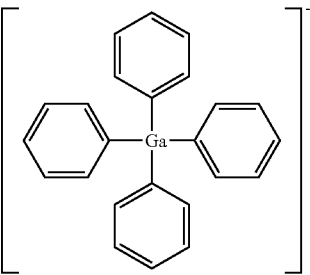 |
| A-41 | I |  |  | PF₆⁻ |
| A-42 | I | —CF₂CF₃ | 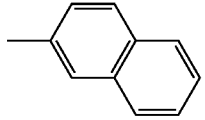 | 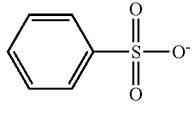 |
| A-43 | I | 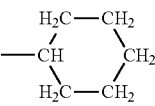 | 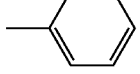 | I⁻ |
| A-44 | I | —CF₃ | 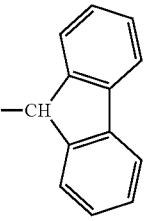 | BF₄⁻ |
| A-45 | I | 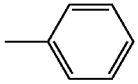 | —CF₂CF₂CF₃ | CF₃SO₃⁻ |

TABLE 3-continued
| Number | A¹ | —R¹¹ | —R¹² | Z^{n−} |
|---|---|---|---|---|
| A-46 | I | 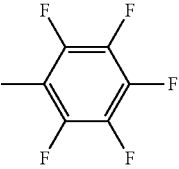 | —CF₃ | GaF₄⁻ |
| A-47 | I | 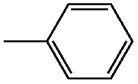 | —CF₂CF₂CF₂CF₂CF₂CF₃ | 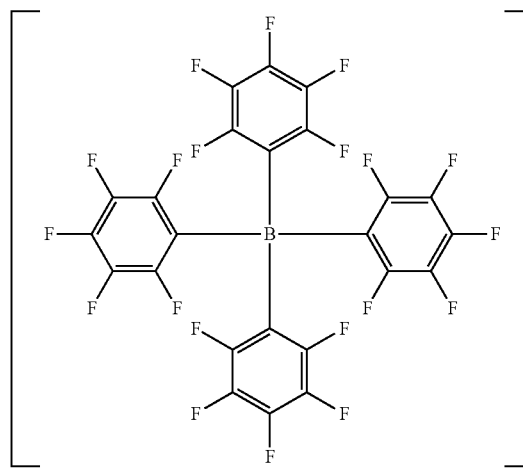 |
| A-48 | I | 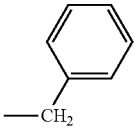 | —CH₃ | Br⁻ |
TABLE 4
| Number | A¹ | —R¹¹ | —R¹² | Z^{n−} |
|---|---|---|---|---|
| A-49 | I | 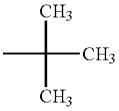 | 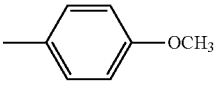 | BrO₄⁻ |
| A-50 | I | —CH₂CH₃ | 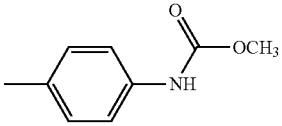 | NO₂⁻ |
| A-51 | I | 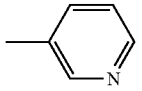 | 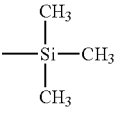 | CF₃SO₃⁻ |
| A-52 | I | —CH₂—CH=CH₂ | 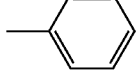 | PO₄³⁻ |
| A-53 | I | —CH₂—O—CH₃ | 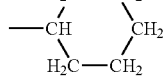 | OH⁻ |

TABLE 4-continued
| Number | A¹ | —R¹¹ | —R¹² | Z$^{n-}$ |
|---|---|---|---|---|
| A-54 | I | 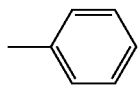 | 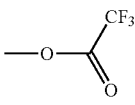 | CF$_3$CO$_2^-$ |
| A-55 | I | 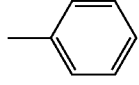 | 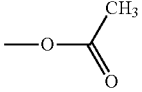 | CH$_3$CO$_2^-$ |
| A-56 | I | 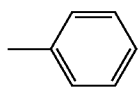 | —OH | 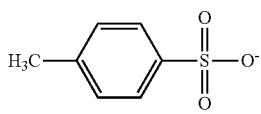 |
| A-57 | I | —OCH$_2$CH$_3$ | 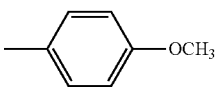 | BF$_4^-$ |
| A-58 | I | 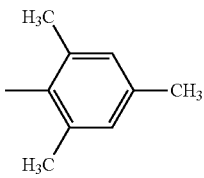 | 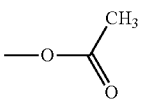 | PF$_6^-$ |
| A-59 | I | 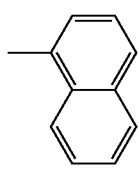 | —OH | OH$^-$ |
| A-60 | I | 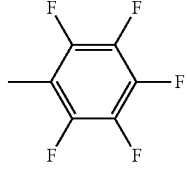 | 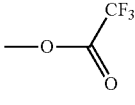 | CF$_3$CO$_2^-$ |
| A-61 | I | 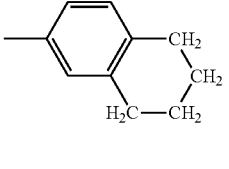 | 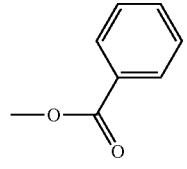 | NO$_3^-$ |
| A-62 | I | 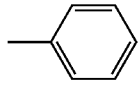 | 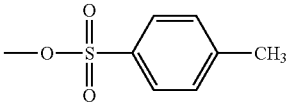 | 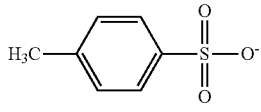 |
| A-63 | I | —CH$_2$CH$_3$ | 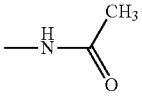 | SbF$_6^-$ |
| A-64 | I | 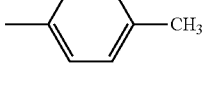 | —OCH$_3$ | 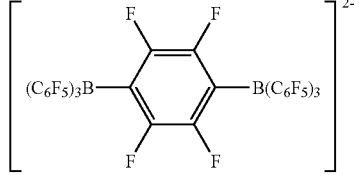 |

TABLE 4-continued

| Number | A¹ | —R¹¹ | —R¹² | $Z^{n-}$ |
|---|---|---|---|---|
| A-65 | Br | phenyl | phenyl | $BF_4^-$ |
| A-66 | Br | 4-tert-butylphenyl | 4-tert-butylphenyl | $PF_6^-$ |
| A-67 | Br | 3-methylphenyl | 4-pyridyl | $Br^-$ |
| A-68 | Br | 4-(phenylthio)phenyl | phenyl | $CF_3CF_2SO_3^-$ |

TABLE 5

| Number | A¹ | —R¹¹ | —R¹² | $Z^{n-}$ |
|---|---|---|---|---|
| A-69 | Br | 4-isopropoxyphenyl | 4-isopropoxyphenyl | tetrakis(4-fluorophenyl)borate |
| A-70 | Br | 2-(1-methylethyl)-4-methoxyphenyl | cyclopentyl | $ClO_4^-$ |
| A-71 | Br | phenyl | —CH₂—CH=CH—CH₃ | $GaF_4^-$ |
| A-72 | Br | 3-pyridyl | —CF₂CF₂CF₃ | $SO_4^{2-}$ |
| A-73 | Br | phenyl | —O—C(=O)—CF₃ | $CF_3CO_2^-$ |

TABLE 5-continued

| | | | | |
|---|---|---|---|---|
| A-74 | Br | —CH=CH$_2$ | —O—C(CH$_3$)$_3$ | C$_6$H$_5$COO$^-$ |
| A-75 | Cl | phenyl | phenyl | PF$_6^-$ |
| A-76 | Cl | —CH$_2$CH$_3$ | pentafluorophenyl | Cl$^-$ |
| A-77 | Cl | phenyl | 4-methylphenyl | CF$_3$CO$_2^-$ |

$$(R^{11}\text{—}A^{1+}\text{—}R^{12})_{n_1} \ Z_1^{n-} \quad (I\text{-}1)$$

| Number | R$^{11}$—A$^{1+}$—R$^{12}$ | Z$^{n-}$ |
|---|---|---|
| A-78 | [dibenzoiodolium]$^+$ | SO$_4^{2-}$ |
| A-79 | [dibenzoiodolium]$^+$ | [B(C$_6$F$_5$)$_4$]$^-$ |
| A-80 | [dibenzobromolium]$^+$ | BF$_4^-$ |
| A-81 | [2,7-dimethyldibenzoiodolium]$^+$ | PF$_6^-$ |

TABLE 5-continued

| A-82 | 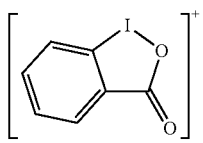 | $CF_3CO_2^-$ |
| A-83 | 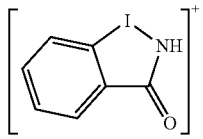 | 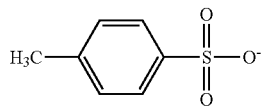 |

The composition for organic electroluminescent elements of the present invention may contain one alone or two or more different types of the above-mentioned electron accepting compounds either singly or as combined in any desired manner and in any desired ratio.

In case where the composition for organic electroluminescent elements of the present invention contains an electron accepting compound, the content of the electron accepting compound in the composition for organic electroluminescent elements of the present invention is generally 0.0005% by weight or more, preferably 0.001% by weight or more and generally 20% by weight or less, preferably 10% by weight or less. The ratio of the electron accepting compound to the polymer of the invention in the composition for organic electroluminescent elements of the present invention is generally 0.5% by weight or more, preferably 1% by weight or more, more preferably 3% by weight or more and generally 80% by weight or less, preferably 60% by weight or less, more preferably 40% by weight or less.

When the content of the electron accepting compound in the composition for organic electroluminescent elements of the present invention is not less than the above-mentioned lower limit, then it is favorable since the electron accepting compound can accept electrons from the polymer and the resistance of the formed organic layer could be lowered. The content not more than the upper limit is also favorable since defects may hardly form in the formed organic layer and since there may hardly occur film thickness unevenness.

<Cationic Radical Compound>

The composition for organic electroluminescent elements of the present invention may further contain a cationic radical compound.

The cationic radical compound is preferably an ionic compound that comprises a cationic radical of a chemical species derived from a hole transporting compound by removing one electron from the compound, and a counter anion thereto. However, in case where the cationic radical is derived from a hole transporting polymer compound, the cationic radical shall have a structure derived from the polymer compound by removing one electron from the repeating unit of the compound.

The cationic radical is preferably a chemical species derived from the compound described hereinabove as a hole transporting compound, by removing one electron from the compound. More preferred is a chemical species derived from the preferred hole transporting compound by removing one electron from the compound, from the viewpoint of the amorphous morphology, the visible light transmittance, the heat resistance and the solubility of the compound.

Here, the cationic radical compound can be formed by mixing the above-mentioned hole transporting compound and the above-mentioned electron accepting compound. Specifically, by mixing the above-mentioned hole transporting compound and the above-mentioned electron accepting compound, there occurs electron transfer from the hole transporting compound to the electron accepting compound to produce a cationic ionic compound that comprises the cation radical of the hole transporting compound and the counter anion thereto.

In case where the composition for organic electroluminescent elements of the present invention contains a cationic radical compound, the content of the cationic radical compound in the composition for organic electroluminescent elements of the present invention is generally 0.0005% by weight or more, preferably 0.001% by weight or more, and is generally 40% by weight or less, preferably 20% by weight or less. The content of the cationic radical compound not less than the above-mentioned lower limit is preferred since the resistance of the formed organic layer could be reduced; and the content of not more than the upper limit is also preferred since defects may hardly form in the formed organic layer and since there may hardly occur film thickness unevenness.

In addition to the above-mentioned components, the composition for organic electroluminescent elements of the present invention may contain any other additional components that may be contained in the hole injection layer forming composition or the hole transport layer forming composition to be mentioned below, in the amount thereof also to be mentioned below.

[Organic Electroluminescent Element]

The organic electroluminescent element of the present invention has, as formed on the support thereof, an anode and a cathode, and, between the anode and the cathode, an organic layer, in which the organic layer contains a layer formed using the composition for organic electroluminescent elements of the present invention that contains the polymer of the invention, according to a wet film formation method.

In the organic electroluminescent element of the present invention, the layer formed according to a wet film formation method is preferably at least one of a hole injection layer and a hole transport layer, and in particular, it is desirable that the organic layer comprises a hole injection layer, a hole transport layer and a light-emitting layer, and preferably, these hole injection layer hole transport layer and light-emitting layer are formed according to a wet film formation method.

The wet film formation method as referred to in the present invention means a method of film formation that employs, as a coating system, a method of forming a film in a wet mode according to, for example, a spin coating method, a dip coating method, a die coating method, a bar coating method, a blade coating method, a roll coating method, a spray coating method, a capillary coating method, an inkjet method, a nozzle printing method, a screen printing method, a gravure printing method, a flexographic printing method or the like, in which the coating film is dried for film formation. Of those film formation methods, preferred are a spin coating method, a spray coating method, an inkjet method, a nozzle printing method, etc.

One example of the embodiment of the layer configuration of the organic electroluminescent element of the present invention and a typical formation method for the element are described below with reference to FIG. 1.

FIG. 1 is a schematic view of a cross section that shows a configuration example of an organic electroluminescent element 10 of the present invention. In FIG. 1, 1 is a substrate, 2 is an anode, 3 is a hole injection layer, 4 is a hole transport layer, 5 is a light-emitting layer, 6 is a hole block layer, 7 is an electron transport layer, 8 is an electron injection layer, 9 is a cathode.

{Substrate}

The substrate 1 is to be a support of the organic electroluminescent element. As the substrate 1, in general, usable are plates of quartz or glass, metal plates, metal foils, plastic films, sheets, etc. Of those, preferred are glass plates, and transparent synthetic resin plates of polyester, polymethacrylate, polycarbonate, polysulfone, etc. It is desirable that the substrate is formed of a material having high gas barrier performance as capable of protecting the organic electroluminescent element from being deteriorated by air. Consequently, in case where a material having low gas barrier performance such as a synthetic resin-made substrate or the like is used, it is desirable that a dense silicon oxide film or the like is provided on at least one side of the substrate to enhance the gas barrier performance of the substrate.

{Anode}

The anode 2 carries the function of injecting holes into the layer on the side of the light-emitting layer 5.

The anode 2 is typically formed of a metal such as aluminium, gold, silver, nickel, palladium, platinum, etc.; a metal oxide such as an oxide of indium and/or tin, etc.; a metal halide such as copper iodide, etc.; carbon black; a conductive polymer such as poly(3-methylthiophene), polypyrrole, polyaniline, etc.

In many cases, the anode 2 is formed typically according to a sputtering method, a vacuum evaporation method or the like. In case where the anode is formed of metal fine particles of silver or the like, other fine particles of copper iodide or the like, carbon black, conductive metal oxide fine particles, conductive polymer fine powders or the like, these fine particles may be dispersed in a suitable binder resin solution and then applied onto the substrate 1 to form the anode thereon. Further, when a conductive polymer is used, a thin film may be directly formed on the substrate through electrolytic polymerization. In addition, a conductive polymer may be applied onto the substrate to form the anode thereon (Appl. Phys. Lett., Vol. 60, p. 2711, 1992).

The anode 2 typically has a single-layer structure, but if desired, may have a laminate structure. In case where the anode 2 has a laminate structure, a layer of a different conductive material may be laminated on the first layer anode.

The thickness of the anode 2 may be suitably selected depending on the necessary transparency and the material thereof. In case where the element is required to be especially highly transparent, it is desirable that the visible light transmittance thereof is generally 60% or more, preferably 80% or more. In this case, it is desirable that the thickness of the anode 2 is generally 5 nm or more, preferably 10 nm or more, and is generally 1000 nm or less, preferably 500 nm or less. In case where the element may be nontransparent, the thickness of the anode 2 may be any desired one depending on the necessary thickness, etc. In this case, the thickness of the anode 2 may be the same as that of the substrate.

In case where any other layer is formed on the surface of the anode 2, it is desirable that, before film formation thereon, the surface of the anode is treated with UV ray/ozone, oxygen plasma, argon plasma or the like to remove impurities from the surface of the anode 2 and to control the ionization potential of the layer to thereby improve the hole injection performance thereof.

{Hole Injection Layer}

The layer that carries the function of transporting holes from the side of the anode 2 to the side of the light-emitting layer 5 is generally referred to as a hole injection layer or hole transport layer. In case where the element has two or more layers each carrying the function of transporting holes from the side of the anode 2 to the side of the light-emitting layer 5, the layer nearer to the anode side may be referred to as the hole injection layer 3. Forming the hole injection layer 3 is preferred from the viewpoint of enhancing the function of transporting holes from the anode 2 to the side of the light-emitting layer 5. In case where the hole injection layer 3 is formed, in general, the hole injection layer 3 is formed on the anode 2.

The thickness of the hole injection layer 3 is generally 1 nm or more, preferably 5 nm or more, and is generally 1000 nm or less, preferably 500 nm or less.

For forming the hole injection layer, employable is any of a vacuum evaporation method or a wet film formation method. Preferred is a set film formation method as excellent in film formability.

Preferably, the hole injection layer 3 contains a hole transporting compound, more preferably contains both a hole transporting compound and an electron accepting compound. Further, the hole injection layer preferably contains a cationic radical compound, and more preferably contains both a cationic radical compound and a hole transporting compound.

A general method for forming the hole injection layer is described below. In the organic electroluminescent element of the present invention, it is desirable that the hole injection layer is formed according to a wet film formation method using the composition for organic electroluminescent elements of the present invention.

<Hole Transporting Compound>

The hole injection layer forming composition generally contains a hole transporting compound to be the hole injection layer 3. In the case of a wet film formation method, in general, the composition additionally contains a solvent. It is desirable that the hole injection layer forming composition has a high hole transporting ability and can efficiently transport the holes injected thereinto. Consequently, it is desirable that the composition has a large hole mobility and has few impurities to be traps during production and during use. In addition, it is also desirable that the composition is excellent in stability, has a small ionization potential and has high transparency to visible light. In particular, in case where the hole injection layer is adjacent to the light-emitting layer in the element, it is desirable that the hole injection does not quench the light emitted by the light-emitting layer and does not form an exciplex with the light-emitting layer to lower the luminescent efficiency of the element.

As the hole transporting material, preferred is a compound having an ionization potential of from 4.5 eV to 6.0 eV, from the viewpoint of the charge injection barrier from the anode to the hole injection layer. Examples of the hole transporting material include aromatic amine compounds, phthalocyanine compounds, porphyrin compounds, oligothiophene compounds, polythiophene compounds, benzylphenyl compounds, compounds with a tertiary amine bonded via a fluorene group, hydrazine compounds, silazane compounds, quinacridone compounds, etc.

Of the above-exemplified compounds, preferred are aromatic amine compounds from the viewpoint of the non-crystallinity and the visible light transmittance thereof, and more preferred are aromatic tertiary amine compounds. Here, the aromatic tertiary amine compounds are compounds having an aromatic tertiary amine structure and include compounds having an aromatic tertiary amine-derived group.

The aromatic tertiary amine compounds are not specifically defined in point of the type thereof, but from the viewpoint of uniform light emission owing to the surface-smoothing effect thereof, more preferred are polymer compounds having a weight-average molecular weight of 1000 or more and 1000000 or less (polymerization-type compounds with continuing repeating units). As preferred examples of the aromatic tertiary amine polymer compound, mentioned are polymer compounds having a repeating unit represented by the following formula (I).

[Chem. 29]

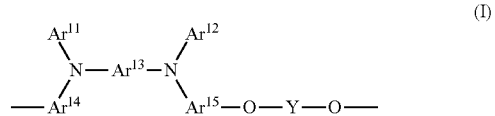

(In the formula (I), $Ar^{11}$ and $Ar^{12}$ each independently represent an aromatic hydrocarbon-cyclic group optionally having a substituent, or an aromatic heterocyclic group optionally having a substituent. $Ar^{13}$ to $Ar^{15}$ each independently represent an aromatic hydrocarbon-cyclic group optionally having a substituent, or an aromatic heterocyclic group optionally having a substituent. Y represents a linking group selected from the following linking groups. Of $Ar^{11}$ to $Ar^{15}$, two groups bonding to the same N atom may bond to each other to form a ring.)

[Chem. 30]

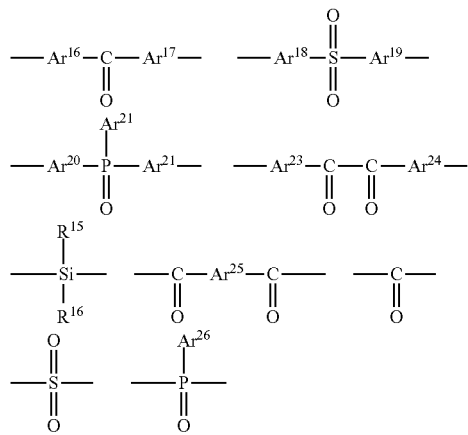

(In the above formulae, $Ar^{16}$ to $Ar^{26}$ each independently represent an aromatic hydrocarbon-cyclic group optionally having a substituent, or an aromatic heterocyclic group optionally having a substituent. $R^{15}$ and $R^{16}$ each independently represent a hydrogen atom or a substituent.)

As the aromatic hydrocarbon-cyclic group for $Ar^{16}$ to $Ar^{26}$, preferred are groups derived from a benzene ring, a naphthalene ring, a phenanthrene ring, a thiophene ring or a pyridine ring having one or two free atomic valences, from the viewpoint of the solubility, heat resistance and hole injection/transport capability of the polymer compounds; and more preferred are those derived from a benzene ring or a naphthalene ring having one or two free atomic valences.

As specific examples of the aromatic tertiary amine polymer compound having the repeating unit represented by the formula (I), mentioned here are those described in WO2005/089024.

Preferably, the hole injection layer 3 contains the above-mentioned electron accepting compound and the above-mentioned cationic radical compound as capable of improving the electroconductivity of the hole injection layer through oxidation of the hole transporting compound therein.

A cationic radical compound derived from a polymer compound, such as PEDOT/PSS (Adv. Mater., 2000, Vol. 12, p. 481) and emeraldine hydrochloride (J. Phys. Chem., 1990, Vol. 94, p. 7716), etc., may also be formed through oxidation polymerization (dehydrogenation polymerization).

Here, oxidation polymerization is to chemically or electrochemically oxidize a monomer in an acid solution using peroxodisulfate or the like. In the case of oxidation polymerization (dehydrogenation polymerization), a monomer is polymerized through oxidation and a cationic radical is formed by removing one electron from the repeating unit of the polymer, taking the acid solution-derived anion as the counter anion.

<Formation of Hole Injection Layer According to Wet Film Formation Method>

In case where the hole injection layer 3 is formed according to a wet film formation method, in general, the material to be the hole injection layer is mixed with a solvent capable of dissolving it (hole injection layer solvent) to prepare a composition for film formation (hole injection layer-forming composition), and the hole injection layer-forming composition is applied onto the layer corresponding to the underlayer to be below the hole injection layer (in general, anode) for film formation thereon, and dried to form the intended film.

The concentration of the hole transporting compound in the hole injection layer-forming composition may be any arbitrary one, not significantly detracting from the advantageous effects of the present invention. From the viewpoint of the uniformity of the film, the concentration is preferably lower. On the other hand, however, from the viewpoint of hardly forming defects in the hole injection layer, the concentration is preferably higher. Concretely, the concentration is preferably 0.01% by weight or more, more preferably 0.1% by weight or more, even more preferably 0.5% by weight or more. On the other hand, the concentration is preferably 70% by weight or less, more preferably 60% by weight or less, even more preferably 50% by weight or less.

As the solvent, for example, there are mentioned ether solvents, ester solvents, aromatic hydrocarbon solvents, amide solvents, etc.

The ether solvents include, for example, aliphatic ethers such as ethylene glycol dimethyl ether, ethylene glycol diethyl ether, propylene glycol 1-monomethyl ether acetate (PGMEA), etc.; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, etc.

The ester solvents include, for example, aromatic esters such as phenyl acetate, phenyl propionate, methyl benzoate, ethyl benzoate, propyl benzoate, n-butyl benzoate, etc.

The aromatic hydrocarbon solvents include, for example, toluene, xylene, cyclohexylbenzene, 3-isopropylbiphenyl, 1,2,3,4-tetramethylbenzene, 1,4-diisopropylbenzene, cyclohexylbenzene, methylnaphthalene, etc. The amide solvents include, for example, N,N-dimethylformamide, N,N-dimethylacetamide, etc.

In addition, dimethyl sulfoxide or the like is also usable here.

For formation of the hole injection layer 3 according to a wet film formation method, in general, the hole injection layer-forming composition is prepared, then this is applied onto the layer corresponding to the underlayer to be below the hole injection layer 3 (in general, anode 2) for film formation thereon, and dried to form the intended film.

For the hole injection layer 3, in general, the coating film is, after film formation, dried by heating or by reduced-pressure drying or the like.

<Formation of Hole Injection Layer According to Vacuum Evaporation Method>

According to a vacuum evaporation method, in general, the hole transport layer 3 may be formed as follows. One or more of the constitutive materials of the hole injection layer 3 (the above-mentioned hole transporting material, electron accepting material, etc.) are put into the crucible arranged in a vacuum container (when two or more materials are used, in general, they are put in individual crucibles), and then the vacuum container is degassed to $10^{-4}$ Pa or so via a suitable vacuum pump. Subsequently, the crucible is heated so that the material is evaporated (when two or more materials are used, in general, the individual crucibles are heated) while the evaporation rate of the material in the crucible is controlled (when two or more materials are used, in general, the evaporation rate of each material is independently controlled) to thereby form the hole injection layer on the anode on the substrate arranged opposite to the crucible. When two or more materials are used, a mixture thereof may be put in a crucible, heated and evaporated to form the hole injection layer.

Not markedly detracting from the advantageous effects of the present invention, the vacuum degree in evaporation is not specifically defined. The vacuum degree in evaporation is typically $0.1 \times 10^{-6}$ Torr ($0.13 \times 10^{-4}$ Pa) or more and $9.0 \times 10^{-6}$ Torr ($12.0 \times 10^{-4}$ Pa) or less. Not markedly detracting from the advantageous effects of the present invention, the evaporation rate is not specifically defined. In general, the evaporation rate is 0.1 angstrom/sec or more and is 5.0 angstrom/sec or less. Also not markedly detracting from the advantageous effects of the present invention, the film formation temperature in evaporation is not specifically defined. The film formation temperature in evaporation is preferably 10° C. or higher and is 50° C. or lower.

The hole injection layer 3 may be crosslinked, like the hole transport layer 4 to be mentioned hereinunder.

{Hole Transport Layer}

The hole transport layer 4 is a layer that carries the function of transporting holes from the side of the anode 2 to the side of the light-emitting layer 5. The hole transport layer 4 is not an indispensable layer in the organic electroluminescent element of the present invention, however, from the viewpoint of enhancing the function of transporting holes from the anode 2 to the light-emitting layer 5, the layer is preferably provided in the element. In case where the hole transport layer 4 is formed, in general, the hole transport layer 4 is formed between the anode 2 and the light-emitting layer 5. In case where the element has the above-mentioned hole injection layer 3, the hole transport layer may be formed between the hole injection layer 3 and the light-emitting layer 5.

The thickness of the hole transport layer 4 is generally 5 nm or more, preferably 10 nm or more, and is, on the other hand, generally 300 nm or less, preferably 100 nm or less.

For forming the hole transport layer 4, employable is any of a vacuum evaporation method or a wet film formation method. Preferably, the layer is formed according to a wet film formation method since the method is excellent in film formality.

A general method for forming a hole transport layer is described below. Preferably, in the organic electroluminescent element of the present invention, the hole transport layer is formed according to a wet film formation method using the composition for organic electroluminescent elements of the present invention.

The hole transport layer 4 generally contains a hole transporting compound. As the hole transporting compound to be contained in the hole transport layer 4, especially mentioned are aromatic diamines having two or more tertiary amines and having two or more condensed aromatic rings on the nitrogen atoms therein, such as typically 4,4'-bis[N-(1-naphthyl)-N-phenylamino]biphenyl (JP-A H5-234681); aromatic amine compounds having a starburst structure such as 4,4',4"-tris(1-naphthylphenylamino)triphenylamine, etc. (J. Lumin., Vol. 72-74, p. 985, 1997); aromatic amine compounds comprising a triphenylamine tetramer (Chem. Commun., p. 2175, 1996); spiro compounds such as 2,2',7,7'-tetrakis-(diphenylamino)-9,9'-spirobifluorene, etc. (Synth. Metals, Vol. 91, p. 209, 1997), carbazole derivatives such as 4,4'-N,N'-dicarbazole-biphenyl. etc. In addition, for example, polyvinylcarbazole, polyvinyltriphenylamine (JP-A H7-53953), tetraphenylbenzidine-containing polyarylene ether sulfones (Polym. Adv. Tech., Vol. 7, p. 33, 1996), etc. are also favorably used here.

<Formation of Hole Transport Layer According to Wet Film Formation Method>

For forming the hole transport layer according to a wet film formation method, in general, the method for forming the above-mentioned hole injection method in a mode of wet film formation may be referred to, in which, however, a composition for forming hole transport layer is used in place of the hole injection layer-forming composition.

When the hole transport layer is formed according to a wet film formation method, in general, the hole transport layer-forming composition further contains a solvent. The solvent to be used in the hole transport layer-forming composition may be the same as that for use in the above-mentioned hole injection layer-forming composition.

The concentration of the hole transporting compound to be in the hole transport layer-forming composition may be within the same range as that of the concentration of the hole transporting compound to be in the hole injection layer-forming composition.

For forming the hole transport layer according to a wet film formation method, the same manner as that for the above-mentioned method for forming the hole injection layer may be employed.

<Formation of Hole Transport Layer According to Vacuum Evaporation Method>

For forming the hole transport layer according to a vacuum evaporation method, in general, the same manner as that for forming the hole injection layer according to a vacuum evaporation method may be employed here, in which, however, the composition for forming the hole transport layer is used in place of the hole injection layer-forming composition. For the film formation conditions such as the vacuum degree in evaporation, the evaporation rate and the temperature, referred to are the same conditions for vacuum evaporation to form the above-mentioned hole injection layer.

(Light-Emitting Layer)

The light-emitting layer 5 is a layer that is excited through recombination of the hole injected from the anode 2 and the electron injected from the cathode 9 when an electric field is given to the pair of electrodes, therefore carrying the function of emitting light. The light-emitting layer 5 is a layer formed between the anode 2 and the cathode 9. In case where a hole injection layer is arranged above the anode, then the light-emitting layer is formed between the hole injection layer and the cathode; and in case where a hole transport layer is arranged above the cathode, the light-emitting layer is formed between the hole transport layer and the cathode.

The thickness of the light-emitting layer 5 may be any arbitrary one, not markedly detracting from the advantageous effects of the present invention. From the viewpoint of hardly forming defects in the film, the thickness is preferably larger, but on the other hand, from the viewpoint of driving voltage reduction, the thickness is preferably smaller. Consequently, the thickness is preferably 3 nm or more, more preferably 5 nm or more, and is, on the other hand in general, preferably 200 nm or less, more preferably 100 nm or less.

The light-emitting layer 5 contains at least a material having the property of light emission (light-emitting material), and preferably contains a material having a charge transporting ability (charge transporting material).

<Light-Emitting Material>

The light-emitting material is not specifically defined so far as the material emits light in a desired light emission wavelength range and so far as the material does not detract from the advantageous effects of the present invention. Here, any known light-emitting material is therefore usable. The light-emitting material may be a fluorescent light-emitting material or a phosphorescent light-emitting material. Preferred is a material having a good luminescent efficiency, and from the viewpoint of the internal quantum efficiency thereof, preferred is a phosphorescent light-emitting material.

Examples of fluorescent light-emitting materials are mentioned below.

As fluorescent light-emitting materials of giving blue light emission (blue fluorescent light-emitting materials), for example, there are mentioned naphthalene, perylene, pyrene, anthracene, coumarin, chrysene, p-bis(2-phenylethenyl)benzene and their derivatives, etc.

As fluorescent light-emitting materials of giving green light emission (green fluorescent light-emitting materials), for example, there are mentioned quinacridone derivatives, coumarin derivatives, aluminium complexes such as $Al(C_9H_6NO)_3$, etc.

As fluorescent light-emitting materials of giving yellow light emission (yellow fluorescent light-emitting materials), for example, there are mentioned rubrene, perimidone derivatives, etc.

As fluorescent light-emitting materials of giving red light emission (red fluorescent light-emitting materials), for example, there are mentioned DCM (4-(dicyanomethylene)-2-methyl-6-(p-dimethylaminostyryl)-4H-pyran) compounds, benzopyran derivatives, rhodamine derivatives, benzothioxanthene derivatives, azabenzothioxanthene, etc.

As the phosphorescent light-emitting materials, for example, there are mentioned organic metal complexes containing a metal selected from Groups 7 to 11 of the Long Periodic Table. As the metal selected from Groups 7 to 11 of the Long Periodic Table, preferably mentioned are ruthenium, rhodium, palladium, silver, rhenium, osmium, iridium, platinum, gold, etc.

The ligand in the organic metal complexes is preferably one having a (hetero)aryl group and pyridine, pyrazole, phenanthroline or the like bonding thereto, such as a (hetero)arylpyridine ligand, a (hetero)arylpyrazole ligand or the like, and is more preferably a phenylpyridine ligand or a phenylpyrazole ligand. Here, (hetero)aryl means an aryl group or a heteroaryl group.

As preferred phosphorescent light-emitting materials, concretely, for example, there are mentioned phenylpyridine complexes such as tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, etc., and porphyrin complexes such as octaethylplatinum porphyrin, octaphenylplatinum porphyrin, octaethylpalladium porphyrin, octaphenylpalladium porphyrin, etc.

As polymeric light-emitting materials, there are mentioned polyfluorenone materials such as poly(9,9-dioctylfluorene-2,7-diyl), poly[(9,9-dioctylfluorene-2,7-diyl)-co-(4,4'-(N-(4-sec-butylphenyl))diphenyl amine)], poly[(9,9-dioctylfluorene-2,7-diyl)-co-(1,4-benzo-2 {2,1'-3}-triazole)], etc., polyphenylenevinylene materials such as poly[2-methoxy-5-(2-hethylhexyloxy)-1,4-phenylenevinylene] etc.

<Charge Transporting Material>

The charge transporting material is a material having the ability to transport positive charges (holes) or negative charges (electrons). Not detracting from the advantageous effects of the present invention, the material is not specifically defined, and any known light-emitting material is applicable.

As the charge transporting material, usable here are compounds and others that are used in the light-emitting layer of organic electroluminescent elements. Especially preferred are compounds that are used as the host material in the light-emitting layer.

As the charge transporting material, concretely, there are mentioned those exemplified hereinabove as the hole transporting compounds for the hole injection layer, such as aromatic amine compounds, phthalocyanine compounds, porphyrin compounds, oligothiophene compounds, polythiophene compounds, benzylphenyl compounds, compounds with a tertiary amine bonded via a fluorene group, hydrazine compounds, silazane compounds, silanamine compounds, phosphamine compounds, quinacridone compounds, etc., and there are further mentioned electron transporting compounds such as anthracene compounds, pyrene compounds, carbazole compounds, pyridine compounds, phenanthroline compounds, oxadiazole compounds, silol compounds, etc.

In addition, also preferably usable here are the compounds exemplified hereinabove for the hole transporting compound for the hole transport layer, for example, aromatic diamines having two or more tertiary amines and having two or more condensed aromatic rings on the nitrogen atoms therein, such as typically 4,4'-bis[N-(1-naphthyl)-N-phenylamino]biphenyl (JP-A H5-234681), aromatic amine compounds having a starburst structure such as 4,4',4''-tris(1-naphthylphenylamino)triphenylamine, etc. (J. Lumin., Vol. 72-74, p. 985, 1997), aromatic amine compounds comprising a triphenylamine tetramer (Chem. Commun., p. 2175, 1996), fluorene compounds such as 2,2',7,7'-tetrakis-(diphenylamino)-9,9'-spirobifluorene, etc. (Synth. Metals, Vol. 91, p. 209, 1997), carbazole compounds such as 4,4'-N,N'-dicarbazole-biphenyl. etc. In addition to these, there are further mentioned oxadiazole compounds such as 2-(4-biphenylyl)-5-(p-tertiary butylphenyl)-1,3,4-oxadiazole (tBu-PBD), 2,5-bis(1-naphthyl)-1,3,4-oxadiazole (BND), etc., silol compounds such as 2,5-bis(6'-(2',2''-bipyridyl))-1,1-dimethyl-3,4-diphenylsilol (PyPySPyPy), etc., phenanthroline compounds such as basophenanthroline (BPhen), 2,9-dimethyl-4,7-diphenyl-1,10-phenanthroline (BCP, bathocuproin), etc.

<Formation of Light-Emitting Layer According to Wet Film Formation Method>

For forming the light-emitting layer, employable here is any of a vacuum evaporation method or a wet film formation method. From the viewpoint of excellent film formability thereof, preferred is a wet film formation method, and more preferred is a spin coating method or an inkjet method. When the hole injection layer or the hole transport layer to be the underlayer below the light-emitting layer is formed using the composition for organic electroluminescent elements of the present invention, then lamination of multiple layers according to a wet film formation method is easy. Consequently, a wet film formation method is preferably employed here. In case where the light-emitting layer is formed according to a wet film formation method, in general, the same manner as that for forming the hole injection layer according to a wet film formation method as mentioned above may be employed, in which, however, a composition for forming the light-emitting layer prepared by mixing the materials to be the light-emitting layer in a solvent capable of dissolving the materials (solvent for light-emitting layer) is used in place of the hole injection layer-forming composition.

The solvent includes, for example, ether solvents, ester solvents, aromatic hydrocarbon solvents and amide solvents that have been mentioned hereinabove in forming the hole injection layer, and in addition to these, further includes alkane solvents, halogenoaromatic hydrocarbon solvents, aliphatic alcohol solvents, alicyclic alcohol solvents, aliphatic ketone solvents, alicyclic ketone solvents, etc. Specific examples of the solvent are mentioned below, however, not detracting from the advantageous effects of the present invention, the solvent is not restricted to the following ones.

For example, there are mentioned aliphatic ether solvents such as ethylene glycol dimethyl ether, ethylene glycol diethyl ether, propylene glycol 1-monomethyl ether acetate (PGMEA), ETC.; aromatic ether solvents such as 1,2-dimethoxybenzene, 1,3-dimethoxybenzene, anisole, phenetol, 2-methoxytoluene, 3-methoxytoluene, 4-methoxytoluene, 2,3-dimethylanisole, 2,4-dimethylanisole, diphenyl ether, etc.; aromatic ester solvents such as phenyl acetate, phenyl propionate, methyl benzoate, ethyl benzoate, propyl benzoate, n-butyl benzoate, etc.; aromatic hydrocarbon solvents such as toluene, xylene, mesitylene, cyclohexylbenzene, tetralin, 3-isopropylbiphenyl, 1,2,3,4-tetramethylbenzene, 1,4-diisopropylbenzene, cyclohexylbenzene, methylnaphthalene, etc.; amide solvents such as N,N-dimethylformamide, N,N-dimethylacetamide, etc.; alkane solvents such as n-decane, cyclohexane, ethylcyclohexane, decalin, bicyclohexane, etc.; halogenoaromatic hydrocarbon solvents such as chlorobenzene, dichlorobenzene, trichlorobenzene, etc.; aliphatic alcohol solvents such as butanol, hexanol, etc.; alicyclic alcohols such as cyclohexanol, cyclooctanol, etc.; aliphatic ketone solvents such as methyl ethyl ketone, dibutyl ketone, etc.; alicyclic ketone solvents such as cyclohexanone, cyclooctanone, fenchone, etc. Of those, especially preferred are alkane solvents and aromatic hydrocarbon solvents.

{Hole Block Layer}

The hole block layer 6 may be provided between the light-emitting layer 5 and the electron injection layer 8 to be mentioned below. The hole block layer 6 is a layer to be laminated on the light-emitting layer 5 so as to be kept in contact with the interface on the side of the cathode 9 of the light-emitting layer 5.

The hole block layer 6 plays a role of blocking the holes moving from the anode 2 from reaching the cathode 9, and plays a role of efficiently transport the electrons injected from the cathode 9 toward the light-emitting layer 5. Regarding the necessary physical properties thereof, the material to constitute the hole block layer 6 is desired to have a high electron mobility, a low hole mobility, a large energy gap (difference between HOMO and LUMO) and a high excitation triplet energy level (T1).

The material satisfying the requirements for the hole block layer includes, for example, mixed ligand complexes such as bis(2-methyl-8-quinolinolato)(phenolato)aluminium, bis(2-methyl-8-quinolinolato)(triphenylsilanolato)aluminium, etc.; metal complexes such as bis(2-methyl-8-quinolato)aluminium-μ-oxo-bis(2-methyl-8-quinolinolato)aluminium binuclear metal complex, etc.; styryl compounds such as distyrylbiphenyl derivatives, etc. (JP-A H11-242996); triazole derivatives such as 3-(4-biphenylyl)-4-phenyl-5(4-tert-butylphenyl)-1,2,4-triazole, etc. (JP-A H7-41759); phenanthroline derivatives such as bathocuproin, etc. (JP-A H10-79297), etc. Further, compounds having at least one pyridine ring substituted at the 2,4,6-positions, as described in WO2005/022962, are also preferred as the material for the hole block layer.

The method for forming the hole block layer 6 is not defined. Accordingly, the layer may be formed according to a wet film formation method, a vaporization method or any other method.

The thickness of the hole block layer 6 may be any desired one, not markedly detracting from the advantageous effects of the present invention. The thickness of the layer is typically 0.3 nm or more, preferably 0.5 nm or more, and is typically 100 nm or less, preferably 50 nm or less.

{Electron Transport Layer}

The electron transport layer 7 is a layer provided between the light-emitting layer 5 and the electron injection layer 8 for further improving the current efficiency of the element.

The electron transport layer 7 is formed of a compound capable of efficiently transporting the electrons injected from the cathode 9 toward the direction of the light-emitting layer 5 between the electrodes given an electric field. The electron transporting material for the electron transport layer 7 must be a compound having a high electron injection efficiency from the cathode 9 or the electron injection layer 8, having a high electron mobility and capable of efficiently transporting the injected electrons.

Concretely, the electron transporting compound for use for the electron transport layer includes, for example, metal complexes such as aluminium complex of 8-hydroxyquinoline, etc. (JP-A S59-194393), 10-hydroxybenzo[h]quinoline metal complexes, oxadiazole derivatives, distyrylbiphenyl derivatives, silol derivatives, 3-hydroxyflavone metal complexes, 5-hydroxyflavone metal complexes, benzoxazole metal complexes, benzothiazole metal complexes, trisbenzimidazolylbenzene (U.S. Pat. No. 5,645,948), quinoxaline compounds (JP-A H6-207169), phenanthroline derivatives (JP-A H5-331459), 2-t-butyl-9,10-N,N'-dicyanoanthraquinonediimine, n-type hydrogenated amorphous silicon carbide, n-type zinc sulfide, n-type zinc selenide, etc.

The thickness of the electron transport layer 7 may be typically 1 nm or more, preferably 5 nm or more, and is typically 300 nm or less, preferably 100 nm or less.

Like in the above, the electron transport layer 7 may be laminated on the hole block layer 6 according to a wet film formation method or a vacuum evaporation method. In general, used is a vacuum evaporation method.

{Electron Injection Layer}

The electron injection layer 8 plays a role of efficiently injecting the electron injected from the cathode 9 to the electron transport layer 7 or the light-emitting layer 5.

For efficient electron injection, the material to form the electron injection layer 8 is preferably a metal having a low work function. Examples of the material include alkali metals such as sodium, cesium, etc.; and alkaline earth metals such as barium, calcium, etc. Preferably, the thickness of the layer is typically 0.1 nm or more and 5 nm or less.

Further, it is also desirable to dope an organic electron transporting material such as typically a nitrogen-containing heterocyclic compound, for example, basophenanthroline or the like or a metal complex, for example, an aluminium complex of 8-hydroxyquinoline or the like with an alkali metal such as sodium, potassium, cesium, lithium, rubidium or the like (as described in JP-A H10-270171, 2002-100478, 2002-100482, etc.), as capable of satisfying an excellent film quality having improved electron injection/transportation ability.

The thickness of the electron injection layer 8 is typically 5 nm or more, preferably 10 nm or more, and is typically 200 nm or less, preferably 100 nm or less.

The electron injection layer 8 is laminated on the light-emitting layer 5, or on the hole block layer 6 or the electron transport layer 7 above the layer 5, according to a wet film formation method or a vacuum evaporation method.

The details of the wet film formation method are the same as those described hereinabove for the light-emitting layer.

{Cathode}

The cathode 9 plays a role of injecting electrons into the layer on the side of the light-emitting layer 5 (electron injection layer, light-emitting layer).

As the material for the cathode 9, usable are those that are used for the above-mentioned anode 2. For efficient electron injection, preferred is use of a metal having a low work function. For example, employable are metals such as tin, magnesium, indium, calcium, aluminium, silver or the like, or their alloys. As concrete examples, there are mentioned alloy electrodes having a low work function, for example, magnesium-silver alloy, magnesium-indium alloy, aluminium-lithium alloy. etc.

From the viewpoint of the stability of the elements, it is desirable that a metal layer having a high work function and stable to air is laminated on the cathode to thereby protect the cathode formed of a metal having a low work function. The metal to be laminated includes, for example, aluminium, silver, copper, nickel, chromium, gold, platinum, etc.

The thickness of the cathode is generally the same as that of the anode.

{Other Layers}

The organic electroluminescent element of the present invention may have any other layer not markedly detracting from the advantageous effects of the invention. Briefly, any other layer than the above may be arranged between the anode and the cathode.

{Other Element Configurations}

The organic electroluminescent element of the present invention may have a configuration opposite to that described in the above, or that is, may have a configuration comprising, as laminated on the support in that order, a cathode, an electron injection layer, an electron transport layer, a hole block layer, a light-emitting layer, a hole transport layer, a hole injection layer, and an anode.

In case where the organic electroluminescent element of the present invention is applied to an organic electroluminescent device, the organic electroluminescent element may be formed as a single element, or may be applied to a configuration where multiple organic electroluminescent elements are arranged in an array, or may also be applied to a configuration where the anode and the cathode are arranged in an X-Y matrix.

[Organic Electroluminescent Device]

The organic electroluminescent display device (organic EL display device) of the present invention uses the above-mentioned organic electroluminescent element of the invention. The type and the configuration of the organic EL display device of the present invention are not specifically defined, and the device can be constructed according to an ordinary method using the organic electroluminescent element of the invention.

For example, the organic EL display device of the present invention can be constructed according to the method described in "Organic EL Display" (by Ohm, issued on Aug. 20, 2004, authored by Shizuo Tokito, Chihaya Adachi, Hideyuki Murata).

[Organic EL Illumination]

The organic electroluminescent illumination (organic EL illumination) of the present invention uses the above-mentioned organic electroluminescent element of the present invention. The type and the configuration of the organic EL illumination of the present invention are not specifically defined. The illumination can be constructed using the organic electroluminescent element of the present invention and according to an ordinary method.

EXAMPLES

Next, the present invention is described more concretely with reference to Examples; however, not overstepping the spirit and the scope thereof, the present invention is not limited to the following Examples.

[Synthesis of Monomer]

<Synthesis of Compound 1>

[Chem. 31]

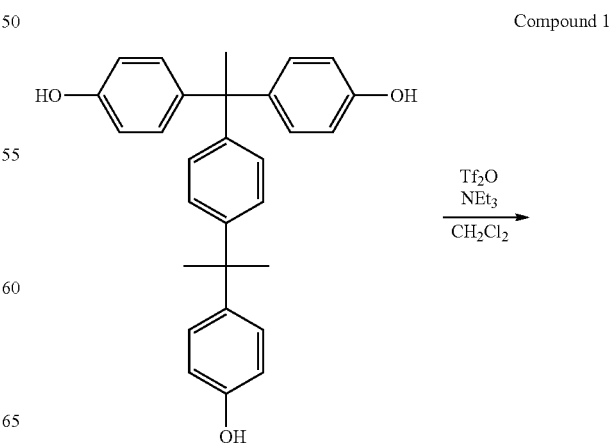

Compound 1

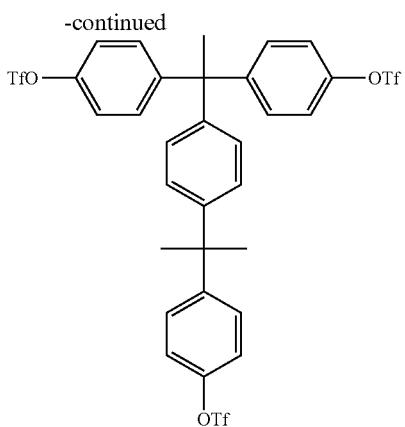

In a nitrogen atmosphere, α,α,α'-tris(4-hydroxyphenyl)-1-ethyl-4-isopropylbenzene (15 g, 35.33 mmol), triethylamine (28.96 g, 286.20 mmol) and methylene chloride (120 mL) were put into a reactor, and stirred at −10° C. Trifluoromethanesulfonic acid anhydride (35.89 g, 127.20 mmol) was added thereto, and stirred at room temperature for 2 hours. Water was put into the reaction mixture, extracted with methylene chloride, and the organic layer was washed with water, then with saline water, dried with magnesium sulfate, and concentrated under reduced pressure. The residue was purified through silica gel column chromatography (hexane/methylene chloride=1/1) to give the compound 1 (24.1 g). The compound 1 was identified by $^1$H NMR.

<Synthesis of Compound 2>

[Chem. 32]

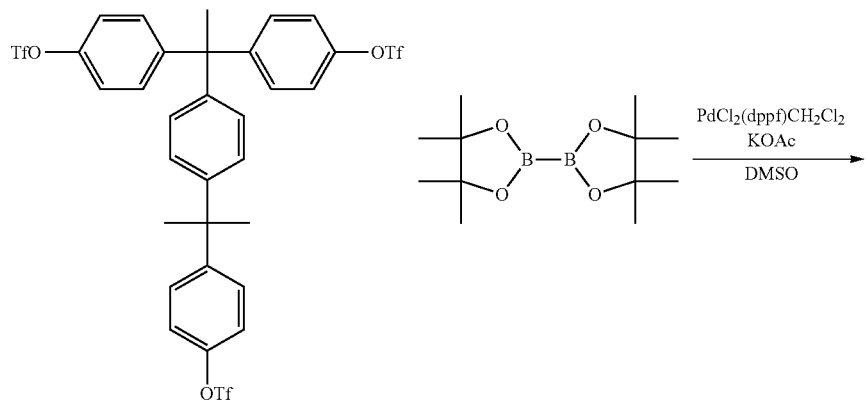

Compound 1

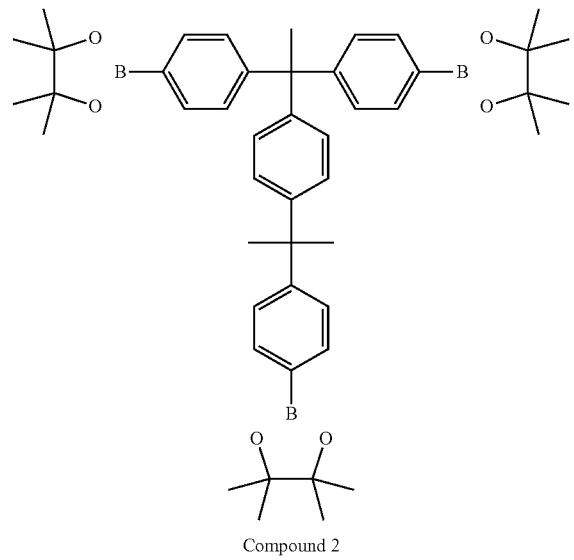

Compound 2

19.87 g (24.22 mmol) of the compound 1 (tris-triflate form), 23.06 g (90.81 mmol) of bispinacolatodiboron, 17.82 g (181.62 mmol) of potassium acetate and 250 mL of dimethyl sulfoxide (dewatered) were put into a 500-mL four-neck flask, and heated up to 60° C. with stirring with a mechanical stirrer, and nitrogen was introduced thereinto for 30 minutes. Subsequently, [1,1'-bis(diphenylphosphino)ferrocene]palladium(II) dichloride dichloromethane adduct was added thereto, and stirred at 80° C. for 3 hours. The reaction solution was poured into 600 mL of pure water, and stirred for 10 minutes, and the formed precipitate was taken out through filtration. Thus filtrated, the precipitate was dispersed in 200 mL of saturated saline water, and stirred for 10 minutes, and then filtered. Thus filtered, the filtrated deposit was dissolved in 200 mL of methylene chloride, and washed twice with 200 mL of pure water and once with 100 mL of saturated saline water. The organic layer was collected, dried with magnesium sulfate, and the metal compound was adsorbed through treatment with activated earth, and thereafter the solvent was evaporated away under reduced pressure. Thus obtained, the crude product was ultrasonically washed with ethanol, then filtered and dried in vacuum to give 17.15 g of the compound 2 as a white solid. The compound 2 was identified by $^1$H NMR.

<Synthesis of Compound 3>

[Chem. 33]

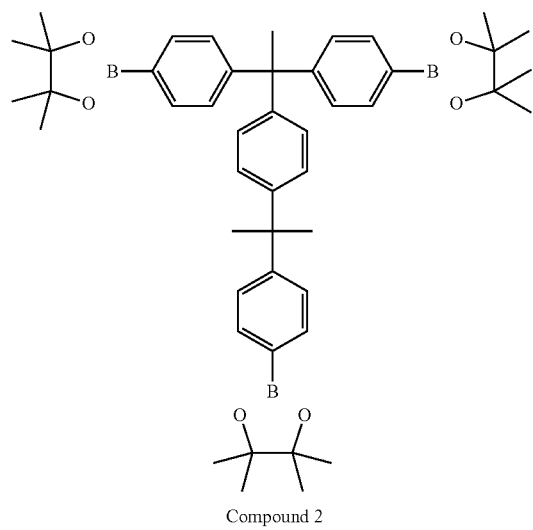

Compound 2

+

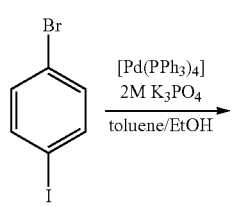

[Pd(PPh$_3$)$_4$]
2M K$_3$PO$_4$
toluene/EtOH

→

-continued

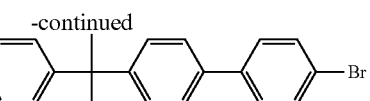

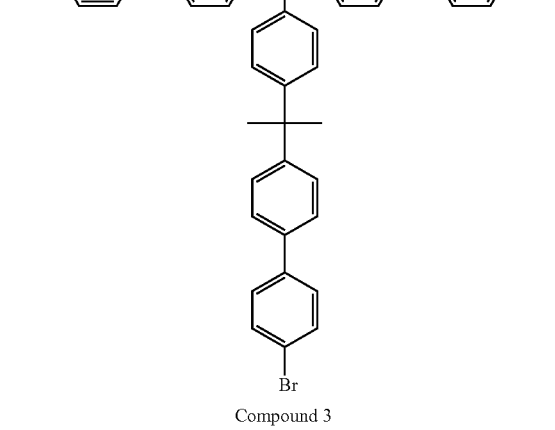

Compound 3

17.15 g (22.73 mmol) of the compound 2 (boronic acid ester), 25.08 (G) (88.65 mmol) of 4-bromoiodobenzene, 350 mL of toluene, 175 mL of ethanol, and 82.96 mL (165.93 mmol) of aqueous 2 M tripotassium phosphate solution were put into a 1-L four-neck flask, then heated up to 60° C. with stirring with a magnetic stirrer, and nitrogen was introduced for 30 minutes. Subsequently, 1.97 g (1.71 mmol) of tetrakis(triphenylphosphine)palladium(0) was added thereto, and stirred for 8 hours with heating under reflux. After the reaction, the organic layer was washed twice with pure water and once with saturated saline water. This was dried with magnesium sulfate and treated with activated earth, and thereafter the solvent was evaporated away under reduced pressure. The residue was processed for rough purification in an eluent in an alumina column (Aluminium Oxide 90N activity I: MERCK) using toluene, and then processed for separation and purification in an eluent in a silica gel column (Silica gel 60N 100 to 210 μm: Kanto Chemical) using hexane/methylene chloride (=1/1 to 0/1). Further, this was recrystallized with a mixed solution of methylene chloride/methanol=1/5 to give 13.40 g of the compound 3 as a white solid. The compound 3 was identified by $^1$H NMR.

<Synthesis of Compound 4>

[Chem. 34]

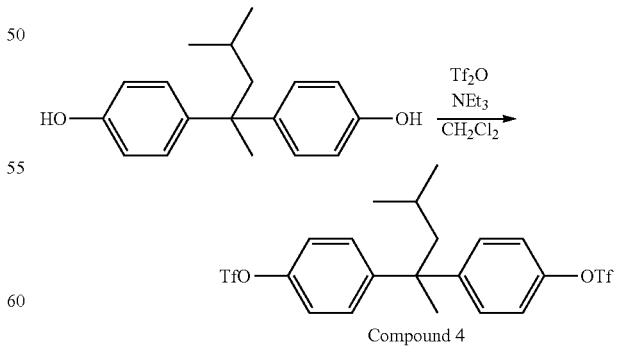

Compound 4

In a nitrogen atmosphere, 4,4'-(1,3-dimethylbutylidene)diphenol (15 g, 55.48 mmol), triethylamine (22.46 g, 221.92 mmol) and methylene chloride (150 mL) were put into a reactor, and stirred at 0° C. Trifluoromethanesulfonic acid anhydride (37.56 g, 133.16 mmol) was added thereto, and stirred at room temperature for 6 hours. Water and 1 N hydrochloric acid were put into the reaction mixture, extracted with methylene chloride, and the organic layer was washed with a mixed liquid of water and 1 N hydrochloric acid, then with saline water, dried with magnesium sulfate, and concentrated under reduced pressure. The residue was purified through silica gel column chromatography (hexane/methylene chloride=3/1) to give the compound 4 (19.1 g).

<Synthesis of Compound 5>

[Chem. 35]

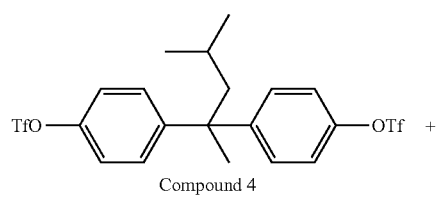

Compound 4

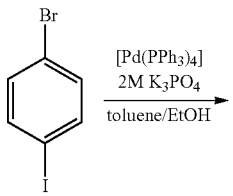

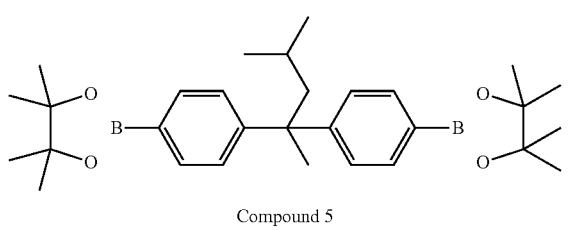

Compound 5

In a nitrogen atmosphere, a dewatered dimethyl sulfoxide (157 mL) suspension of the compound 4 (19.1 g, 35.73 mmol), bispinacolatodiborane (21.78 g, 85.76 mmol) and potassium acetate (17.89 g, 182.25 mmol) was heated at 60° C., and then dichloro[1,1'-bis(diphenylphosphino)ferrocene]palladium(II) dichloromethane adduct (1.46 g, 1.79 mol) was added thereto, heated up to 80° C., and stirred for 4 hours. This was left cooled to room temperature, then water was put into the reaction mixture, the precipitated crystal was collected through filtration, dissolved in methylene chloride, and magnesium sulfate and white clay were put thereinto, stirred and filtered, the filtrate was concentrated, and the residue was purified through silica gel column chromatography (hexane/methylene chloride=1/1) and washed in suspension with hexane to give the compound 5 (7.9 g).

<Synthesis of Compound 6>

[Chem. 36]

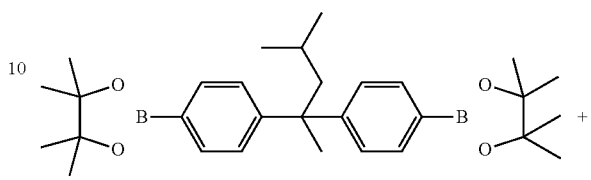

Compound 5

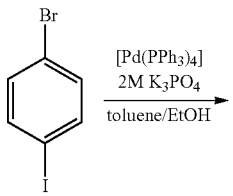

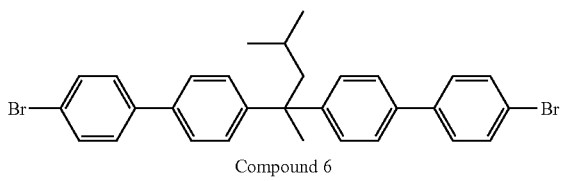

Compound 6

In a nitrogen atmosphere, tetrakis(triphenylphosphine)palladium(0) (1.56 g, 1.35 mmol) and aqueous 2 M tripotassium phosphate solution (67 mL) were added to a solution of the compound 5 (13.2 g, 26.92 mmol), 4-bromoiodobenzene (17.67 g, 62.47 mmol), toluene (268 mL) and ethanol (134 mL) at room temperature, and refluxed for 8.5 hours. After left cooled to room temperature, the reaction mixture was extracted with toluene, the organic layer was washed with water, then dried with magnesium sulfate, and concentrated under reduced pressure. The residue was purified through silica gel column chromatography (hexane/methylene chloride=8/1), concentrated, and a small amount of hexane was added thereto to precipitate the crystal, thereby giving the compound 6 (8.3 g).

<Synthesis of Compound 7>

4-(3-Aminophenyl)benzocyclobutene (compound 7) was synthesized according to the known method described in JP-A 2009-263665, using 3-nitrophenylboronic acid and 4-bromo-benzocyclobutene as the starting materials.

<Synthesis of Compound 8>

2-Amino-9,9-dihexylfluorene (compound 8) was synthesized according to the known method described in JP-A 2009-263665, using 2-nitrofluorene and 1-bromohexane as the starting materials.

<Synthesis of Compound 9>

[Chem. 37]

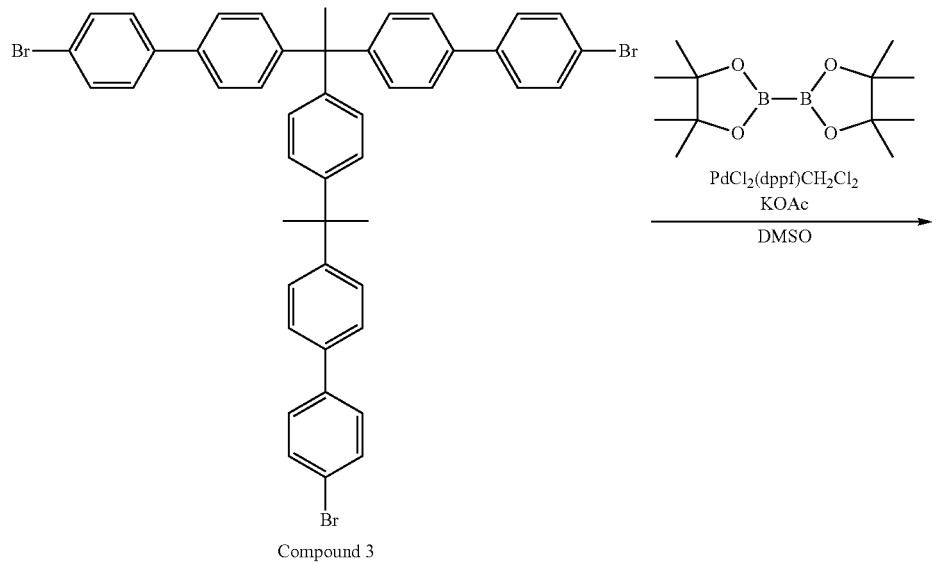

Compound 3

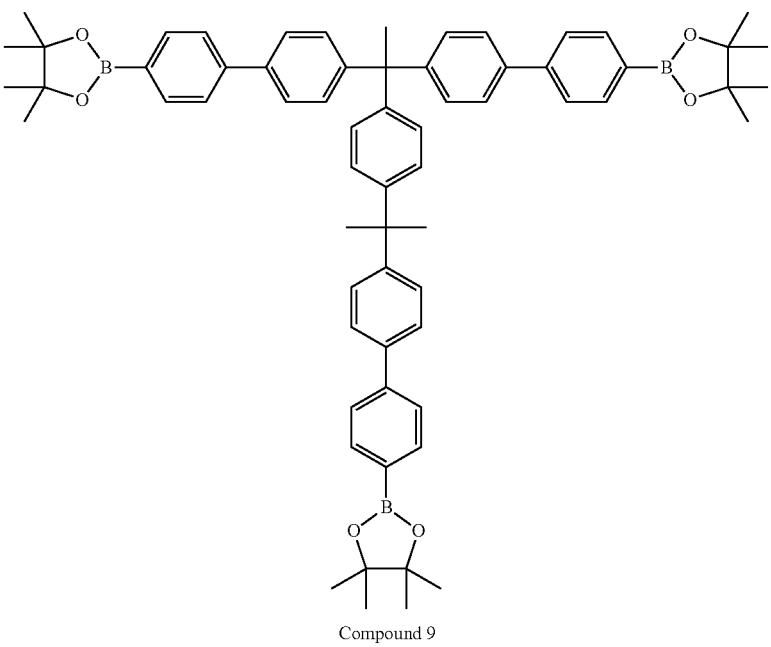

Compound 9

In a nitrogen atmosphere, a dewatered dimethyl sulfoxide (100 mL) suspension of the compound 3 (5.00 g, 5.94 mmol), bispinacolatodiborane (5.43 g, 21.4 mmol) and potassium acetate (4.37 g, 44.5 mmol) was heated at 60° C., and then dichloro[1,1'-bis(diphenylphosphino)ferrocene]palladium (II) dichloromethane adduct (0.36 g, 0.44 mol) was added thereto, heated up to 80° C., and stirred for 6 hours. This was left cooled to room temperature, then water was put into the reaction mixture, the precipitated crystal was collected through filtration, dissolved in methylene chloride, and magnesium sulfate and white clay were put thereinto, stirred and filtered, the filtrate was concentrated, and the precipitated crystal was washed in suspension with ethanol to give the compound 9 (5.28 g).

<Synthesis of Compound 10>

[Chem. 38]

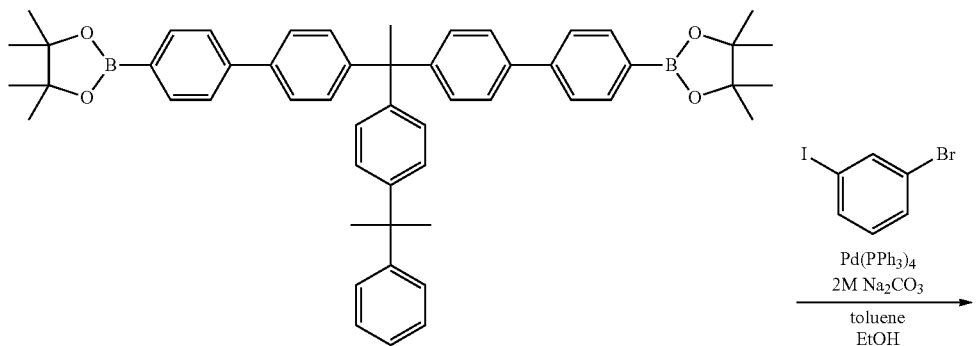

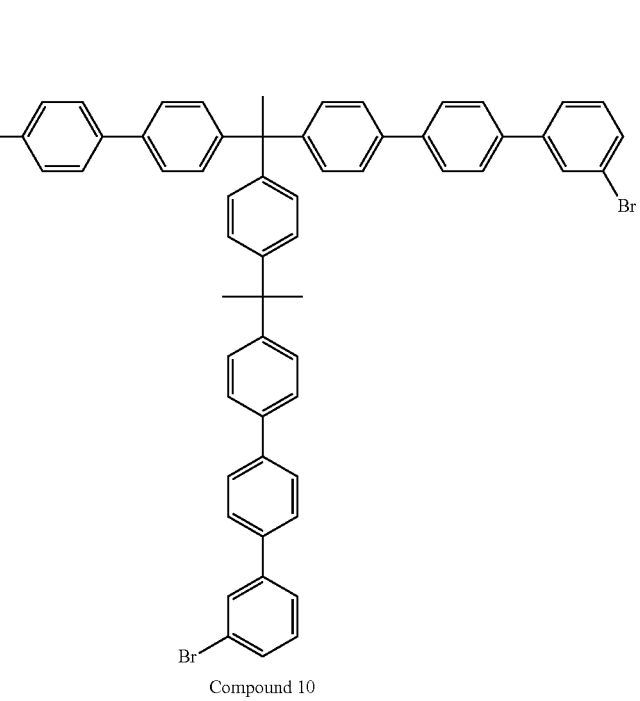

In a nitrogen atmosphere, aqueous 2 M sodium carbonate solution (60 mL) and tetrakis(triphenylphosphine)palladium (0) (0.53 g, 0.46 mmol) were added to a solution of the compound 9 (5.00 g, 5.09 mmol), 3-bromoiodobenzene (4.72 g, 16.8 mmol), toluene (120 mL) and ethanol (60 mL), and refluxed for 8 hours. After left cooled to room temperature, the reaction mixture was extracted with toluene, the organic layer was washed with water, then dried with magnesium sulfate, and concentrated under reduced pressure. The residue was purified through silica gel column chromatography (hexane/toluene=2/1), and recrystallized with toluene to give the compound 10 (0.87 g).

[Synthesis of Polymer]
<Synthesis of Target Polymer 1>
[Chem. 39]
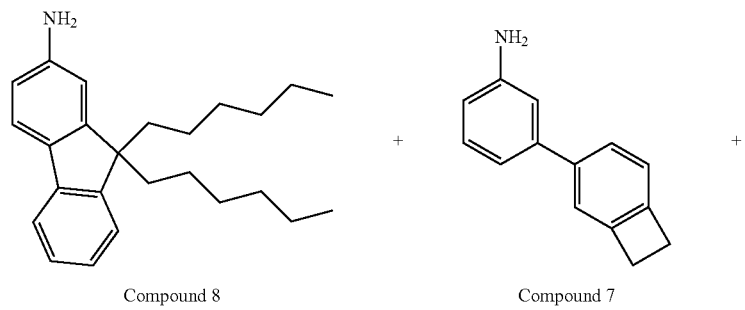
Compound 8 + Compound 7 +
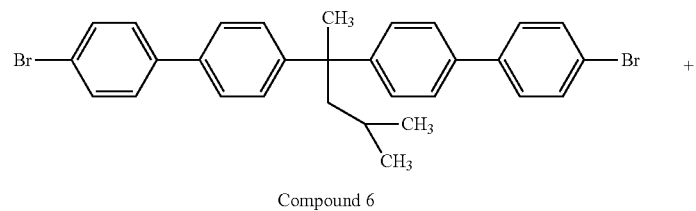
Compound 6 +
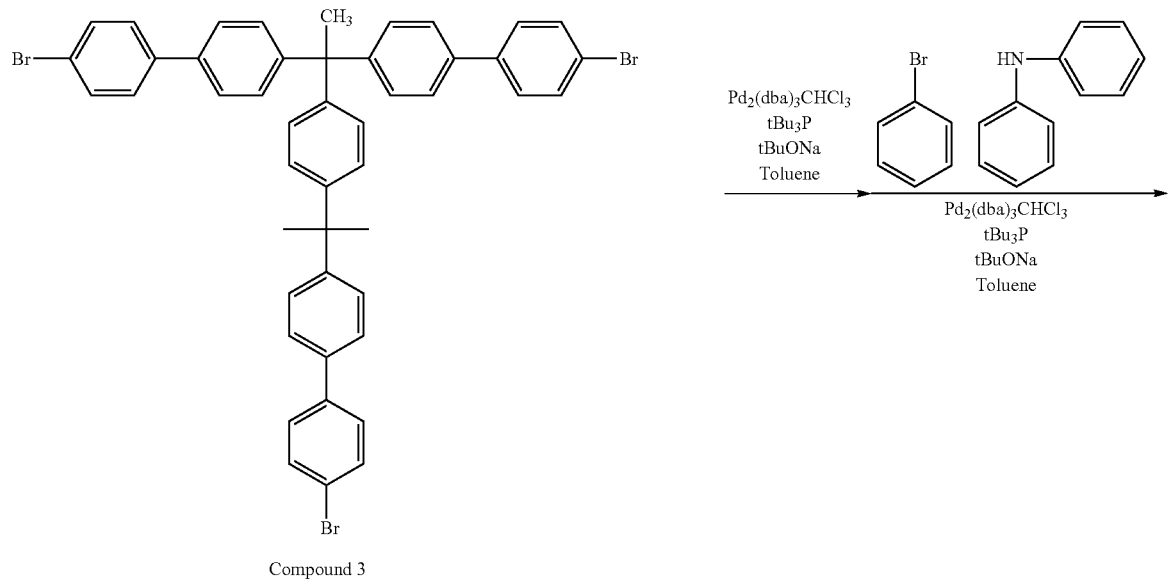
Compound 3

-continued

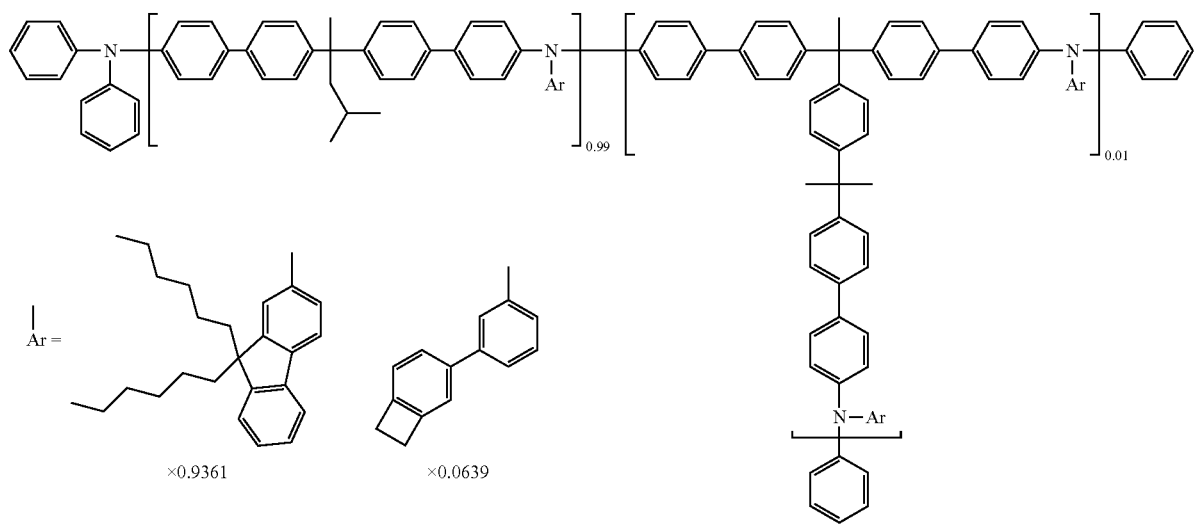

Target Polymer 1

The compound 6 (5.00 g, 9.11 mmol), the compound 8 (5.967 g, 17.07 mmol), the compound 7 (0.228 g, 1.16 mmol), sodium tert-butoxide (5.958 g, 62.0 mmol) and toluene (50 ml) were put into a reactor, then fully purged with nitrogen, and heated up to 65° C. (solution A1). Tri-t-butyl phosphine (0.177 g, 0.875 mmol) was added to a toluene (10 ml) solution of tris(dibenzylideneacetone)dipalladium chloroform complex (0.113 g, 0.109 mmol), and heated up to 65° C. (solution B1). In a nitrogen stream atmosphere, the solution B1 was added to the solution A1, and reacted for 2 hours with heating under reflux. The compound 6 (4.55 g) was added thereto. After this was heated under reflux for 2.0 hours, the compound 3 (0.153 g) was added thereto. After this was refluxed for 1 hour, the compound 6 (0.15 g) was further added thereto. After refluxed for 1 hour, the reaction liquid was left cooled, and the reaction liquid was dropwise added to ethanol (750 ml) to crystallize a crude polymer 1.

The obtained crude polymer 1 was dissolved in toluene (150 ml), and bromobenzene (0.573 g) and sodium tert-butoxide (5.959 g) were added thereto, then fully purged with nitrogen and heated up to 65° C. (solution C1). Tri-t-butyl phosphine (0.088 g) was added to a toluene (10 ml) solution of tris(dibenzylideneacetone)dipalladium chloroform complex (0.057 g), and heated up to 65° C. (solution D1). In a nitrogen stream atmosphere, the solution D1 was added to the solution C1, and reacted for 4 hours with heating under reflux. Diphenylamine (3.086 g) and the solution D1 that had been additionally prepared were added to the reaction liquid, and further reacted for 2 hours with heating under reflux. The reaction liquid was left cooled and dropwise added to ethanol (750 ml) to give an end-capped crude polymer 1.

The end-capped crude polymer 1 was dissolved in toluene, reprecipitated in acetone, and the precipitated polymer was separated through filtration. The separated crude polymer was dissolved in toluene, washed with diluted hydrochloric acid, and reprecipitated in ammonia-containing ethanol. The polymer collected by filtration was purified through column chromatography to give the target polymer 1 (4.3 g).

Weight-average molecular weight (Mw)=112000

Degree of dispersion (Mw/Mn)=2.04

<Synthesis of Target Polymer 2>

[Chem. 40]

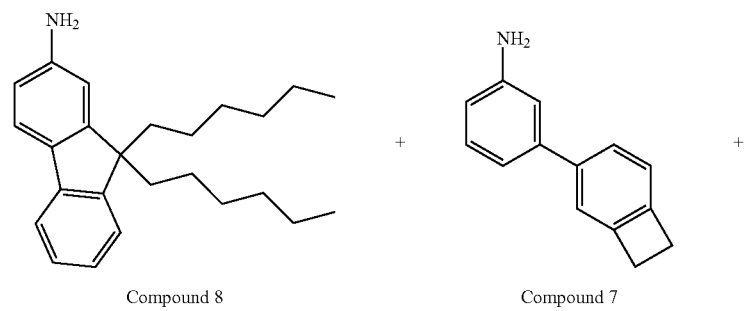

Compound 8       Compound 7

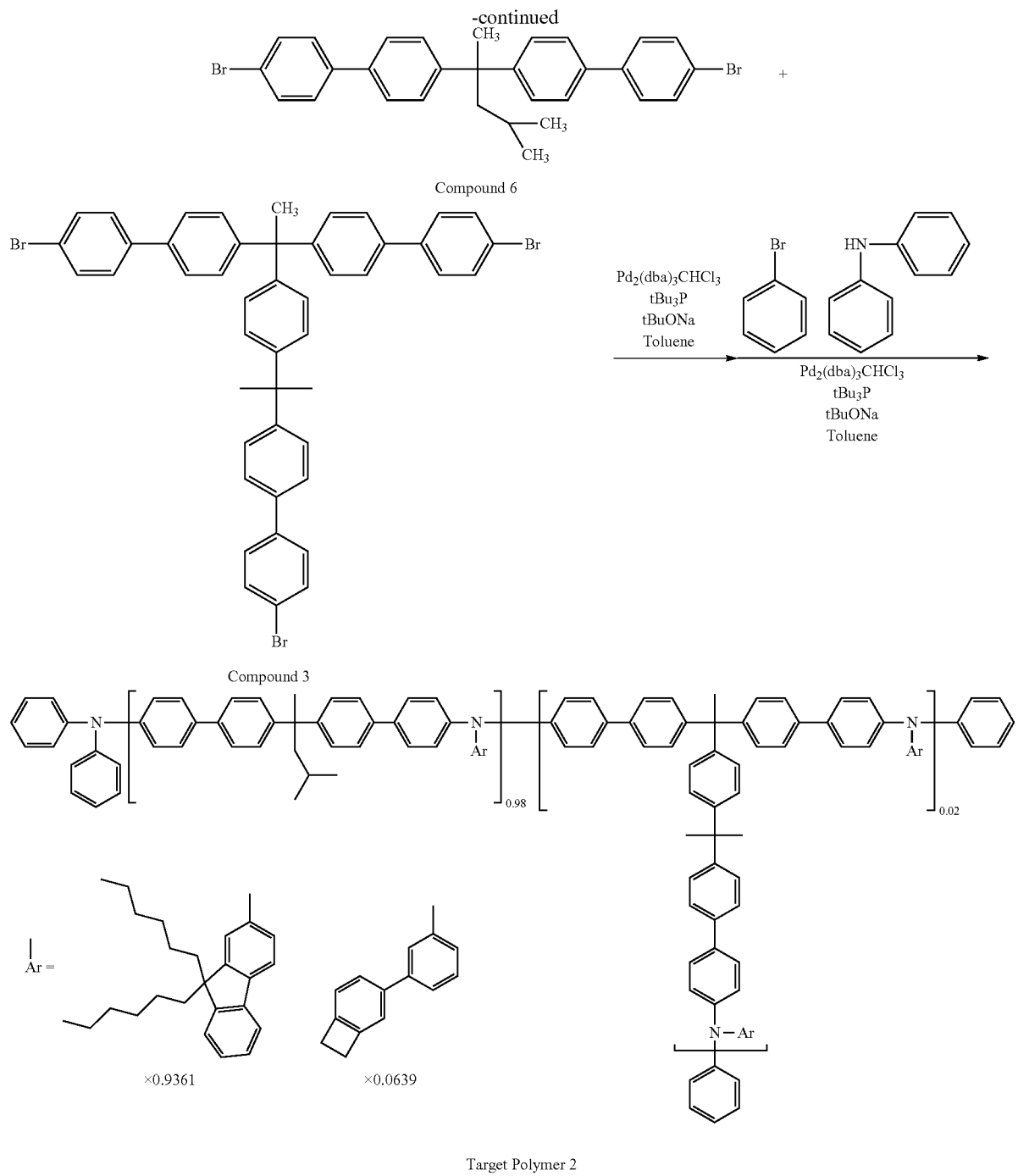

Target Polymer 2

The compound 6 (6.00 g, 10.9 mmol), the compound 8 (7.16 g, 20.5 mmol), the compound 7 (0.273 g, 1.39 mmol), sodium tert-butoxide (7.15 g, 74.4 mmol) and toluene (48 ml) were put into a reactor, then fully purged with nitrogen, and heated up to 65° C. (solution A2). Tri-t-butyl phosphine (0.212 g, 1.05 mmol) was added to a toluene (10 ml) solution of tris(dibenzylideneacetone)dipalladium chloroform complex (0.136 g, 0.131 mmol), and heated up to 65° C. (solution B2). In a nitrogen stream atmosphere, the solution B2 was added to the solution A2, and reacted for 2 hours with heating under reflux. The compound 6 (5.16 g) was added thereto. This was heated under reflux for 2.0 hours, and the compound 3 (0.368 g) was added thereto. After this was refluxed for 1 hour, the compound 6 (0.054 g) was further added thereto. After refluxed for 1 hour, the reaction liquid was left cooled, and the reaction liquid was dropwise added to ethanol (1000 ml) to crystallize a crude polymer 2.

The obtained crude polymer 2 was dissolved in toluene (280 ml), and N,N-diphenylamine (0.370 g) and sodium tert-butoxide (7.150 g) were added thereto, then fully purged with nitrogen and heated up to 65° C. (solution C2). Tri-t-butyl phosphine (0.106 g) was added to a toluene (18 ml) solution of tris(dibenzylideneacetone)dipalladium chloroform complex (0.068 g), and heated up to 65° C. (solution D2). In a nitrogen stream atmosphere, the solution D2 was added to the solution C2, and reacted for 4 hours with heating under reflux. Bromobenzene (1.718 g) and the solution D2 that had been additionally prepared were added to the reaction liquid, and further reacted for 2 hours with heating under reflux. The reaction liquid was left cooled and dropwise added to ethanol (1000 ml) to give an end-capped crude polymer 2.

The end-capped crude polymer 2 was dissolved in toluene, reprecipitated in acetone, and the precipitated polymer was separated through filtration. The separated crude polymer was dissolved in toluene, washed with diluted hydrochloric acid, and reprecipitated in ammonia-containing ethanol. The polymer collected by filtration was purified through column chromatography to give the target polymer 2 (7.2 g).

Weight-average molecular weight (Mw)=118200
Degree of dispersion (Mw/Mn)=1.93

<Synthesis of Target Polymer 3>

[Chem. 41]
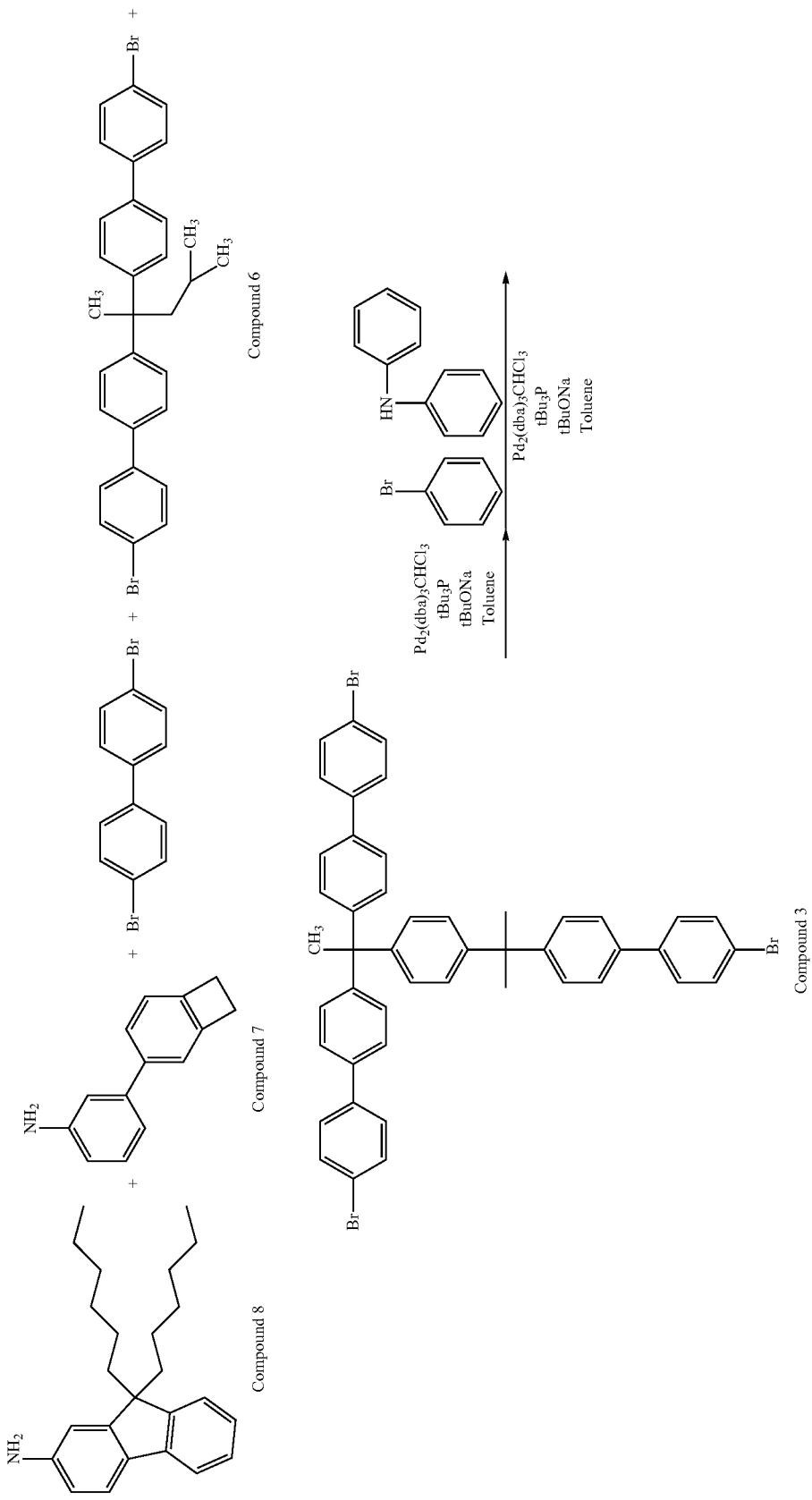

-continued
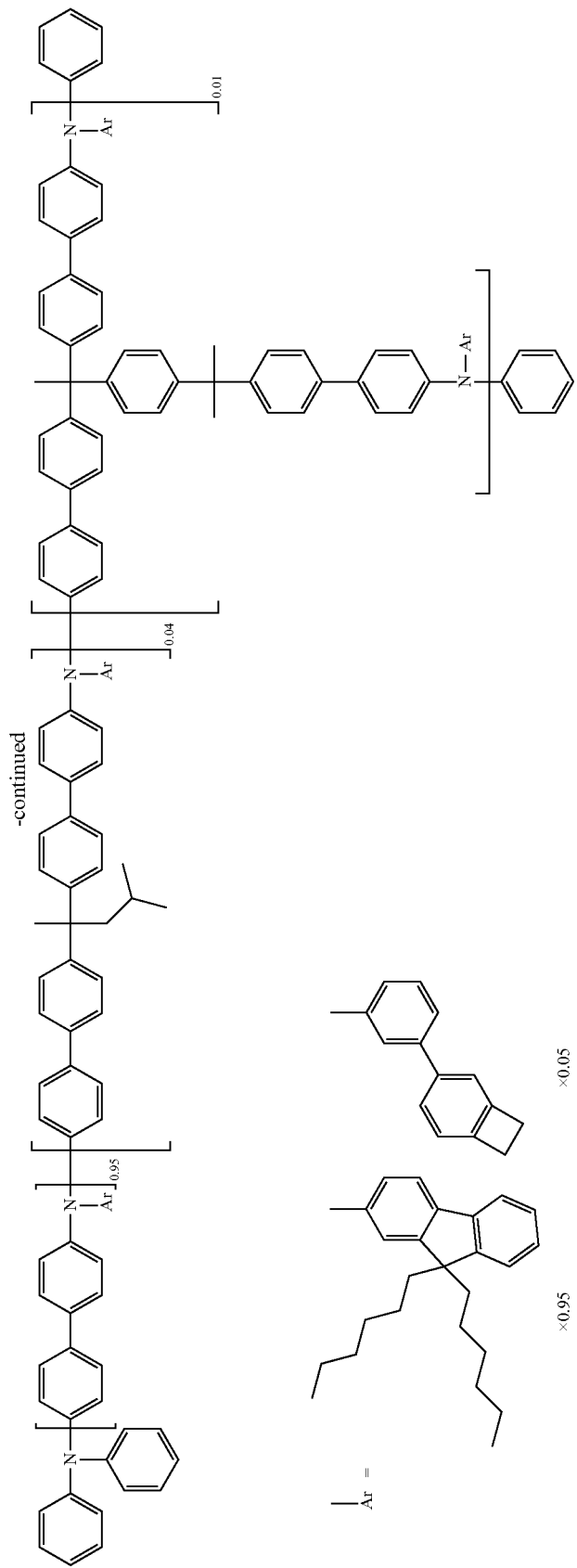
Target Polymer 3
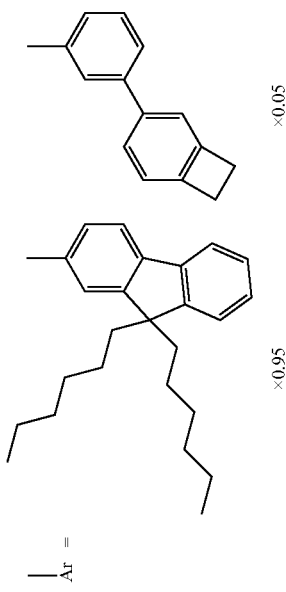

4,4'-Dibromobiphenyl (5.80 g, 18.6 mmol), the compound 8 (12.34 g, 35.3 mmol), the compound 7 (0.36 g, 1.86 mmol), sodium tert-butoxide (12.14 g, 126.4 mmol) and toluene (48 ml) were put into a reactor, then fully purged with nitrogen, and heated up to 65° C. (solution A3). Tri-t-butyl phosphine (0.827 g, 4.09 mmol) was added to a toluene (17 ml) solution of tris(dibenzylideneacetone)dipalladium chloroform complex (0.385 g, 0.372 mmol), and heated up to 65° C. (solution B3). In a nitrogen stream atmosphere, the solution B3 was added to the solution A3, and reacted for 2 hours with heating under reflux. Subsequently, 4,4'-dibromobiphenyl (4.81 g, 15.4 mmol) was added thereto. This was heated under reflux for 2.0 hours, and the compound 6 (0.815 g) and the compound 3 (0.313 g) were added thereto. After this was refluxed for 1 hour, 4,4'-dibromobiphenyl (0.058 g) was added thereto. After refluxed for 1 hour, the reaction liquid was left cooled, and the reaction liquid was dropwise added to ethanol (1000 ml) to crystallize a crude polymer 3.

The obtained crude polymer 3 was dissolved in toluene (280 ml), and N,N-diphenylamine (0.629 g) and sodium tert-butoxide (12.14 g) were added thereto, then fully purged with nitrogen and heated up to 65° C. (solution C3). Tri-t-butyl phosphine (0.248 g) was added to a toluene (18 ml) solution of tris(dibenzylideneacetone)dipalladium chloroform complex (0.115 g), and heated up to 65° C. (solution D3). In a nitrogen stream atmosphere, the solution D3 was added to the solution C3, and reacted for 4 hours with heating under reflux. Bromobenzene (2.92 g) and the solution D3 that had been additionally prepared were added to the reaction liquid, and further reacted for 2 hours with heating under reflux. The reaction liquid was left cooled and dropwise added to ethanol (1000 ml) to give an end-capped crude polymer 3.

The end-capped crude polymer 3 was dissolved in toluene, reprecipitated in acetone, and the precipitated polymer was separated through filtration. The separated crude polymer was dissolved in toluene, washed with diluted hydrochloric acid, and reprecipitated in ammonia-containing ethanol. The polymer collected by filtration was purified through column chromatography to give the target polymer 3 (9.6 g).

Weight-average molecular weight (Mw)=110100

Degree of dispersion (Mw/Mn)=1.95

<Synthesis of Target Polymer 4>

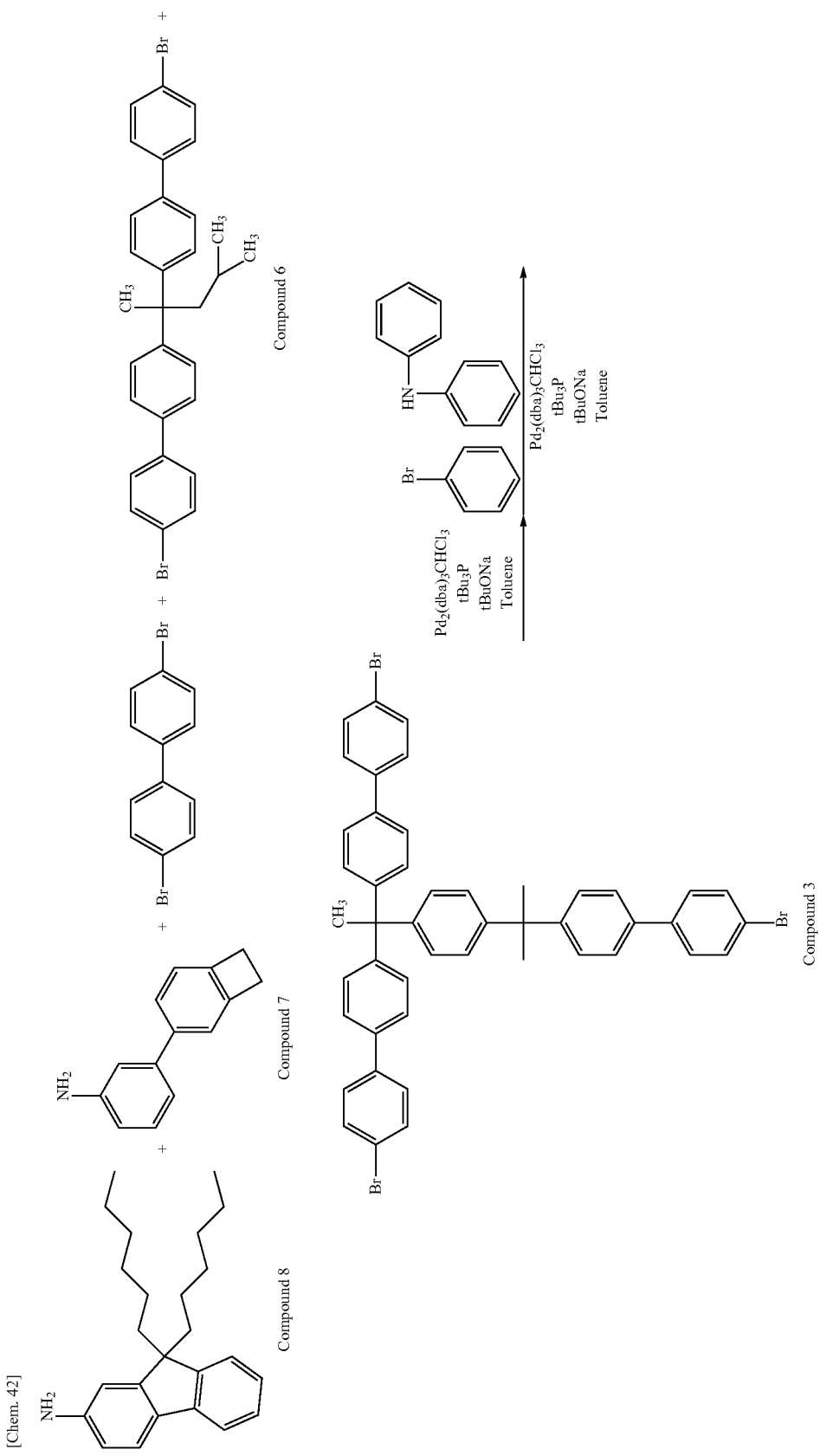

-continued
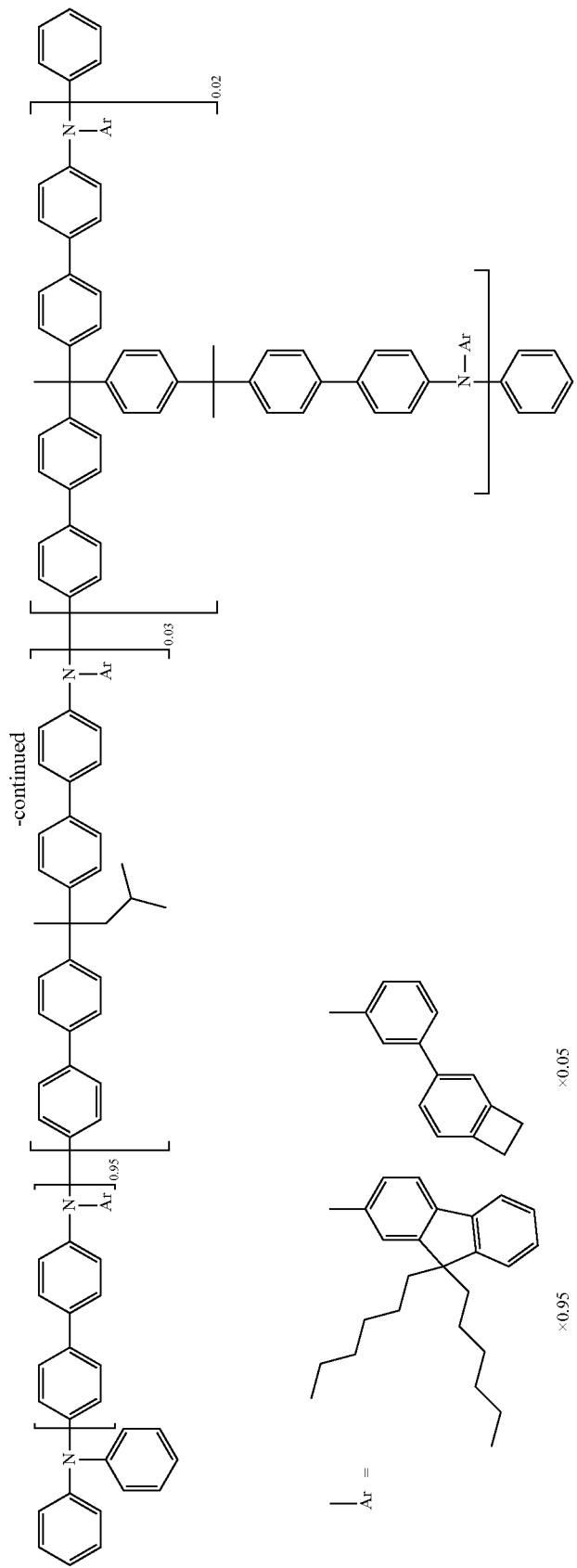
Target Polymer 4
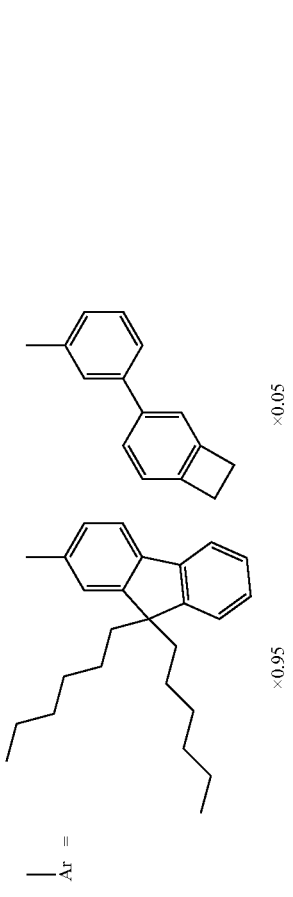

4,4'-Dibromobiphenyl (5.80 g, 18.6 mmol), the compound 8 (12.34 g, 35.3 mmol), the compound 7 (0.36 g, 1.86 mmol), sodium tert-butoxide (12.14 g, 126.4 mmol) and toluene (48 ml) were put into a reactor, then fully purged with nitrogen, and heated up to 65° C. (solution A4). Tri-t-butyl phosphine (0.827 g, 4.09 mmol) was added to a toluene (17 ml) solution of tris(dibenzylideneacetone)dipalladium chloroform complex (0.385 g, 0.372 mmol), and heated up to 65° C. (solution B4). In a nitrogen stream atmosphere, the solution B4 was added to the solution A4, and reacted for 2 hours with heating under reflux. Subsequently, 4,4'-dibromobiphenyl (4.81 g, 15.4 mmol) was added thereto. This was heated under reflux for 2.0 hours, and the compound 6 (0.611 g) and the compound 3 (0.626 g) were added thereto. After refluxed for 1 hour, the reaction liquid was left cooled, and the reaction liquid was dropwise added to ethanol (1000 ml) to crystallize a crude polymer 4.

The obtained crude polymer 4 was dissolved in toluene (280 ml), and N,N-diphenylamine (0.629 g) and sodium tert-butoxide (12.14 g) were added thereto, then fully purged with nitrogen and heated up to 65° C. (solution C4). Tri-t-butyl phosphine (0.248 g) was added to a toluene (18 ml) solution of tris(dibenzylideneacetone)dipalladium chloroform complex (0.115 g), and heated up to 65° C. (solution D4). In a nitrogen stream atmosphere, the solution D4 was added to the solution C4, and reacted for 4 hours with heating under reflux. Bromobenzene (2.92 g) and the solution D4 that had been additionally prepared were added to the reaction liquid, and further reacted for 2 hours with heating under reflux. The reaction liquid was left cooled and dropwise added to ethanol (1000 ml) to give an end-capped crude polymer 4.

The end-capped crude polymer 4 was dissolved in toluene, reprecipitated in acetone, and the precipitated polymer was separated through filtration. The separated crude polymer was dissolved in toluene, washed with diluted hydrochloric acid, and reprecipitated in ammonia-containing ethanol. The polymer collected by filtration was purified through column chromatography to give the target polymer 4 (3.6 g).

Weight-average molecular weight (Mw)=135800
Degree of dispersion (Mw/Mn)=2.06
<Synthesis of Target Polymer 5>

[Chem. 43]

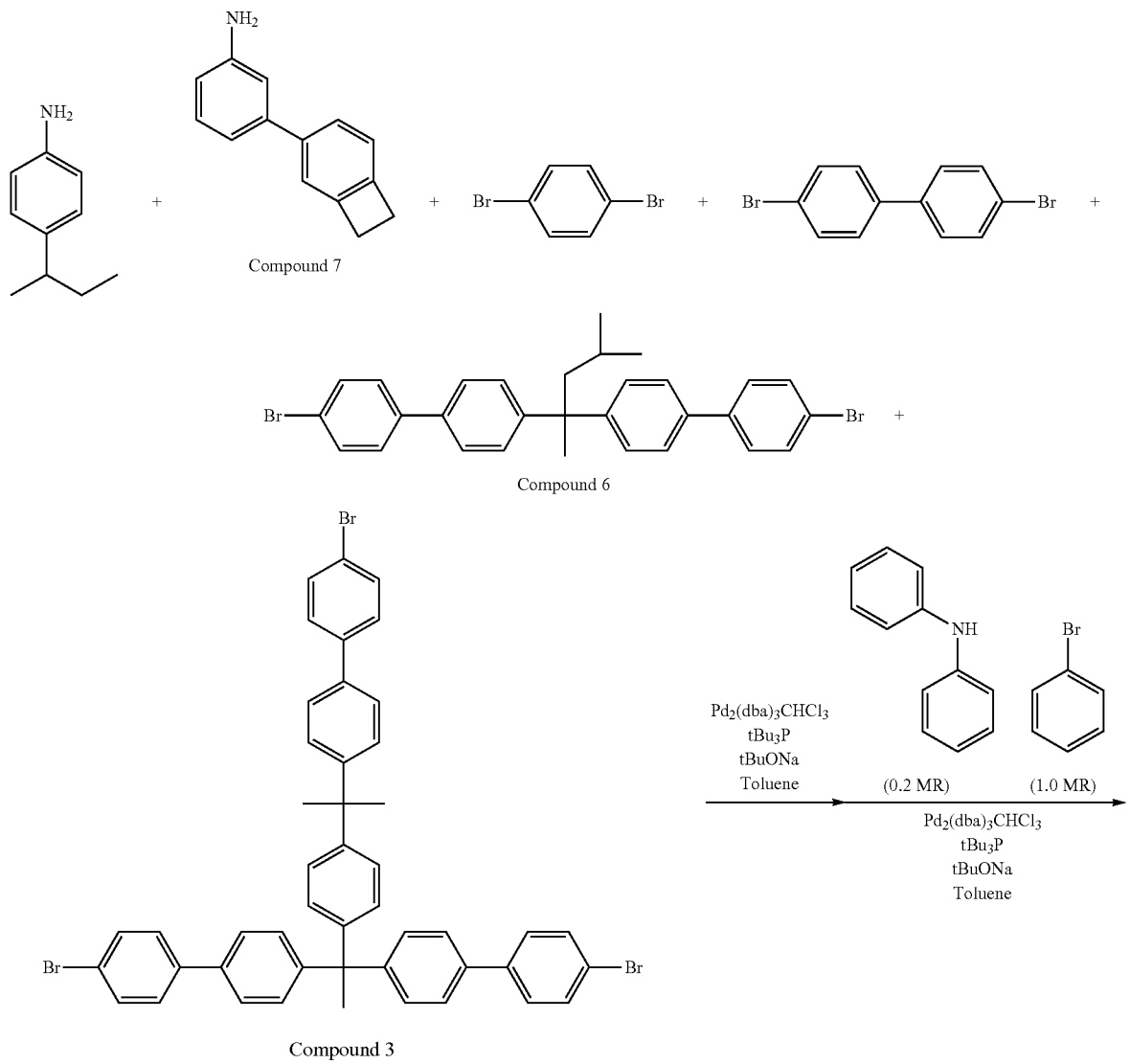

-continued

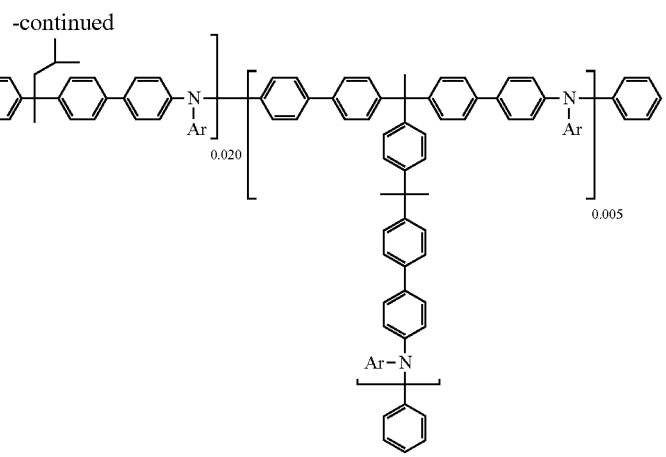

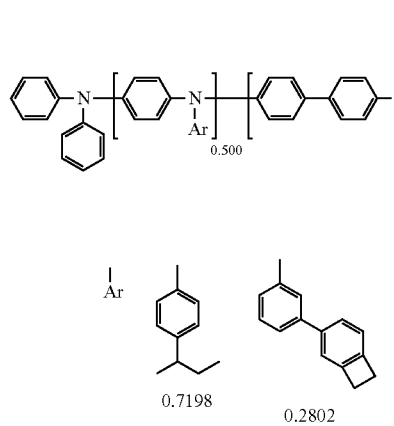

Target Polymer 5

Sec-butylaniline (5.3 g, 35.5156 mmol), the compound 7 (2.7 g, 13.8253 mmol), dibromobenzene (5.82 g, 24.6705 mmol), sodium tert-butoxide (15.17 g, 157.89 mmol) and toluene (45 ml) were put into a reactor, then fully purged with nitrogen, and heated up to 60° C. (solution A5). Tri-t-butyl phosphine (0.8 g, 3.95 mmol) was added to a toluene (25 ml) solution of tris(dibenzylideneacetone)dipalladium chloroform complex (0.51 g, 0.49 mmol), and heated up to 60° C. (solution B5). In a nitrogen stream atmosphere, the solution B5 was added to the solution A5, and reacted for 2 hours with heating under reflux. 4,4'-Dibromobiphenyl (6.945 g, 22.2596 mmol) was added thereto. This was heated under reflux for 1.0 hour, and the compound 6 (0.541 g, 0.9868 mmol) and the compound 3 (0.208 g, 0.2467 mmol) were added thereto all at a time. After this was heated under reflux for 1.0 hour, 4,4'-dibromobiphenyl (0.122 g, 0.391 mmol) was added thereto. After 30 minutes, the reaction liquid was left cooled, and the reaction liquid was dropwise added to ethanol (1500 ml) to crystalize a crude polymer 5.

The obtained crude polymer 5 was dissolved in toluene (300 ml), and N,N-diphenylamine (1.67 g) and sodium tert-butoxide (7.6 g) were added thereto, then fully purged with nitrogen and heated up to 60° C. (solution C5). Tri-t-butyl phosphine (0.4 g) was added to a toluene (20 ml) solution of tris(dibenzylideneacetone)dipalladium chloroform complex (0.255 g), and heated up to 60° C. (solution D5). In a nitrogen stream atmosphere, the solution D5 was added to the solution C5, and reacted for 2 hours with heating under reflux. Bromobenzene (3.87 g) was added to the reaction liquid. This was reacted for 4 hours with heating under reflux. The reaction liquid was left cooled and dropwise added to ethanol/water (1500 ml/100 ml) to give an end-capped crude polymer 5.

The end-capped crude polymer 5 was dissolved in toluene, reprecipitated in acetone, and the precipitated polymer was separated through filtration. The separated crude polymer was dissolved in toluene, washed with diluted hydrochloric acid, and reprecipitated in ammonia-containing ethanol. The polymer collected by filtration was purified through column chromatography to give the target polymer 5 (4.1 g).

Weight-average molecular weight (Mw)=88300

Degree of dispersion (Mw/Mn)=1.55

<Synthesis of Target Polymer 6>

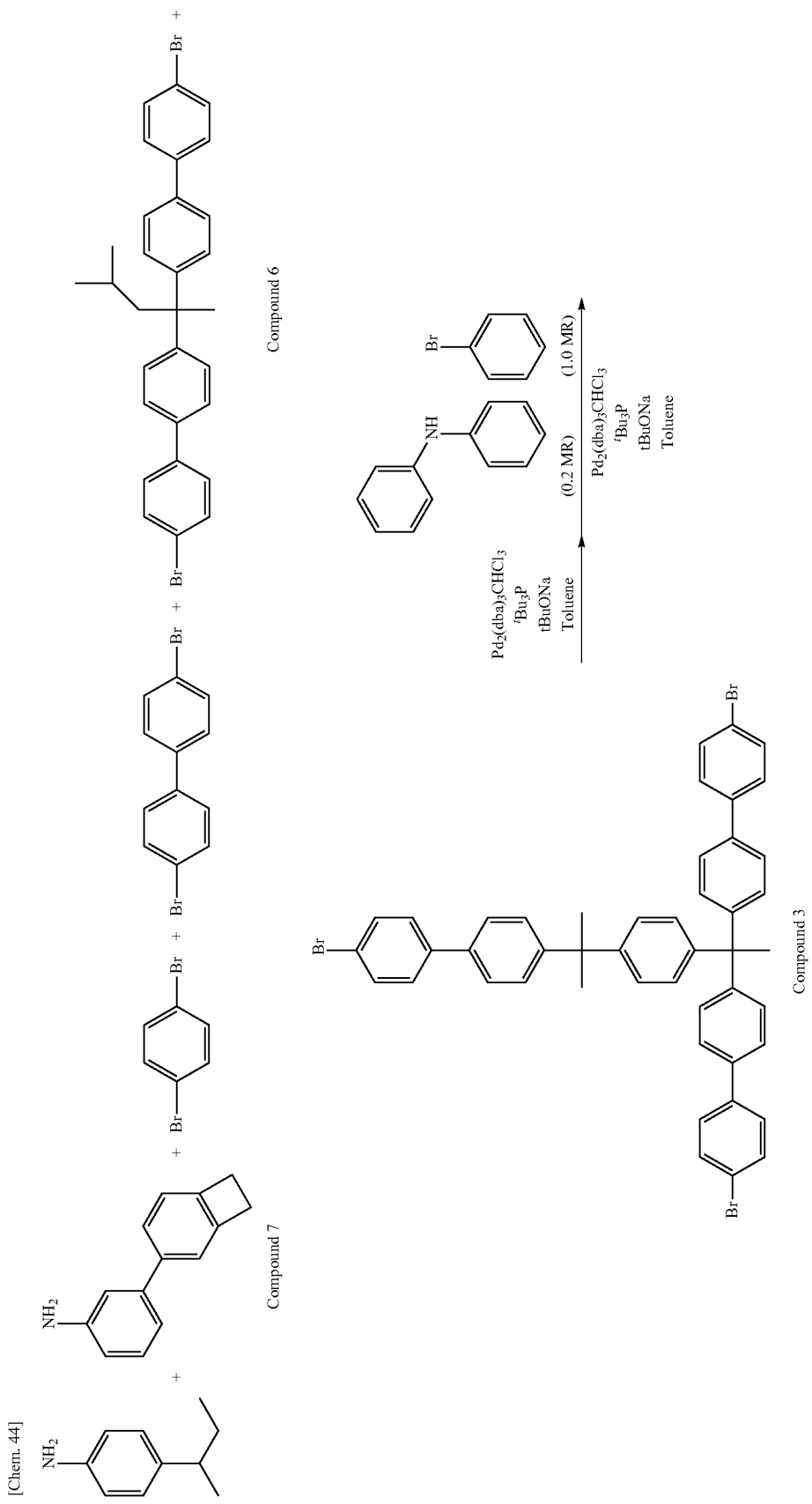

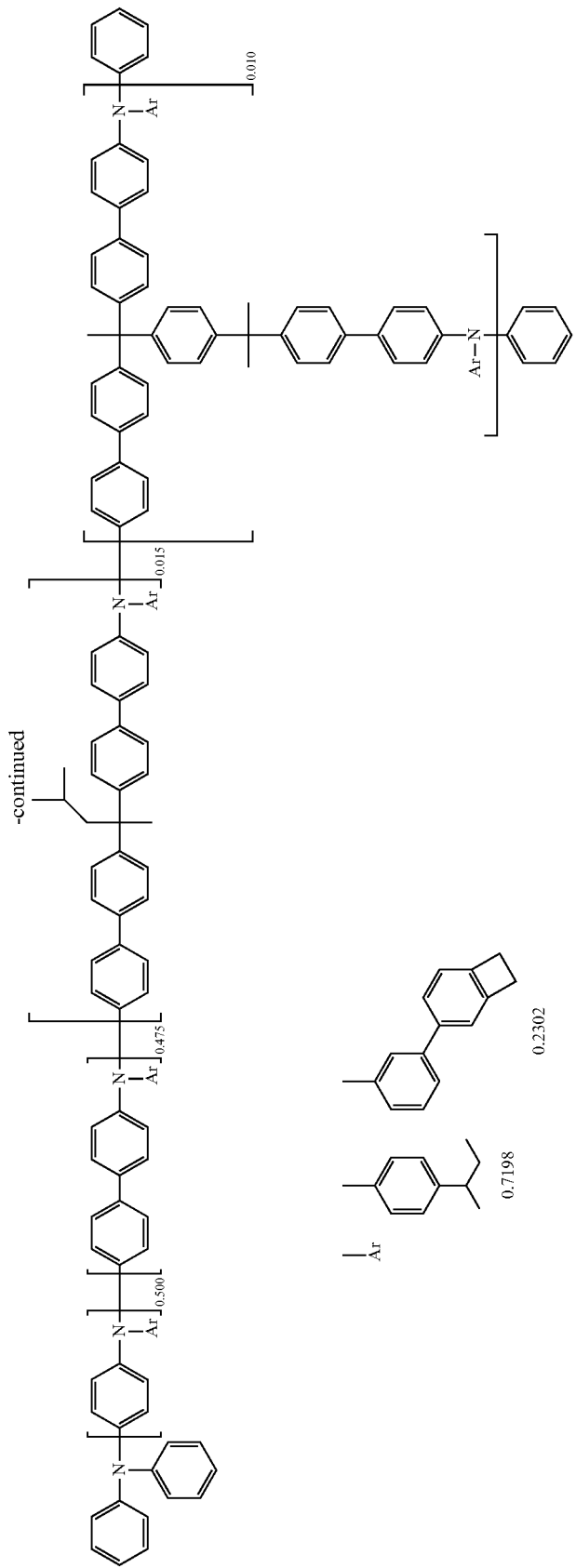

Sec-butylaniline (7.285 g, 48.8 mmol), the compound 7 (3.711 g, 19.0 mmol), dibromobenzene (8.00 g, 33.9 mmol), sodium tert-butoxide (20.86 g, 217.0 mmol) and toluene (64 ml) were put into a reactor, then fully purged with nitrogen, and heated up to 60° C. (solution A9). Tri-t-butyl phosphine (1.10 g, 5.42 mmol) was added to a toluene (32 ml) solution of tris(dibenzylideneacetone)dipalladium chloroform complex (0.70 g, 0.678 mmol), and heated up to 60° C. (solution B9). In a nitrogen stream atmosphere, the solution B9 was added to the solution A9, and reacted for 2 hours with heating under reflux. 4,4'-Dibromobiphenyl (9.52 g, 30.5 mmol) was added thereto. This was heated under reflux for 1.0 hour, and the compound 6 (0.558 g, 1.02 mmol) and the compound 3 (0.571 g, 0.678 mmol) were added thereto all at a time. After this was heated under reflux for 1.0 hour, 4,4'-dibromobiphenyl (0.106 g, 0.339 mmol) was added thereto. After 30 minutes, the reaction liquid was left cooled, and the reaction liquid was dropwise added to ethanol (1500 ml) to crystalize a crude polymer 9.

The obtained crude polymer 9 was dissolved in toluene (300 ml), and N,N-diphenylamine (1.15 g) and sodium tert-butoxide (20.9 g) were added thereto, then fully purged with nitrogen and heated up to 60° C. (solution C9). Tri-t-butyl phosphine (0.549 g) was added to a toluene (20 ml) solution of tris(dibenzylideneacetone)dipalladium chloroform complex (0.351 g), and heated up to 60° C. (solution D9). In a nitrogen stream atmosphere, the solution D9 was added to the solution C9, and reacted for 2 hours with heating under reflux. Bromobenzene (5.32 g) was added to the reaction liquid. This was reacted for 4 hours with heating under reflux. The reaction liquid was left cooled and dropwise added to ethanol/water (1500 ml/100 ml) to give an end-capped crude polymer 9.

The end-capped crude polymer 9 was dissolved in toluene, reprecipitated in acetone, and the precipitated polymer was separated through filtration. The separated crude polymer was dissolved in toluene, washed with diluted hydrochloric acid, and reprecipitated in ammonia-containing ethanol. The polymer collected by filtration was purified through column chromatography to give the target polymer 6 (5.9 g).

Weight-average molecular weight (Mw)=74000

Degree of dispersion (Mw/Mn)=2.17

<Synthesis of Target Polymer 7>

[Chem. 45]
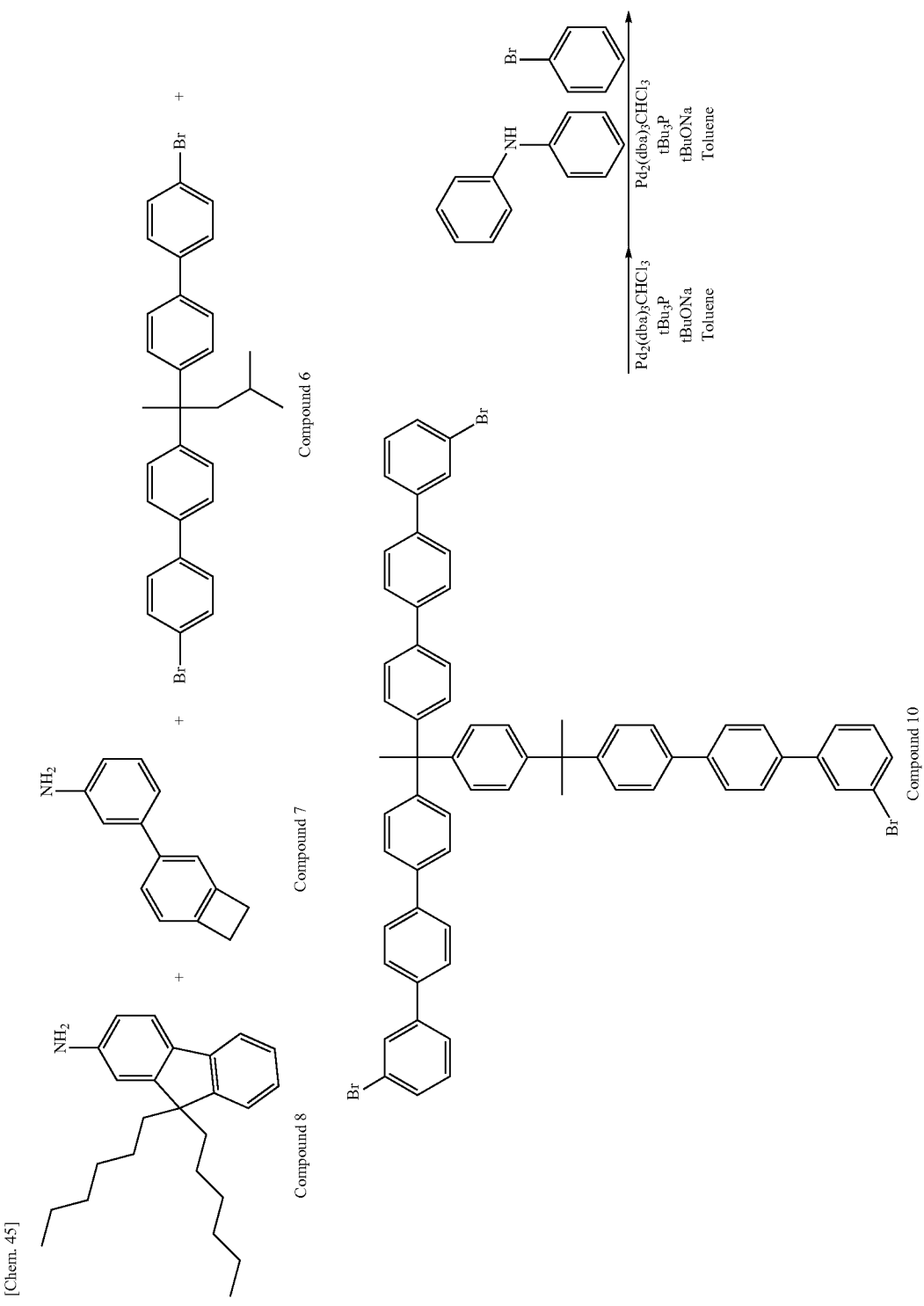

-continued
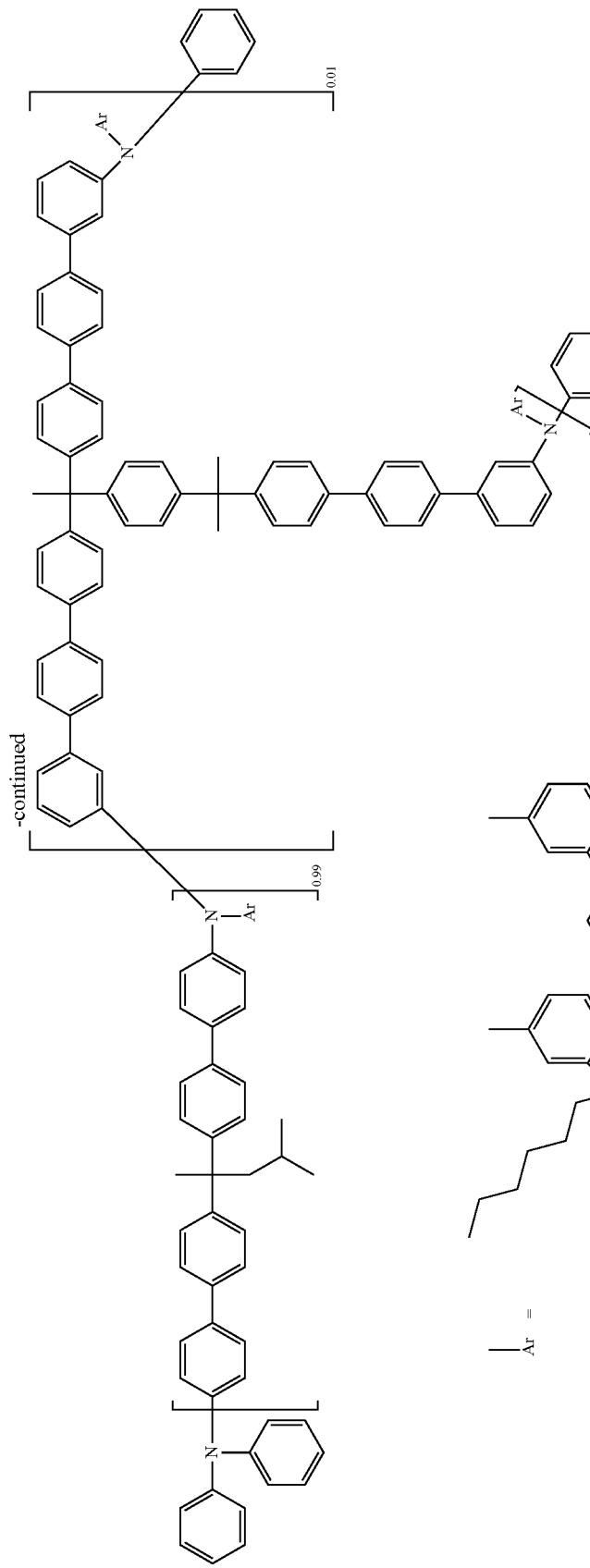
Target Polymer 7
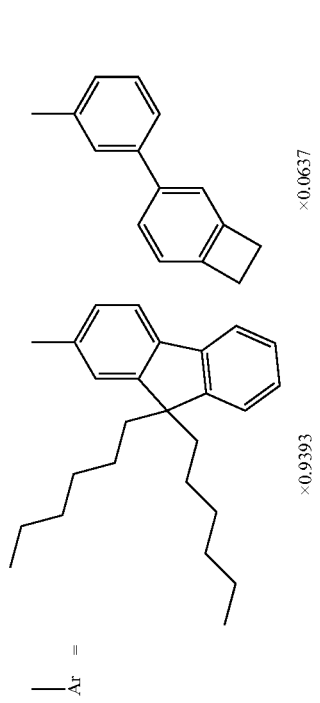

The compound 6 (2.19 g, 4.00 mmol), the compound 8 (2.62 g, 7.49 mmol), the compound 7 (0.100 g, 0.511 mmol), sodium tert-butoxide (2.61 g, 24.0 mmol) and toluene (22 ml) were put into a reactor, then fully purged with nitrogen, and heated up to 65° C. (solution A1). Tri-t-butyl phosphine (0.129 g, 0.640 mmol) was added to a toluene (5 ml) solution of tris(dibenzylideneacetone)dipalladium chloroform complex (0.083 g, 0.080 mmol), and heated up to 65° C. (solution B1). In a nitrogen stream atmosphere, the solution B1 was added to the solution A1, and reacted for 2 hours with heating under reflux. The compound 6 (1.947 g) was added thereto. After this was refluxed for 1 hour, the compound 10 (0.086 g) was added thereto. After refluxed for 1 hour, the reaction liquid was left cooled, and the reaction liquid was dropwise added to ethanol (350 ml) to crystallize a crude polymer 7.

The obtained crude polymer 7 was dissolved in toluene (55 ml), and bromobenzene (0.628 g) and sodium tert-butoxide (1.31 g) were added thereto, then fully purged with nitrogen and heated up to 65° C. (solution C1). Tri-t-butyl phosphine (0.033 g) was added to a toluene (10 ml) solution of tris (dibenzylideneacetone)dipalladium chloroform complex (0.021 g), and heated up to 65° C. (solution D1). In a nitrogen stream atmosphere, the solution D1 was added to the solution C1, and reacted for 4 hours with heating under reflux. Diphenylamine (0.135 g) and the solution D1 that had been additionally prepared were added to the reaction liquid, and further reacted for 2 hours with heating under reflux. The reaction liquid was left cooled and dropwise added to ethanol (350 ml) to give an end-capped crude polymer 7.

The end-capped crude polymer 7 was dissolved in toluene, washed with diluted hydrochloric acid, and reprecipitated in ammonia-containing ethanol to give a crude polymer. The polymer collected by filtration was dissolved in toluene, and acetone was added thereto to precipitate the polymer. The precipitated polymer was dissolved in toluene, and purified through column chromatography to give the target polymer 7 (2.16 g).

Weight-average molecular weight (Mw)=75700
Degree of dispersion (Mw/Mn)=1.50

<Synthesis of Comparative Polymer 1>

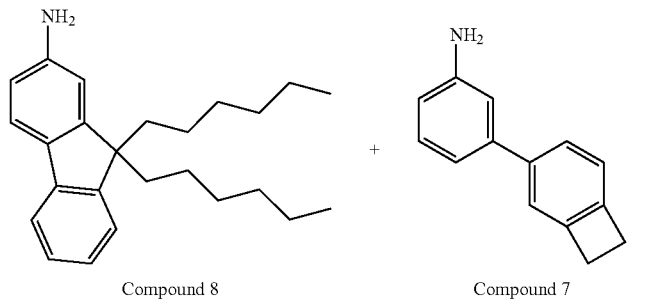

Compound 8              Compound 7

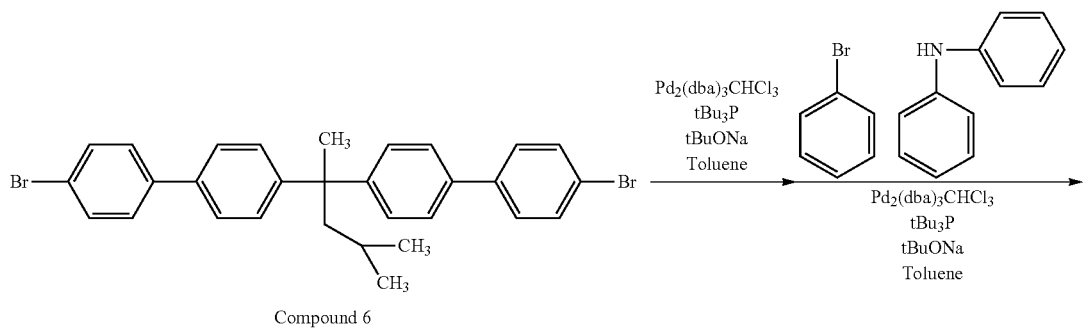

Compound 6

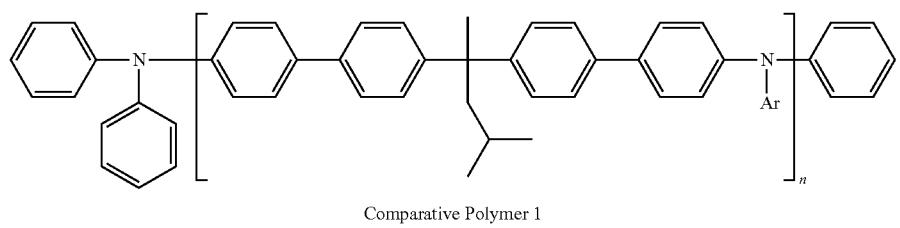

Comparative Polymer 1

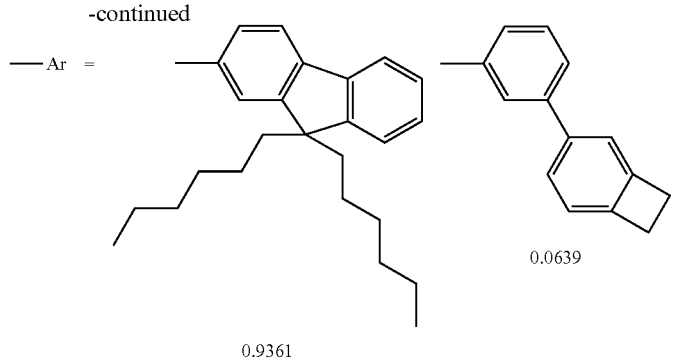

The compound 6 (7.000 g, 12.76 mmol), the compound 8 (8.354 g, 23.90 mmol), the compound 7 (0.318 g, 1.63 mmol), sodium tert-butoxide (8.342 g, 86.8 mmol) and toluene (70 ml) were put into a reactor, then fully purged with nitrogen, and heated up to 65° C. (solution A6). Tri-t-butyl phosphine (0.248 g, 1.23 mmol) was added to a toluene (10 ml) solution of tris(dibenzylideneacetone)dipalladium chloroform complex (0.158 g, 0.153 mmol), and heated up to 65° C. (solution B6). In a nitrogen stream atmosphere, the solution B6 was added to the solution A6, and reacted for 2 hours with heating under reflux. After the compounds to 6 to 8 were confirmed to have disappeared, the compound 6 (6.58 g) was added to the system. This was heated under reflux for 2.0 hours, then the reaction liquid was left cooled, and the reaction liquid was dropwise added to ethanol (1000 ml) to crystallize a crude polymer 6.

The obtained crude polymer 6 was dissolved in toluene (210 ml), and bromobenzene (0.802 g, 5.11 mmol) and sodium tert-butoxide (8.342 g, 86.8 mmol) were added thereto, then fully purged with nitrogen and heated up to 65° C. (solution C6). Tri-t-butyl phosphine (0.124 g, 0.613 mmol) was added to a toluene (10 ml) solution of tris(dibenzylideneacetone)dipalladium chloroform complex (0.079 g, 0.076 mmol), and heated up to 65° C. (solution D6). In a nitrogen stream atmosphere, the solution D6 was added to the solution C6, and reacted for 4 hours with heating under reflux. Diphenylamine (4.32 g, 25.53 mmol) and the solution D6 that had been additionally prepared were added to the reaction liquid, and further reacted for 2 hours with heating under reflux. The reaction liquid was left cooled and dropwise added to ethanol (1000 ml) to give an end-capped crude polymer 6.

The end-capped crude polymer 6 was dissolved in toluene, reprecipitated in acetone, and the precipitated polymer was collected through filtration. The crude polymer was dissolved in toluene, washed with diluted hydrochloric acid, and reprecipitated in ammonia-containing ethanol. The polymer collected by filtration was purified through column chromatography to give a comparative polymer 1 (9.8 g).

Weight-average molecular weight (Mw)=72000
Degree of dispersion (Mw/Mn)=1.50

<Synthesis of Comparative Polymer 2>

[Chem. 47]

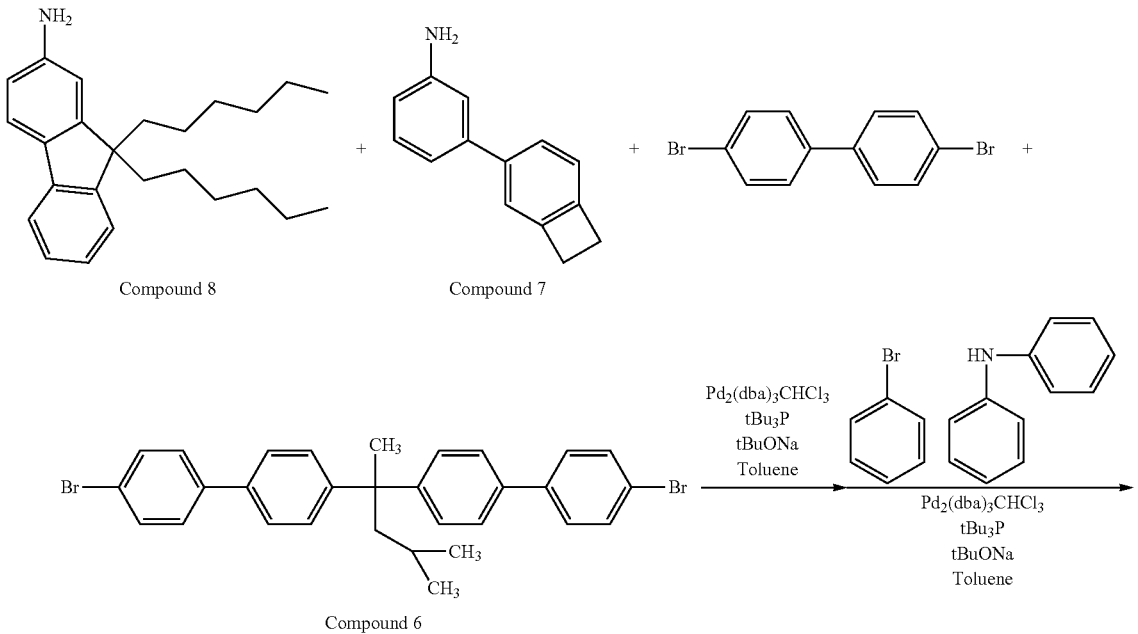

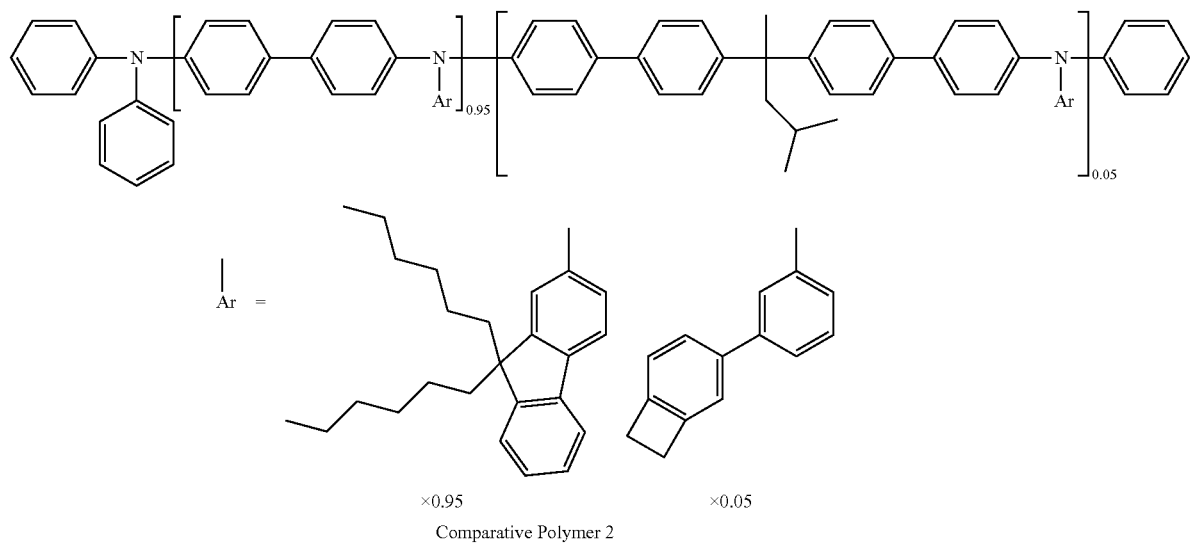

Comparative Polymer 2

4,4'-Dibromobiphenyl (4.23 g, 13.6 mol), the compound 8 (9.00 g, 25.7 mmol), the compound 7 (0.265 g, 1.36 mmol), sodium tert-butoxide (10.1 g, 104.5 mmol) and toluene (48 ml) were put into a reactor, then fully purged with nitrogen, and heated up to 65° C. (solution A7). Tri-t-butyl phosphine (0.285 g, 2.16 mmol) was added to a toluene (35 ml) solution of tris(dibenzylideneacetone)dipalladium chloroform complex (0.285 g, 0.275 mmol), and heated up to 65° C. (solution B7). In a nitrogen stream atmosphere, the solution B was added to the solution A, and reacted for 2 hours with heating under reflux. Subsequently, 4,4'-dibromobiphenyl (3.51 g, 11.3 mmol) was added thereto. This was heated under reflux for 2.0 hours, and the compound 6 (0.669 g) was added thereto. This was refluxed for 1 hour, and then 4,4'-dibromobiphenyl (0.053 g) was added thereto. This was refluxed for 1 hour, and then reaction liquid was left cooled, and the reaction liquid was dropwise added to ethanol (1000 ml) to crystallize a crude polymer 7.

The obtained crude polymer 7 was dissolved in toluene (250 ml), and N,N-diphenylamine (0.92 g) and sodium tert-butoxide (10.1 g) were added thereto, then fully purged with nitrogen and heated up to 65° C. (solution C7). Tri-t-butyl phosphine (0.219 g) was added to a toluene (18 ml) solution of tris(dibenzylideneacetone)dipalladium chloroform complex (0.142 g), and heated up to 65° C. (solution D7). In a nitrogen stream atmosphere, the solution D7 was added to the solution C, and reacted for 4 hours with heating under reflux. Bromobenzene (4.25 g) and the solution D7 that had been additionally prepared were added to the reaction liquid, and further reacted for 2 hours with heating under reflux. The reaction liquid was left cooled and dropwise added to ethanol (1000 ml) to give an end-capped crude polymer 7.

The end-capped crude polymer 7 was dissolved in toluene, reprecipitated in acetone, and the precipitated polymer was collected through filtration. The crude polymer collected by filtration was dissolved in toluene, washed with diluted hydrochloric acid, and reprecipitated in ammonia-containing ethanol. The polymer collected by filtration was purified through column chromatography to give a comparative polymer 2 (5.2 g).

Weight-average molecular weight (Mw)=84800
Degree of dispersion (Mw/Mn)=1.38
<Synthesis of Comparative Polymer 3>

[Chem. 48]

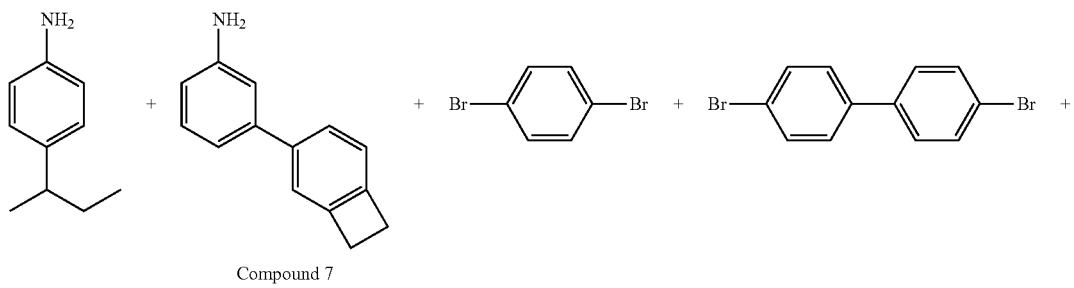

Compound 7

-continued

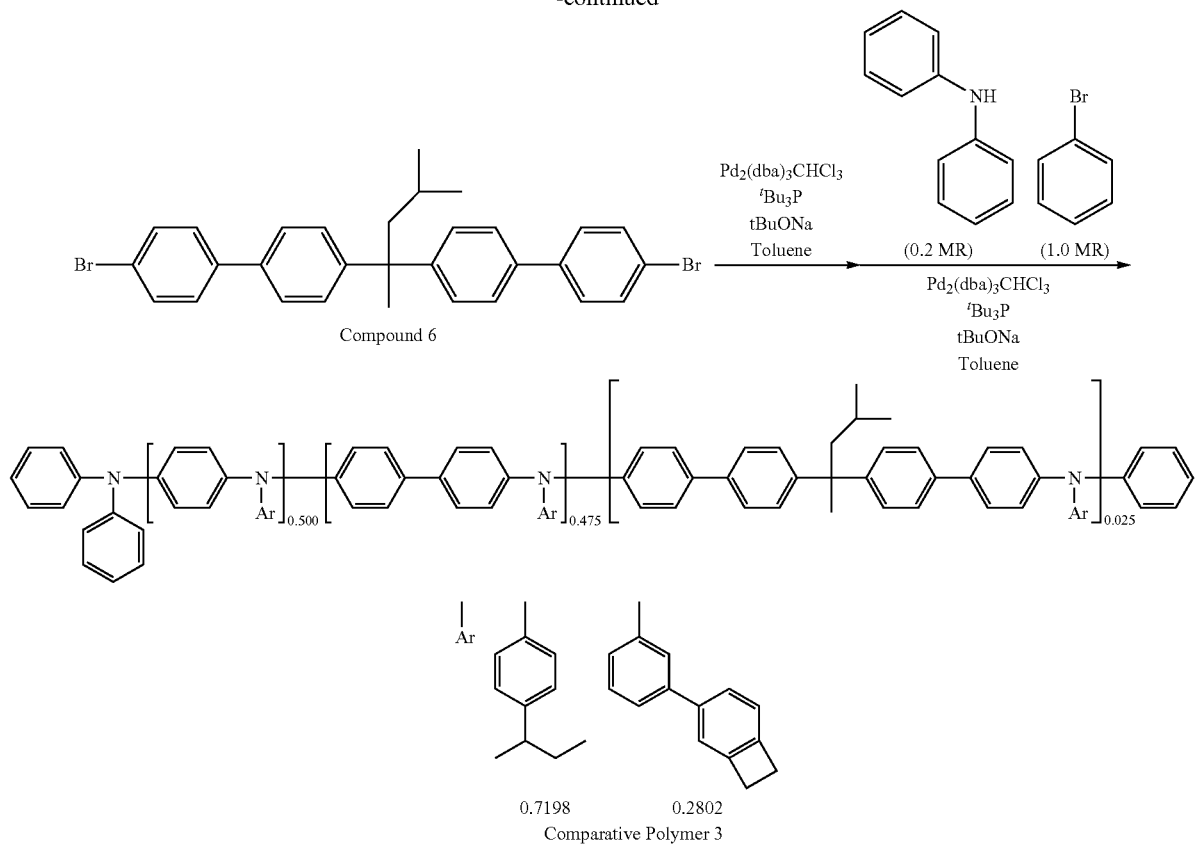

Comparative Polymer 3

Sec-butylaniline (5.30 g, 35.5 mmol), the compound 7 (2.70 g, 13.8 mmol), dibromobenzene (5.82 g, 24.7 mmol), sodium tert-butoxide (15.17 g, 157.9 mmol) and toluene (45 ml) were put into a reactor, then fully purged with nitrogen, and heated up to 60° C. (solution A8). Tri-t-butyl phosphine (0.8 g, 3.95 mmol) was added to a toluene (25 ml) solution of tris(dibenzylideneacetone)dipalladium chloroform complex (0.51 g, 0.49 mmol), and heated up to 60° C. (solution B8). In a nitrogen stream atmosphere, the solution B8 was added to the solution A8, and reacted for 2.0 hours with heating under reflux. 4,4'-Dibromobiphenyl (6.945 g, 22.2596 mmol) was added thereto. This was heated under reflux for 1.0 hour, and the compound 6 (0.642 g, 1.17 mmol) was added thereto. This was heated under reflux for 1 hour, and 4,4'-dibromobiphenyl (0.24 g, 0.769 mmol) was added. After 30 minutes, the reaction liquid was left cooled, and the reaction liquid was dropwise added to ethanol (1500 ml) to crystallize a crude polymer 8.

The obtained crude polymer 8 was dissolved in toluene (300 ml), and N,N-diphenylamine (1.67 g) and sodium tert-butoxide (7.6 g) were added thereto, then fully purged with nitrogen and heated up to 60° C. (solution C8). Tri-t-butyl phosphine (0.4 g) was added to a toluene (20 ml) solution of tris(dibenzylideneacetone)dipalladium chloroform complex (0.255 g), and heated up to 60° C. (solution D8). In a nitrogen stream atmosphere, the solution D8 was added to the solution C8, and reacted for 2 hours with heating under reflux. Bromobenzene (3.87 g) was added thereto. This was reacted for 4 hours with heating under reflux. The reaction liquid was left cooled and dropwise added to ethanol/water (1500 ml/100 ml) to give an end-capped crude polymer 8.

The end-capped crude polymer 8 was dissolved in toluene, reprecipitated in acetone, and the precipitated polymer was collected through filtration. The crude polymer collected by filtration was dissolved in toluene, washed with diluted hydrochloric acid, and reprecipitated in ammonia-containing ethanol. The polymer collected by filtration was purified through column chromatography to give a comparative polymer 3 (3.9 g).

Weight-average molecular weight (Mw)=71200

Degree of dispersion (Mw/Mn)=1.39

[Measurement of Charge Mobility]

The charge mobility was measured according to the time of flight (TOF) method shown in a non-patent document: A. Melnyk and D. M. Pai, Physical Methods of Chemistry, John Wiley & Sons (1993), p. 321, and H. D. Scher and E. W. Montroll, Phys. Rev., B12, 2445 (1975). The TOF measurement method is described below.

Figure 2:
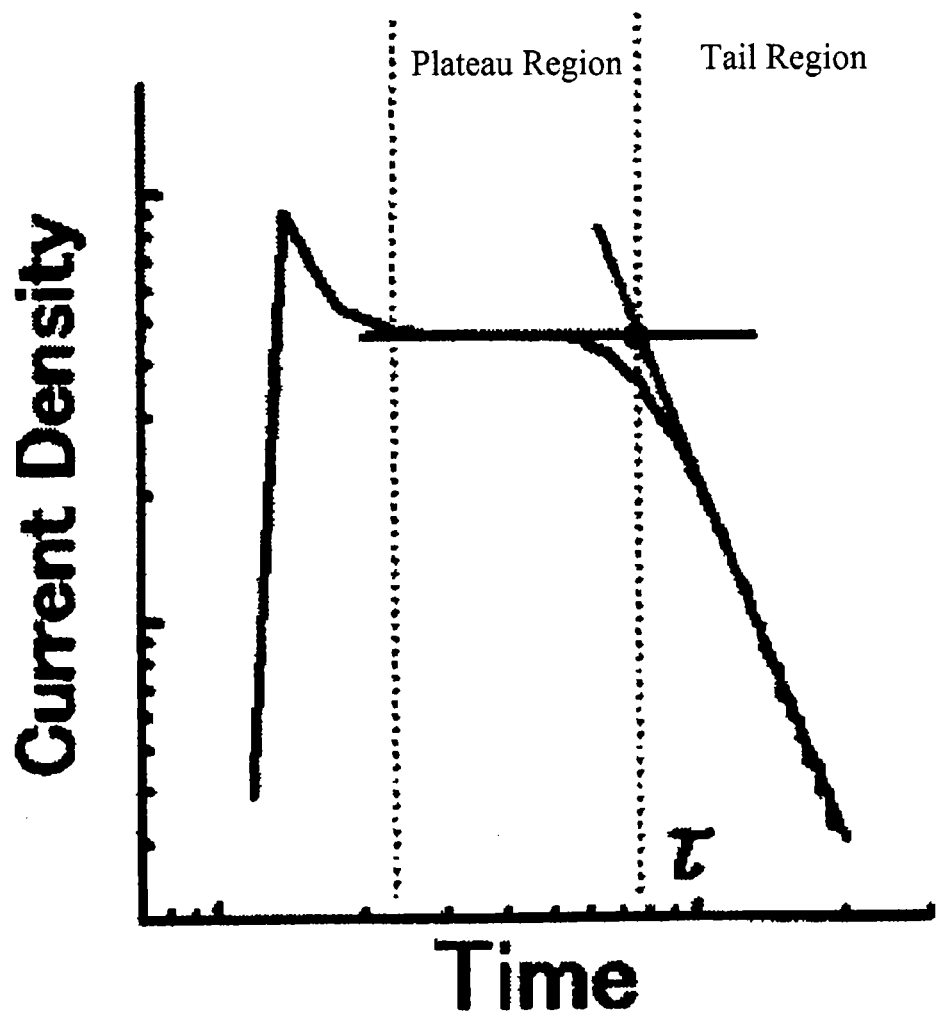
FIG. 2 is a graph showing a general transient photocurrent waveform in measurement of a charge mobility according to a TOF method.

An element sample having a sandwich electrode of which the electrode on at least one side is a transparent or semitransparent electrode is, while kept given an external electric field, irradiated with a pulse laser to excite the sample material, and the generated transient photocurrent is measured. From the transient photocurrent waveform, a logarithmic graph is formed relative to both the time and the current. A general transient photocurrent waveform has a plateau region where the current changes little with time and a tail region where the current reduces with time, as shown in FIG. 2. The boundary point of the two regions is referred to as a folding point. The time of giving the folding point is referred to as a charge transit time ($\tau$), and the drift mobility $\mu$ is obtained from the relational expression shown below in which L indicates the thickness of the sample and V indicates the applied voltage.

$$\mu = \frac{L^2}{\tau V} \quad \text{[Math. 1]}$$

<Measurement Condition>

A film of the charge transporting material to be analyzed and a counter electrode are formed on a semitransparent electrode, and sealed up to prepare a test sample. For forming the film of the charge transporting material, employable is any of a wet process or a dry process capable of giving a good amorphous film. The thickness of the film of the charge transporting material could be such that the distance from the site where charge separation may occur in charge mobility measurement to the counter electrode could be sufficiently long and the distance would not have any influence on evaluation of charge transferability. Concretely, the thickness is preferably 500 nm or more, more preferably 1000 nm or more.

Next, a predetermined electric field is applied to the sample so that the semitransparent electrode could be an anode and the counter electrode could be a cathode. The electric field intensity is preferably larger from the viewpoint that the influence of spontaneous diffusion of the charges moving inside the film could be small, but on the other hand, the electric field intensity is preferably smaller from the viewpoint that the effect of pulling the charges to the counter electrode would not be too strong and the charge loss could be evaluated accurately. Concretely, the electric field intensity is preferably 90 kV/cm or more, more preferably 120 kV/cm, but on the other hand, preferably 360 kV/cm or less, more preferably 310 kV/cm or less.

In this state, the test sample is irradiated with a monochromatic pulse laser from the semitransparent electrode side thereof. The electric field intensity in laser light irradiation, the excitation wavelength of the laser light, the pulse width and the quantity of light per one pulse are the same for the target sample of which the charge detection amount ratio is to be measured, in measurement of the hole charge amount Q (h) and the electron charge amount Q (e). The quantity of light per one pulse is preferably smaller since there is a probability that the charge transporting ability would be estimated high owing to the influence of generation of excessive charges, and concretely, the quantity of light is preferably 30 µJ or less.

When a film of the charge transporting material is irradiated with light, there occurs charge separation on the side of the semitransparent electrode of the film and holes moves toward the counter electrode. The current value is measured with an oscilloscope or the like to calculate the charge mobility.

<Measurement of Charge Mobility of Target Polymer 1>

The charge mobility of the target polymer 1 was measured as follows. First, a substrate having an ITO transparent conductive film (ITO stripe) deposited on a glass substrate in a thickness of 70 nm (by Geomatec) was ultrasonically washed with an aqueous surfactant solution, then washed with ultrapure water, ultrasonically washed with ultrapure water and washed with ultrapure water, then dried with compressed air, and washed with IJV ozone.

A solution was prepared by dissolving the target polymer 1 was dissolved in a mixed solvent of toluene and silicone oil (Shin-etsu Silicone's KF96) in a concentration of 10% by weight therein, and according to a spin coating method, the solution was applied onto the washed substrate to form a film thereon. The film formation was carried out all in a nitrogen atmosphere. According to the process, there was produced a film of the target polymer 1 having a thickness of 2 µm. Next, the sample was transferred into the vacuum chamber of a vacuum evaporation apparatus. As a mask for cathode deposition, a striped shadow mask having a stripe width of 2 mm was airtightly attached to the element so as to be orthogonal to the ITO stripe. Subsequently, the apparatus was degassed to have a vacuum degree of $8.0 \times 10^{-4}$ Pa or less, and then aluminium put on a molybdenum boat therein was heated to thereby form an electrode having a thickness of 80 nm on the sample. During aluminium film formation, the vacuum degree in the chamber was kept at $2.0 \times 10^{-3}$ Pa or less, and the evaporation rate was kept at from 0.6 to 10.0 angstrom/sec.

The sample was arranged in an electric field in such a manner that the ITO film thereof could be the anode and the aluminium electrode could be the cathode, and in that state, the transient photocurrent through the sample was measured using Spectra-Physics' "VSL-337MD-S" (nitrogen laser)" (excitation wavelength 337 nm, pulse width <4 ns). Using a reflection ND filter, the photoirradiation energy was so controlled that the quantity of light per one pulse could be 10 µJ, and the sample was irradiated with light from the ITO electrode side thereof. The transient photocurrent waveform was measured using an oscilloscope (Tektronix's "TDS2022"), and the charge mobility was calculated from the folding point thereon. The measurement was carried out while the sample was given an electric field intensity of 160 kV/cm.

The calculation result of the charge mobility was expressed as a relative value (standardized hole mobility) based on the calculation result, "1.0", of the charge mobility of the comparative polymer 1 to be shown below. The result is shown in Table 6.

<Measurement of Charge Mobility of Target Polymer 2>

The standardized hole mobility was measured in the same manner as above, except that the target polymer 1 was changed to the target polymer 2, and the result is shown in Table 6.

<Measurement of Charge Mobility of Comparative Polymer 1>

The measurement was carried out in the same manner as above, except that the target polymer 1 was changed to the comparative polymer 1, and the calculated charge mobility is referred to as 1.0.

TABLE 6

|  | Target Polymer 1 | Target Polymer 2 | Comparative Polymer 1 |
| --- | --- | --- | --- |
| Standardized Hole Mobility | 6.4 | 14.4 | 1.0 |

The target polymer 1 and the target polymer 2 are, different from the comparative polymer 1 having a main chain structure of the same type, the polymers of the present invention with a branched structure introduced thereinto.

As shown in Table 6, the target polymers 1 and 2 of the polymers of the present invention have a markedly high hole mobility, as compared with the comparative polymer 1. From the results, it is known that the charge transporting ability can be improved by introducing the specific branched structure as in the present invention.

<Measurement of Charge Mobility of Target Polymer 6>

The standardized hole mobility was measured in the same manner as above, except that the target polymer 1 was changed to the target polymer 6, and the result is shown in Table 7.

<Measurement of Charge Mobility of Comparative Polymer 3>

The measurement was carried out in the same manner as above, except that the target polymer 1 was changed to the comparative polymer 3, and the calculated charge mobility is referred to as 1.0.

TABLE 7

|  | Target Polymer 6 | Comparative Polymer 3 |
|---|---|---|
| Standardized Hole Mobility | 2.3 | 1.0 |

The target polymer 6 is, different from the comparative polymer 3 having a main chain structure of the same type, the polymer of the present invention with a branched structure introduced thereinto.

As shown in Table 7, the target polymer 6 of the polymer of the present invention has a high hole mobility, as compared with the comparative polymer 3. From the results, it is known that the charge transporting ability can be improved by introducing the specific branched structure as in the present invention.

[Production Method for Organic Electroluminescent Element]

Example 1

An organic electroluminescent element was produced according to the following process.

A glass substrate 1 having, as deposited by sputtering thereon, an indium tin oxide (ITO) transparent conductive film, was patterned to have a stripe anode 2 having a stripe width of 2 mm, according to ordinary photolithography combined with hydrochloric acid etching. The thus-patterned ITO substrate was ultrasonically washed with an aqueous surfactant solution, washed with ultrapure water, ultrasonically washed with ultrapure water, and washed with ultrapure water in that order, then dried, and washed with UV ozone.

Next, a composition for forming hole injection layer was prepared, comprising an arylamine polymer represented by the following structural formula (P-1), 4-isopropyl-4'-methyldiphenyliodonium tetrakis(pentafluorophenyl)borate represented by the following structural formula (A-1) and ethyl benzoate. The composition for forming hole injection layer was applied onto the anode 2 in a mode of spin coating under the condition mentioned below, thereby forming a hole injection layer 3 having a thickness of 40 nm.

[Chem. 49]

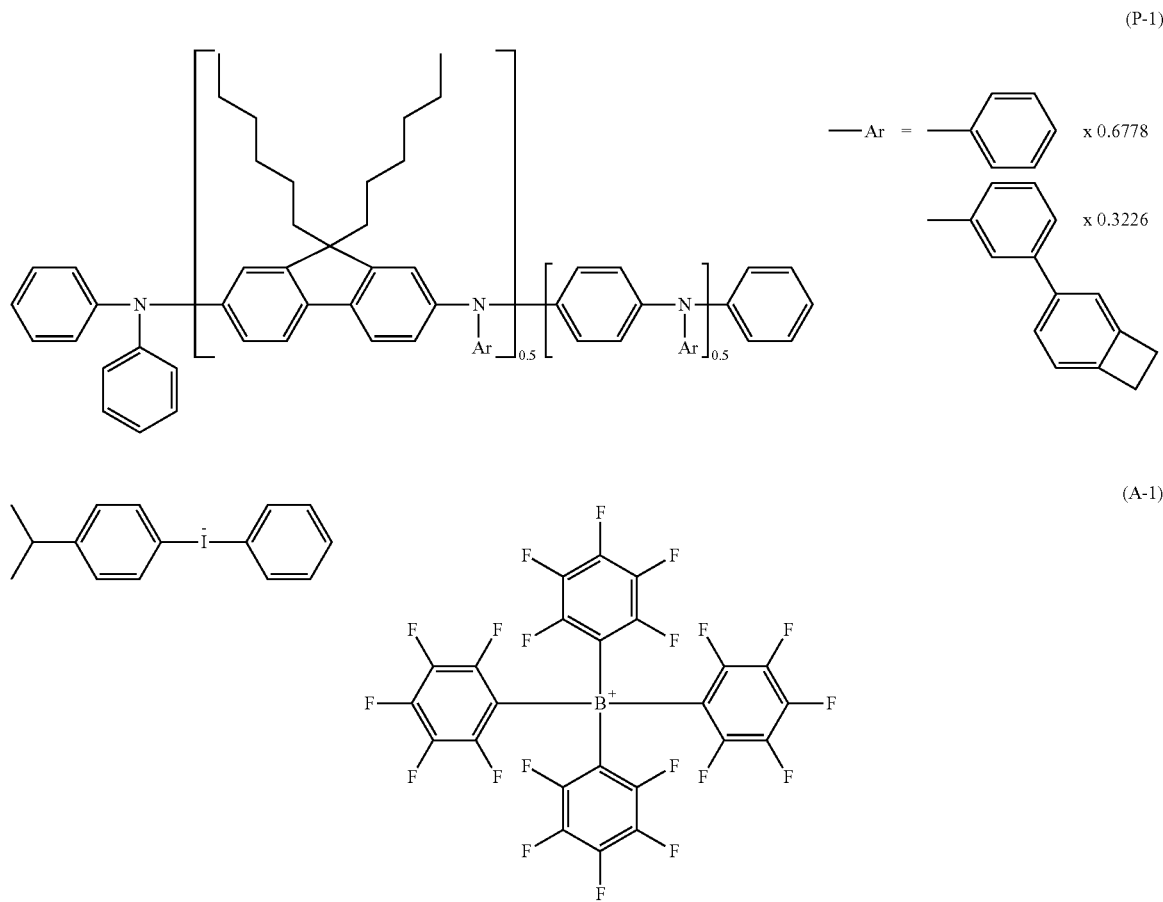

(P-1)

(A-1)

183

<Composition for Forming Hole Injection Layer>

| Solvent | ethyl benzoate |
|---|---|
| Composition concentration | P-1: 2.5% by weight |
| | A-1: 0.5% by weight |

<Condition for Forming Hole Injection Layer 3>

| Spin coating atmosphere | in air |
|---|---|
| Heating condition | in air, 230° C., 1 hour |

Subsequently, a composition for forming hole transport layer, containing the target polymer 2 shown below, was prepared, and this was applied onto the hole injection layer 3 in a mode of spin coating under the condition mentioned below, and polymerized by heating to form a hole transport layer 4 having a thickness of 10 mm.

184

<Composition for Forming Hole Transport Layer>

| Solvent | cyclohexylbenzene |
|---|---|
| Composition concentration | target polymer 2: 1.0% by weight |

<Condition for Forming Hole Transport Layer 4>

| Spin coating atmosphere | in nitrogen |
|---|---|
| Heating condition | in nitrogen, 230° C., 1 hour |

Next, an organic compound (E1) having the following structure was laminated on the hole transport layer 4 according to a vacuum evaporation method at an evaporation rate of from 0.8 to 1.2 angstrom/sec, thereby forming a light-emitting layer 5 having a thickness of 60 nm.

[Chem. 50]

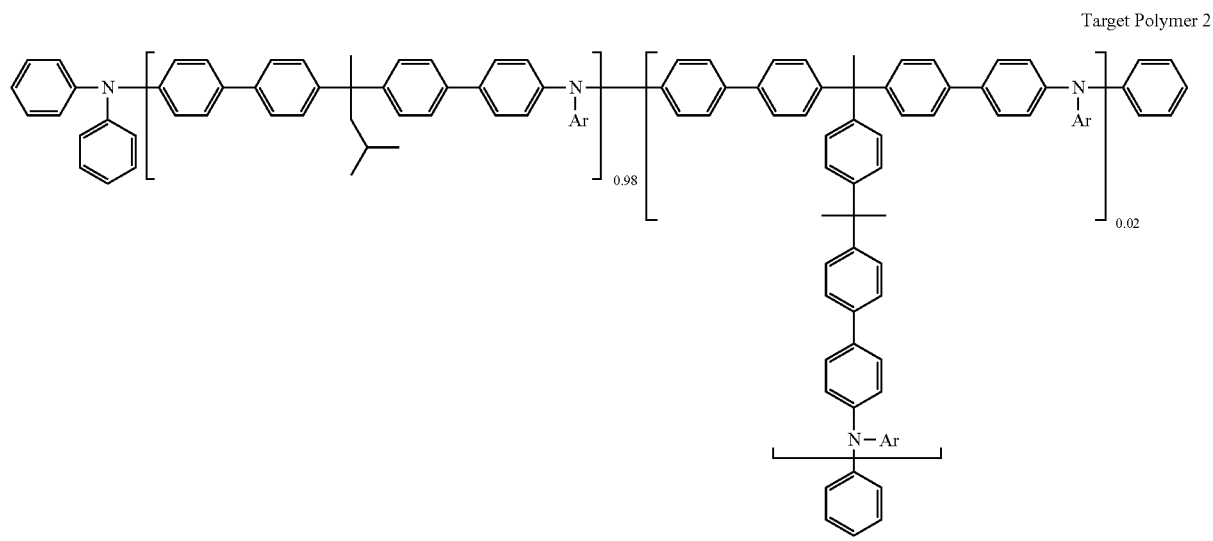

Target Polymer 2

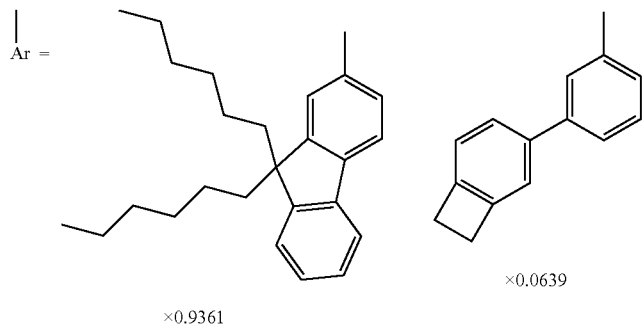

[Chem. 51]

(E1)

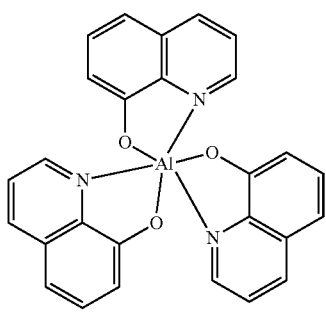

Next, as a mask for cathode deposition, a striped shadow mask having a stripe width of 2 mm was airtightly attached onto the electron transport layer 7 so as to be orthogonal to the ITO stripe of the anode 2.

Using a molybdenum boat, lithium fluoride (LiF) was first vapor-deposited on the electron transport layer 7 at a deposition rate of from 0.1 to 0.4 angstrom/second, thereby forming thereon an electron injection layer 8 having a thickness of 0.5 nm. Next, similarly to the above, aluminium was heated on a molybdenum boat and vapor-deposited at a deposition rate of from 0.7 to 5.3 angstrom/sec, thereby forming an aluminium layer having a thickness of 80 nm as a cathode 9.

Subsequently, the element was sealed up according to the method mentioned below, for preventing the element from being degraded by moisture in air during storage. In a nitrogen globe box, a photocurable resin (Three Bond's 30Y-437) was applied to the outer periphery of a glass plate having a size of 23 mm×23 mm, to a width of 1 mm, and a moisture getter sheet (by Dynic) was arranged in the center part. The substrate after cathode formation thereon was put on it and stuck thereto in such a manner that the coated side of the substrate could face the desiccant sheet. Subsequently, only the area coated with the photocurable resin was irradiated with UV rays and the resin was thereby cured.

In the manner as above, an organic electroluminescent element having a light emission area part with a size of 2 mm×2 mm was obtained. When a voltage was applied thereto, the element presented 522-nm light emission derived from the organic compound (E1).

Example 2

A glass substrate 1 having, as deposited by sputtering thereon, an indium tin oxide (ITO) transparent conductive film, an anode 2 was patterned to have a stripe anode 2 having a stripe width of 2 mm, according to ordinary photolithography combined with hydrochloric acid etching. The thus-patterned ITO substrate was ultrasonically washed with an aqueous surfactant solution, washed with ultrapure water, ultrasonically washed with ultrapure water, and washed with ultrapure water in that order, then dried, and washed with UV ozone.

Next, a composition for forming hole injection layer was prepared, comprising an arylamine polymer represented by the structural formula (comparative polymer 2) and the structural formula (comparative polymer 3) shown below, 4-isopropyl-4'-methyldiphenyliodonium tetrakis(pentafluorophenyl)borate represented by the above-mentioned structural formula (A-1) and ethyl benzoate. The composition for forming hole injection layer was applied onto the anode 2 in a mode of spin coating under the condition mentioned below, thereby forming a hole injection layer 3 having a thickness of 60 nm.

[Chem. 52]

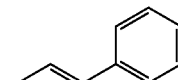

(RH-1)

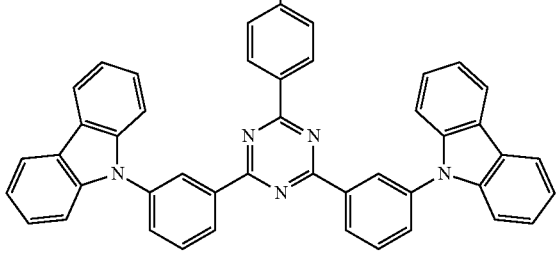

(RH-2)

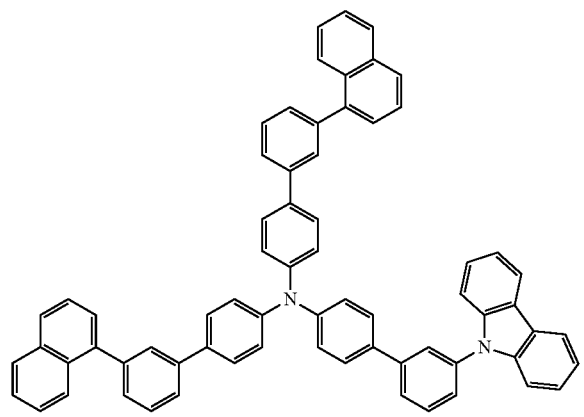

(RD-1)

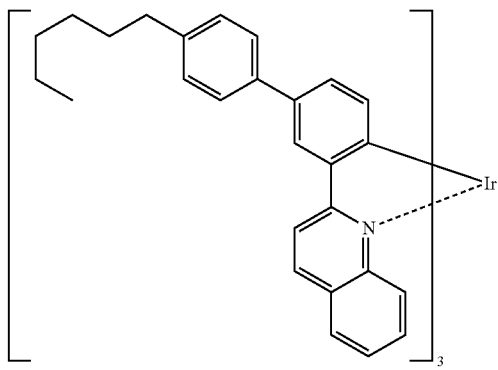

<Composition for Forming Hole Injection Layer 3>

| Solvent | ethyl benzoate |
|---|---|
| Composition concentration | Comparative Polymer 2: 0.875% by weight |
| | Comparative Polymer 3: 2.625% by weight |
| | A-1: 0.7% by weight |

<Condition for Forming Hole Injection Layer 3>

| | |
|---|---|
| Spin coating atmosphere | in air |
| Heating condition | in air, 230° C., 1 hour |

Subsequently, a composition for forming hole transport layer, containing a compound having the structural formula shown as the above-mentioned (target polymer 2), was prepared, and this was applied onto the hole injection transport layer 3 in a mode of spin coating under the condition mentioned below, and polymerized by heating to form a hole transport layer 4 having a thickness of 10 mm.

<Composition for Forming Hole Transport Layer>

| | |
|---|---|
| Solvent | cyclohexylbenzene |
| Composition concentration | target polymer 2: 1.0% by weight |

<Condition for Forming Hole Injection Transport Layer 4>

| | |
|---|---|
| Spin coating atmosphere | in nitrogen |
| Heating condition | in nitrogen, 230° C., 1 hour |

Next, a composition for forming light-emitting layer, containing compounds having the structural formulae (RH-1), (RH-2) and (RD-1) shown below, was prepared, and this was applied onto the hole transport layer 4 in a mode of spin coating under the condition mentioned below, and heated to form a light-emitting layer 5 having a thickness of 50 nm thereon.

[Chem. 53]

(RH-1)

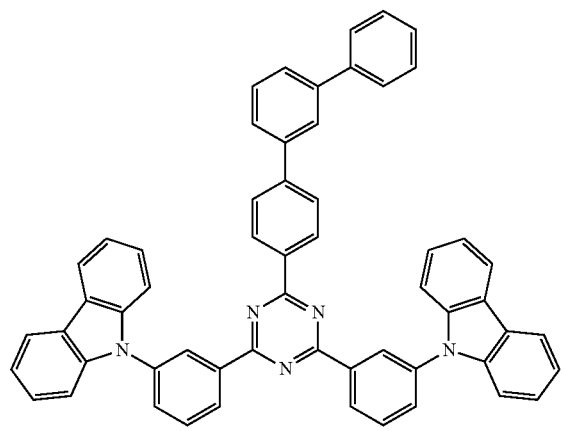

(RH-2)

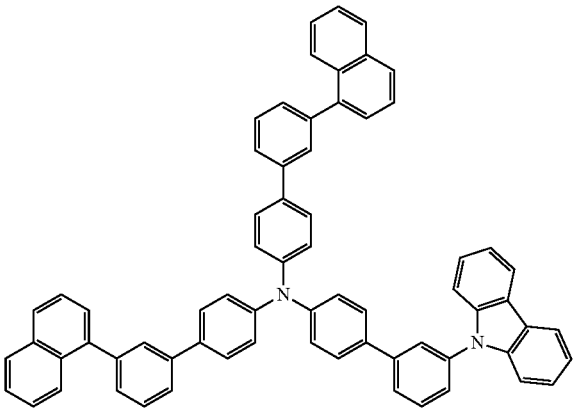

(RD-1)

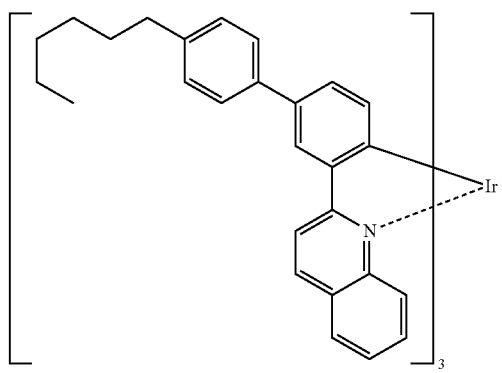

<Composition for Forming Light-Emitting Layer>

| | |
|---|---|
| Solvent | cyclohexylbenzene |
| Composition concentration | RH-1: 1.2% by weight |
| | RH-2: 3.6% by weight |
| | RD-1: 0.48% by weight |

<Condition for Forming Light-Emitting Layer 5>

| | |
|---|---|
| Spin coating atmosphere | in nitrogen |
| Heating condition | in nitrogen, 120° C., 20 min |

The substrate processed for film formation thereon up to the light-emitting layer 5 was transferred into a vacuum evaporation apparatus, this was degassed until the vacuum degree inside the apparatus could reach $2.0 \times 10^{-4}$ Pa or less, and then a compound having the structural formula (HB-1) shown below was laminated on the light-emitting layer 5 according to a vacuum evaporation method at a deposition rate of from 0.8 to 1.2 angstrom/sec, thereby forming thereon a hole block layer 6 having a thickness of 10 nm.

[Chem. 54]

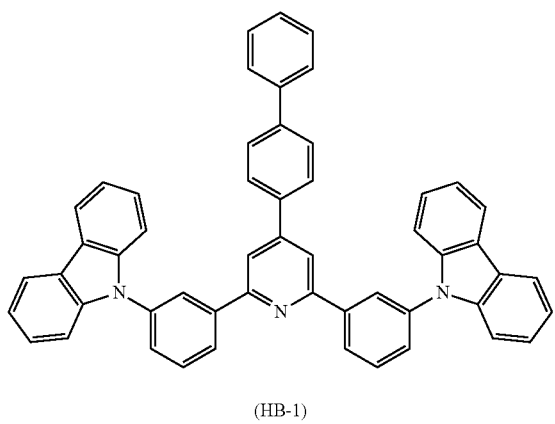

(HB-1)

Further, an organic compound (E1) having the structure shown below was laminated on the hole block layer 6 according to a vacuum evaporation method at a deposition rate of from 0.8 to 1.2 angstrom/sec, thereby forming thereon an electron transport layer 7 having a thickness of 20 nm.

[Chem. 55]

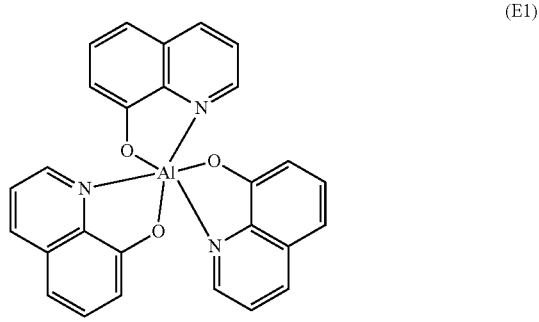

(E1)

Here, the substrate having been processed for vapor deposition to form the electron transport layer 7 was transferred into a different chamber connected to the chamber where the hole block layer 6 and the electron transport layer 7 had been vapor-deposited thereon, in vacuum, and, as a mask for cathode deposition, a 2-mm wide stripe shadow mask was airtightly stuck to the electron transport layer 7 in such a manner that the shadow mask could be orthogonal to the ITO stripe of the anode 2.

Using a molybdenum boat, lithium fluoride (LiF) was first vapor-deposited on the electron transport layer 7 at a deposition rate of from 0.1 to 0.4 angstrom/second, thereby forming thereon an electron injection layer 8 having a thickness of 0.5 nm. Next, similarly to the above, aluminium was heated on a molybdenum boat and vapor-deposited at a deposition rate of from 0.7 to 5.3 angstrom/sec, thereby forming an aluminium layer having a thickness of 80 nm as a cathode 9.

Subsequently, the element was sealed up according to the method mentioned below, for preventing the element from being degraded by moisture in air during storage. In a nitrogen globe box, a photocurable resin (Three Bond's 30Y-437) was applied to the outer periphery of a glass plate having a size of 23 mm×23 mm, to a width of 1 mm, and a moisture getter sheet (by Dynic) was arranged in the center part. The substrate after cathode formation thereon was put on it and stuck thereto in such a manner that the coated side of the substrate could face the desiccant sheet. Subsequently, only the area coated with the photocurable resin was irradiated with UV rays and the resin was thereby cured.

In the manner as above, an organic electroluminescent element having a light emission area part with a size of 2 mm×2 mm was obtained.

The organic electroluminescent element was tested for measuring the operation life thereof, and the result is shown in Table 8.

<Measurement of Operation Life>

A method for measurement of operation life is described. A direct-current constant voltage (30 mA/cm$^2$) is kept applied to the produced organic electroluminescent element during the test, and the brightness change is observed with a photodiode. The time taken until the brightness value reaches 80% of the initial value at the start of the test is counted. The operation life of the organic electroluminescent element of Comparative Example 1 is referred to as "1.0", and based on the value, the relative value of each test sample is calculated. The current test is carried out in a room where the room temperature is air-conditioned at 23±1.5° C.

Example 3

An organic electroluminescent element was produced in the same manner as in Example 2, except that the composition for forming hole injection and the composition for forming hole transport layer were changed to the following, and tested for the operation life also in the same manner, and the result is shown in Table 8.

<Composition for Forming Hole Injection Layer>

| Solvent | ethyl benzoate |
|---|---|
| Composition concentration | comparative polymer 3: 2.625% by weight |
| | target polymer 3: 0.875% by weight |
| | A-1: 0.7% by weight |

[Chem. 56]

Target Polymer 3

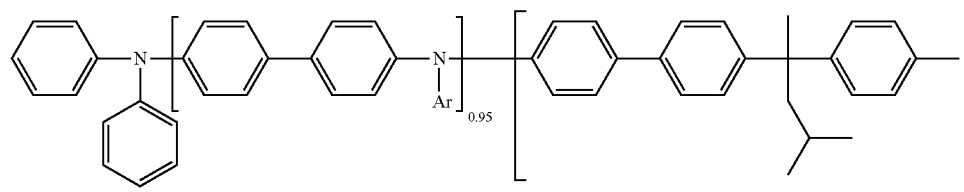

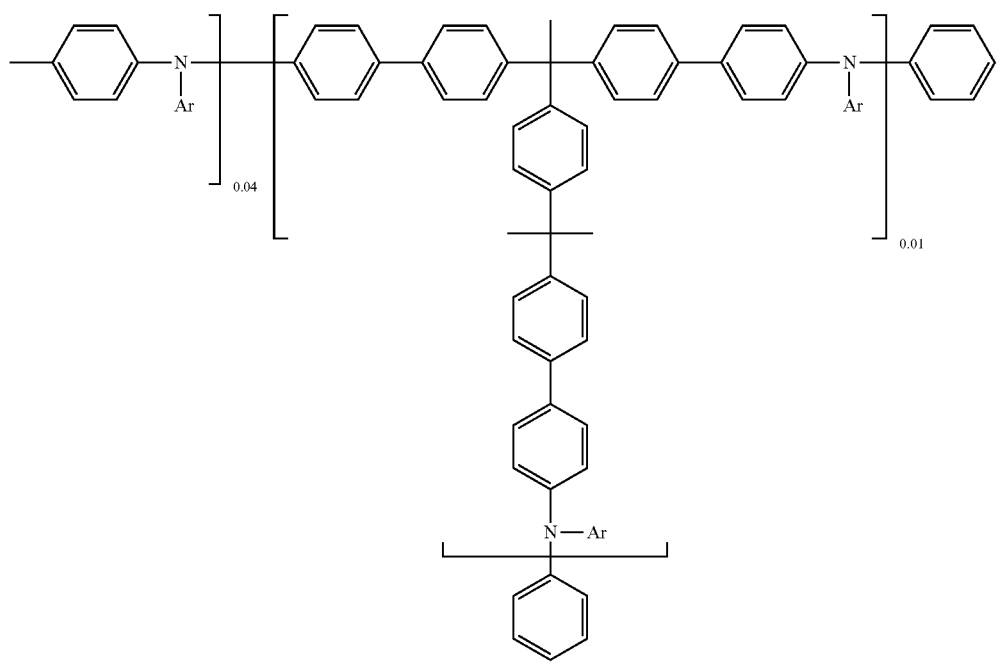
<Composition for Forming Hole Transport Layer>
| Solvent | cyclohexylbenzene |
|---|---|
| Composition concentration | comparative polymer 1: 1.0% by weight |
[Chem. 57]
Comparative Polymer 1
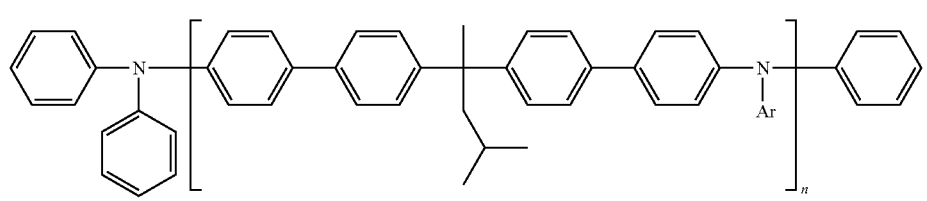

—Ar =

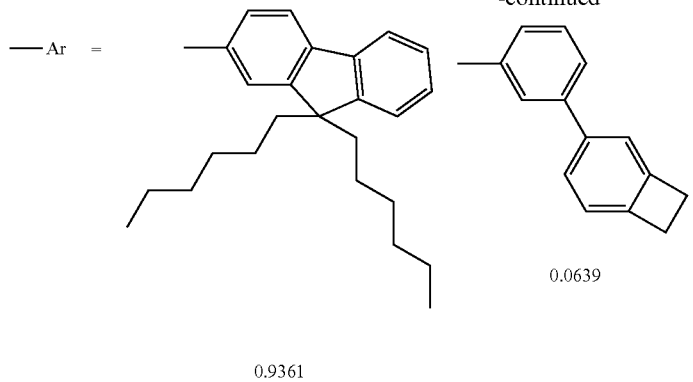

0.9361  0.0639

Example 4

An organic electroluminescent element was produced in the same manner as in Example 3, except that the composition for forming hole injection was changed to the following, and tested for the operation life also in the same manner, and the result is shown in Table 8.

<Composition for Forming Hole Injection Layer>

| | |
|---|---|
| Solvent | ethyl benzoate |
| Composition concentration | comparative polymer 3: 2.625% by weight |
| | target polymer 4: 0.875% by weight |
| | A-1: 0.7% by weight |

[Chem. 58]

Target Polymer 4

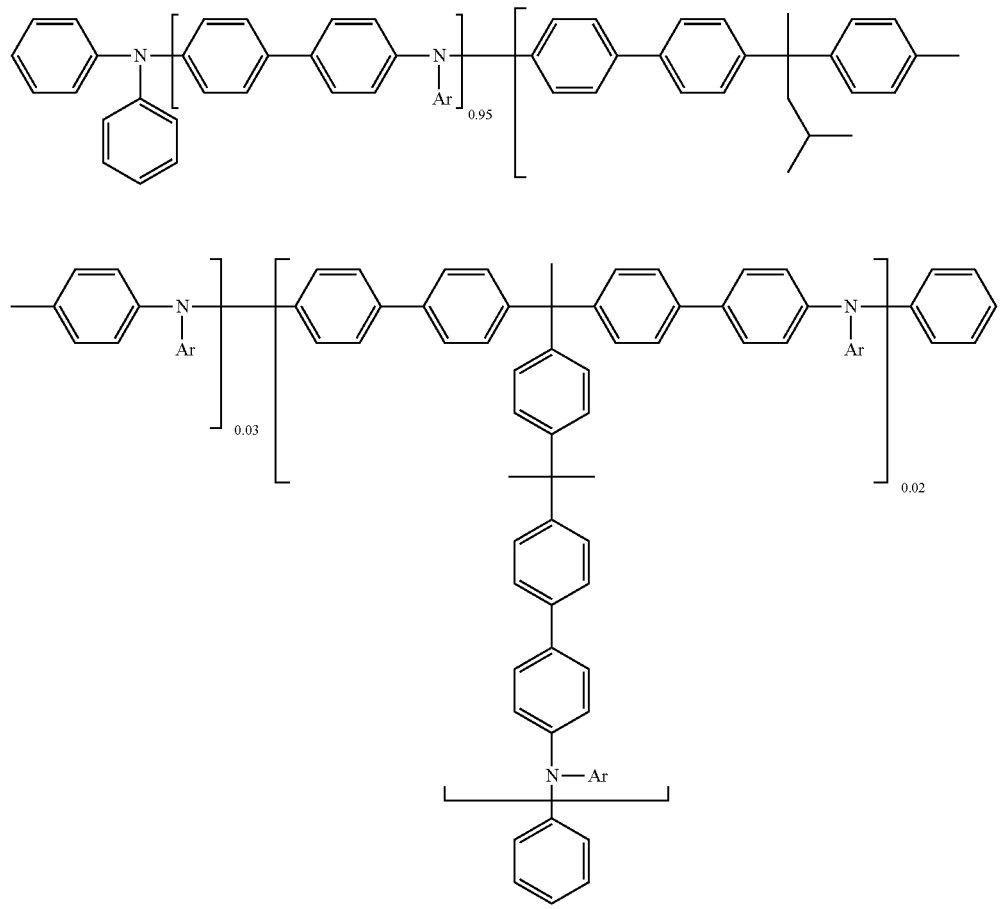

-continued

Ar = 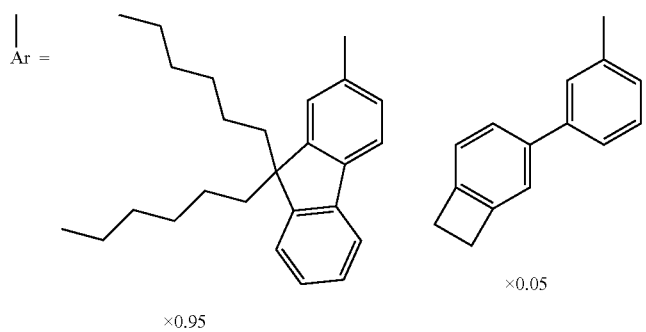

Example 5

An organic electroluminescent element was produced in the same manner as in Example 3, except that the composition for forming hole injection was changed to the following, and tested for the operation life also in the same manner, and the result is shown in Table 8.

<Composition for Forming Hole Injection Layer>

| | |
|---|---|
| Solvent | ethyl benzoate |
| Composition concentration | target polymer 5: 2.625% by weight comparative polymer 2: 0.875% by weight A-1: 0.7% by weight |

[Chem. 59]

Target Polymer 5

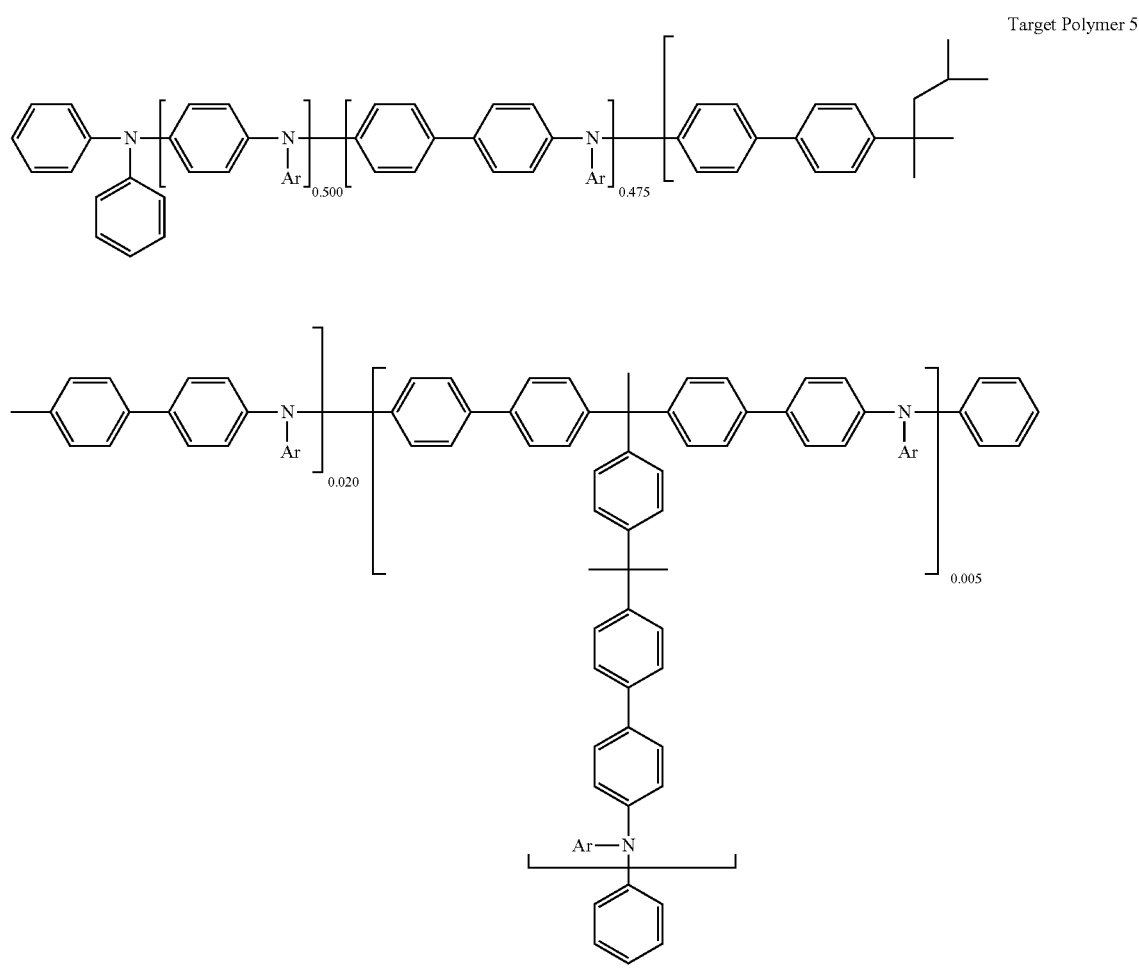

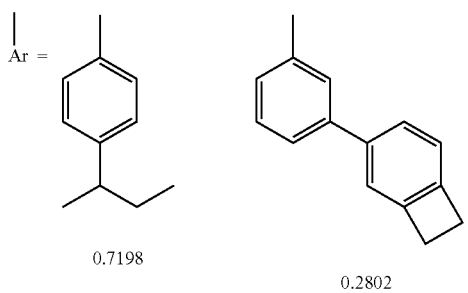

Comparative Example 1

An organic electroluminescent element was produced in the same manner as in Example 3, except that the composition for forming hole injection was changed to the following, and tested for the operation life also in the same manner, and the value was referred to as "1.0".

<Composition for Forming Hole Injection Layer>

| Solvent | ethyl benzoate |
|---|---|
| Composition concentration | comparative polymer 3: 2.625% by weight |
| | comparative polymer 2: 0.875% by weight |
| | A-1: 0.7% by weight |

TABLE 8

| | Polymer Used | | |
|---|---|---|---|
| | Hole Injection Layer 3 | Hole Transport Layer 4 | Relative Life |
| Example 2 | comparative polymer 3 comparative polymer 2 | target polymer 2 | 1.2 |
| Example 3 | comparative polymer 3 target polymer 3 | comparative polymer 1 | 2.6 |
| Example 4 | comparative polymer 3 target polymer 4 | comparative polymer 1 | 2.6 |
| Example 5 | target polymer 5 comparative polymer 2 | comparative polymer 1 | 2.0 |
| Comparative Example 1 | comparative polymer 3 | comparative polymer 1 | 1.0 |

TABLE 8-continued

| Polymer Used | | |
|---|---|---|
| Hole Injection Layer 3 | Hole Transport Layer 4 | Relative Life |
| comparative polymer 2 | | |

As shown in Table 8, the elements produced using the polymer of the present invention have a long element life and have high drive stability.

Example 6

An element having a layer configuration of (anode/hole injection layer/hole transport layer/cathode) was produced.

A glass substrate 1 having, as deposited thereon, an indium tin oxide (ITO) transparent conductive film having a thickness of 70 nm (sheet formed by sputter deposition, sheet resistance 15Ω) was patterned according to ordinary lithography to have a stripe anode having a stripe width of 2 mm. The thus-patterned ITO substrate (anode) was ultrasonically washed with acetone, washed with pure water, and ultrasonically washed with isopropyl alcohol in that order, then dried with a nitrogen blow, and finally washed with UV ozone.

Next, a coating liquid for forming hole injection layer was prepared, comprising the target polymer 6 having the structural formula mentioned below, the target polymer 4 having the structural formula, 4-isopropyl-4'-methyldiphenyliodonium tetrakis(pentafluorophenyeborate represented by the following structural formula (A1) and ethyl benzoate. The coating liquid was applied onto the anode in a mode of spin coating under the condition mentioned below, thereby forming a hole injection layer having a thickness of 150 nm.

[Chem. 60]

Target Polymer 6

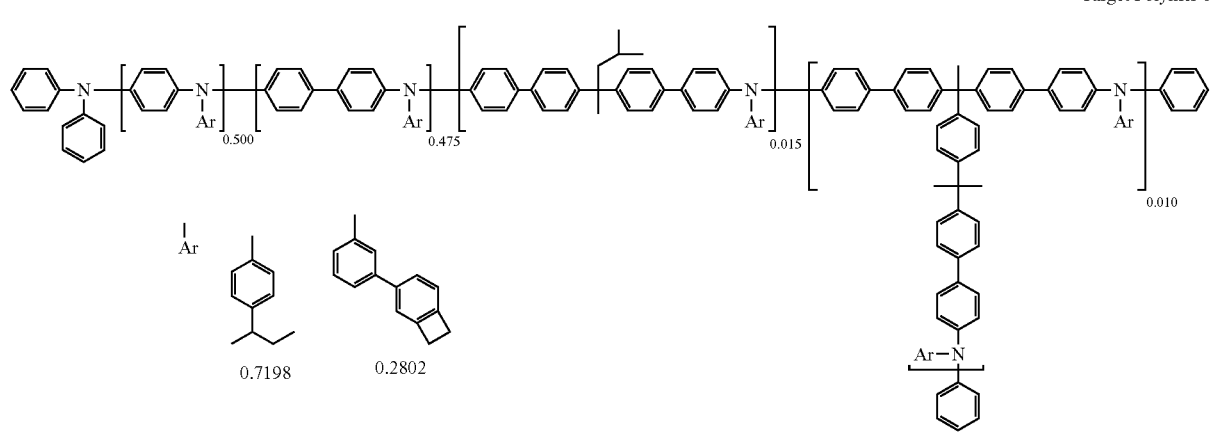

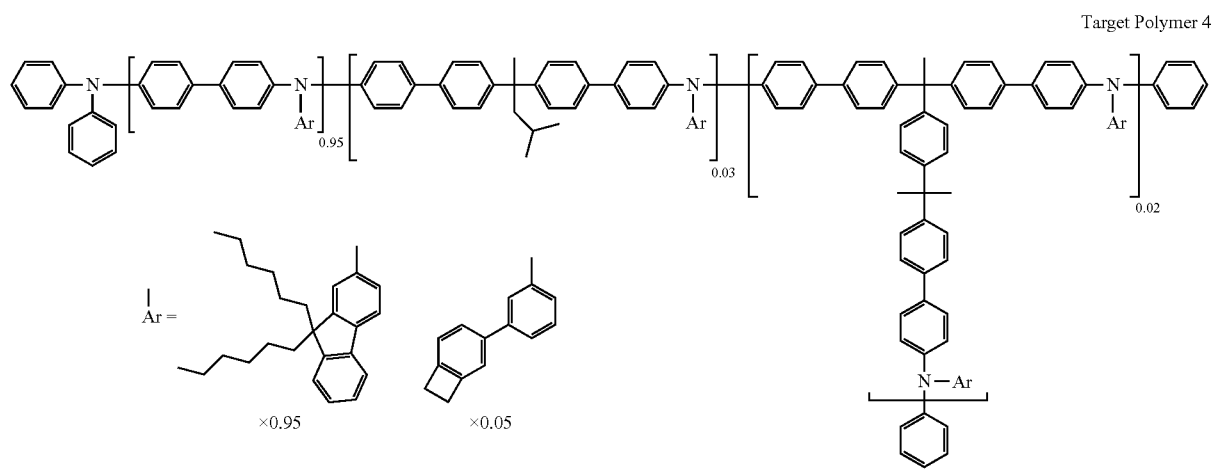

Target Polymer 4

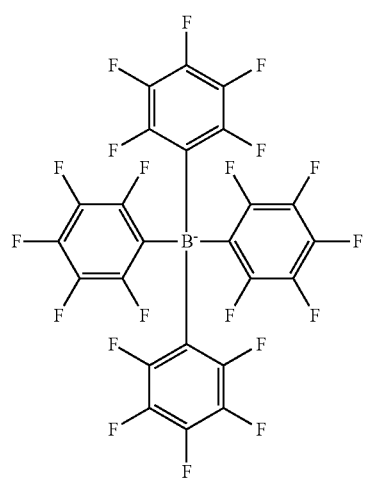

(A1)

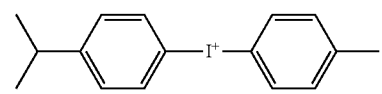

<Coating Liquid for Forming Hole Injection Layer>

| Solvent | ethyl benzoate |
|---|---|
| Composition concentration | target polymer 6: 1.375% by weight |
| | target polymer 4: 4.135% by weight |
| | A1: 0.55% by weight |

<Condition for Forming Hole Injection Layer>

| Spin coating atmosphere | in air |
|---|---|
| Heating condition | in air, 230° C., 1 hour |

Subsequently, a coating liquid for forming hole transport layer, containing the comparative polymer 1 shown by the following formula, was prepared, and this was applied on the above in a mode of spin coating under the condition mentioned below, and polymerized by heating to form a hole transport layer having a thickness of 12 mm.

[Chem. 61]

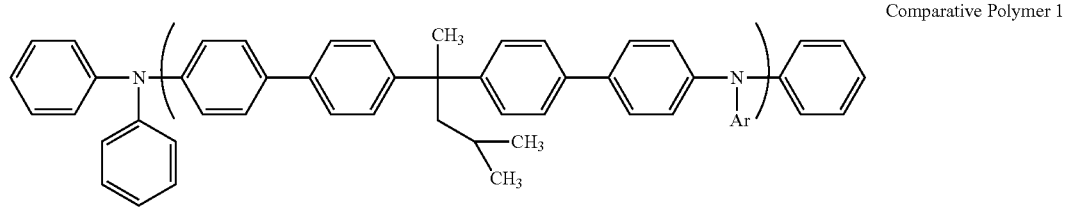

Comparative Polymer 1

<Coating Liquid for Forming Hole Transport Layer>

| Solvent | cyclohexylbenzene |
|---|---|
| Composition concentration | 1.4% by weight |

<Condition for Forming Hole Transport Layer>

| Spin coating atmosphere | in nitrogen |
|---|---|
| Heating condition | in nitrogen, 230° C., 1 hour |

Subsequently, aluminium was laminated on the above as a 2-mm wide stripe cathode having a thickness of 80 nm, according to a vacuum evaporation method in such a manner that the cathode stripes could be orthogonal to the anode ITO stripes. In that manner, an element having a current area of a size of 2 mm×2 mm was produced. The current density of the element given a voltage of 3 V is shown in Table 9.

Example 7

An element was produced in the same manner as in Example 2 except that the hole injection layer was formed in the manner mentioned below.

A coating liquid for forming hole injection layer was prepared, containing the target polymer 6 shown by the following structural formula, the comparative polymer 2 shown by the following structural formula, 4-isopropyl-4'-methyl-diphenyliodonium tetrakis(pentafluorophenyl)borate represented by the structural formula (A1) and ethyl benzoate. The coating liquid was applied onto the anode in a mode of spin coating under the condition mentioned below, thereby forming a hole injection layer having a thickness of 150 nm.

[Chem. 62]

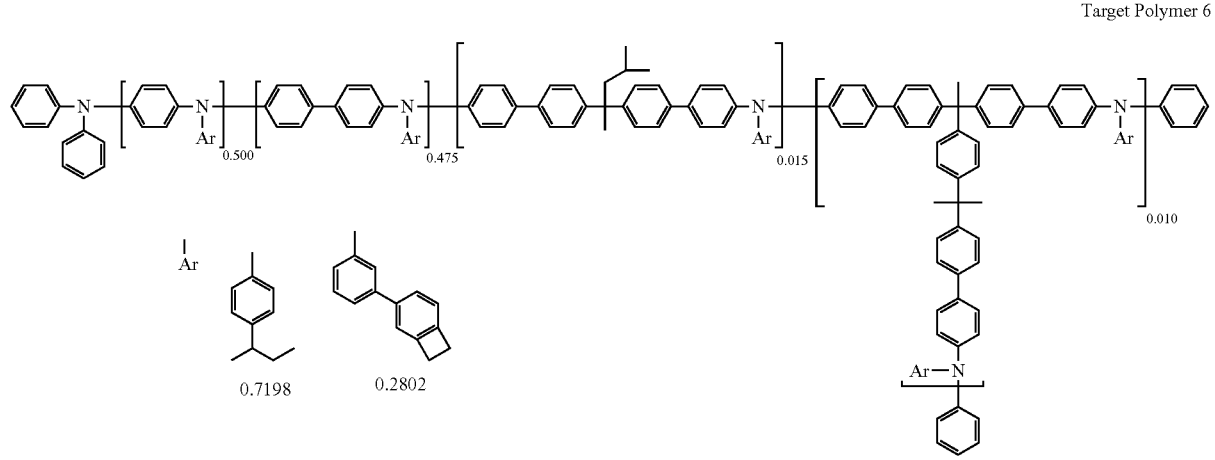

Target Polymer 6

-continued

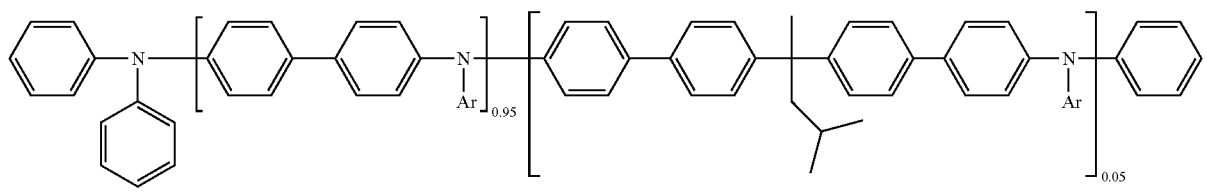
Comparative Polymer 2

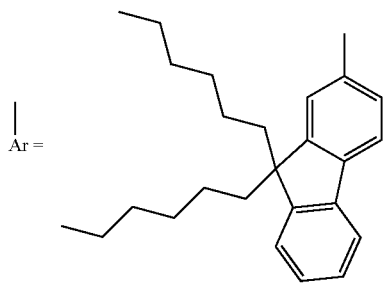

Ar = x 0.95          x 0.05

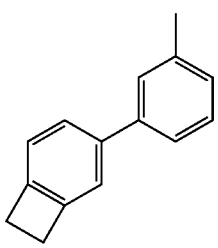
(A1)

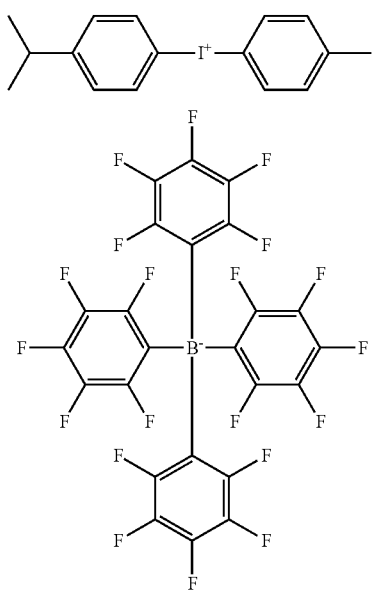

<Coating Liquid for Forming Hole Injection Layer>

| Solvent | ethyl benzoate |
|---|---|
| Composition concentration | target polymer 6: 1.375% by weight |
| | comparative polymer 2: 4.135% by weight |
| | A1: 0.55% by weight |

<Condition for Forming Hole Injection Layer>

| Spin coating atmosphere | in air |
|---|---|
| Heating condition | in air, 230° C., 1 hour |

The current density of the element given a voltage of 3V is shown in Table 9.

Comparative Example 2

An element was produced in the same manner as in Example 2 except that the hole injection layer was formed in the manner mentioned below.

A coating liquid for forming hole injection layer was prepared, containing the comparative polymer 3 shown by the following structural formula, the target polymer 2 shown by the following structural formula, 4-isopropyl-4'-methyl-diphenyliodonium tetrakis(pentafluorophenyl)borate represented by the structural formula (A1) and ethyl benzoate. The coating liquid was applied onto the anode in a mode of spin coating under the condition mentioned below, thereby forming a hole injection layer having a thickness of 150 nm.

[Chem. 63]
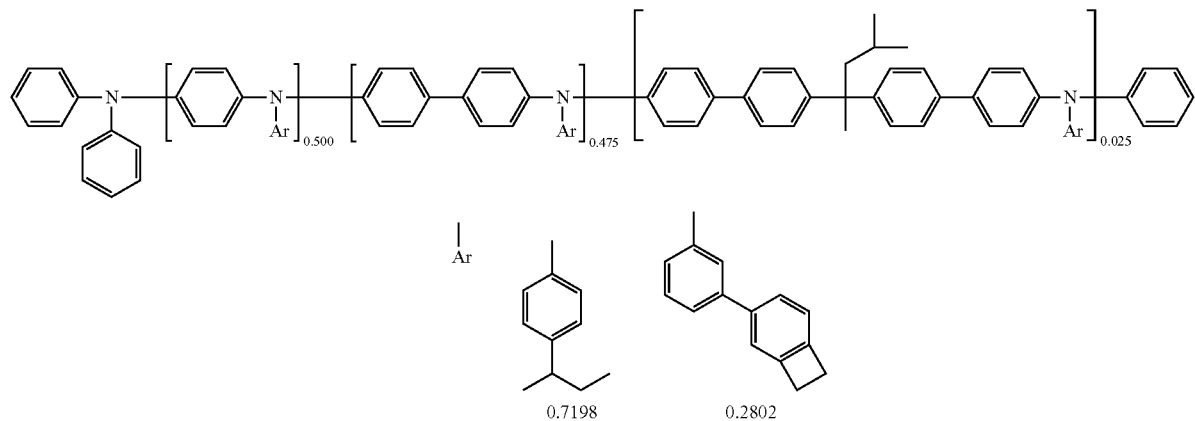
Comparative Polymer 3
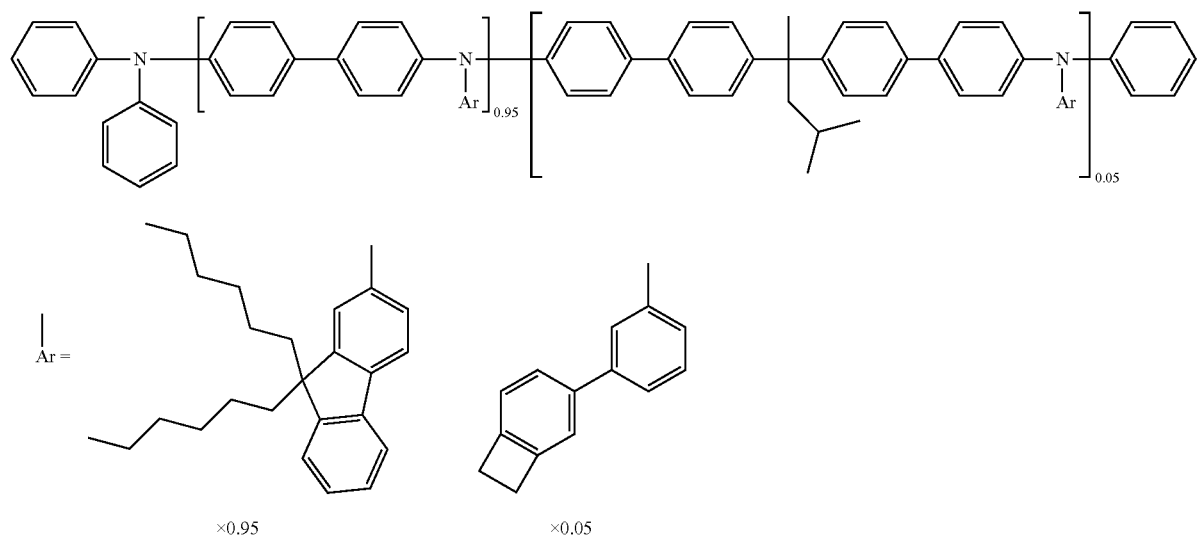
Comparative Polymer 2
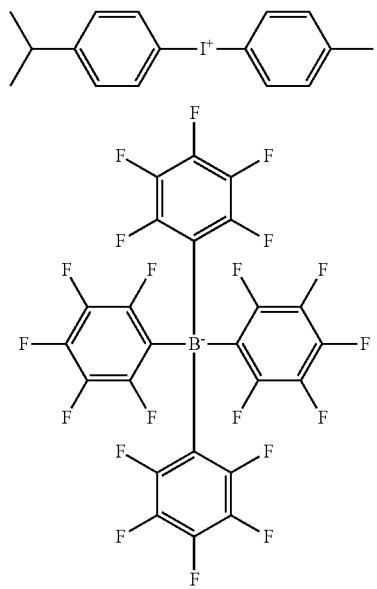
(A1)

<Coating Liquid for Forming Hole Injection Layer>

| Solvent | ethyl benzoate |
|---|---|
| Composition concentration | comparative polymer 3: 1.375% by weight<br>comparative polymer 2: 4.135% by weight<br>A1: 0.55% by weight |

<Condition for Forming Hole Injection Layer>

| Spin coating atmosphere | in air |
|---|---|
| Heating condition | in air, 230° C., 1 hour |

The current density of the element given a voltage of 3V is shown in Table 9.

TABLE 9

| | Polymer Used | | Current Density |
| --- | --- | --- | --- |
| | Hole Injection Layer | Hole Transport Layer | [mA/cm²] @3 V |
| Example 6 | target polymer 6 target polymer 4 | comparative polymer 1 | 4.65 |
| Example 7 | target polymer 6 comparative polymer 2 | comparative polymer 1 | 4.42 |
| Comparative Example 2 | comparative polymer 3 comparative polymer 2 | comparative polymer 1 | 3.18 |

As shown in Table 9, the elements produced using the polymer of the present invention have a high current density, when given a voltage of 3 V.

While the invention has been described in detail with reference to specific examples thereof, it will be apparent to one skilled in the art that various changes and modifications can be made therein without departing from the spirit and scope thereof.

The present application is based on a Japanese patent application filed on Feb. 23, 2012 (Application No. 2012-037678) and a Japanese patent application filed on Aug. 6, 2012 (Application No. 2012-173835), the contents of which are incorporated herein by reference.

REFERENCE SIGNS LIST

1 Substrate
2 Anode
3 Hole Injection Layer
4 Hole Transport Layer
5 Light-Emitting Layer
6 Hole Block Layer
7 Electron Transport Layer
8 Electron Injection Layer
9 Cathode
10 Organic Electroluminescent Element

The invention claimed is:

1. A polymer, comprising:
a repeating unit having a partial structure represented by formula (1):

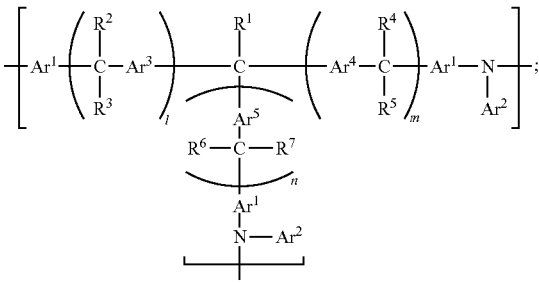

(1)

and
a repeating unit having a crosslinking group,
wherein, in formula (1):
$Ar^1$, $Ar^3$, $Ar^4$, and $Ar^5$ each independently represent an aromatic hydrocarbon-cyclic group optionally having a substituent or an aromatic heterocyclic group optionally having a substituent;
$Ar^2$ represents an aromatic hydrocarbon-cyclic group optionally having a substituent, or an aromatic heterocyclic group optionally having a substituent;
$R^1$ represents an alkyl group optionally having a substituent, or an alkoxy group optionally having a substituent;
$R^2$ to $R^7$ each independently represent a hydrogen atom, an alkyl group optionally having a substituent, an alkoxy group optionally having a substituent, an aromatic hydrocarbon-cyclic group optionally having a substituent, or an aromatic heterocyclic group optionally having a substituent, wherein $R^2$ and $R^3$ may bond to each other to form a ring, $R^4$ and $R^5$ may bond to each other to form a ring, and $R^6$ and $R^7$ may bond to each other to form a ring;
l, m, and n each independently indicate an integer of from 0 to 2; and
multiple $Ar^1$ to $Ar^5$ or $R^2$ to $R^7$ may be the same or different.

2. The polymer according to claim 1, wherein in the formula (1), at least one of l, m, and n is an integer differing from the others.

3. The polymer according to claim 1, further comprising:
a repeating unit having a partial structure of formula (2):

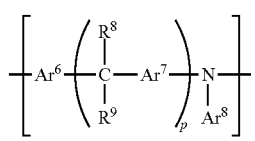

(2)

wherein, in formula (2):
$Ar^6$ and $Ar^7$ each independently represent an aromatic hydrocarbon-cyclic group optionally having a substituent, or an aromatic heterocyclic group optionally having a substituent;
$Ar^8$ represents an aromatic hydrocarbon-cyclic group optionally having a substituent, or an aromatic heterocyclic group optionally having a substituent;
$R^8$ and $R^9$ each independently represent a hydrogen atom, an alkyl group optionally having a substituent, an alkoxy group optionally having a substituent, an aromatic hydrocarbon-cyclic group optionally having a substituent, or an aromatic heterocyclic group optionally having a substituent;

$R^8$ and $R^9$ may bond to each other to form a ring;

p indicates an integer of from 0 to 2; and multiple substituents of at least one of $R^8$, $R^9$, and $Ar^7$ may be the same or different.

4. The polymer according to claim 1, wherein the crosslinking group is at least one group selected from crosslinking groups of the following formulae:

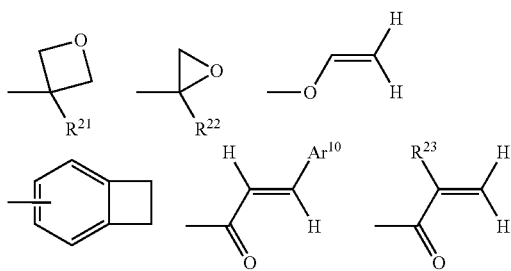

wherein:

$R^{21}$ to $R^{23}$ each independently represent a hydrogen atom, or an alkyl group optionally having a substituent;

$A^{10}$ represents an aromatic hydrocarbon-cyclic group optionally having a substituent, or an aromatic heterocyclic group optionally having a substituent; and when multiple crosslinking groups and multiple $R^{21}$ to $R^{23}$ and $Ar^{10}$ are present, the multiple $R^{21}$ to $R^{23}$ and $Ar^{10}$ may be the same or different.

5. The polymer according to claim 1, wherein the weight-average molecular weight (Mw) of the polymer is 20,000 or more, and the degree of dispersion (Mw/Mn, where Mn indicates the number-average molecular weight of the polymer) is 2.5 or less.

6. A material for organic electroluminescent element, comprising the polymer according to claim 1.

7. A composition for organic electroluminescent element, comprising the polymer according to claim 1.

8. An organic electroluminescent element, comprising:
a substrate;
an anode and a cathode on the substrate; and
an organic layer between the anode and the cathode,
wherein the organic layer contains a layer formed according to a wet film formation method using the composition for organic electroluminescent elements according to claim 7.

9. The organic electroluminescent element according to claim 8, wherein the layer formed according to a wet film formation method is at least one of a hole injection layer and a hole transport layer.

10. The organic electroluminescent element according to claim 9, wherein the organic layer includes a hole injection layer, a hole transport layer, and a light-emitting layer, and
wherein all of the hole injection layer, the hole transport layer and the light-emitting layer are a layer formed according to a wet film formation method.

11. An organic EL display device, comprising the organic electroluminescent element according to claim 8.

12. An organic EL lighting device, comprising the organic electroluminescent element according to claim 8.

* * * * *